US011961903B2

(12) United States Patent
Ha et al.

(10) Patent No.: US 11,961,903 B2
(45) Date of Patent: Apr. 16, 2024

(54) POWER SEMICONDUCTOR DEVICE AND METHOD OF FABRICATING THE SAME

(71) Applicant: HYUNDAI MOBIS CO., LTD., Seoul (KR)

(72) Inventors: Jeong Mok Ha, Yongin-si (KR); Hyuk Woo, Yongin-si (KR); Sin A Kim, Yongin-si (KR); Tae Youp Kim, Yongin-si (KR); Ju Hwan Lee, Yongin-si (KR); Min Gi Kang, Yongin-si (KR); Tae Yang Kim, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 193 days.

(21) Appl. No.: 17/330,039

(22) Filed: May 25, 2021

(65) Prior Publication Data

US 2021/0376143 A1 Dec. 2, 2021

(30) Foreign Application Priority Data

May 26, 2020 (KR) .................. 10-2020-0063131
May 28, 2020 (KR) .................. 10-2020-0064148

(Continued)

(51) Int. Cl.
*H01L 29/78* (2006.01)
*H01L 29/16* (2006.01)
*H01L 29/66* (2006.01)

(52) U.S. Cl.
CPC ...... *H01L 29/7813* (2013.01); *H01L 29/1608* (2013.01); *H01L 29/66734* (2013.01)

(58) Field of Classification Search
CPC ............. H01L 29/7813; H01L 29/1608; H01L 29/66734

(Continued)

(56) References Cited

U.S. PATENT DOCUMENTS

2006/0076617 A1 * 4/2006 Shenoy ............... H01L 29/7813
257/E29.066
2007/0252195 A1 11/2007 Yoshikawa et al.
(Continued)

FOREIGN PATENT DOCUMENTS

JP 2002-083963 A 3/2002
JP 2003-017701 A 1/2003
(Continued)

OTHER PUBLICATIONS

Office Action issued in corresponding Korean Patent Application No. 10-2020-0063131 dated Jun. 12, 2021.
(Continued)

*Primary Examiner* — Igwe U Anya
(74) *Attorney, Agent, or Firm* — MORGAN, LEWIS & BOCKIUS LLP

(57) ABSTRACT

A power semiconductor device includes a semiconductor layer of silicon carbide (SiC), at least one trench that extends in one direction, a gate insulating layer disposed on at least an inner wall of the at least one trench, at least one gate electrode layer disposed on the gate insulating layer, a drift region disposed in the semiconductor layer at least on one side of the at least one gate electrode layer, a well region disposed in the semiconductor layer to be deeper than the at least one gate electrode layer, a source region disposed in the well region, and at least one channel region disposed in the semiconductor layer of one side of the at least one gate electrode layer between the drift region and the source region.

15 Claims, 85 Drawing Sheets

(30) Foreign Application Priority Data

| | | |
|---|---|---|
| Jun. 2, 2020 | (KR) | 10-2020-0066309 |
| Jun. 5, 2020 | (KR) | 10-2020-0068205 |
| Jun. 9, 2020 | (KR) | 10-2020-0069417 |
| Jun. 11, 2020 | (KR) | 10-2020-0070701 |
| Jun. 12, 2020 | (KR) | 10-2020-0071310 |
| Nov. 2, 2020 | (KR) | 10-2020-0144559 |

(58) Field of Classification Search
USPC .................................................. 257/77
See application file for complete search history.

(56) References Cited

U.S. PATENT DOCUMENTS

| | | | |
|---|---|---|---|
| 2015/0171175 A1 | 6/2015 | Takaya et al. | |
| 2018/0269278 A1* | 9/2018 | Yamaguchi | H01L 29/7396 |
| 2021/0367039 A1* | 11/2021 | Ha | H01L 29/7828 |

FOREIGN PATENT DOCUMENTS

| | | |
|---|---|---|
| JP | 2015-115337 A | 6/2015 |
| JP | 2015-118966 A | 6/2015 |
| JP | 2019-121705 A | 7/2019 |
| JP | 2020-068321 A | 4/2020 |
| KR | 10-2000-0013572 A | 3/2000 |
| KR | 10-2011-0049249 A | 5/2011 |
| KR | 10-2011-0087392 A | 8/2011 |
| KR | 10-2016-0150349 A | 12/2016 |
| KR | 10-2018-0001044 A | 1/2018 |
| KR | 10-2019-0001233 A | 1/2019 |

OTHER PUBLICATIONS

Office Action issued in corresponding Korean Patent Application No. 10-2020-0066309 dated Jun. 20, 2021.
Office Action issued in corresponding Korean Patent Application No. 10-2020-0068205 dated Jun. 22, 2021.
Office Action issued in corresponding Korean Patent Application No. 10-2020-0069417 dated Jun. 22, 2021.
Office Action issued in corresponding Korean Patent Application No. 10-2020-0070701 dated Jun. 26, 2021.
Office Action issued in corresponding Korean Patent Application No. 10-2020-0071310 dated Jul. 11, 2021.
Office Action issued in corresponding Korean Patent Application No. 10-2020-0144559 dated Dec. 8, 2021.

* cited by examiner

POWER SEMICONDUCTOR DEVICE AND METHOD OF FABRICATING THE SAME

CROSS-REFERENCE TO RELATED APPLICATION

This application claims the benefit of priority to Korean Patent Application No. 10-2020-0063131, filed in the Korean Intellectual Property Office on May 26, 2020, Korean Patent Application No. 10-2020-0064148, filed in the Korean Intellectual Property Office on May 28, 2020, Korean Patent Application No. 10-2020-0066309, filed in the Korean Intellectual Property Office on Jun. 2, 2020, Korean Patent Application No. 10-2020-0068205, filed in the Korean Intellectual Property Office on Jun. 5, 2020, Korean Patent Application No. 10-2020-0069417, filed in the Korean Intellectual Property Office on Jun. 9, 2020, Korean Patent Application No. 10-2020-0070701, filed in the Korean Intellectual Property Office on Jun. 11, 2020, Korean Patent Application No. 10-2020-0071310, filed in the Korean Intellectual Property Office on Jun. 12, 2020, and Korean Patent Application No. 10-2020-0144559, filed in the Korean Intellectual Property Office on Nov. 2, 2020, the entire contents of which are incorporated herein by reference.

TECHNICAL FIELD

The present disclosure relates to a semiconductor device, and more particularly, relates to a power semiconductor device for switching a power transfer and a method of fabricating the same.

BACKGROUND

A power semiconductor device is a semiconductor device that operates in a high-voltage and high-current environment. The power semiconductor device is being used in a field requiring high-power switching, for example, in power conversion, a power converter, an inverter, etc. For example, the power semiconductor device may include an insulated gate bipolar transistor (IGBT), a metal oxide semiconductor field effect transistor (MOSFET), etc. The power semiconductor device basically requires high withstand voltage characteristics, and nowadays, the power semiconductor device additionally requires a high-speed switching operation.

As such, a power semiconductor device that uses silicon carbide (SiC) instead of silicon (Si) is being developed. The silicon carbide (SiC) that is a wide gap semiconductor material whose bandgap is greater than that of silicon may maintain stability even at a high temperature compared to silicon. In addition, because a breakdown electric field of the silicon carbide is higher than that of the silicon, the silicon carbide may stably operate even at a high temperature. Accordingly, the silicon carbide makes a stable operation possible at a high temperature through the following characteristics: a higher breakdown voltage than silicon and excellent heat release.

To increase a channel density of a power semiconductor device using this silicon carbide, a trench type of gate structure having a vertical channel structure is being developed. In the trench type of gate structure, because an electric field is concentrated on a trench edge, there is a limitation in reducing the channel density by using a structure for protecting a lower part of a trench. In addition, as a source contact structure is disposed between gate electrodes, it is also difficult to decrease a distance between the gate electrodes. As such, there is a limitation in reducing the channel density.

SUMMARY

The present disclosure has been made to solve the above-mentioned problems occurring in the prior art while advantages achieved by the prior art are maintained intact.

An aspect of the present disclosure provides a silicon carbide-based power semiconductor device capable of alleviating electric field concentration and increasing a channel density and a method of fabricating the same. However, the above object is an example, and the scope of the invention is not limited thereto.

The technical problems to be solved by the present disclosure are not limited to the aforementioned problems, and any other technical problems not mentioned herein will be clearly understood from the following description by those skilled in the art to which the present disclosure pertains.

According to an aspect of the present disclosure, a power semiconductor device includes a semiconductor layer of silicon carbide (SiC), at least one trench that extends in one direction and is recessed into the semiconductor layer from a surface of the semiconductor layer, a gate insulating layer that is disposed on at least an inner wall of the at least one trench, at least one gate electrode layer that is disposed on the gate insulating layer and disposed in the at least one trench, a drift region that is disposed in the semiconductor layer at least on one side of the at least one gate electrode layer and has a first conductivity type, a well region that is disposed in the semiconductor layer to be deeper than the at least one gate electrode layer, so as to be in contact with at least a part of the drift region and to surround a bottom surface of the at least one gate electrode layer at least at one end of the at least one gate electrode layer, and has a second conductivity type, a source region that is disposed in the well region and has the first conductivity type, and at least one channel region that is disposed in the semiconductor layer of one side of the at least one gate electrode layer between the drift region and the source region and has the second conductivity type.

The source region may include a source contact region connected with a source electrode layer outside the one end of the at least one gate electrode layer.

The power semiconductor device may include a well contact region extending through the source region from the well region in the source contact region, connected with the source electrode layer, and having the second conductivity type, and a doping concentration of the well contact region may be higher than a doping concentration of the well region.

The drift region may include a vertical portion vertically extending in the semiconductor layer of the one side of the at least one gate electrode layer, and the at least one channel region may be disposed in the semiconductor layer between the vertical portion of the drift region and the source region.

The well region, the source region, and the channel region may be disposed in the semiconductor layer so as to be located on opposite sides of the vertical portion of the drift region.

The drift region may include vertical portions vertically extending in the semiconductor layer of opposite sides of the at least one gate electrode layer, and the at least one channel region may include channel regions disposed in the semiconductor layer between the vertical portions of the drift region and the source region.

The at least one channel region may be a part of the well region.

The at least one trench may include a plurality of trenches disposed in the semiconductor layer in parallel along the one direction, the at least one gate electrode layer may include a plurality of gate electrode layers disposed in the plurality of trenches, the well region and the source region may extend across the plurality of gate electrode layers, and the at least one channel region may include a plurality of channel regions disposed in the semiconductor layer of one sides of the plurality of gate electrode layers.

The source region may include a source contact region connected with a source electrode layer outside one ends of the plurality of gate electrode layers.

The drift region may include vertical portions vertically extending in the semiconductor layer between the plurality of gate electrode layers, and the channel regions may be disposed in the semiconductor layer between the vertical portions of the drift region and the source region.

The at least one trench may include a plurality of trenches arranged to be spaced from each other in line along the one direction, the at least one gate electrode layer may include a plurality of gate electrode layers disposed in the plurality of trenches, and the well region and the source region may be disposed in the semiconductor layer between the plurality of trenches at least.

The power semiconductor device may further include a drain region having the first conductivity type in the semiconductor layer under the drift region, and a doping concentration of the drain region may be higher than a doping concentration of the drift region.

According to another aspect of the present disclosure, power semiconductor device includes a semiconductor layer of silicon carbide (SiC), a plurality of trenches that extend in parallel in one direction and are recessed into the semiconductor layer from a surface of the semiconductor layer, a gate insulating layer that are disposed on at least inner walls of the trenches, a plurality of gate electrode layers that are disposed on the gate insulating layer and disposed in the plurality of trenches, a drift region that includes a plurality of vertical portions disposed in the semiconductor layer between the plurality of gate electrode layers and has a first conductivity type, a well region that is disposed in the semiconductor layer to be deeper than the plurality of gate electrode layers, so as to be in contact with the plurality of vertical portions of the drift region and to surround bottom surfaces of the plurality of gate electrode layers at opposite ends of the plurality of gate electrode layers, and has a second conductivity type, a source region that is disposed in the well region and has the first conductivity type, and a plurality of channel regions that are disposed in the semiconductor layer of opposite sides of the plurality of gate electrode layers between the plurality of vertical portions of the drift region and the source region and has the second conductivity type.

According to another aspect of the present disclosure, a method of fabricating a power semiconductor device includes forming a drift region having a first conductivity type in a semiconductor layer of silicon carbide (SiC), forming a well region being in contact with at least a part of the drift region and having a second conductivity type, in the semiconductor layer, forming a source region having the first conductivity type, in the well region, forming at least one channel region having the second conductivity type, in the semiconductor layer between the drift region and the source region, forming at least one trench to be shallower than the well region, so as to be recessed into the semiconductor layer from a surface of the semiconductor layer and to extend across the drift region in the one direction, forming a gate insulating layer on at least an inner wall of the at least one trench, and forming at least one gate electrode layer on the gate insulating layer and in the at least one trench. The well region is formed in the semiconductor layer to be deeper than the at least one gate electrode layer, so as to surround a bottom surface of the at least one gate electrode layer at one end of the at least one gate electrode layer, and the channel region is formed in the semiconductor layer of one side of the at least one gate electrode layer between the drift region and the source region.

The forming of the source region may include forming a source contact region connected with a source electrode layer outside the one end of the at least one gate electrode layer.

The method may further include forming, in the source contact region, a well contact region extending through the source region from the well region, connected with the source electrode layer, and having the second conductivity type, and a doping concentration of the well contact region may be higher than a doping concentration of the well region.

The forming of the well region may be performed by implanting impurities of the second conductivity type into the semiconductor layer, and the forming of the source region may be performed by implanting impurities of the first conductivity type into the well region.

The drift region may be formed on a drift region having the first conductivity type, and a doping concentration of the drain region may be higher than a doping concentration of the drift region.

The drain region may be formed with a substrate of the first conductivity type, and the drift region may be formed with an epitaxial layer on the substrate.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Below, an embodiment of the present disclosure will be described in detail with reference to accompanying drawings. However, the present disclosure may be implemented in various different forms and should not be construed as being limited to embodiments to be disclosed below. Rather, these embodiments are provided as examples so that this disclosure will be thorough and complete and will fully convey the scope of the invention to one skilled in the art. Also, for convenience of description, sizes of at least some components or elements shown in drawings may be exaggerated or reduced. In drawings, the same sign refers to the same element.

Unless otherwise defined, all terms used herein are to be interpreted as commonly understood by one skilled in the art. In drawings, sizes of layers and regions are exaggerated for description, and are thus provided to describe normal structures of the present disclosure.

The same reference signs indicate the same components. When a first component such as a layer, a region, or a substrate is described as being on a second component, it may be understood as the first component is directly on the second component or a third component is interposed therebetween. On the other hand, when a first component is described as being "directly on" a second component, it is understood as any intermediate component is not interposed therebetween.

Figure 1:
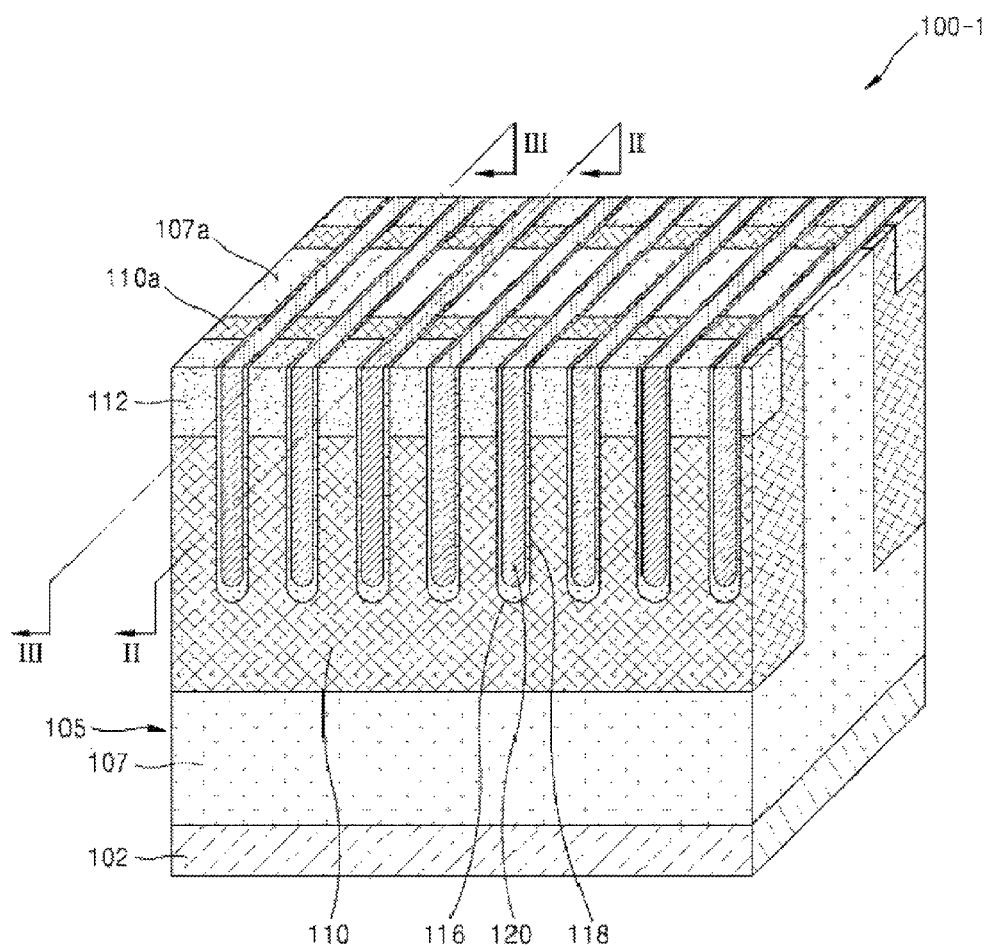
FIG. 1 is a schematic perspective view illustrating a power semiconductor device according to an embodiment of the present disclosure.
Figure 2:
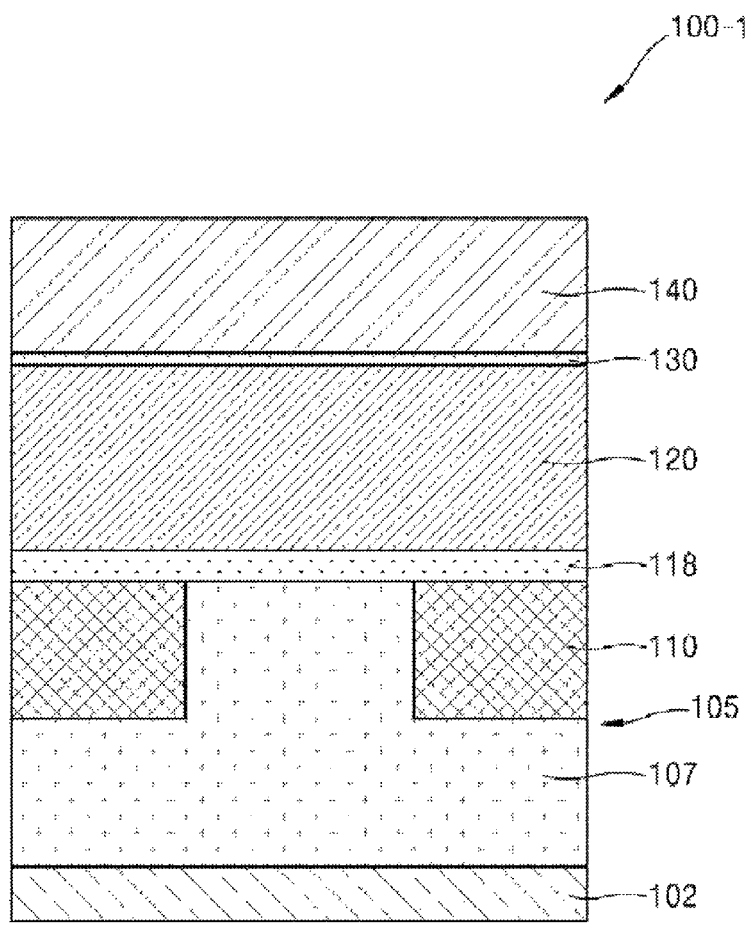
FIG. 2 is a plan view illustrating a power semiconductor device taken along line II-II of FIG. 1.
Figure 3:
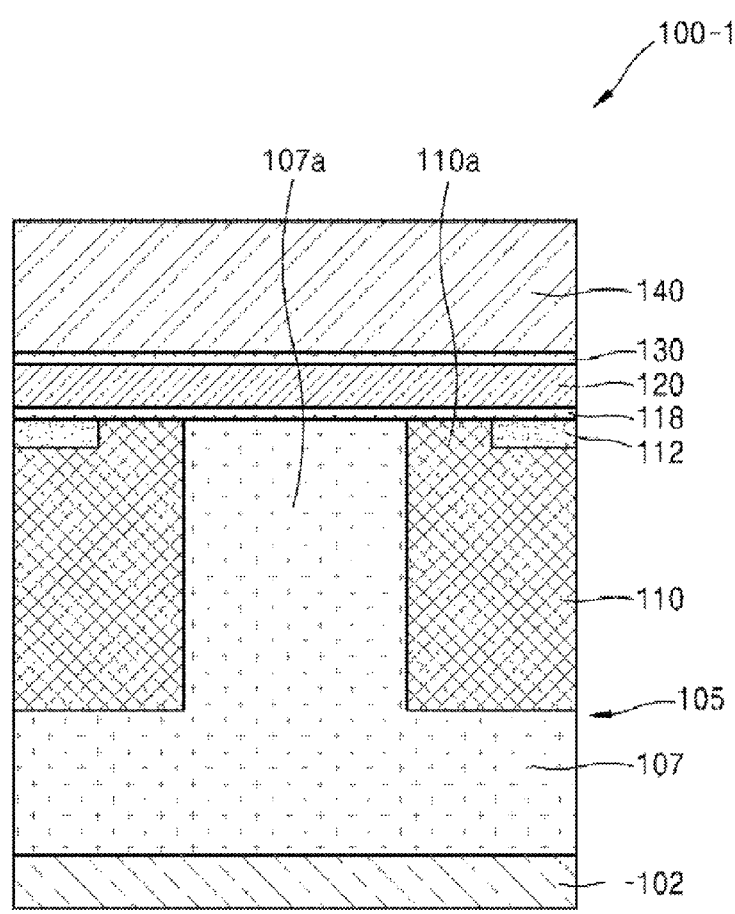
FIG. 3 is a cross-sectional view illustrating a power semiconductor device taken along line III-III of FIG. 2.

FIG. 1 is a schematic perspective view illustrating a power semiconductor device according to an embodiment of the present disclosure, FIG. 2 is a plan view illustrating a power semiconductor device taken along line II-II of FIG. 1, and FIG. 3 is a cross-sectional view illustrating a power semiconductor device taken along line III-III of FIG. 2.

Referring to FIGS. 1 to 3, a power semiconductor device 100-1 may at least include a semiconductor layer 105, a gate insulating layer 118, and a gate electrode layer 120. For example, the power semiconductor device 100-1 may have a power MOSFET structure.

The semiconductor layer 105 may refer to one semiconductor material layer or a plurality of semiconductor material layers, for example, may refer to one epitaxial layer or a plurality of epitaxial layers. In addition, the semiconductor layer 105 may refer to one or multiple epitaxial layers on a semiconductor substrate.

For example, the semiconductor layer 105 may be formed of silicon carbide (SiC). In more detail, the semiconductor layer 105 may include at least one epitaxial layer of silicon carbide.

Silicon carbide (SiC) may have a bandgap wider than silicon, thus maintaining stability even at a high temperature compared to silicon. In addition, because a breakdown electric field of the silicon carbide is higher than that of the silicon, the silicon carbide may stably operate even at a high temperature. Accordingly, the power semiconductor device 100-1 including the semiconductor layer 105 formed of silicon carbide may have a high breakdown voltage compared to the case of using silicon and may provide an excellent heat release characteristic and a stable operating characteristic at a high temperature.

In more detail, the semiconductor layer 105 may include a drift region 107. The drift region 107 may have a first conductivity type and may be formed by implanting impurities of the first conductivity type into a part of the semiconductor layer 105. For example, the drift region 107 may be formed by doping impurities of the first conductivity type in an epitaxial layer of silicon carbide.

A well region 110 may be formed in the semiconductor layer 105 to be in contact with at least a part of the drift region 107 and may have a second conductivity type. For example, the well region 110 may be formed by doping impurities of the second conductivity type opposite to the first conductivity type in the drift region 107.

For example, the well region 110 may be formed to surround at least a part of the drift region 107. As such, the drift region 107 may include a vertical portion 107a, at least a part of which is surrounded by the well region 110. In an operation of the power semiconductor device 100-1, the vertical portion 107a may provide a vertical movement path of charges.

The well region 110 is illustrated in FIG. 1 as including two regions spaced from each other and the vertical portion 107a interposed therebetween, but the well region 110 may be variously changed or modified. For example, the vertical portion 107a may have a shape whose side surface is surrounded by the well region 110 once.

A source region 112 may be formed in the well region 110 and may have the first conductivity type. For example, the source region 112 may be formed by doping impurities of the first conductivity type in the well region 110. The concentration of the first conductivity-type impurities doped in the source region 112 may be higher than that doped in the drift region 107.

At least one channel region 110a may be formed in the semiconductor layer 105 between the drift region 107 and the source region 112. For example, the channel region 110a may have the second conductivity type such that an inversion channel is formed along one direction.

Because the channel region 110a has a doping type opposite to that of the source region 112 and the drift region 107, the channel region 110a may form a diode junction with the source region 112 and the drift region 107. Accordingly, the channel region 110a may not permit charges to move in a normal situation; however, when an operating voltage is applied to the gate electrode layer 120, an inversion channel may be formed therein such that the movement of charges is permitted.

In some embodiments, the channel region 110a may be a part of the well region 110. In this case, the channel region 110a may be formed to be continuously connected with the well region 110. A doping concentration of the second conductivity-type impurities of the channel region 110a may be the same as that of the remaining portion of the well region 110 or may be different therefrom for the adjustment of a threshold voltage.

In some embodiments, the well region 110, the channel region 110a, and the source region 112 may be formed to be symmetrical with respect to the vertical portion 107a of the drift region 107. For example, each of the well region 110, the channel region 110a, and the source region 112 may include a left part and a right part that are formed to be symmetrical with respect to the vertical portion 107a of the drift region 107. In each of the well region 110, the channel region 110a, and the source region 112, the left part and the right part may be separated from each other or may be connected to each other.

In addition, a drain region 102 may be formed in the semiconductor layer 105 under the drift region 107 and may have the first conductivity type. For example, the drain region 102 may be doped with impurities of a high concentration compared to the drift region 107.

In some embodiments, the drain region 102 may be implemented with a substrate of silicon carbide having the first conductivity type. In this case, the drain region 102 may be understood as a part of the semiconductor layer 105 or may be understood as a substrate independent of the semiconductor layer 105.

At least one trench 116 may be formed to be recessed into the semiconductor layer 105 from a surface of the semiconductor layer 105 as much as a given depth. For example, the at least one trench 116 may have a predetermined depth from the surface (e.g., an upper surface) of the semiconductor layer 105. The trench 116 may extend in one direction within the semiconductor layer 105. One direction may refer to a length direction, not a depth direction of the trench 116, and may refer to a direction of line II-II or III-III of FIG. 1.

The gate insulating layer 118 may be formed on at least an inner wall of the trench 116. For example, the gate insulating layer 118 may include an insulating material such as silicon oxide, silicon carbide oxide, silicon nitride, hafnium oxide, zirconium oxide, or aluminum oxide, or may include a stacked structure thereof. A thickness of the gate insulating layer 118 may be uniform, or a part of the gate insulating layer 118 formed on a bottom surface of the trench 116 may be thicker than a part of the gate insulating layer 118 formed on a side wall of the trench 116.

At least one gate electrode layer 120 may be formed on the gate insulating layer 118 so as to be disposed in the trench 116. For example, the gate electrode layer 120 may include an appropriate conductive material such as polysilicon, metal, metal nitride, or metal silicide, or may include a stacked structure thereof.

The drift region 107 may be formed in the semiconductor layer 105 on one side of the gate electrode layer 120. For example, the vertical portion 107a of the drift region 107 may vertically extend in the semiconductor layer 105 of one side of the gate electrode layer 120. The expression, "an element may vertically extend," may mean that the element may extend in a direction perpendicular to a major surface of the semiconductor layer 105 or a major surface of the power semiconductor device according to various embodiments.

In some embodiments, the drift region 107 may be formed in the semiconductor layer 105 on opposite sides of the gate electrode layer 120. For example, the drift region 107 may include vertical portions 107a that vertically extend in the semiconductor layer 105 of opposite sides of the gate electrode layer 120.

The well region 110 may be formed to be deeper than the gate electrode layer 120, so as to surround the bottom surface of the gate electrode layer 120 at one end of the gate electrode layer 120. In addition, the well region 110 may be formed to be deeper than the gate electrode layer 120, so as to surround the bottom surface of the gate electrode layer 120 at opposite ends of the gate electrode layer 120. As such, opposite end parts of the gate electrode layer 120 around the source region 112 may be surrounded by the well region 110.

This structure may alleviate the concentration of an electric field on the bottom surface of the trench 116, that is, at a lower part of the gate electrode layer 120. Accordingly, in the power semiconductor device 100-1 according to the embodiment, the well region 110 may be formed to be deeper than the gate electrode layer 120 without additionally forming a deep well, and thus, the concentration of an electric field on the bottom surface of the trench 116 may be alleviated. A conventional vertical channel structure is problematic in that a junction resistance and a threshold voltage increase as a distance between a deep well and a trench becomes shorter. However, the issue may not occur in the power semiconductor device 100-1 according to the embodiment.

The channel region 110a may be formed in the semiconductor layer 105 of one side of the gate electrode layer 120 between the vertical portion 107a of the drift region 107 and the source region 112. Accordingly, the semiconductor layer 105 of the one side of the gate electrode layer 120 may include a structure in which the source region 112, the channel region 110a, and the vertical portion 107a of the drift region 107 are connected along one direction.

The above structure of the channel region 110a may be called a "lateral channel structure" in that the channel region 110a is formed along a side wall of the gate electrode layer 120.

In addition, channel regions 110a may be formed in the semiconductor layer 105 of opposite sides of the gate electrode layer 120 between the vertical portion 107a of the drift region 107 and the source region 112.

In some embodiments, the gate insulating layer 118 and the gate electrode layer 120 may be formed in the trench 116, and in addition, may be formed to further extend to the outside of the trench 116.

In some embodiments, one trench 116 or a plurality of trenches 116 may be provided in the semiconductor layer 105. The number of trenches 116 may be appropriately selected without limiting the scope of the embodiment.

For example, the plurality of trenches 116 may be formed in the semiconductor layer 105 in parallel along one direction. As the trenches 116 extend in one direction and are spaced from each other in a direction perpendicular to the one direction, the trenches 116 may be arranged in parallel.

In this case, a plurality of gate electrode layers 120 may be formed on the gate insulating layer 118 so as to fill the inside of the trenches 116. As such, the gate electrode layers 120 may be formed in the semiconductor layer 105 in a trench type and may be arranged to extend in parallel in the one direction like the trenches 116.

In addition, each of the well region 110 and the source region 112 may extend across the gate electrode layers 120. The vertical portions 107a of the drift region 107 may be arranged in the semiconductor layer 105 between the gate electrode layers 120. The plurality of channel regions 110a may be formed in the semiconductor layer 105 between the source region 112 and the vertical portions 107a of the drift region 107 on one side or opposite sides of each of the gate electrode layers 120.

In some embodiments, the well region 110 may be formed in the semiconductor layer 105 to be deeper than the gate electrode layers 120, so as to be in contact with the vertical portions 107a of the drift region 107 and to surround the bottom surface of the gate electrode layers 120 at opposite ends of the gate electrode layers 120.

An interlayer insulating layer 130 may be formed on the gate electrode layer 120.

A source electrode layer 140 may be formed on the interlayer insulating layer 130 and may be connected with the source region 112. For example, the source electrode layer 140 may be formed of an appropriate conductive material, metal, etc.

For clearness of illustration, unlike FIGS. 2 and 3, the interlayer insulating layer 130 and the source electrode layer 140 are not illustrated in FIG. 1.

In the power semiconductor device 100-1 described above, the first conductivity type and the second conductivity type may be opposite to each other, and each of the first conductivity type and the second conductivity type may be one of n-type and p-type. For example, when the first conductivity type is n-type, the second conductivity type is p-type, and vice versa.

In more detail, when the power semiconductor device 100-1 is an N-type MOSFET, the drift region 107 may be an N-region, the source region 112, a source contact region 112a, and the drain region 102 may be N+ regions, the well region 110 and the channel region 110a may be P− regions, and a well contact region 114 may be a P+ region.

In an operation of the power semiconductor device 100-1, a current may generally flow in a vertical direction from the drain region 102 along the vertical portions 107a of the drift region 107, and may then flow through the channel region 110a to the source region 112 along the side surfaces of the gate electrode layers 120.

In the power semiconductor device 100-1 described above, the gate electrode layers 120 may be densely arranged in parallel in a stripe type, and the channel regions 110a may be disposed on the side surfaces of the gate electrode layers 120. As such, a channel density may increase.

Also, in the power semiconductor device 100-1, because the bottom surfaces of the gate electrode layers 120 are surrounded by the well region 110, a breakdown phenomenon due to the concentration of an electric field on edges of the trenches 116 may be alleviated. Accordingly, the high withstand voltage characteristic of the power semiconductor device 100-1 may be improved. This may mean that the reliability of operation of the power semiconductor device 100-1 is improved.

Figure 4:
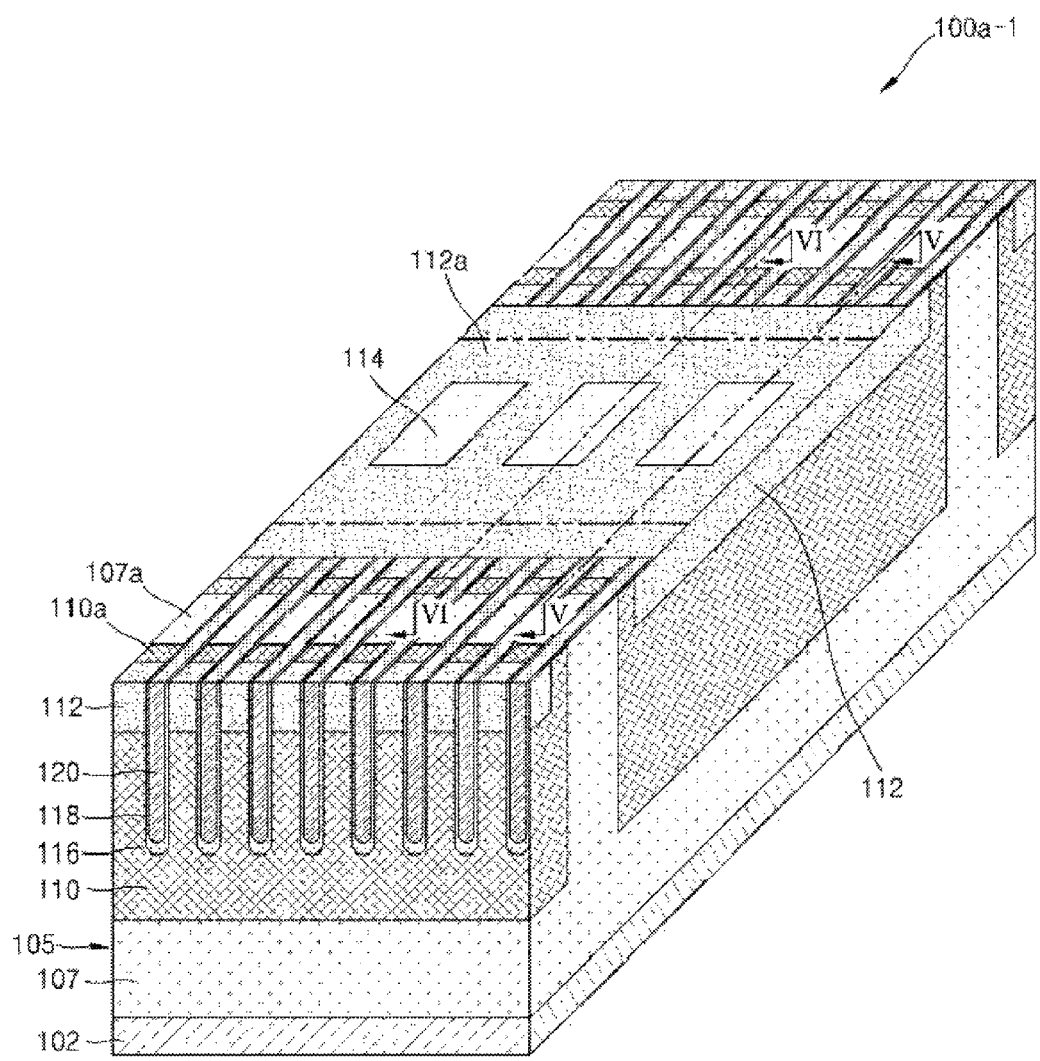
FIG. 4 is a schematic perspective view illustrating a power semiconductor device according to another embodiment of the present disclosure.
Figure 5:
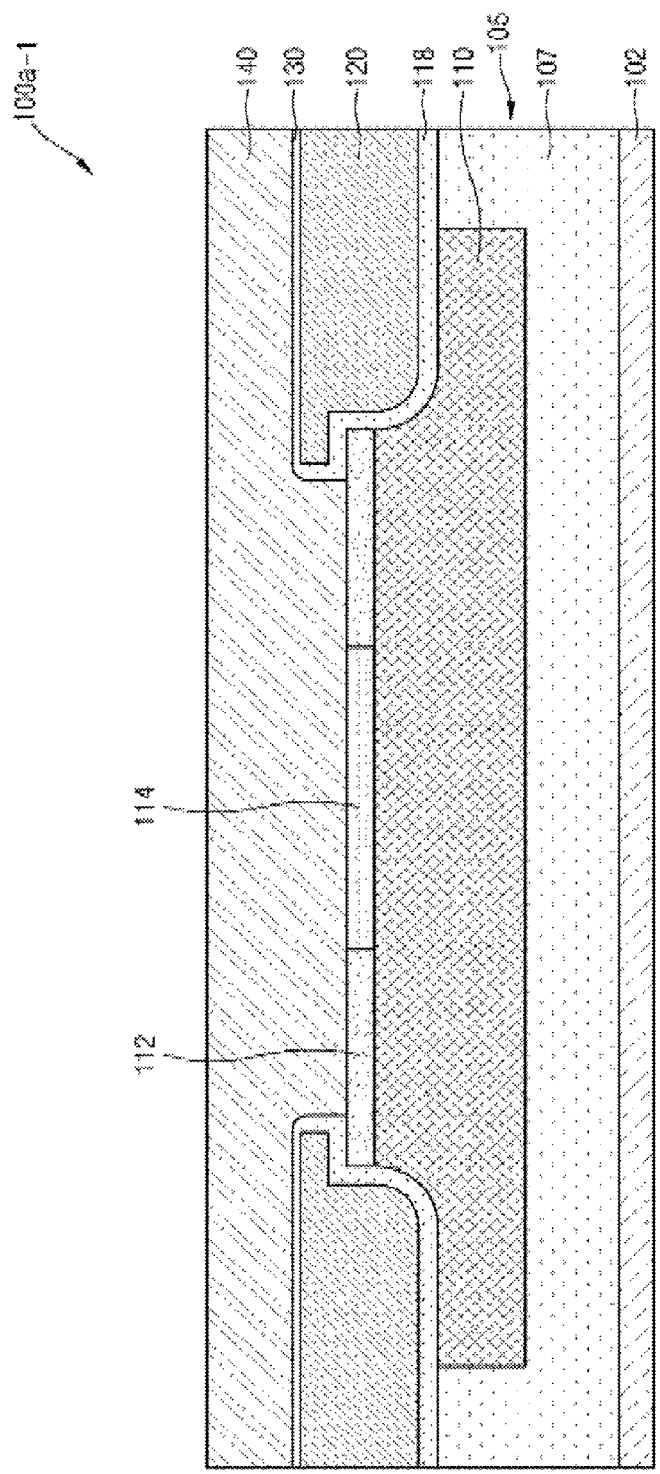
FIG. 5 is a cross-sectional view illustrating a power semiconductor device taken along line V-V of FIG. 4.
Figure 6:
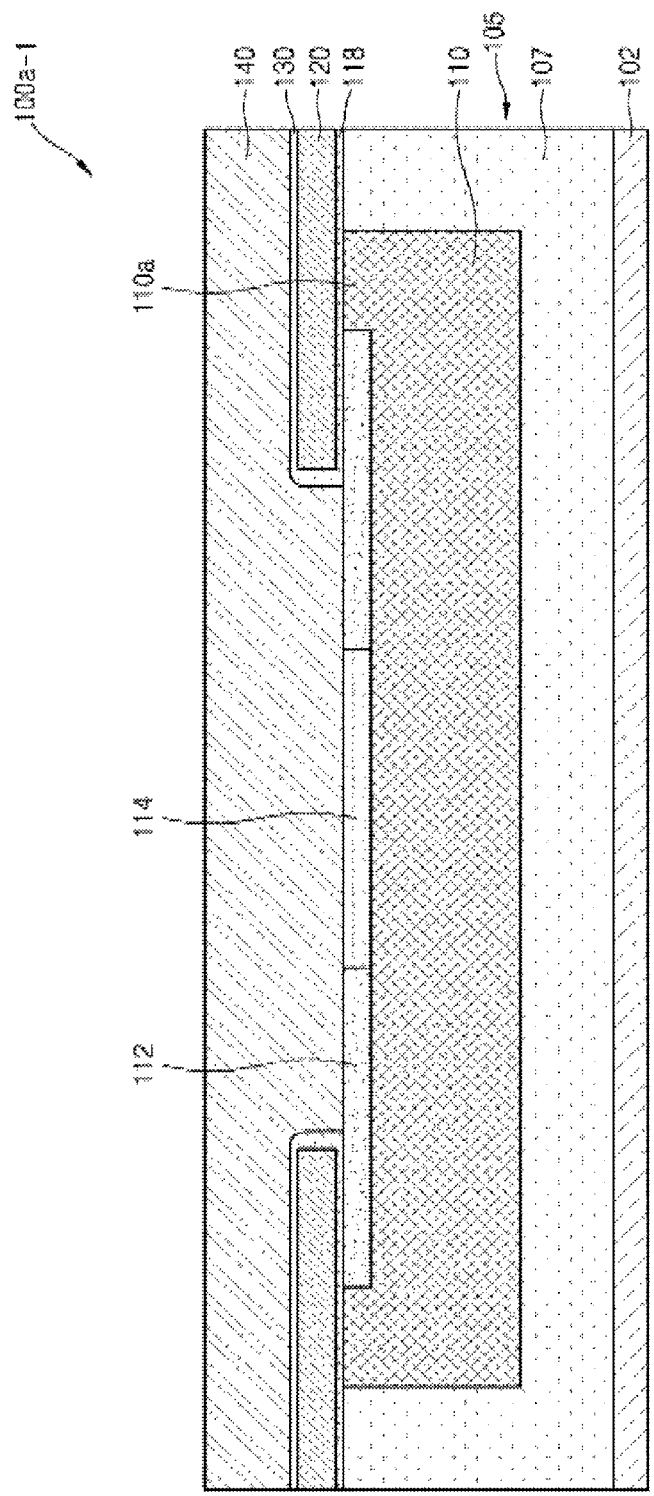
FIG. 6 is a cross-sectional view illustrating a power semiconductor device taken along line VI-VI of FIG. 4.

FIG. 4 is a schematic perspective view illustrating a power semiconductor device 100a-1 according to another embodiment of the present disclosure, FIG. 5 is a cross-sectional view illustrating the power semiconductor device 100a-1 taken along line V-V of FIG. 4, and FIG. 6 is a cross-sectional view illustrating the power semiconductor device 100a-1 taken along line VI-VI of FIG. 4.

The power semiconductor device 100a-1 according to the embodiment may be implemented by using or partially modifying the power semiconductor device 100-1 of FIGS. 1 to 3, and thus, additional description will be omitted to avoid redundancy.

Referring to FIGS. 4 to 6, the source region 112 may include the source contact region 112a connected with the source electrode layer 140 outside at least one ends of the gate electrode layers 120. For example, the source contact region 112a that is a part of the source region 112 may refer to the part with which the source electrode layer 140 is connected.

The well contact region 114 may be formed in the source contact region 112a. For example, the well contact region 114 may extend from the well region 110 to penetrate the source region 112 and may have the second conductivity type. One well contact region 114 or a plurality of source contact regions 114 may be formed in the source contact region 112a.

For example, the well contact region 114 may be connected with the source electrode layer 140, and may be doped with second conductivity-type impurities of a higher concentration than the well region 110 to reduce a contact resistance when connected with the source electrode layer 140.

An example is illustrated in FIGS. 4 to 6 as the source contact region 112a and the well contact region 114 are formed in the source region 112 of one side of the vertical portions 107a of the drift region 107. However, when each of the source region 112 and the well region 110 is divided into a plurality of regions, each of the source contact region 112a and the well contact region 114 may be formed in each of the corresponding regions.

In some embodiments, the plurality of trenches 116 may be arranged to be spaced from each other in line along one direction. As such, the gate electrode layers 120 may also be arranged to be spaced from each other in line in the one direction, along the trenches 116. In this case, the well region 110 and the source region 112 may be formed in the semiconductor layer 105 so as to be located between the trenches 116 arranged to be spaced from each other in line along the one direction.

For example, the structure of the power semiconductor device 100-1 of FIGS. 1 to 3 may be disposed in plurality along one direction, and the well region 110 and the source region 112 may be formed therebetween.

For clearness of illustration, unlike FIGS. 5 and 6, the interlayer insulating layer 130 and the source electrode layer 140 are not illustrated in FIG. 4.

In the power semiconductor device 100a-1 according to the embodiment, the source contact region 112a and the well contact region 114 may be disposed outside the gate electrode layers 120, not between the gate electrode layers 120, and thus, the gate electrode layers 120 may be arranged more densely. As such, a channel density of the power semiconductor device 100a-1 may markedly increase. In addition, according to the power semiconductor device 100a-1, a breakdown phenomenon due to the concentration of an electric field on edges of the trenches 116 may be alleviated, and thus, a high withstand voltage characteristic of the power semiconductor device 100a-1 may be improved. This may mean that the reliability of operation of the power semiconductor device 100a-1 is improved.

Figure 7:
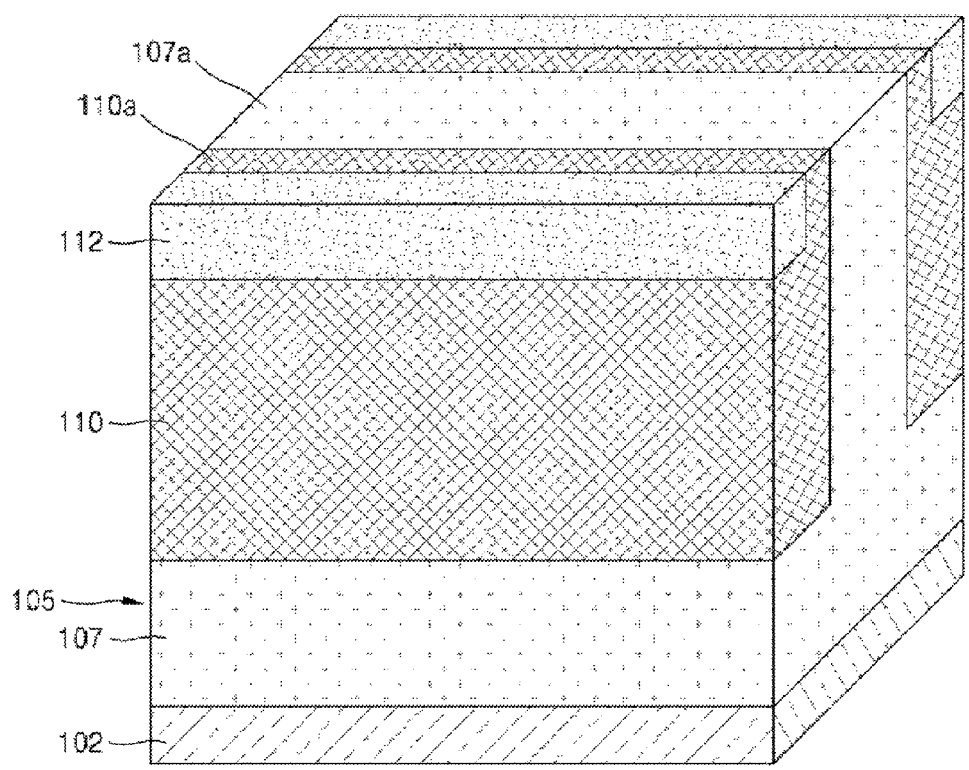
FIGS. 7 to 9 are schematic perspective views illustrating a method of fabricating a power semiconductor device according to an embodiment of the present disclosure.
Figure 8:
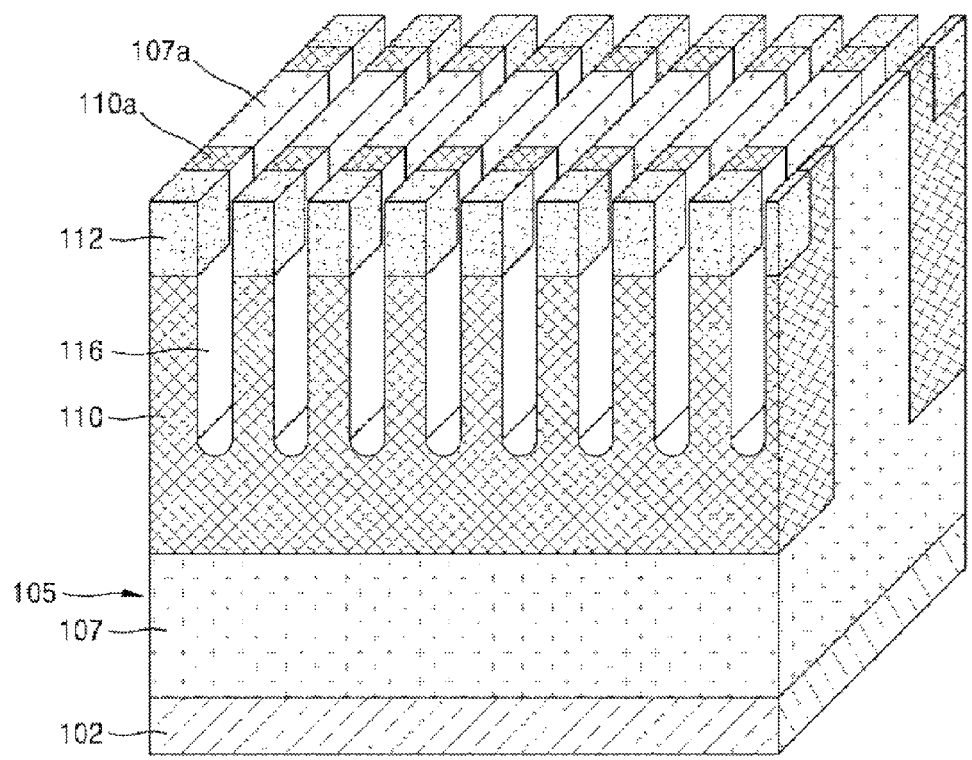
Figure 9:
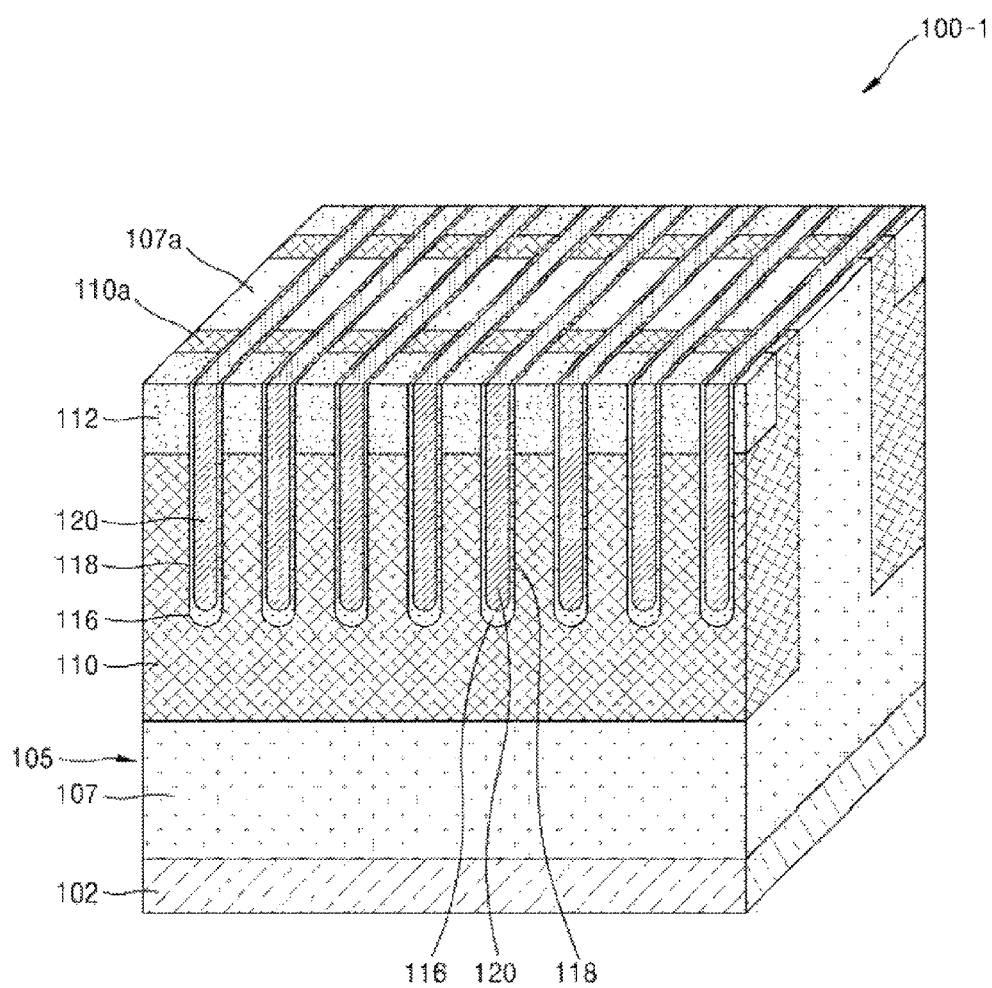

FIGS. 7 to 9 are schematic perspective views illustrating a method of fabricating the power semiconductor device 100a-1 according to an embodiment of the present disclosure.

Referring to FIG. 7, the drift region 107 having the first conductivity type may be formed in the semiconductor layer 105 of silicon carbide (SiC). For example, the drift region 107 may be formed on the drain region 102 having the first conductivity type. In some embodiments, the drain region 102 may be implemented with a substrate of the first conductivity type, and the drift region 107 may be formed on the substrate with one or more epitaxial layers.

Next, the well region 110 having the second conductivity type may be formed in the semiconductor layer 105 so as to be in contact with at least a part of the drift region 107. For example, the forming of the well region 110 may be performed by implanting impurities of the second conductivity type into the semiconductor layer 105.

For example, the well region 110 may be formed in the semiconductor layer 105 such that the drift region 107 includes the vertical portion 107a, at least a part of which is surrounded by the well region 110. In more detail, the well region 110 may be formed by doping impurities of a conductivity type opposite to that of the drift region 107 in the drift region 107.

Then, the source region 112 having the first conductivity type may be formed in the well region 110. For example, source region 112 may be formed by implanting impurities of the first conductivity type into the well region 110.

In addition to the formation of the source region 112, at least one channel region 110a in which an inversion channel is formed along one direction and which has the second conductivity type may be formed in the semiconductor layer 105 between the source region 112 and the drift region 107. For example, the channel region 110a may be formed between the source region 112 and the vertical portion 107a of the drift region 107.

In the above fabricating method, the impurity implantation or the impurity doping may be performed such that the impurities are mixed when the impurities are implanted into the semiconductor layer 105 or an epitaxial layer is formed. However, an ion implantation method using a mask pattern may be used for implantation of the impurities in a selective region.

Optionally, a heat treatment process for activating or diffusing the impurities may be performed after the ion implantation.

Referring to FIG. 8, at least one trench 116 may be formed to be recessed into the semiconductor layer 105 from a surface of the semiconductor layer 105 as much as a given depth. For example, the at least one trench 116 may have a predetermined depth from the surface (e.g., an upper surface) of the semiconductor layer 105.

For example, the trench 116 may extend across the drift region 107 in one direction and may be formed to be shallower than the well region 110.

In addition, the plurality of trenches 116 may be formed in the semiconductor layer 105 in parallel in one direction.

For example, the trenches 116 may be formed by forming a photo mask by using photo lithography and then etching the semiconductor layer 105 by using the photo mask as an etching protection layer.

Referring to FIG. 9, the gate insulating layer 118 may be formed on the inner walls of the trenches 116. For example, the gate insulating layer 118 may be formed by oxidizing the semiconductor layer 105 to form an oxide or by depositing an insulating material such as oxide or nitride on the semiconductor layer 105.

Afterwards, the gate electrode layers 120 may be formed on the gate insulating layer 118 so as to be disposed in the trenches 116. For example, the gate electrode layer 120 may be formed by forming a conductive layer on the gate insulating layer 118 and patterning the conductive layer. The gate electrode layer 120 may be formed by doping impurities in polysilicon or may be formed to include a conductive metal or metal silicide.

A patterning process may be performed by using photo lithography and etching processes. The photo lithography process may include a process of forming a photoresist pattern as a mask layer by using a photo process and a development process, and the etching process may include a process of selectively etching an underlying structure by using the photoresist pattern.

As such, the well region 110 may be disposed to be deeper than the gate electrode layer 120 so as to surround the bottom surface of the gate electrode layer 120 at one end of the gate electrode layer 120, and the channel region 110a may be formed in the semiconductor layer 105 of one side or opposite sides of the gate electrode layer 120 between the drift region 107 and the source region 112.

In addition, as illustrated in FIGS. 2 and 3, the interlayer insulating layer 130 may be formed on the gate electrode layer 120.

Afterwards, the source electrode layer 140 may be formed on the interlayer insulating layer 130. For example, the source electrode layer 140 may be formed by forming a conductive layer, for example, a metal layer on the interlayer insulating layer 130 and patterning the conductive layer.

Meanwhile, the power semiconductor device 100a-1 of FIGS. 4 to 6 may be fabricated by adding some processes to the method of fabricating the power semiconductor device 100-1 described above or changing or modifying the fabricating method.

For example, when the power semiconductor device 100a-1 is fabricated, the forming of the source region 112 may include forming the source contact region 112a connected with the source electrode layer 140 at least outside one end of the gate electrode layer 120. In some embodiments, the source contact region 112a may not be distinguished from the source region 112.

In addition, before the trenches 116 are formed, the well contact region 114 may be formed in the source contact region 112a. For example, the well contact region 114 may be formed by implanting the second conductivity-type impurities of a higher concentration than the well region 110, into a part of the well region 110.

When the power semiconductor device 100a-1 is fabricated, the trenches 116 may be arranged to be spaced from each other in line in one direction. In addition, the well region 110, the channel region 110a, and the source region 112 may be formed in the semiconductor layer between the trenches 116.

According to the above fabricating method, the power semiconductor device 100-1 using the semiconductor layer 105 of silicon carbide may be economically fabricated by using processes that are applied to a conventional silicon substrate.

Figure 10:
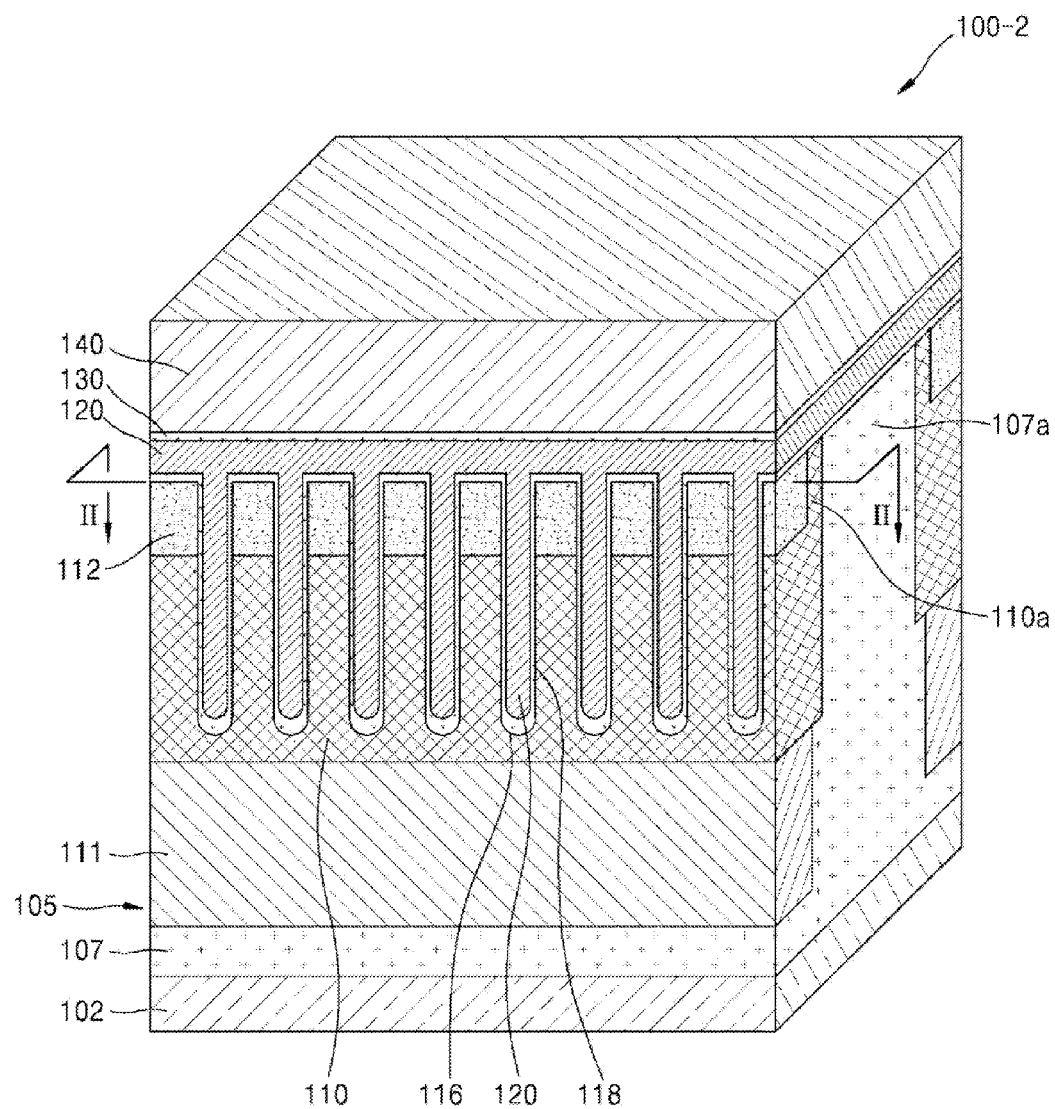
FIG. 10 is a schematic perspective view illustrating a power semiconductor device according to an embodiment of the present disclosure.
Figure 11:
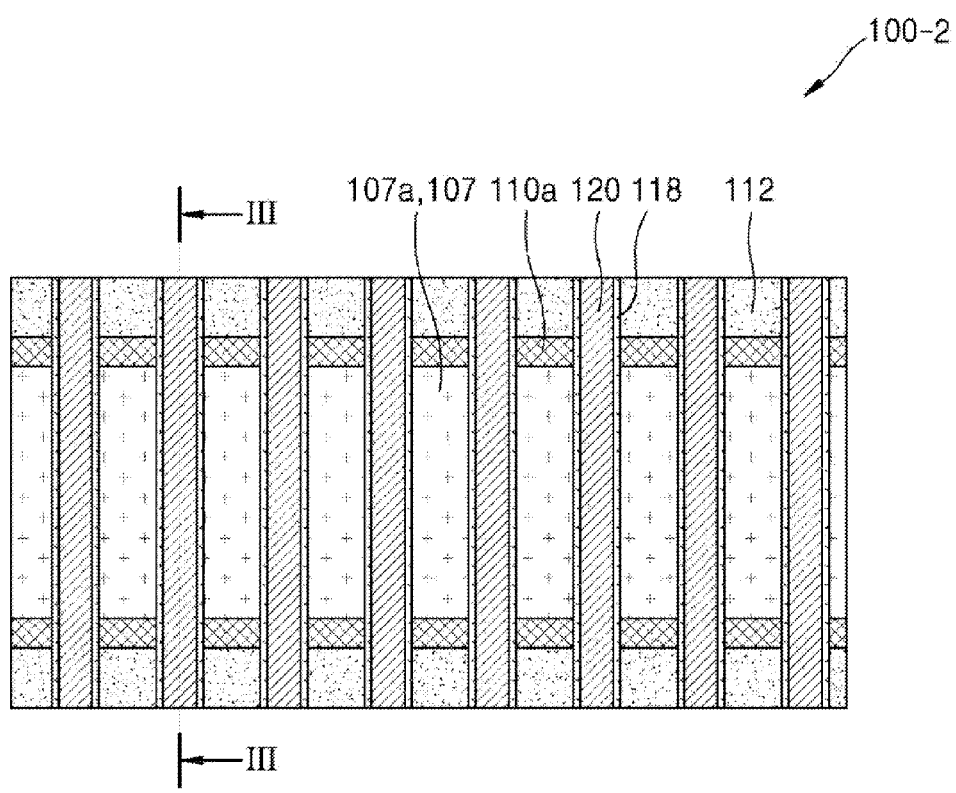
FIG. 11 is a plan view illustrating a power semiconductor device taken along line II-II of FIG. 10.
Figure 12:
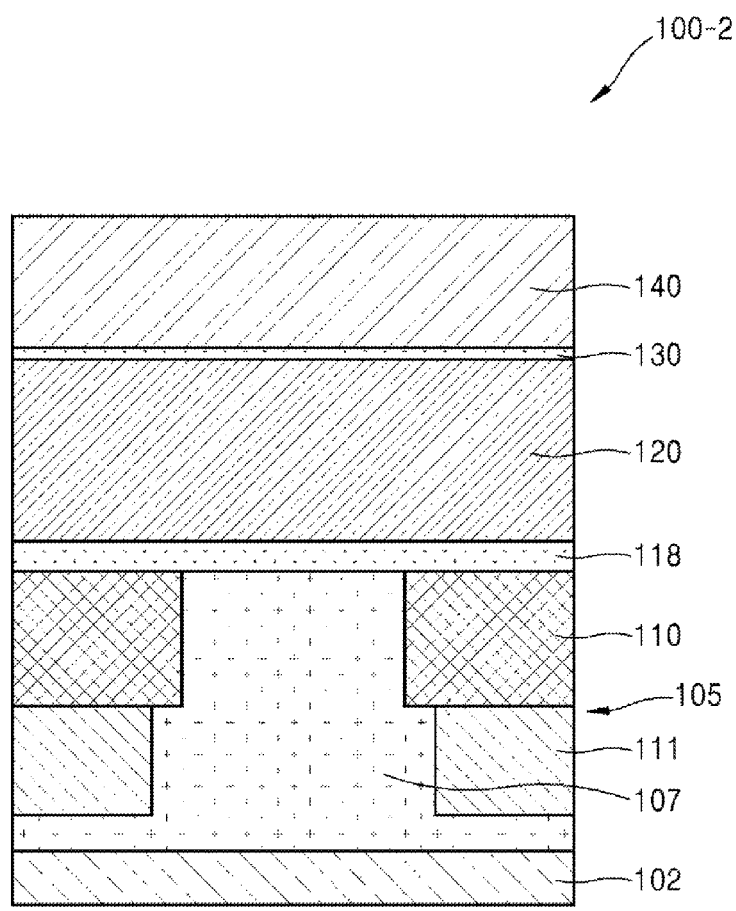
FIG. 12 is a cross-sectional view illustrating a power semiconductor device taken along line III-III of FIG. 11.

FIG. 10 is a schematic perspective view illustrating a power semiconductor device 100-2 according to an embodiment of the present disclosure, FIG. 11 is a plan view illustrating the power semiconductor device 100-2 taken along line II-II of FIG. 10, and FIG. 12 is a cross-sectional view illustrating the power semiconductor device 100-2 taken along line III-III of FIG. 11.

Referring to FIGS. 10 to 12, the power semiconductor device 100-2 may at least include the semiconductor layer 105, the gate insulating layer 118, and the gate electrode layer 120. For example, the power semiconductor device 100-2 may have a power MOSFET structure.

The semiconductor layer 105 may refer to one semiconductor material layer or a plurality of semiconductor material layers, for example, may refer to one epitaxial layer or a plurality of epitaxial layers. In addition, the semiconductor layer 105 may refer to one or multiple epitaxial layers on a semiconductor substrate.

For example, the semiconductor layer 105 may be formed of silicon carbide (SiC). In more detail, the semiconductor layer 105 may include at least one epitaxial layer of silicon carbide.

Silicon carbide (SiC) may have a bandgap wider than silicon, thus maintaining stability even at a high temperature compared to silicon. In addition, because a breakdown electric field of the silicon carbide is higher than that of the silicon, the silicon carbide may stably operate even at a high temperature. Accordingly, the power semiconductor device 100-2 including the semiconductor layer 105 formed of silicon carbide may have a high breakdown voltage compared to the case of using silicon and may provide an excellent heat release characteristic and a stable operating characteristic at a high temperature.

In more detail, the semiconductor layer 105 may include the drift region 107. The drift region 107 may have the first conductivity type and may be formed by implanting impurities of the first conductivity type into a part of the semiconductor layer 105. For example, the drift region 107 may be formed by doping impurities of the first conductivity type in an epitaxial layer of silicon carbide.

The well region 110 may be formed in the semiconductor layer 105 to be in contact with the drift region 107 and may have the second conductivity type. For example, the well region 110 may be formed by doping impurities of the second conductivity type opposite to the first conductivity type in the drift region 107.

For example, the well region 110 may be formed to surround at least a part of the drift region 107. As such, the drift region 107 may include the vertical portion 107a, at least a part of which is surrounded by the well region 110. In an operation of the power semiconductor device 100-2, the vertical portion 107a may provide a vertical movement path of charges.

The well region 110 is illustrated in FIG. 10 as including two regions spaced from each other and the vertical portion 107a interposed therebetween, but the well region 110 may be variously changed or modified. For example, the vertical portion 107a may have a shape whose side surface is surrounded by the well region 110 once.

A pillar region 111 may be formed in the semiconductor layer 105 under the well region 110 so as to be in contact with the drift region 107. As such, a super junction with the drift region 107 may be formed. For example, the pillar region 111 may be disposed under the well region 110 to be in contact with the well region 110, and opposite side surfaces of the pillar region 111 may be disposed to be in contact with the drift region 107. The pillar region 111 may also be referred to as a field reduction region or a deep well region.

The pillar region 111 may have a conductivity type different from that of the drift region 107 and may be formed in the semiconductor layer 105 so as to form the super junction with the drift region 107. For example, the pillar region 111 may have the second conductivity type that is opposite to that of the drift region 107 and is the same as that of the well region 110. For example, a doping concentration of second conductivity-type impurities of the pillar region 111 may be the same as or lower than a doping concentration of second conductivity-type impurities of the well region 110.

In some embodiments, the pillar region 111 may be formed to have a width narrower than a width of the well region 110 on the basis of one direction. One direction may refer to a direction of line III-III of FIG. 11. In addition, opposite ends of the pillar region 111 may be disposed to be inwardly shifted from opposite ends of the well region 110 on the basis of one direction.

As such, under the well region 110, the pillar region 111 may be formed to inwardly go back from opposite ends of the well region 110 in a state of being in contact with the well region 110. For example, when the pillar region 111 is formed in two regions spaced from each other like the well region 110, a separation distance between two pillar regions 111 may be greater than a separation distance between two well regions 110.

In some embodiments, a side surface and a lower surface of the pillar region 111 may be in contact with the drift region 107. For example, a plurality of pillar regions 111 and a plurality of drift regions 107 may be alternately disposed such that side surfaces of the pillar region 111 and the drift region 107 are in contact with each other, and thus, a super junction structure may be formed. In addition, a plurality of pillar regions 111 and a plurality of drift regions 107 may be alternately disposed under one well region 110.

The source region 112 may be formed in the well region 110 and may have the first conductivity type. For example, the source region 112 may be formed by doping impurities of the first conductivity type in the well region 110. The concentration of the first conductivity-type impurities doped in the source region 112 may be higher than that doped in the drift region 107.

The channel region 110a may be formed in the semiconductor layer 105 between the drift region 107 and the source region 112. For example, the channel region 110a may have the second conductivity type, and an inversion channel may be formed therein along one direction in an operation of the power semiconductor device 100-2.

Because the channel region 110a has a doping type opposite to that of the source region 112 and the drift region 107, the channel region 110a may form a diode junction with the source region 112 and the drift region 107. Accordingly, the channel region 110a may not permit charges to move in a normal situation; however, when an operating voltage is applied to the gate electrode layer 120, an inversion channel may be formed therein such that the movement of charges is permitted.

In some embodiments, the channel region 110a may be a part of the well region 110. In this case, the channel region 110a may be integrally formed to be continuously connected with the well region 110. A doping concentration of the second conductivity-type impurities of the channel region 110*a* may be the same as that of the remaining portion of the well region 110 or may be different therefrom for the adjustment of a threshold voltage.

In some embodiments, the well region 110, the pillar region 111, the channel region 110*a*, and the source region 112 may be formed to be symmetrical with respect to the vertical portion 107*a* of the drift region 107. For example, the well region 110, the pillar region 111, the channel region 110*a*, and the source region 112 may be formed at opposite ends of the vertical portion 107*a* of the drift region 107, or each of the well region 110, the pillar region 111, the channel region 110*a*, and the source region 112 may include a first part and a second part formed to be symmetrical with respect to the vertical portion 107*a* of the drift region 107. In each of the well region 110, the pillar region 111, the channel region 110*a*, and the source region 112, the first part and the second part may be separated from each other or may be connected to each other.

In addition, the drain region 102 may be formed in the semiconductor layer 105 under the drift region 107 and may have the first conductivity type. For example, the drain region 102 may be doped with impurities of a high concentration compared to the drift region 107.

In some embodiments, the drain region 102 may be implemented with a substrate of silicon carbide having the first conductivity type. In this case, the drain region 102 may be understood as a part of the semiconductor layer 105 or may be understood as a substrate independent of the semiconductor layer 105.

At least one trench 116 may be formed to be recessed into the semiconductor layer 105 from a surface of the semiconductor layer 105 as much as a given depth. For example, the at least one trench 116 may have a predetermined depth from the surface (e.g., an upper surface) of the semiconductor layer 105. The trench 116 may extend in one direction within the semiconductor layer 105. One direction may refer to a length direction, not a depth direction of the trench 116, and may refer to a direction of line III-III of FIG. 11.

The gate insulating layer 118 may be formed at least on an inner wall of the trench 116. For example, the gate insulating layer 118 may be formed on an inner surface of the trench 116 and on the semiconductor layer 105 outside the trench 116. A thickness of the gate insulating layer 118 may be uniform, or a part of the gate insulating layer 118 formed on the bottom surface of the trench 116 may be thicker than a part of the gate insulating layer 118 formed on a side wall of the trench 116 such that an electric field decreases at a bottom part of the trench 116.

For example, the gate insulating layer 118 may include an insulating material such as silicon oxide, silicon carbide oxide, silicon nitride, hafnium oxide, zirconium oxide, or aluminum oxide, or may include a stacked structure thereof.

At least one gate electrode layer 120 may be formed on the gate insulating layer 118 so as to be disposed in the trench 116. For example, the gate electrode layer 120 may include an appropriate conductive material such as polysilicon, metal, metal nitride, or metal silicide, or may include a stacked structure thereof.

The drift region 107 may be formed in the semiconductor layer 105 on one side of the gate electrode layer 120. For example, the vertical portion 107*a* of the drift region 107 may vertically extend in the semiconductor layer 105 of one side of the gate electrode layer 120. The channel region 110*a* may be formed in the semiconductor layer 105 of one side of the gate electrode layer 120 between the vertical portion 107*a* of the drift region 107 and the source region 112. Accordingly, the semiconductor layer 105 of the one side of the gate electrode layer 120 may include a structure in which the source region 112, the channel region 110*a*, and the vertical portion 107*a* of the drift region 107 are connected along one direction.

In some embodiments, the drift region 107 may be formed in the semiconductor layer 105 on opposite sides of the gate electrode layer 120. For example, the drift region 107 may include the vertical portions 107*a* that vertically extend in the semiconductor layer 105 of opposite sides of the gate electrode layer 120. The channel region 110*a* may be formed in the semiconductor layer 105 of opposite sides of the gate electrode layer 120 between the vertical portions 107*a* of the drift region 107 and the source region 112.

The above structure of the channel region 110*a* may be called a "lateral channel structure" in that the channel region 110*a* is formed along a side wall of the gate electrode layer 120.

The well region 110 may be formed to be deeper than the gate electrode layer 120, so as to surround the bottom surface of the gate electrode layer 120 at one end part of the gate electrode layer 120. In addition, the well region 110 may be formed to be deeper than the gate electrode layer 120, so as to surround the bottom surface of the gate electrode layer 120 at opposite end parts of the gate electrode layer 120. As such, opposite end parts of the gate electrode layer 120 around the source region 112 may be surrounded by the well region 110.

In some embodiments, the gate insulating layer 118 and the gate electrode layer 120 may be formed in the trench 116, and in addition, may be formed to further extend to the outside of the trench 116.

In some embodiments, one trench 116 or a plurality of trenches 116 may be provided in the semiconductor layer 105. The number of trenches 116 may be appropriately selected without limiting the scope of the embodiment.

For example, the plurality of trenches 116 may be formed in the semiconductor layer 105 in parallel along one direction. As the trenches 116 extend in one direction and are spaced from each other in a direction perpendicular to the one direction, the trenches 116 may be arranged in parallel.

In this case, a plurality of gate electrode layers 120 may be formed on the gate insulating layer 118 so as to fill the inside of the trenches 116. As such, the gate electrode layers 120 may be formed in the semiconductor layer 105 in a trench type and may be arranged to extend in parallel in the one direction like the trenches 116.

In addition, each of the well region 110 and the source region 112 may extend across the gate electrode layers 120. The vertical portions 107*a* of the drift region 107 may be arranged in the semiconductor layer 105 between the gate electrode layers 120. The channel region 110*a* may be formed in the semiconductor layer 105 between the source region 112 and the vertical portions 107*a* of the drift region 107 on one side or opposite sides of each of the gate electrode layers 120.

The interlayer insulating layer 130 may be formed on the gate electrode layer 120. For example, the interlayer insulating layer 130 may include an appropriate insulating material such as oxide or nitride, or may include a stacked structure thereof.

The source electrode layer 140 may be formed on the interlayer insulating layer 130 and may be connected with the source region 112. For example, the source electrode layer 140 may be formed of an appropriate conductive material, metal, etc.

In the power semiconductor device 100-2 described above, the first conductivity type and the second conductivity type may be opposite to each other, and each of the first conductivity type and the second conductivity type may be one of n-type and p-type. For example, when the first conductivity type is n-type, the second conductivity type is p-type, and vice versa.

In more detail, when the power semiconductor device 100-2 is an N-type MOSFET, the drift region 107 may be an N-region, the source region 112 and the drain region 102 may be N+ regions, and the well region 110, the pillar region 111, and the channel region 110a may be P− regions.

In an operation of the power semiconductor device 100-2, a current may generally flow in a vertical direction from the drain region 102 along the vertical portions 107a of the drift region 107, and may then flow through the channel region 110a to the source region 112 along the side surfaces of the gate electrode layers 120.

In the power semiconductor device 100-2 described above, the gate electrode layers 120 in the trenches 116 may be densely arranged in parallel in a stripe type or a line type, and the channel regions 110a may be disposed on the side surfaces of the gate electrode layers 120. As such, a channel density may increase.

Also, in the power semiconductor device 100-2 described above, the well (110) structure may alleviate the concentration of an electric field on the bottom surface of the trench 116, that is, at a lower part of the gate electrode layer 120. As such, a margin of an electric field across the gate insulating layer 118 of the power semiconductor device 100-2 may increase, and thus, the reliability of operation of the power semiconductor device 100-2 may be improved. In addition, it is possible to reduce a junction resistance of the vertical portion 107a of the drift region 107 by decreasing an electric field of the bottom surface of the trench 116 and decreasing an electric field across the gate insulating layer 118.

Meanwhile, because the power semiconductor device 100-2 is used for high-power switching, the power semiconductor device 100-2 requires a high withstand voltage characteristic. When a high voltage is applied to the drain region 102, a depletion region may be expanded from the semiconductor layer 105 adjacent to the drain region 102 such that a voltage barrier of a channel is lowered. This phenomenon is called "drain induced barrier lowering (DIBL)".

The DIBL may cause an abnormal turn-on of the channel region 110a, and in addition, may cause a punch through phenomenon that a depletion region from a drain side reaches a source side as it expands.

However, the power semiconductor device 100-2 described above may secure an appropriate high withstand voltage characteristic by suppressing an abnormal current flow and a punch through phenomenon due to the DIBL by using the pillar region 111 forming the super junction with the drift region 107.

The high withstand voltage characteristic may be further improved by adjusting a charge amount of the pillar region 111 and a charge amount of the drift region 107.

Figure 23:
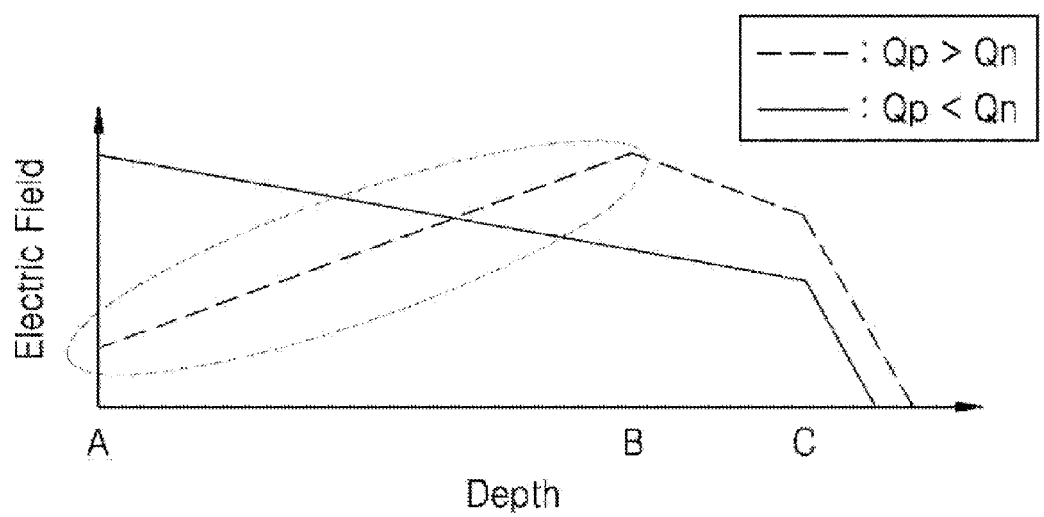
FIG. 23 is a graph illustrating a change of an electric field according to a depth of a power semiconductor device according to an embodiment of the present disclosure.

FIG. 23 is a graph illustrating a change of an electric field according to a depth of the power semiconductor device 100-2.

Referring to FIG. 23, when a charge amount Qp of the pillar region 111 is greater than a charge amount Qn of the drift region 107, a breakdown voltage may increase by allowing a maximum electric field to be formed in the drift region 107 on the same line as the bottom surface of the pillar region 111 in an operation of the power semiconductor device 100-2. A slope of the intensity of an electric field between location A and location B in FIG. 23 may be controlled by adjusting the charge amount Qp of the pillar region 111.

For example, the charge amount Qp of the pillar region 111 may become greater than the charge amount Qn of the drift region 107 by making a doping concentration of the second conductivity-type impurities of the pillar region 111 higher than a doping concentration of the first conductivity-type impurities of the drift region 107. As such, the high withstand voltage characteristic of the power semiconductor device 100-2 may be improved.

Figure 13:
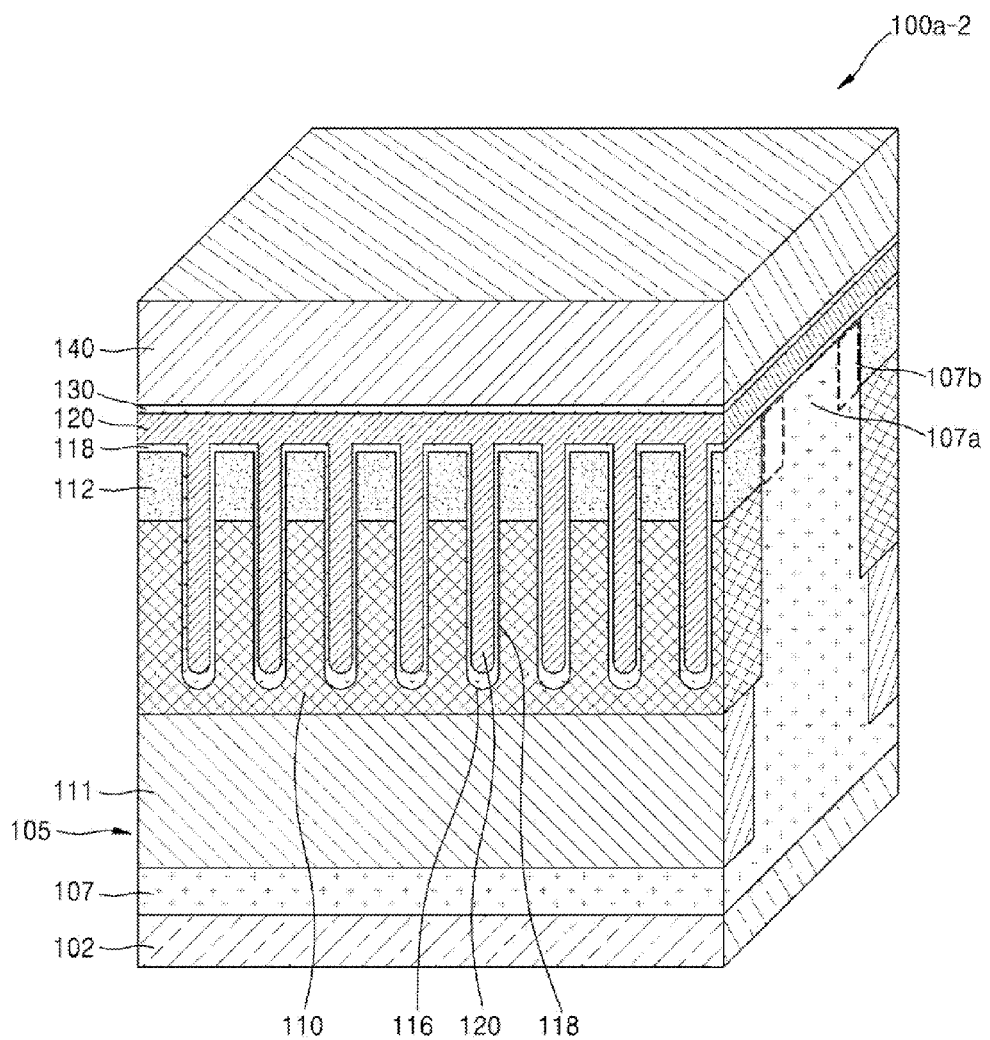
FIG. 13 is a perspective view illustrating a power semiconductor device according to another embodiment of the present disclosure.

FIG. 13 is a perspective view illustrating a power semiconductor device 100a-2 according to another embodiment of the present disclosure.

The power semiconductor device 100a-2 according to the embodiment may be implemented by using or partially modifying the power semiconductor device 100-2 of FIGS. 10 to 12, and thus, additional description will be omitted to avoid redundancy.

Referring to FIG. 13, in the power semiconductor device 100a-2, a channel region 107b may be formed in the semiconductor layer 105 between the drift region 107 and the source region 112. For example, the channel region 107b may have the first conductivity type, and an accumulation channel may be formed therein in an operation of the power semiconductor device 100a-2.

For example, the channel region 107b may be formed in the semiconductor layer 105 between the source region 112 and the vertical portion 107a of the drift region 107. The channel region 107b may have the same doping type as the source region 112 and the drift region 107.

In this case, the source region 112, the channel region 107b, and the drift region 107 may be normally electrically connected. However, in the structure of the semiconductor layer 105 of silicon carbide, a potential barrier is formed while a band of the channel region 107b is upwardly bent due to the influence of a negative charge generated by the formation of a carbon cluster in the gate insulating layer 118. As such, there may be formed the accumulation channel that permits a charge or current flow in the channel region 107b only when an operating voltage is applied to the gate electrode layer 120.

Accordingly, a threshold voltage to be applied to the gate electrode layer 120 to form the accumulation channel in the channel region 107b may be considerably lower than a threshold voltage to be applied to the gate electrode layer 120 to form the inversion channel of the channel region 110a of FIGS. 10 to 12.

In some embodiments, the channel region 107b may be a part of the drift region 107. In more detail, the channel region 107b may be a part of the vertical portions 107a of the drift region 107. For example, the channel region 107b may be integrally formed with the drift region 107. In this case, the drift region 107 may be connected with the source region 112 through the channel region 107b. That is, at a channel region (107b) part, the drift region 107 and the source region 112 may be in contact with each other.

A doping concentration of the first conductivity-type impurities of the channel region 107b may be the same as that of the remaining portion of the drift region 107 or may be different therefrom for the adjustment of a threshold voltage.

As a modified example of the embodiment, the well region 110 may be formed to protrude toward the vertical portion 107a of the drift region 107 father than a part of the source region 112, and the channel region 107b may be formed in the semiconductor layer 105 on the protruding portion of the well region 110.

In addition, the well region 110 may further include a tap portion extending toward the gate electrode layer 120 at an end part of the protruding portion. The channel region 107b may be formed on the protruding portion and the tap portion of the well region 110 in a bent shape.

Additionally, the vertical portion 107a of the drift region 107 may further extend to between a lower part of the source region 112 and the well region 110. In this case, the channel region 107b may be formed to further extend to between the lower part of the source region 112 and the well region 110.

The above structures may allow the channel region 107b to be more restricted between the gate electrode layer 120 and the well region 110.

The power semiconductor device 100a-2 may include the advantages of the power semiconductor device 100-2 of FIGS. 10 to 12, and additionally, may make a threshold voltage low.

Figure 14:
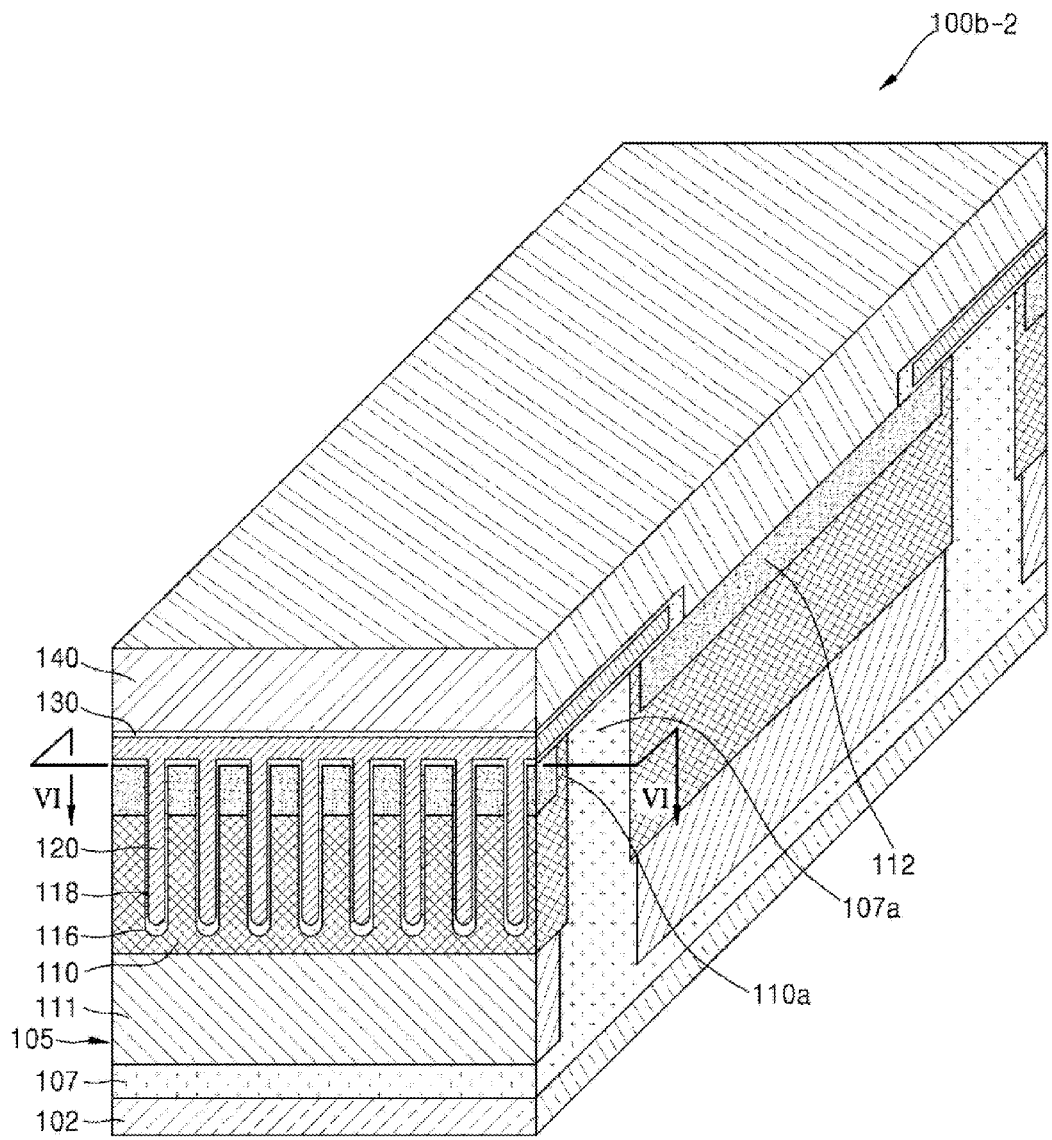
FIG. 14 is a schematic perspective view illustrating a power semiconductor device according to another embodiment of the present disclosure.
Figure 15:
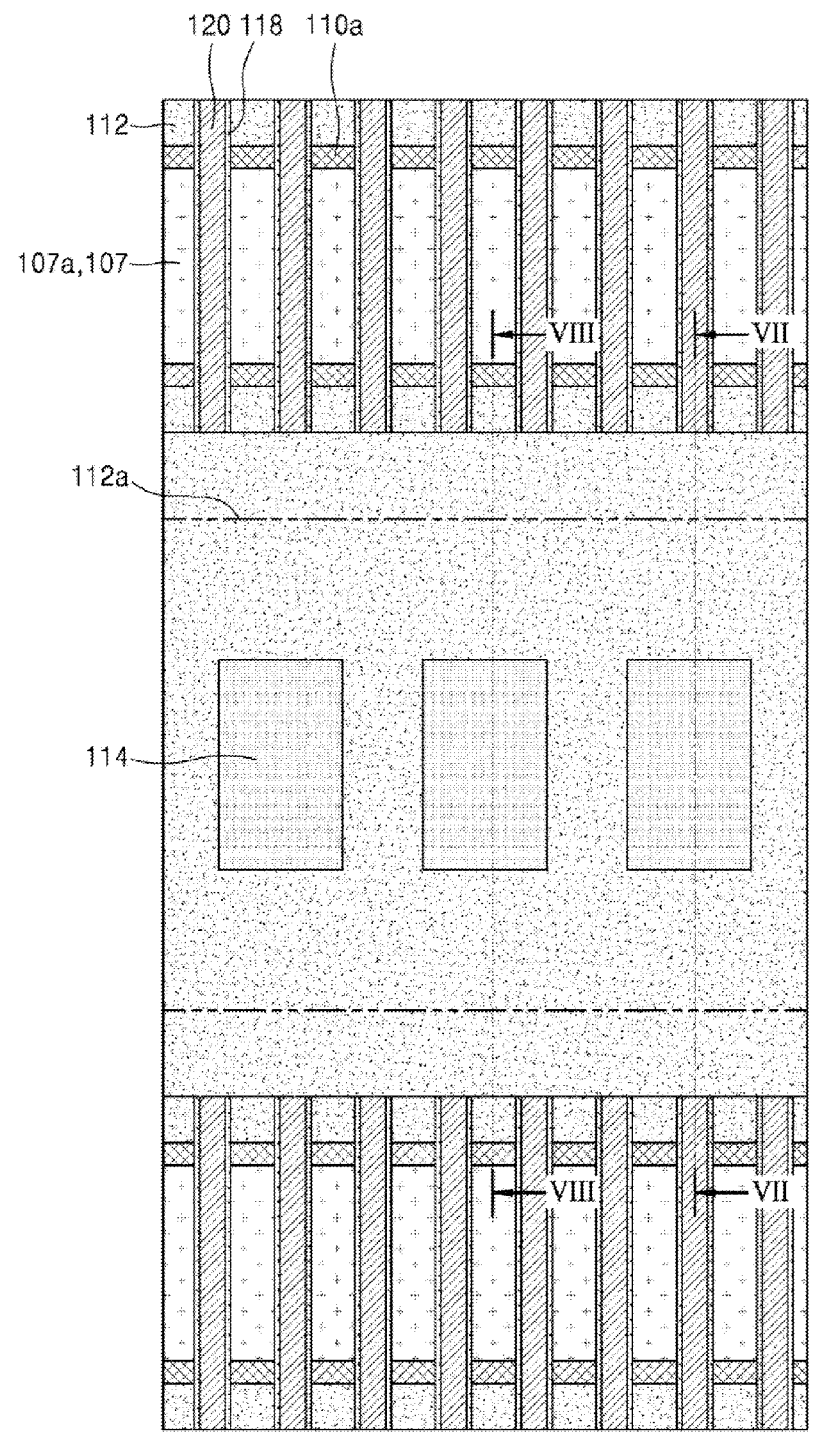
FIG. 15 is a plan view illustrating a power semiconductor device taken along line VI-VI of FIG. 14.
Figure 16:
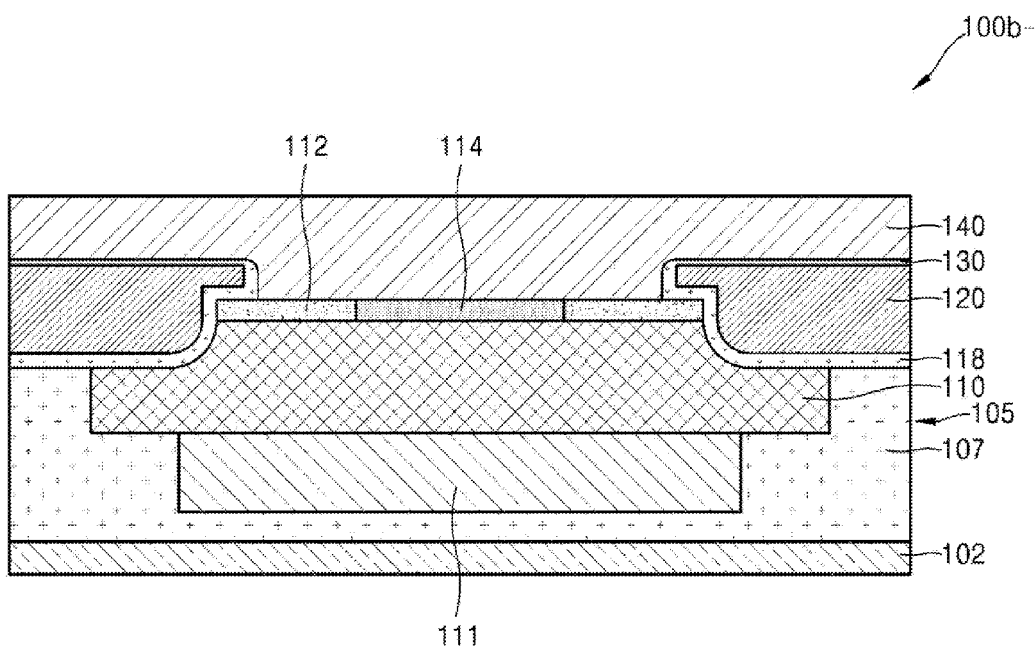
FIG. 16 is a cross-sectional view illustrating a power semiconductor device taken along line VII-VII of FIG. 15.
Figure 17:
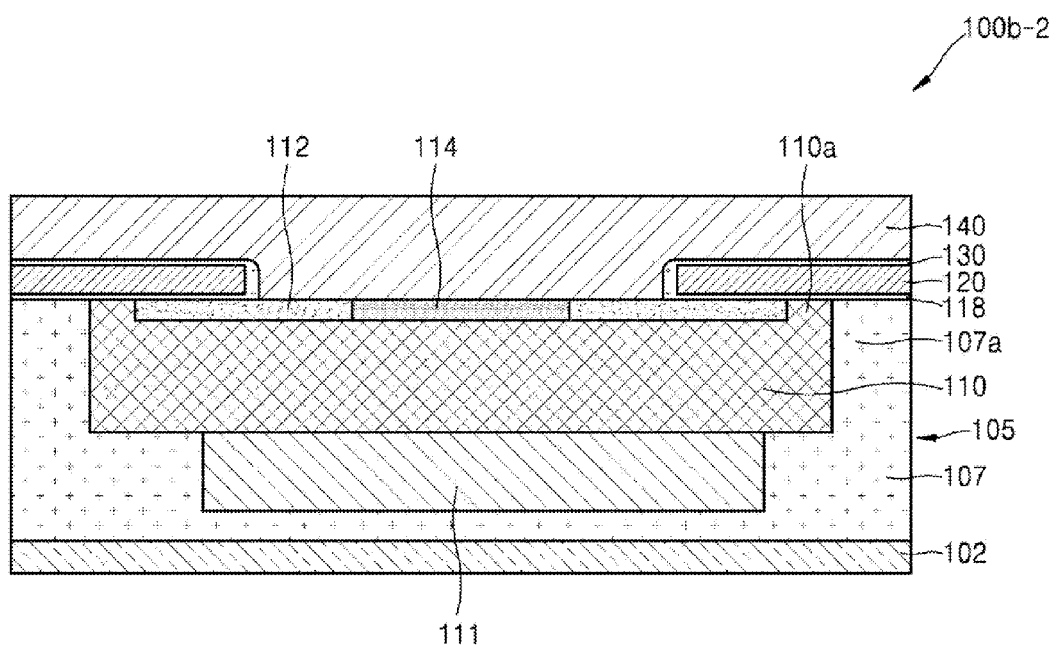
FIG. 17 is a cross-sectional view illustrating a power semiconductor device taken along line VIII-VIII of FIG. 15.

FIG. 14 is a schematic perspective view illustrating a power semiconductor device 100b-2 according to another embodiment of the present disclosure, FIG. 15 is a plan view illustrating the power semiconductor device 100b-2 taken along line VI-VI of FIG. 14, FIG. 16 is a cross-sectional view illustrating the power semiconductor device 100b-2 taken along line VII-VII of FIG. 15, and FIG. 17 is a cross-sectional view illustrating the power semiconductor device 100b-2 taken along line VIII-VIII of FIG. 15.

The power semiconductor device 100b-2 according to the embodiment may be implemented by using or partially modifying the power semiconductor device 100-2 of FIGS. 10 to 12, and thus, additional description will be omitted to avoid redundancy.

Referring to FIGS. 14 to 17, in the power semiconductor device 100b-2, the source region 112 may include the source contact region 112a outside at least one ends of the gate electrode layers 120. For example, the source contact region 112a that is a part of the source region 112 may refer to the part with which the source electrode layer 140 is connected.

The well contact region 114 may be formed in the source contact region 112a. For example, the well contact region 114 may extend from the well region 110 to penetrate the source region 112 and may have the second conductivity type. One well contact region 114 or a plurality of source contact regions 114 may be formed in the source contact region 112a.

For example, the well contact region 114 may be doped with second conductivity-type impurities of a higher concentration than the well region 110 to reduce a contact resistance when connected with the source electrode layer 140.

The source electrode layer 140 may be connected in common with the source contact region 112a and the well contact region 114.

An example is illustrated in FIGS. 14 to 17 as the source contact region 112a and the well contact region 114 are formed in the source region 112 of one side of the vertical portions 107a of the drift region 107. However, when each of the source region 112 and the well region 110 is divided into a plurality of regions, each of the source contact region 112a and the well contact region 114 may be formed in each of the corresponding regions.

In some embodiments, the plurality of trenches 116 may be arranged to be spaced from each other in line along one direction. As such, the gate electrode layers 120 may also be arranged to be spaced from each other in line in the one direction, along the trenches 116. In this case, the well region 110, the source region 112, the source contact region 112a, and the well contact region 114 may be formed in the semiconductor layer 105 between the trenches 116 arranged to be spaced from each other in line along the one direction.

For example, the power semiconductor device 100b-2 may be formed by arranging the structure of the power semiconductor device 100-2 of FIGS. 10 to 12 in plurality along one direction and by disposing the well region 110, the source region 112, the source contact region 112a, and the well contact region 114 therebetween.

For example, when the power semiconductor device 100-2 is an N-type MOSFET, the source contact region 112a may be an N+ region, and the well contact region 114 may be a P+ region.

According to the power semiconductor device 100b-2, the source contact region 112a and the well contact region 114 may be disposed outside the gate electrode layers 120, not between the gate electrode layers 120, and thus, the gate electrode layers 120 may be arranged more densely. As such, a channel density of the power semiconductor device 100a-2 may markedly increase.

Figure 18:
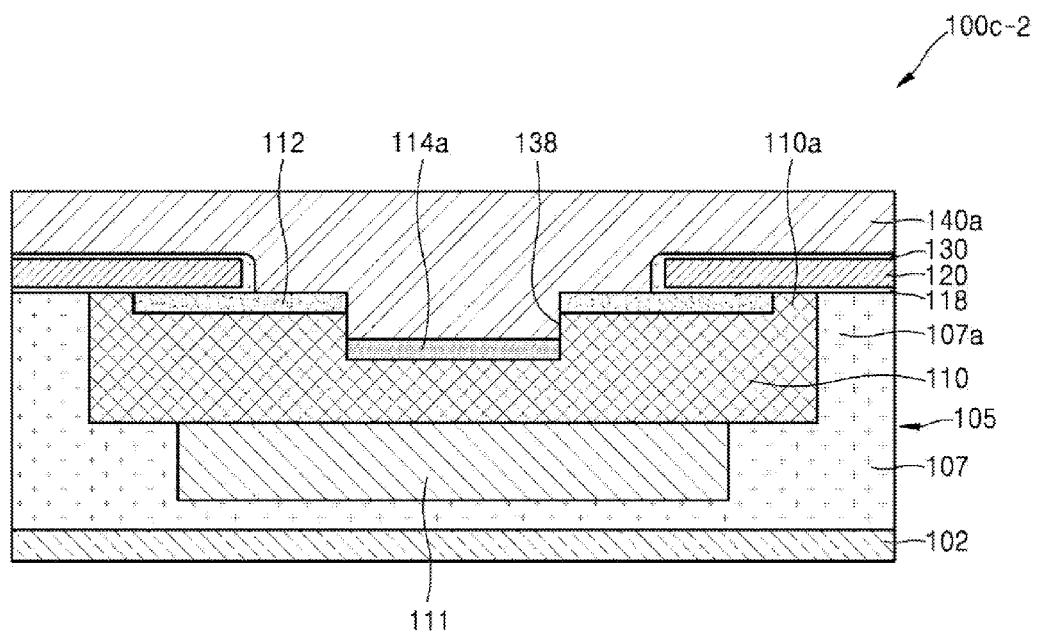
FIGS. 18 and 19 are cross-sectional views illustrating power semiconductor devices according to other embodiments of the present disclosure.
Figure 19:
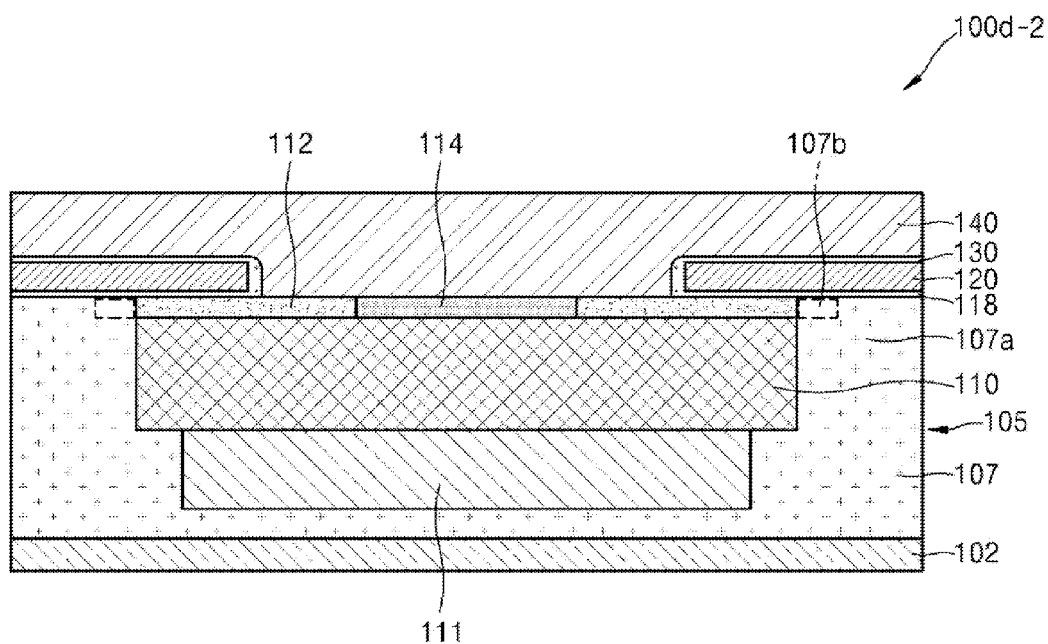

FIGS. 18 and 19 are cross-sectional views illustrating power semiconductor devices 100c-2 and 100d-2 according to other embodiments of the present disclosure. Each of the power semiconductor devices 100c-2 100d-2 may be implemented by modifying a partial configuration of the power semiconductor device 100b-2 of FIGS. 14 to 17, and thus, additional description will be omitted to avoid redundancy.

Referring to FIG. 18, the power semiconductor device 100c-2 may include at least one groove 138, which is formed to penetrate the source region 112 and to be recessed into the well region 110, in the source contact region 112a of the source region 112. A well contact region 114a may be formed on at least a bottom surface of the groove 138 so as to be in contact with the well region 110.

A source electrode layer 140a may be formed to fill the groove 138, and thus, may be connected with the well contact region 114a, the well region 110, and/or the source region 112. The above structure may widen the contact area between the source electrode layer 140a and the well region 110 and the contact area between the source electrode layer 140a and the source region 112 such that contact resistances therebetween decrease.

In some embodiments, the well contact region 114a may be formed on the whole surface of the well region 110 exposed by the groove 138. Accordingly, the well contact region 114a may be formed on the well region 110 exposed from a bottom surface and a side wall of the groove 138. The above structure of the well contact region 114a may allow the contact resistance between the source electrode layer 140a and the well region 110 to further decrease.

Referring to FIG. 19, the power semiconductor device 100d-2 may include the channel region 107b forming the accumulation channel, instead of the channel region 110a of the power semiconductor device 100b-2 of FIGS. 14 to 17. The structure of the power semiconductor device 100d-2 including the channel region 107b may refer to the description given with reference to FIG. 13.

Accordingly, the power semiconductor device 100d-2 may correspond to a structure in which the power semiconductor device 100a-2 of FIG. 13 is connected in plurality and the well region 110, the source region 112, the source contact region 112a, and the well contact region 114 are disposed therebetween.

Figure 20:
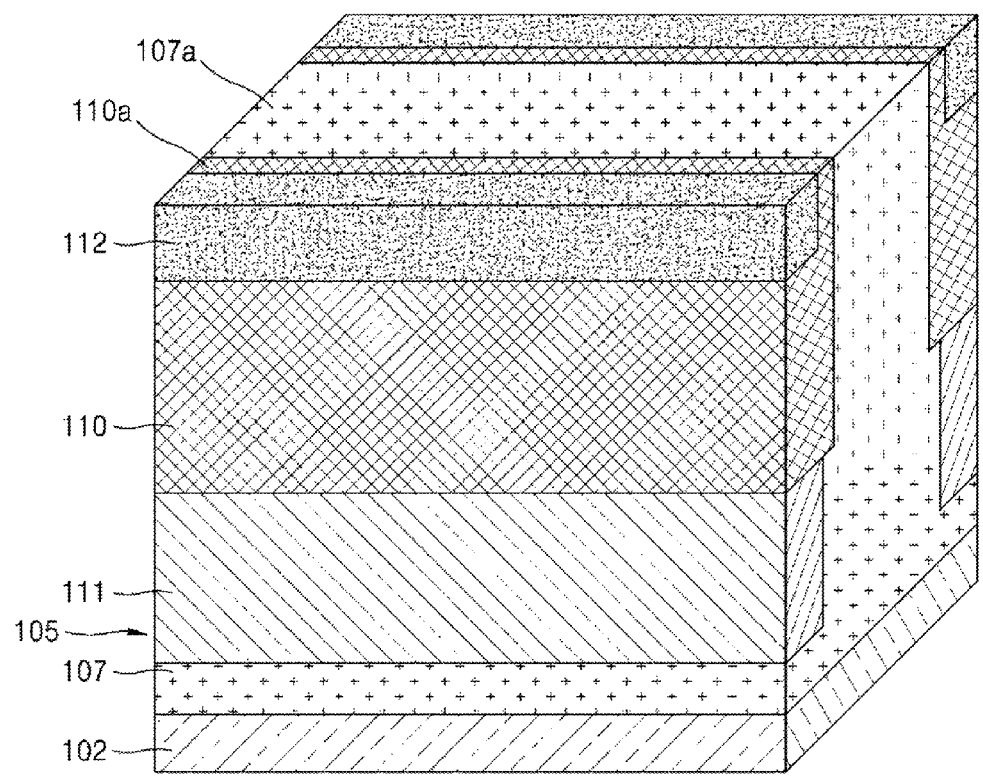
FIGS. 20 to 22 are schematic perspective views illustrating a method of fabricating a power semiconductor device according to an embodiment of the present disclosure.
Figure 21:
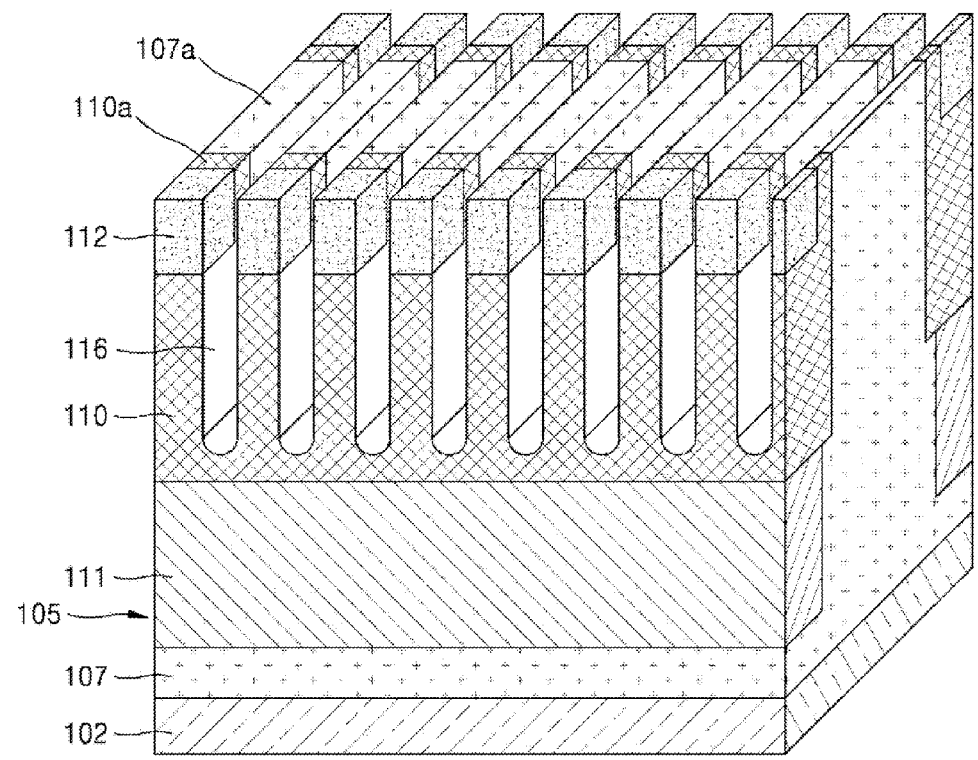
Figure 22:
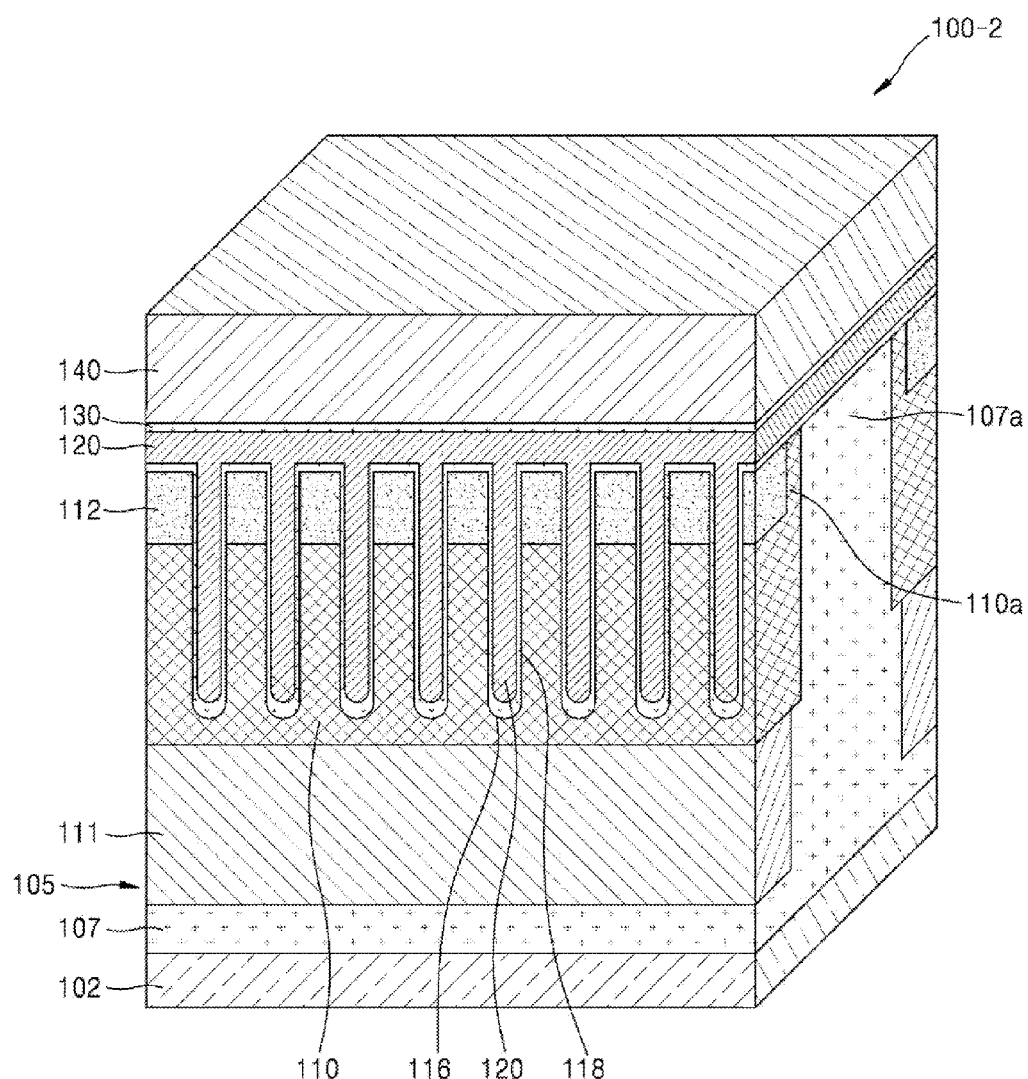

FIGS. 20 to 22 are schematic perspective views illustrating a method of fabricating the power semiconductor device 100-2 according to an embodiment of the present disclosure.

Referring to FIG. 20, the drift region 107 having the first conductivity type may be formed in the semiconductor layer 105 of silicon carbide (SiC). For example, the drift region 107 may be formed on the drain region 102 having the first conductivity type. In some embodiments, the drain region 102 may be implemented with a substrate of the first conductivity type, and the drift region 107 may be formed on the substrate with one or more epitaxial layers.

Next, the well region 110 having the second conductivity type may be formed in the semiconductor layer 105 so as to be in contact with the drift region 107. For example, the forming of the well region 110 may be performed by implanting impurities of the second conductivity type into the semiconductor layer 105. The well region 110 may be formed with a given depth from a surface of the semiconductor layer 105, substantially.

For example, the well region 110 may be formed in the semiconductor layer 105 such that the drift region 107 includes the vertical portion 107a, at least a part of which is surrounded by the well region 110. In more detail, the well region 110 may be formed by doping impurities of a conductivity type opposite to that of the drift region 107 in the drift region 107.

Afterwards, the pillar region 111 having the second conductivity type may be formed in the semiconductor layer 105 under the well region 110 such that the pillar region 111 is in contact with the drift region 107 to form a super junction with the drift region 107. The pillar region 111 may be formed by implanting impurities of the second conductivity type the same as that of the well region 110. The well region 110 and the pillar region 111 may be formed in an arbitrary order.

Then, the source region 112 having the first conductivity type may be formed in the well region 110. For example, source region 112 may be formed by implanting impurities of the first conductivity type into the well region 110. The source region 112 may be formed in the well region 110 with a given depth from the surface of the semiconductor layer 105, substantially.

In addition to the formation of the source region 112, the channel region 110a where an inversion channel is formed along one direction may be formed in the semiconductor layer 105 between the source region 112 and the drift region 107. The channel region 110a may be formed between the source region 112 and the vertical portion 107a of the drift region 107. For example, the channel region 110a may be a part of the well region 110 and may be formed by implanting impurities of the second conductivity type into the semiconductor layer 105.

In a modified example of the embodiment, an order in which the well region 110, the pillar region 111, the source region 112, and the channel region 110a are formed or an impurity doping order may be changed to an arbitrary order.

In the above fabricating method, the impurity implantation or the impurity doping may be performed such that the impurities are mixed when the impurities are implanted into the semiconductor layer 105 or an epitaxial layer is formed. However, an ion implantation method using a mask pattern may be used for implantation of the impurities in a selective region.

Optionally, a heat treatment process for activating or diffusing the impurities may be performed after the ion implantation.

Referring to FIG. 21, at least one trench 116 may be formed to be recessed into the semiconductor layer 105 from the surface of the semiconductor layer 105 as much as a given depth. For example, the at least one trench 116 may have a predetermined depth from the surface (e.g., an upper surface) of the semiconductor layer 105.

For example, the trench 116 may extend across the drift region 107 in one direction and may be formed to be shallower than the well region 110.

In addition, the at least one trench 116 may include a plurality of trenches 116, and the trenches 116 may be simultaneously formed in the semiconductor layer 105 in parallel in one direction, for example. The channel region 110a may be further restricted by the trenches 116.

For example, the trenches 116 may be formed by forming a photo mask by using photo lithography and then etching the semiconductor layer 105 by using the photo mask as an etching protection layer.

Referring to FIG. 22, the gate insulating layer 118 may be formed on the bottoms and inner walls of the trenches 116. For example, the gate insulating layer 118 may be formed by oxidizing the semiconductor layer 105 to form an oxide or by depositing an insulating material such as oxide or nitride on the semiconductor layer 105.

Afterwards, the gate electrode layers 120 may be formed on the gate insulating layer 118 so as to be disposed in the trenches 116. For example, the gate electrode layer 120 may be formed by forming a conductive layer on the gate insulating layer 118 and patterning the conductive layer. The gate electrode layer 120 may be formed by doping impurities in polysilicon or may be formed to include a conductive metal or metal silicide.

A patterning process may be performed by using photo lithography and etching processes. The photo lithography process may include a process of forming a photoresist pattern as a mask layer by using a photo process and a development process, and the etching process may include a process of selectively etching an underlying structure by using the photoresist pattern.

As such, the well region 110 may be disposed to be deeper than the gate electrode layer 120 so as to surround the bottom surface of the gate electrode layer 120 at one end of the gate electrode layer 120, and the channel region 110a may be formed in the semiconductor layer 105 of one side or opposite sides of the gate electrode layer 120 between the drift region 107 and the source region 112.

Afterwards, the interlayer insulating layer 130 may be formed on the gate electrode layer 120.

Afterwards, the source electrode layer 140 may be formed on the interlayer insulating layer 130. For example, the source electrode layer 140 may be formed by forming a conductive layer, for example, a metal layer on the interlayer insulating layer 130 and patterning the conductive layer.

Meanwhile, the power semiconductor device 100a-2 of FIG. 13 may be fabricated by adding some processes to the method of fabricating the power semiconductor device 100-2 described above or changing or modifying the fabricating method. For example, the channel region 107b may be formed with a part of the drift region 107 so as to form the accumulation channel.

The power semiconductor device 100b-2 of FIGS. 14 to 17 may be fabricated by adding some processes to the method of fabricating the power semiconductor device 100-2 described above or changing or modifying the fabricating method.

For example, when the power semiconductor device 100b-2 is fabricated, the forming of the source region 112 may include forming the source contact region 112a connected with the source electrode layer 140 at least outside one end of the gate electrode layer 120. In some embodiments, the source contact region 112a may be a part of the source region 112.

In addition, before the trenches 116 are formed, the well contact region 114 may be formed in the source contact region 112a. For example, the well contact region 114 may be formed by implanting the second conductivity-type impurities of a higher concentration than the well region 110, into a part of the well region 110.

When the power semiconductor device 100b-2 is fabricated, the trenches 116 may be arranged to be spaced from each other in line in one direction. In addition, the well region 110, the channel region 110a, and the source region 112 may be formed in the semiconductor layer 105 between the trenches 116.

The method of fabricating the power semiconductor device 100c-2, which is described with reference to FIG. 18, may further include forming at least one groove 138 in the source region 112 so as to penetrate the source region 112 and to be recessed into the well region 110, forming the well contact region 114 on a bottom surface of the groove 138 so as to be in contact with the well region 110, and forming the source electrode layer 140 so as to be connected with the well contact region 114.

According to the above fabricating method, the power semiconductor device 100-2 using the semiconductor layer 105 of silicon carbide may be economically fabricated by using processes that are applied to a conventional silicon substrate.

Figure 24:
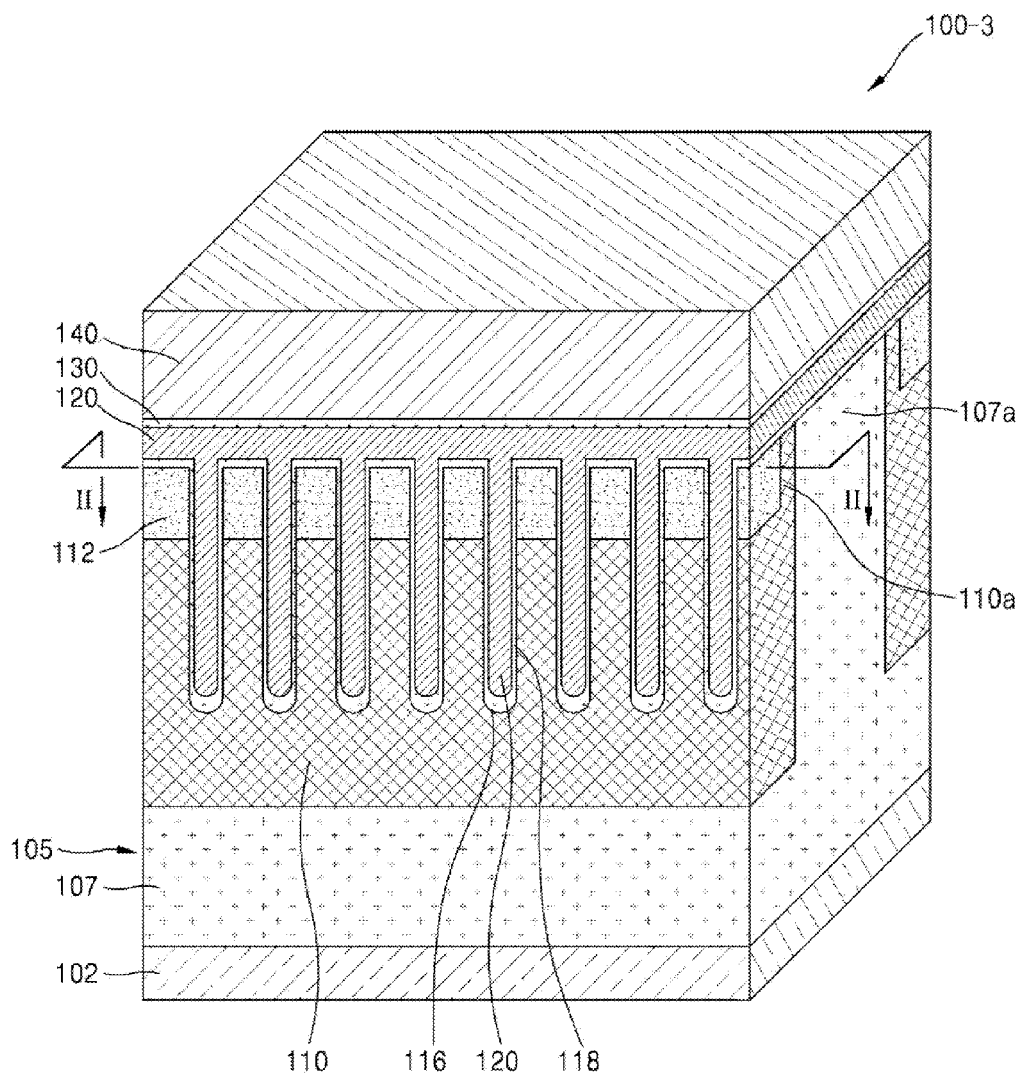
FIG. 24 is a schematic perspective view illustrating a power semiconductor device according to an embodiment of the present disclosure.
Figure 25:
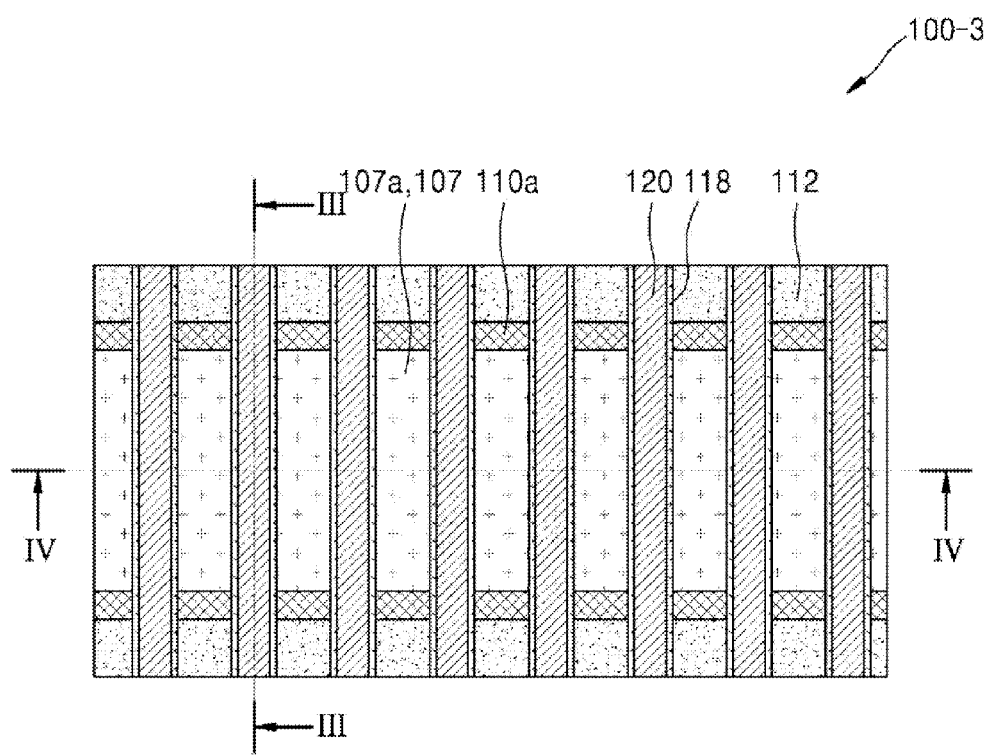
FIG. 25 is a plan view illustrating a power semiconductor device taken along line II-II of FIG. 24.
Figure 26:
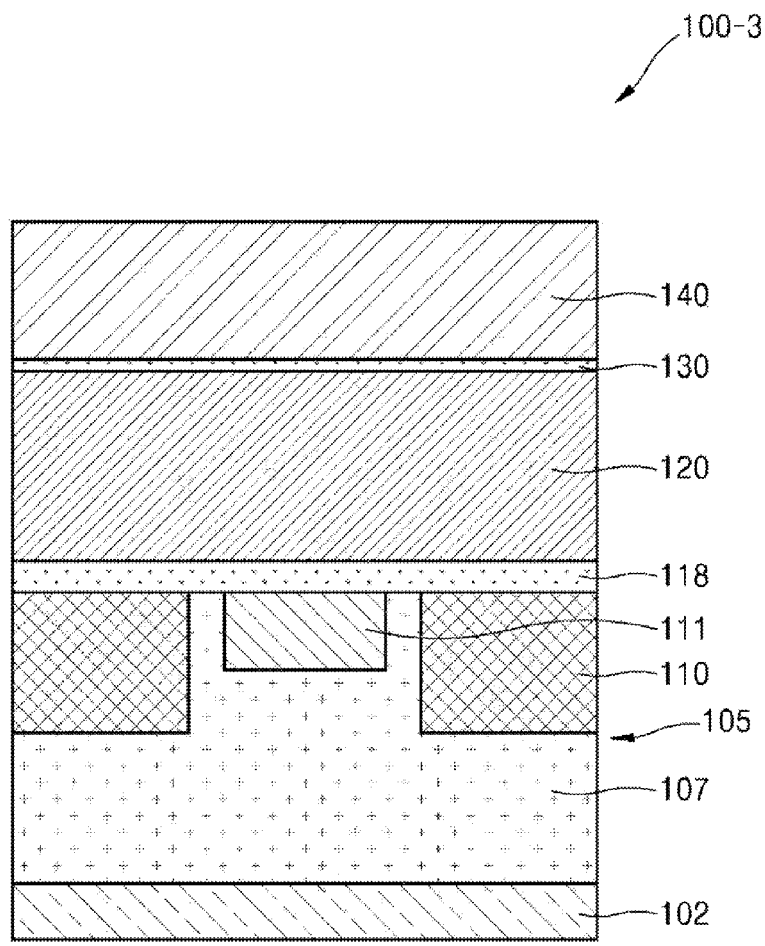
FIG. 26 is a cross-sectional view illustrating a power semiconductor device taken along line III-III of FIG. 25.
Figure 27:
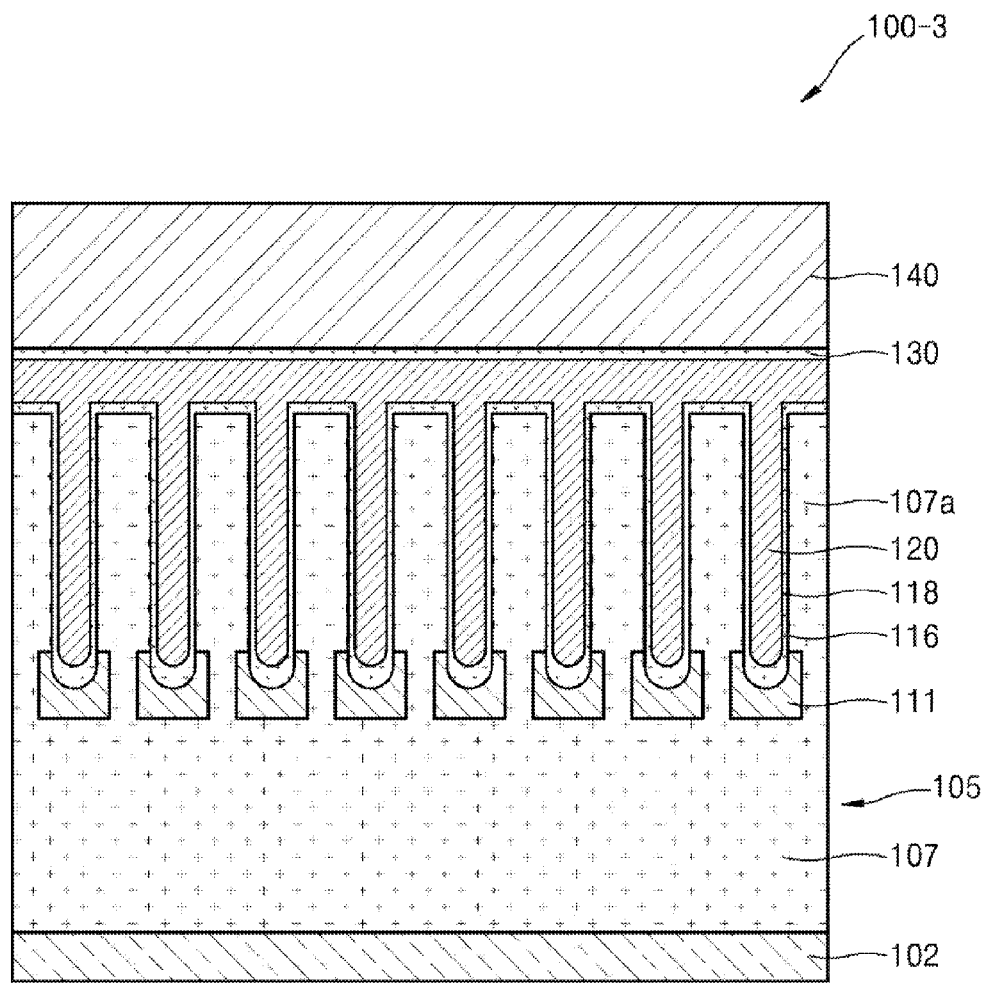
FIG. 27 is a cross-sectional view illustrating a power semiconductor device taken along line VI-VI of FIG. 25.

FIG. 24 is a schematic perspective view illustrating a power semiconductor device 100-3 according to an embodiment of the present disclosure, FIG. 25 is a plan view illustrating the power semiconductor device 100-3 taken along line II-II of FIG. 24, FIG. 26 is a cross-sectional view illustrating the power semiconductor device 100-3 taken along line III-III of FIG. 25, and FIG. 27 is a cross-sectional view illustrating the power semiconductor device 100-3 taken along line VI-VI of FIG. 25.

Referring to FIGS. 24 to 27, the power semiconductor device 100-3 may include the semiconductor layer 105, the gate insulating layer 118, and at least one gate electrode layer 120. For example, the power semiconductor device 100-3 may have a power MOSFET structure.

The semiconductor layer 105 may refer to one semiconductor material layer or a plurality of semiconductor material layers, for example, may refer to one epitaxial layer or a plurality of epitaxial layers. In addition, the semiconductor layer 105 may refer to one or multiple epitaxial layers on a semiconductor substrate.

For example, the semiconductor layer 105 may be formed of silicon carbide (SiC). In more detail, the semiconductor layer 105 may include at least one epitaxial layer of silicon carbide.

Silicon carbide (SiC) may have a bandgap wider than silicon, thus maintaining stability even at a high temperature compared to silicon. In addition, because a breakdown electric field of the silicon carbide is higher than that of the silicon, the silicon carbide may stably operate even at a high temperature. Accordingly, the power semiconductor device 100-3 including the semiconductor layer 105 formed of silicon carbide may have a high breakdown voltage compared to the case of using silicon and may provide an excellent heat release characteristic and a stable operating characteristic at a high temperature.

In more detail, the semiconductor layer 105 may include the drift region 107. The drift region 107 may have the first conductivity type and may be formed by implanting impurities of the first conductivity type into a part of the semiconductor layer 105. For example, the drift region 107 may be formed by doping impurities of the first conductivity type in an epitaxial layer of silicon carbide.

The well region 110 may be formed in the semiconductor layer 105 to be in contact with the drift region 107 and may have the second conductivity type. For example, the well region 110 may be formed by doping impurities of the second conductivity type opposite to the first conductivity type in the drift region 107.

For example, the well region 110 may be formed to surround at least a part of the drift region 107. As such, the drift region 107 may include the vertical portion 107a, at least a part of which is surrounded by the well region 110. In an operation of the power semiconductor device 100-3, the vertical portion 107a may provide a vertical movement path of charges.

The well region 110 is illustrated in FIG. 24 as including two regions spaced from each other and the vertical portion 107a interposed therebetween, but the well region 110 may be variously changed or modified. For example, the vertical portion 107a may have a shape whose side surface is surrounded by the well region 110 once.

A field reduction region 111 may be formed to be spaced from the well region 110 at a given depth of the semiconductor layer 105 and may have the second conductivity type. The field reduction region 111 may be formed by implanting impurities of the second conductivity type, and a doping concentration of the field reduction region 111 may be the same as that of the well region 110 or may be lower than that of the well region 110.

The source region 112 may be formed in the well region 110 and may have the first conductivity type. For example, the source region 112 may be formed by doping impurities of the first conductivity type in the well region 110. The concentration of the first conductivity-type impurities doped in the source region 112 may be higher than that doped in the drift region 107.

The channel region 110a may be formed in the semiconductor layer 105 between the drift region 107 and the source region 112. For example, the channel region 110a may have the second conductivity type, and an inversion channel may be formed therein along one direction in an operation of the power semiconductor device 100-3.

Because the channel region 110a has a doping type opposite to that of the source region 112 and the drift region 107, the channel region 110a may form a diode junction with the source region 112 and the drift region 107. Accordingly, the channel region 110a may not permit charges to move in a normal situation; however, when an operating voltage is applied to the gate electrode layer 120, an inversion channel may be formed therein such that the movement of charges is permitted.

In some embodiments, the channel region 110a may be a part of the well region 110. In this case, the channel region 110a may be integrally formed to be continuously connected with the well region 110. A doping concentration of the second conductivity-type impurities of the channel region 110a may be the same as that of the remaining portion of the well region 110 or may be different therefrom for the adjustment of a threshold voltage.

In some embodiments, the well region 110, the channel region 110a, and the source region 112 may be formed to be symmetrical with respect to the vertical portion 107a of the drift region 107. For example, the well region 110, the channel region 110a, and the source region 112 may be formed at opposite ends of the vertical portion 107a of the drift region 107, or each of the well region 110, the channel region 110a, and the source region 112 may include a first part and a second part formed to be symmetrical with respect to the vertical portion 107a of the drift region 107. In each of the well region 110, the channel region 110a, and the source region 112, the first part and the second part may be separated from each other or may be connected to each other.

In addition, the drain region 102 may be formed in the semiconductor layer 105 under the drift region 107 and may have the first conductivity type. For example, the drain region 102 may be doped with impurities of a high concentration compared to the drift region 107.

In some embodiments, the drain region 102 may be implemented with a substrate of silicon carbide having the first conductivity type. In this case, the drain region 102 may be understood as a part of the semiconductor layer 105 or may be understood as a substrate independent of the semiconductor layer 105.

At least one trench 116 may be formed to be recessed into the semiconductor layer 105 from a surface of the semiconductor layer 105 as much as a given depth. For example, the at least one trench 116 may have a predetermined depth from the surface (e.g., an upper surface) of the semiconductor layer 105. The trench 116 may extend in one direction within the semiconductor layer 105. One direction may refer to a length direction, not a depth direction of the trench 116, and may refer to a direction of line III-III of FIG. 25.

The gate insulating layer 118 may be formed on at least an inner wall of the trench 116. For example, the gate insulating layer 118 may be formed on an inner surface of the trench 116 and on the semiconductor layer 105 outside the trench 116. A thickness of the gate insulating layer 118 may be uniform, or a part of the gate insulating layer 118 formed on the bottom surface of the trench 116 may be thicker than a part of the gate insulating layer 118 formed on a side wall of the trench 116 such that an electric field decreases at a bottom part of the trench 116.

For example, the gate insulating layer 118 may include an insulating material such as silicon oxide, silicon carbide oxide, silicon nitride, hafnium oxide, zirconium oxide, or aluminum oxide, or may include a stacked structure thereof.

At least one gate electrode layer 120 may be formed on the gate insulating layer 118 so as to be disposed in the trench 116. For example, the gate electrode layer 120 may include an appropriate conductive material such as polysilicon, metal, metal nitride, or metal silicide, or may include a stacked structure thereof.

The drift region 107 may be formed in the semiconductor layer 105 on one side of the gate electrode layer 120. For example, the vertical portion 107a of the drift region 107 may vertically extend in the semiconductor layer 105 of one side of the gate electrode layer 120. The channel region 110a may be formed in the semiconductor layer 105 of one side of the gate electrode layer 120 between the vertical portion 107a of the drift region 107 and the source region 112. Accordingly, the semiconductor layer 105 of the one side of the gate electrode layer 120 may include a structure in which the source region 112, the channel region 110a, and the vertical portion 107a of the drift region 107 are connected along one direction.

In some embodiments, the drift region 107 may be formed in the semiconductor layer 105 on opposite sides of the gate electrode layer 120. For example, the drift region 107 may include the vertical portions 107a that vertically extend in the semiconductor layer 105 of opposite sides of the gate electrode layer 120. The channel region 110a may be formed in the semiconductor layer 105 of opposite sides of the gate electrode layer 120 between the vertical portions 107a of the drift region 107 and the source region 112.

The above structure of the channel region 110a may be called a "lateral channel structure" in that the channel region 110a is formed along a side wall of the gate electrode layer 120.

The well region 110 may be formed to be deeper than the gate electrode layer 120, so as to surround the bottom surface of the gate electrode layer 120 at one end part of the gate electrode layer 120. In addition, the well region 110 may be formed to be deeper than the gate electrode layer 120, so as to surround the bottom surface of the gate electrode layer 120 at opposite end parts of the gate electrode layer 120. As such, opposite end parts of the gate electrode layer 120 around the source region 112 may be surrounded by the well region 110.

The field reduction region 111 may be formed to be spaced from the well region 110, in the semiconductor layer 105 under the bottom surface of the gate electrode layer 120. In more detail, the field reduction region 111 may be formed to be in contact with the gate insulating layer 118 under the bottom surface of the gate electrode layer 120 and to surround the bottom surface of the trench 116 or the gate electrode layer 120. The field reduction region 111 may have a floating structure in which an external power is not directly applied thereto.

According to the floating structure, the well region 110 may surround the bottom surface of the gate electrode layer 120 at opposite end parts thereof, and the field reduction region 111 may surround the bottom surface at a central part of the gate electrode layer 120. Accordingly, the structure of the well region 110 and the placement of the field reduction region 111 may further alleviate the concentration of an electric field on the bottom surface of the trench 116, that is, at a lower part of the gate electrode layer 120.

As such, a margin of an electric field across the gate insulating layer 118 of the power semiconductor device 100-3 may increase, and thus, the reliability of operation of the power semiconductor device 100-3 may be improved. In addition, it is possible to reduce a junction resistance of the vertical portion 107a of the drift region 107 by decreasing an electric field of the bottom surface of the trench 116 and decreasing an electric field across the gate insulating layer 118.

In some embodiments, the gate insulating layer 118 and the gate electrode layer 120 may be formed in the trench 116, and in addition, may be formed to further extend to the outside of the trench 116.

In some embodiments, one trench 116 or a plurality of trenches 116 may be provided in the semiconductor layer 105. The number of trenches 116 may be appropriately selected without limiting the scope of the embodiment.

For example, the plurality of trenches 116 may be formed in the semiconductor layer 105 in parallel along one direction. As the trenches 116 extend in one direction and are spaced from each other in a direction perpendicular to the one direction, the trenches 116 may be arranged in parallel.

In this case, a plurality of gate electrode layers 120 may be formed on the gate insulating layer 118 so as to fill the inside of the trenches 116. As such, the gate electrode layers 120 may be formed in the semiconductor layer 105 in a trench type and may be arranged to extend in parallel in the one direction like the trenches 116.

Also, the field reduction regions 111 may be respectively disposed to be in contact with the gate insulating layer 118, under bottom surfaces of the trenches 116 or under bottom surfaces of the gate electrode layers 120. In this case, the field reduction region 111 may collectively refer to a plurality of island regions.

In addition, each of the well region 110 and the source region 112 may extend across the gate electrode layers 120. The vertical portions 107a of the drift region 107 may be arranged in the semiconductor layer 105 between the gate electrode layers 120. The channel region 110a may be formed in the semiconductor layer 105 between the source region 112 and the vertical portions 107a of the drift region 107 on one side or opposite sides of each of the gate electrode layers 120.

The interlayer insulating layer 130 may be formed on the gate electrode layer 120. For example, the interlayer insulating layer 130 may include an appropriate insulating material such as oxide or nitride, or may include a stacked structure thereof.

The source electrode layer 140 may be formed on the interlayer insulating layer 130 and may be connected with the source region 112. For example, the source electrode layer 140 may be formed of an appropriate conductive material, metal, etc.

In the power semiconductor device 100-3 described above, the first conductivity type and the second conductivity type may be opposite to each other, and each of the first conductivity type and the second conductivity type may be one of n-type and p-type. For example, when the first conductivity type is n-type, the second conductivity type is p-type, and vice versa.

In more detail, when the power semiconductor device 100-3 is an N-type MOSFET, the drift region 107 may be an N-region, the source region 112 and the drain region 102 may be N+ regions, and the well region 110, the field reduction region 111, and the channel region 110a may be P− regions.

In an operation of the power semiconductor device 100-3, a current may generally flow in a vertical direction from the drain region 102 along the vertical portions 107a of the drift region 107, and may then flow through the channel region 110a to the source region 112 along the side surfaces of the gate electrode layers 120.

In the power semiconductor device 100-3 described above, the gate electrode layers 120 in the trenches 116 may be densely arranged in parallel in a stripe type or a line type, and the channel regions 110a may be disposed on the side surfaces of the gate electrode layers 120. As such, a channel density may increase.

Figure 28:
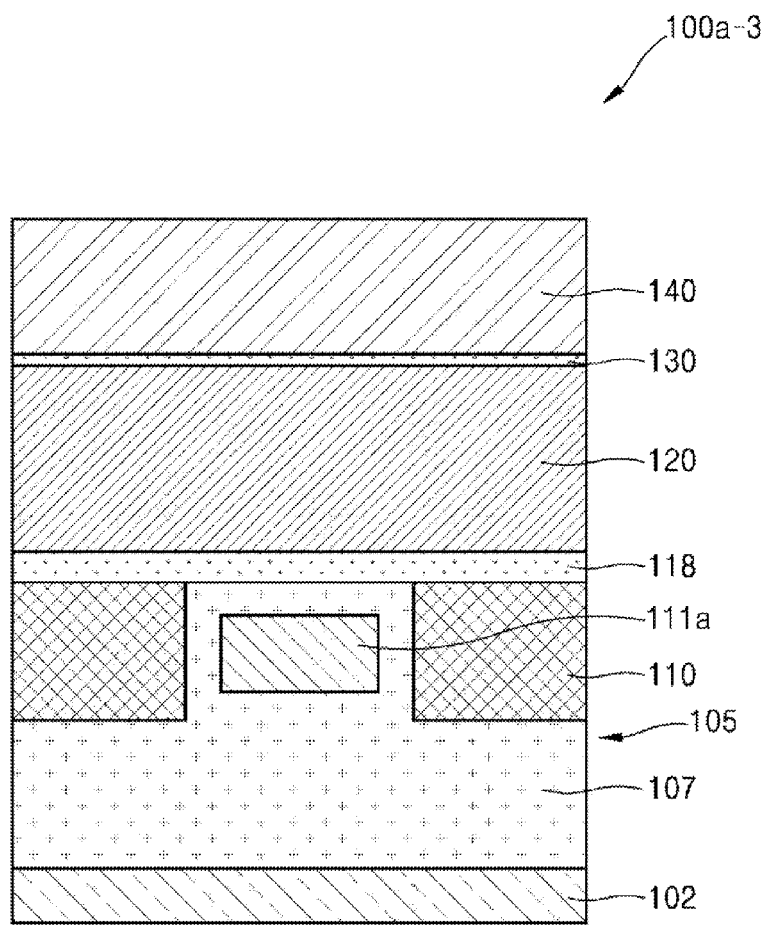
FIGS. 28 and 29 are cross-sectional views illustrating a power semiconductor device according to another embodiment of the present disclosure.
Figure 29:
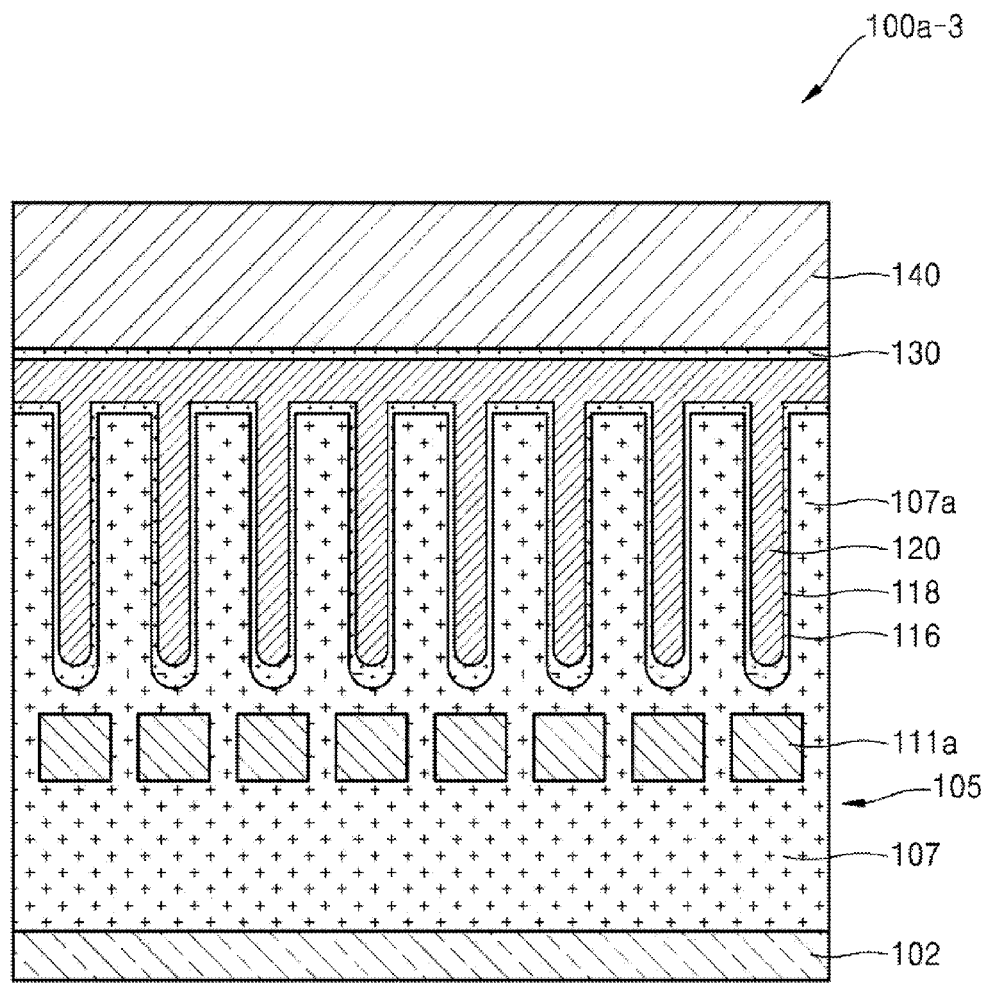

FIGS. 28 and 29 are cross-sectional views illustrating a power semiconductor device 100a-3 according to another embodiment of the present disclosure. The power semiconductor device 100a-3 may be implemented by modifying a partial configuration of the power semiconductor device 100-3 of FIGS. 24 to 27, and thus, additional description will be omitted to avoid redundancy.

Referring to FIGS. 28 and 29, a field reduction region 111a may be disposed under the bottom surface of the gate electrode layer 120, that is, may be formed to be spaced from the gate insulating layer 118 under the bottom surface of the gate electrode layer 120. In addition, the field reduction region 111a may be disposed in an island structure or a floating structure so as to be surrounded by the drift region 107 under the gate electrode layer 120.

When a plurality of trenches 116 are provided, the field reduction regions 111a may be respectively disposed under bottom surfaces of the trenches 116 or under bottom surfaces of the gate electrode layers 120 in a floating structure or in an island structure.

Even in the floating or island structure, the field reduction region 111a may be disposed under the bottom surface of the trench 116, thus alleviating the field concentration on the gate insulating layer 118 of the bottom surface of the trench 116.

Figure 30:
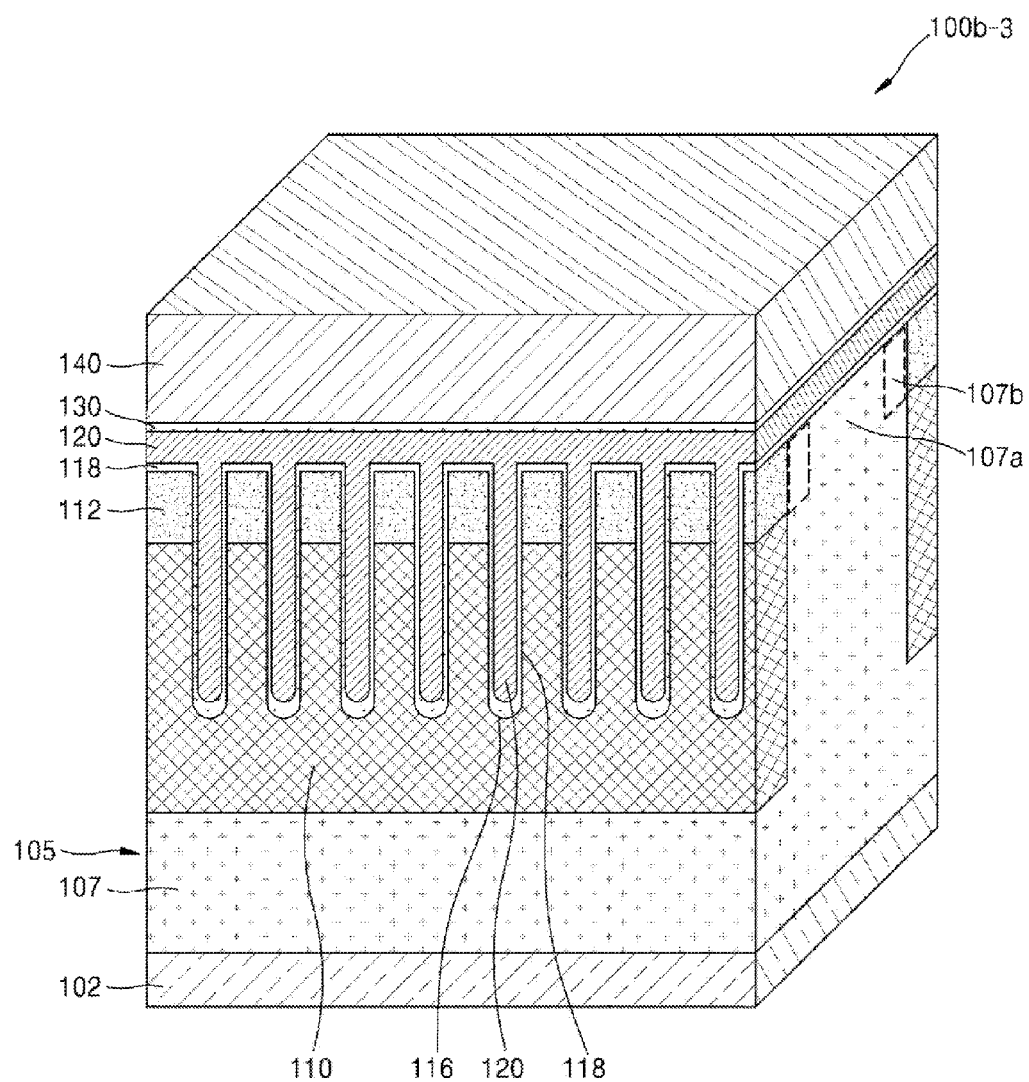
FIG. 30 is a cross-sectional view illustrating a power semiconductor device according to another embodiment of the present disclosure.

FIG. 30 is a cross-sectional view illustrating a power semiconductor device 100b-3 according to another embodiment of the present disclosure. The power semiconductor device 100b-3 may be implemented by using or partially modifying the power semiconductor device 100-3 or 100a-3 of FIGS. 24 to 29, and thus, additional description will be omitted to avoid redundancy.

Referring to FIG. 30, in the power semiconductor device 100b-3, the channel region 107b may be formed in the semiconductor layer 105 between the drift region 107 and the source region 112. For example, the channel region 107b may have the first conductivity type, and the accumulation channel may be formed therein in an operation of the power semiconductor device 100b-3.

For example, the channel region 107b may be formed in the semiconductor layer 105 between the source region 112 and the vertical portion 107a of the drift region 107. The channel region 107b may have the same doping type as the source region 112 and the drift region 107.

In this case, the source region 112, the channel region 107b, and the drift region 107 may be normally electrically connected. However, in the structure of the semiconductor layer 105 of silicon carbide, a potential barrier is formed while a band of the channel region 107b is upwardly bent due to the influence of a negative charge generated by the formation of a carbon cluster in the gate insulating layer 118. As such, there may be formed the accumulation channel that permits a charge or current flow in the channel region 107b only when an operating voltage is applied to the gate electrode layer 120.

Accordingly, a threshold voltage to be applied to the gate electrode layer 120 to form the accumulation channel in the channel region 107b may be considerably lower than a threshold voltage to be applied to the gate electrode layer 120 to form the inversion channel of the channel region 110a of FIGS. 24 to 28.

In some embodiments, the channel region 107b may be a part of the drift region 107. In more detail, the channel region 107b may be a part of the vertical portions 107a of the drift region 107. For example, the channel region 107b may be integrally formed with the drift region 107. In this case, the drift region 107 may be connected with the source region 112 through the channel region 107b. That is, at a channel region (107b) part, the drift region 107 and the source region 112 may be in contact with each other.

A doping concentration of the first conductivity-type impurities of the channel region 107b may be the same as that of the remaining portion of the drift region 107 or may be different therefrom for the adjustment of a threshold voltage.

As a modified example of the embodiment, the well region 110 may be formed to protrude toward the vertical portion 107a of the drift region 107 father than a part of the source region 112, and the channel region 107b may be formed in the semiconductor layer 105 on the protruding portion of the well region 110.

In addition, the well region 110 may further include a tap portion extending toward the gate electrode layer 120 at an end part of the protruding portion. The channel region 107b may be formed on the protruding portion and the tap portion of the well region 110 in a bent shape.

Additionally, the vertical portion 107a of the drift region 107 may further extend to between a lower part of the source region 112 and the well region 110. In this case, the channel region 107b may be formed to further extend to between the lower part of the source region 112 and the well region 110.

The above structures may allow the channel region 107b to be more restricted between the gate electrode layer 120 and the well region 110.

The power semiconductor device 100b-3 may include the advantages of the power semiconductor devices 100-3 and 100a-3 of FIGS. 24 to 28, and additionally, may make a threshold voltage low.

Figure 31:
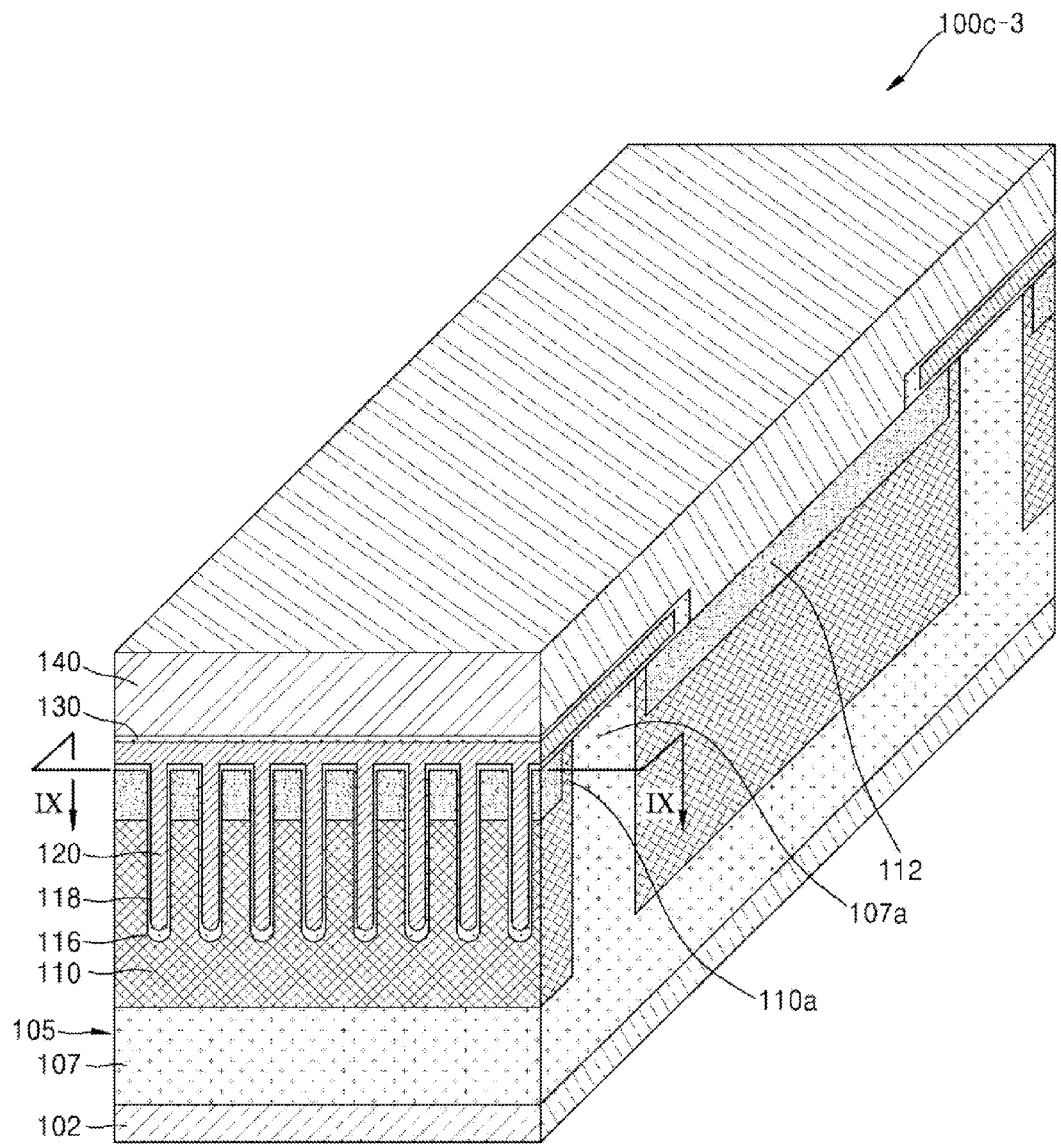
FIG. 31 is a schematic perspective view illustrating a power semiconductor device according to another embodiment of the present disclosure.
Figure 32:
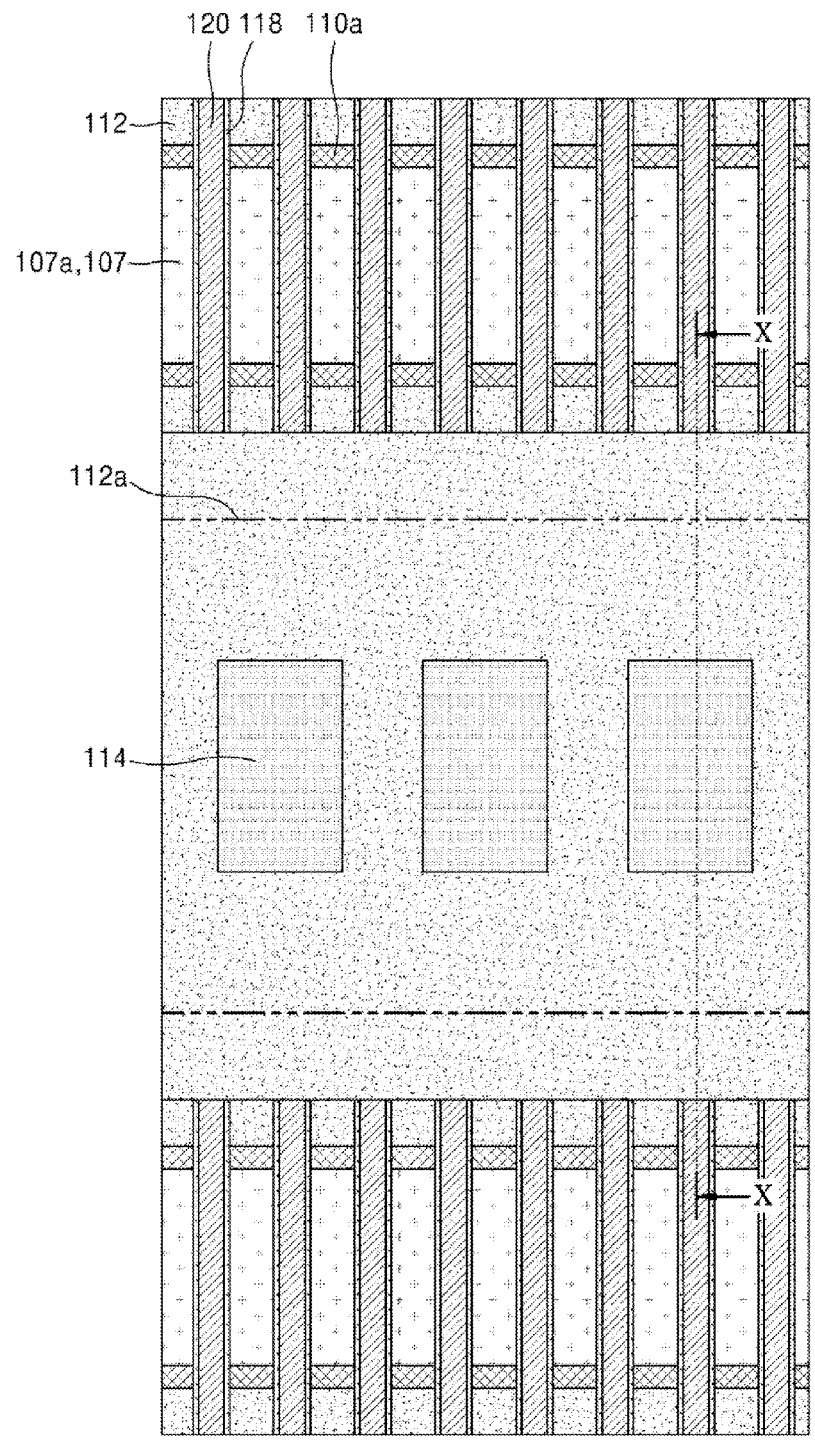
FIG. 32 is a plan view illustrating a power semiconductor device taken along line XI-XI of FIG. 31.
Figure 33:
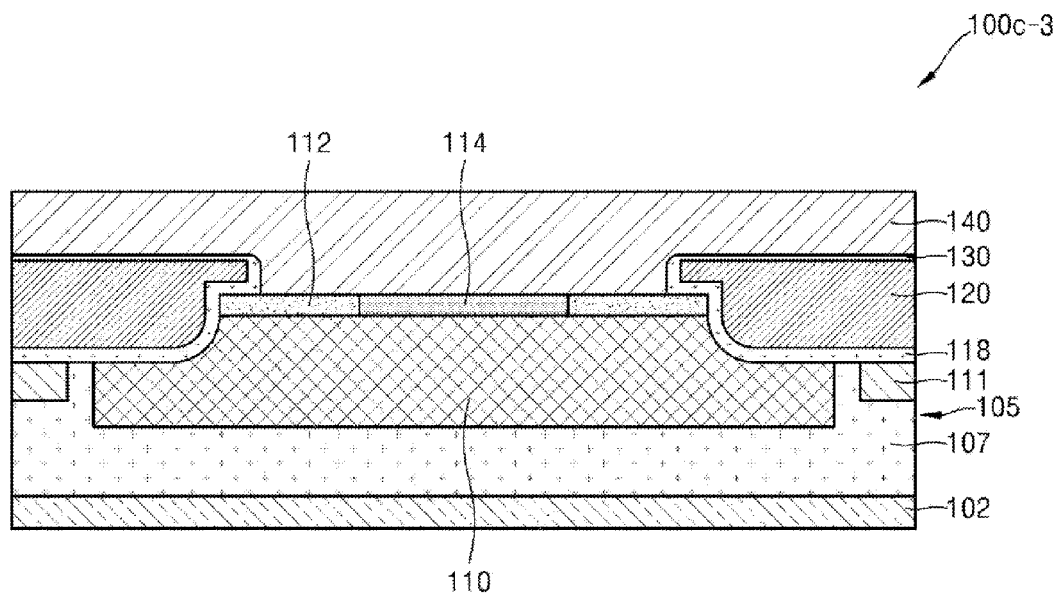
FIG. 33 is a cross-sectional view illustrating a power semiconductor device taken along line X-X of FIG. 32.

FIG. 31 is a schematic perspective view illustrating a power semiconductor device 100c-3 according to another embodiment of the present disclosure, FIG. 32 is a plan view illustrating the power semiconductor device 100c-3 taken along line XI-XI of FIG. 31, and FIG. 33 is a cross-sectional view illustrating the power semiconductor device 100c-3 taken along line X-X of FIG. 32.

The power semiconductor device 100c-3 according to the embodiment may be implemented by using or partially modifying the power semiconductor device 100-3 of FIGS. 24 to 27, and thus, additional description will be omitted to avoid redundancy.

Referring to FIGS. 31 to 33, in the power semiconductor device 100c-3, the source region 112 may include the source contact region 112a outside at least one end of the gate electrode layers 120. For example, the source contact region 112a that is a part of the source region 112 may refer to the part with which the source electrode layer 140 is connected.

The well contact region 114 may be formed in the source contact region 112a. For example, the well contact region 114 may extend from the well region 110 to penetrate the source region 112 and may have the second conductivity type. One well contact region 114 or a plurality of source contact regions 114 may be formed in the source contact region 112a.

For example, the well contact region 114 may be doped with second conductivity-type impurities of a higher concentration than the well region 110 to reduce a contact resistance when connected with the source electrode layer 140.

The source electrode layer 140 may be connected in common with the source contact region 112a and the well contact region 114.

The source contact region 112a and the well contact region 114 may be formed in the source region 112 of one side of the vertical portions 107a of the drift region 107. In a modified example of the embodiment, when each of the source region 112 and the well region 110 is divided into a plurality of regions, each of the source contact region 112a and the well contact region 114 may be formed in each of the corresponding regions.

In some embodiments, the plurality of trenches 116 may be arranged to be spaced from each other in line along one direction. As such, the gate electrode layers 120 may also be arranged to be spaced from each other in line in the one direction, along the trenches 116. In this case, the well region 110, the source region 112, the source contact region 112a, and the well contact region 114 may be formed in the semiconductor layer 105 between the trenches 116 arranged to be spaced from each other in line along the one direction.

For example, the power semiconductor device 100c-3 may be formed by arranging the structure of the power semiconductor device 100-3 of FIGS. 24 to 27 in plurality along one direction and by disposing the well region 110, the source region 112, the source contact region 112a, and the well contact region 114 therebetween.

For example, when the power semiconductor device 100-3 is an N-type MOSFET, the source contact region 112a may be an N+ region, and the well contact region 114 may be a P+ region.

According to the power semiconductor device 100c-3, the source contact region 112a and the well contact region 114 may be disposed outside the gate electrode layers 120, not between the gate electrode layers 120, and thus, the gate electrode layers 120 may be arranged more densely. As such, a channel density of the power semiconductor device 100a-3 may markedly increase.

Meanwhile, the structure of the power semiconductor device 100c-3 may be applied to the power semiconductor device 100a-3 of FIGS. 28 and 29 and the power semiconductor device 100b-3 of FIG. 30. That is, the power semiconductor device 100a-3 or the power semiconductor device 100b-3 may be arranged in line in plurality, and the well region 110, the source region 112, the source contact region 112a, and the well contact region 114 may be disposed therebetween.

Figure 34:
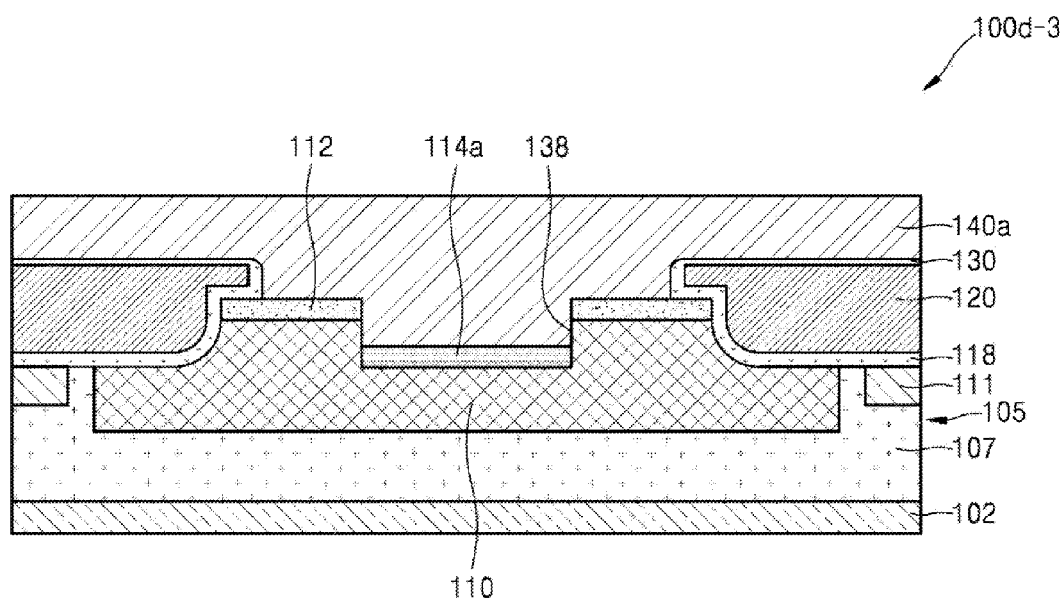
FIG. 34 is a cross-sectional view illustrating a power semiconductor device according to another embodiment of the present disclosure.

FIG. 34 is a cross-sectional view illustrating a power semiconductor device 100d-3 according to another embodiment of the present disclosure. The power semiconductor device 100d-3 may be implemented by modifying a partial configuration of the power semiconductor device 100c-3 of FIGS. 31 to 33, and thus, additional description will be omitted to avoid redundancy.

Referring to FIG. 34, the power semiconductor device 100d-3 may include at least one groove 138, which is formed to penetrate the source region 112 and to be recessed into the well region 110, in the source contact region 112a of the source region 112. The well contact region 114a may be formed to be in contact with the well region 110, on at least a bottom surface of the groove 138.

The source electrode layer 140a may be formed to fill the groove 138 and may be connected with the well contact region 114a, the well region 110, and/or the source region 112. The above structure may widen the contact area between the source electrode layer 140a and the well region 110 and the contact area between the source electrode layer 140a and the source region 112 such that contact resistances therebetween decrease.

In some embodiments, the well contact region 114a may be formed on the whole surface of the well region 110 exposed by the groove 138. Accordingly, the well contact region 114a may be formed on the well region 110 exposed from a bottom surface and a side wall of the groove 138. The above structure of the well contact region 114a may allow the contact resistance between the source electrode layer 140a and the well region 110 to further decrease.

Meanwhile, the field reduction region 111 may be disposed to be in contact with the gate insulating layer 118, but may be modified to be downwardly spaced from the gate insulating layer 118.

Figure 35:
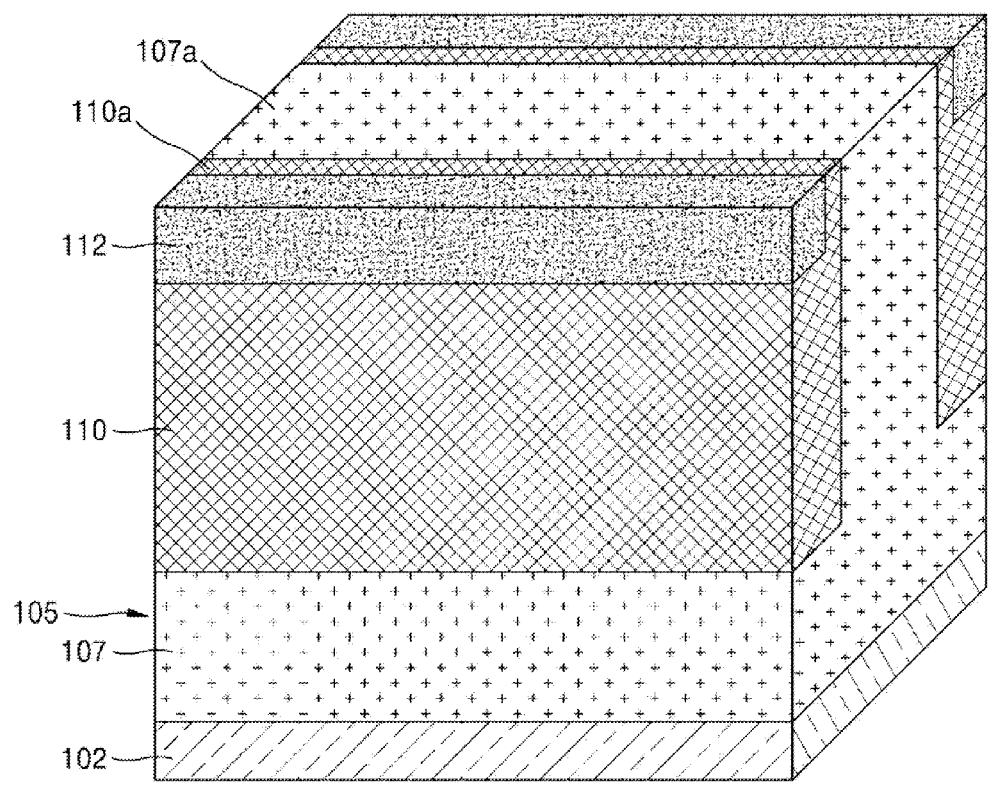
FIGS. 35 to 37 are schematic perspective views illustrating a method of fabricating a power semiconductor device according to an embodiment of the present disclosure.
Figure 36:
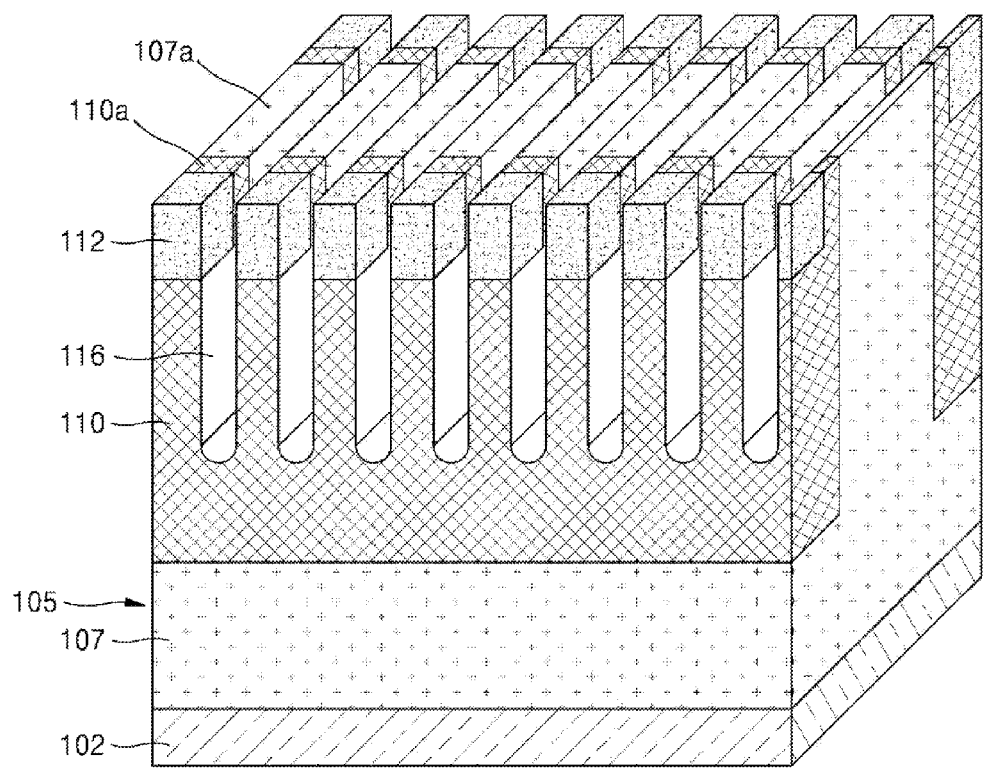
Figure 37:
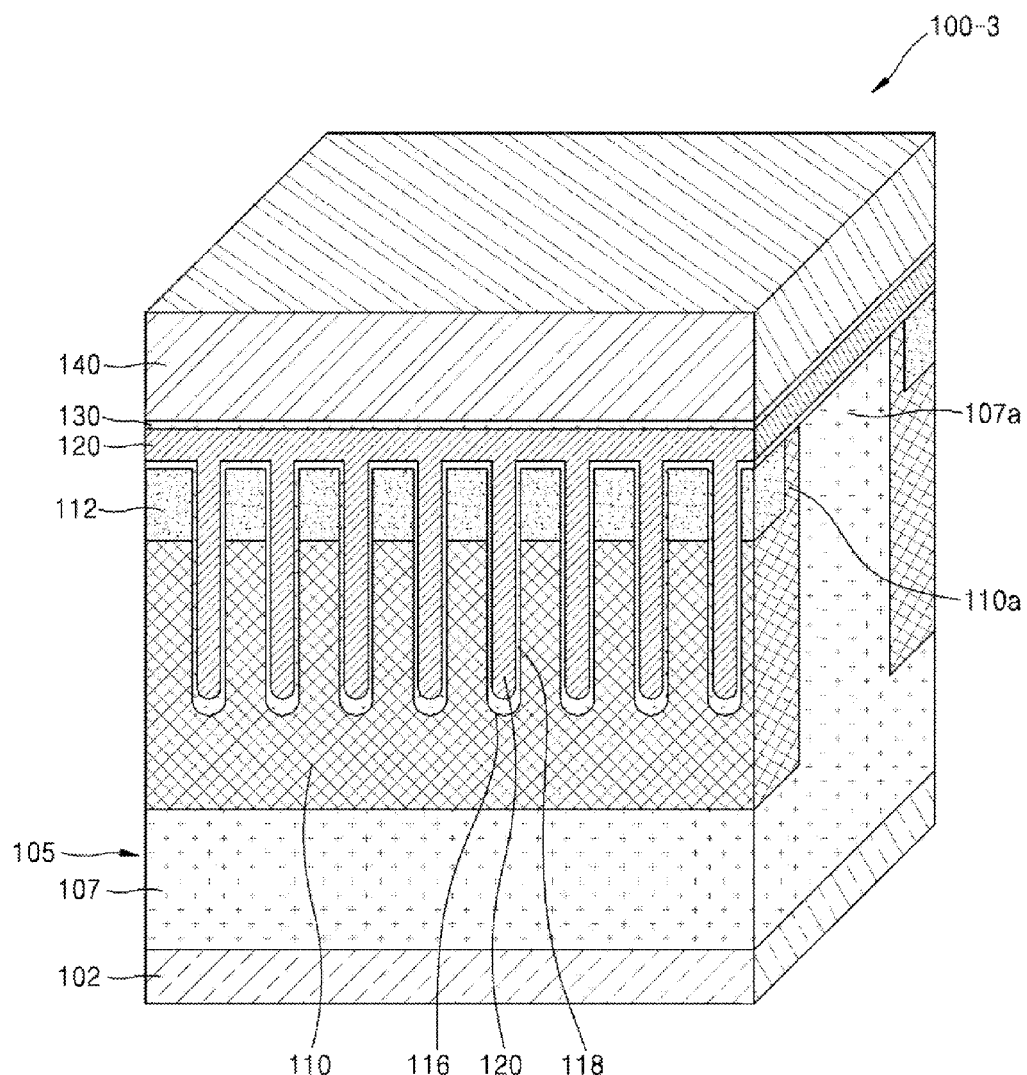

FIGS. 35 to 37 are schematic perspective views illustrating a method of fabricating the power semiconductor device 100-3 according to an embodiment of the present disclosure.

Referring to FIG. 35, the drift region 107 having the first conductivity type may be formed in the semiconductor layer 105 of silicon carbide (SiC). For example, the drift region 107 may be formed on the drain region 102 having the first conductivity type. In some embodiments, the drain region 102 may be implemented with a substrate of the first conductivity type, and the drift region 107 may be formed on the substrate with one or more epitaxial layers.

Next, the well region 110 having the second conductivity type may be formed in the semiconductor layer 105 so as to be in contact with the drift region 107. For example, the forming of the well region 110 may be performed by implanting impurities of the second conductivity type into the semiconductor layer 105. The well region 110 may be formed with a given depth from a surface of the semiconductor layer 105, substantially.

For example, the well region 110 may be formed in the semiconductor layer 105 such that the drift region 107 includes the vertical portion 107a, at least a part of which is surrounded by the well region 110. In more detail, the well region 110 may be formed by doping impurities of a conductivity type opposite to that of the drift region 107 in the drift region 107.

Before or after the well region 110 is formed, the field reduction region 111 having the second conductivity type may be formed at a given depth of the semiconductor layer 105 so as to be spaced from the well region 110. For example, the field reduction region 111 may be formed by implanting impurities of the second conductivity type into the semiconductor layer 105.

Then, the source region 112 having the first conductivity type may be formed in the well region 110. For example, source region 112 may be formed by implanting impurities of the first conductivity type into the well region 110. The source region 112 may be formed in the well region 110 with a given depth from the surface of the semiconductor layer 105, substantially.

In addition to the formation of the source region 112, the channel region 110a where an inversion channel is formed along one direction may be formed in the semiconductor layer 105 between the source region 112 and the drift region 107. The channel region 110a may be formed between the source region 112 and the vertical portion 107a of the drift region 107. For example, the channel region 110a may be a part of the well region 110 and may be formed by implanting impurities of the second conductivity type into the semiconductor layer 105.

In a modified example of the embodiment, an order in which the well region 110, the source region 112, the channel region 110a, and the field reduction region 111 are doped with impurities may be changed arbitrarily.

In the above fabricating method, the impurity implantation or the impurity doping may be performed such that the impurities are mixed when the impurities are implanted into the semiconductor layer 105 or an epitaxial layer is formed. However, an ion implantation method using a mask pattern may be used for implantation of the impurities in a selective region.

Optionally, a heat treatment process for activating or diffusing the impurities may be performed after the ion implantation.

Referring to FIG. 36, at least one trench 116 may be formed to be recessed into the semiconductor layer 105 from a surface of the semiconductor layer 105 as much as a given depth. For example, the at least one trench 116 may have a predetermined depth from the surface (e.g., an upper surface) of the semiconductor layer 105.

For example, the trench 116 may extend across the drift region 107 in one direction and may be formed to be shallower than the well region 110.

In addition, the at least one trench 116 may include a plurality of trenches 116, and the trenches 116 may be simultaneously formed in the semiconductor layer 105 in parallel in one direction, for example. The channel region 110a may be further restricted by the trenches 116.

For example, the trenches 116 may be formed by forming a photo mask by using photo lithography and then etching the semiconductor layer 105 by using the photo mask as an etching protection layer.

Referring to FIG. 37, the gate insulating layer 118 may be formed on the bottoms and inner walls of the trenches 116. For example, the gate insulating layer 118 may be formed by oxidizing the semiconductor layer 105 to form an oxide or by depositing an insulating material such as oxide or nitride on the semiconductor layer 105.

Afterwards, the gate electrode layers 120 may be formed on the gate insulating layer 118 so as to be disposed in the trenches 116. For example, the gate electrode layer 120 may be formed by forming a conductive layer on the gate insulating layer 118 and patterning the conductive layer. The gate electrode layer 120 may be formed by doping impurities in polysilicon or may be formed to include a conductive metal or metal silicide.

A patterning process may be performed by using photo lithography and etching processes. The photo lithography process may include a process of forming a photoresist pattern as a mask layer by using a photo process and a development process, and the etching process may include a process of selectively etching an underlying structure by using the photoresist pattern.

As such, the well region 110 may be disposed to be deeper than the gate electrode layer 120 so as to surround the bottom surface of the gate electrode layer 120 at one end of the gate electrode layer 120, and the channel region 110a may be formed in the semiconductor layer 105 of one side or opposite sides of the gate electrode layer 120 between the drift region 107 and the source region 112. Also, the field reduction region 111 may be disposed to be in contact with the gate insulating layer 118 under the bottom surface of the gate electrode layer 120.

Afterwards, the interlayer insulating layer 130 may be formed on the gate electrode layer 120.

Afterwards, the source electrode layer 140 may be formed on the interlayer insulating layer 130. For example, the source electrode layer 140 may be formed by forming a conductive layer, for example, a metal layer on the interlayer insulating layer 130 and patterning the conductive layer.

Meanwhile, the power semiconductor device 100b-3 of FIG. 30 may be fabricated by adding some processes to the method of fabricating the power semiconductor device 100-3 described above or changing or modifying the fabricating method. For example, the channel region 107b may be formed with a part of the drift region 107 so as to form the accumulation channel.

The power semiconductor device 100c-3 of FIGS. 31 to 33 may be fabricated by adding some processes to the method of fabricating the power semiconductor device 100-3 described above or changing or modifying the fabricating method.

For example, when the power semiconductor device 100c-3 is fabricated, the forming of the source region 112 may include forming the source contact region 112a connected with the source electrode layer 140 at least outside one end of the gate electrode layer 120. In some embodiments, the source contact region 112a may be a part of the source region 112.

In addition, before the trenches 116 are formed, the well contact region 114 may be formed in the source contact region 112a. For example, the well contact region 114 may be formed by implanting the second conductivity-type impurities of a higher concentration than the well region 110, into a part of the well region 110.

When the power semiconductor device 100c-3 is fabricated, the trenches 116 may be arranged to be spaced from each other in line in one direction. In addition, the well region 110, the channel region 110a, and the source region 112 may be formed in the semiconductor layer 105 between the trenches 116.

The method of fabricating the power semiconductor device 100d-3, which is described with reference to FIG. 34, may further include forming at least one groove 138 in the source region 112 so as to penetrate the source region 112 and to be recessed into the well region 110, forming the well contact region 114 on a bottom surface of the groove 138 so as to be in contact with the well region 110, and forming the source electrode layer 140 so as to be connected with the well contact region 114.

According to the above fabricating method, the power semiconductor device 100-3 using the semiconductor layer 105 of silicon carbide may be economically fabricated by using processes that are applied to a conventional silicon substrate.

Figure 38:
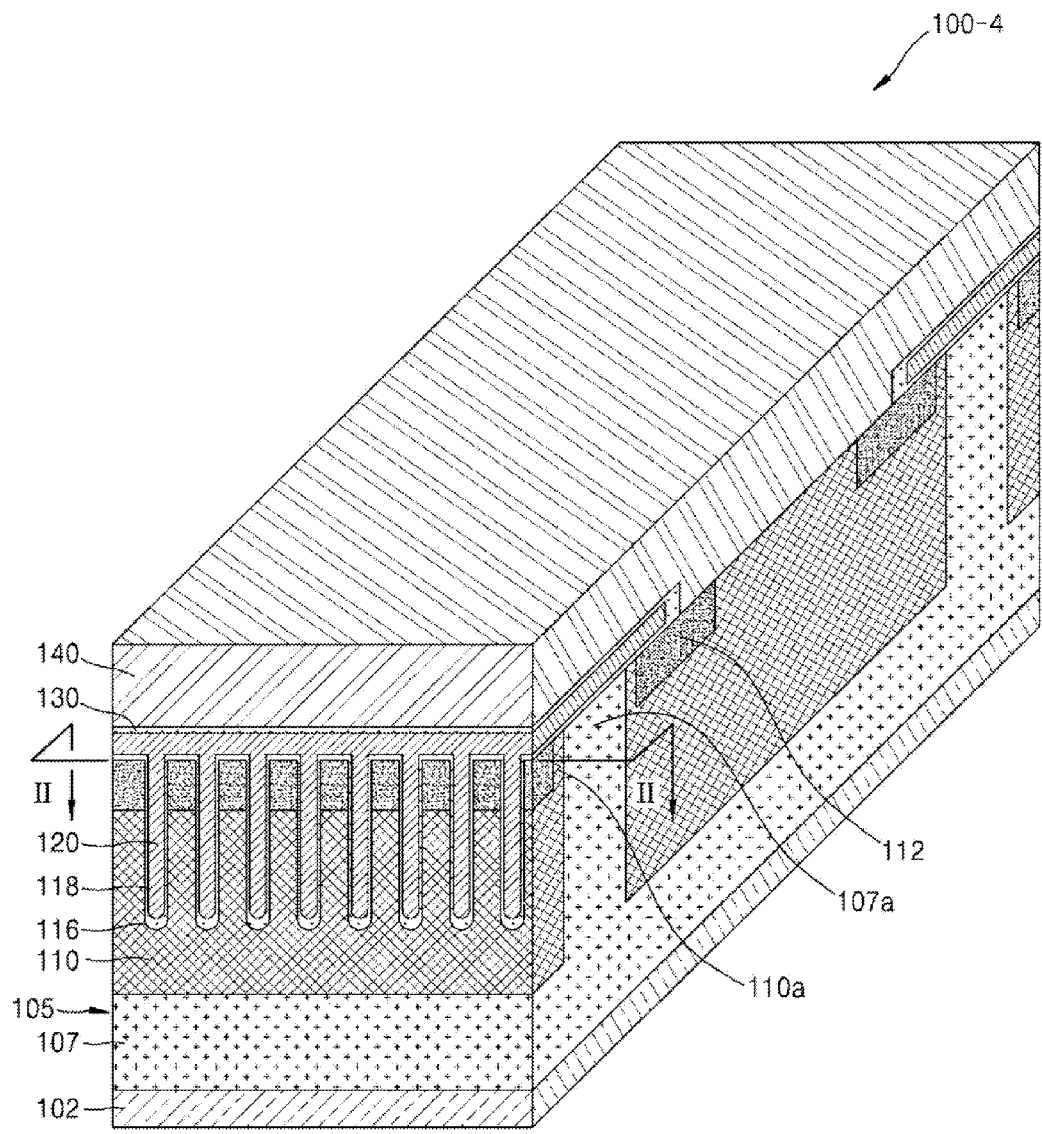
FIG. 38 is a schematic perspective view illustrating a power semiconductor device according to an embodiment of the present disclosure.
Figure 39:
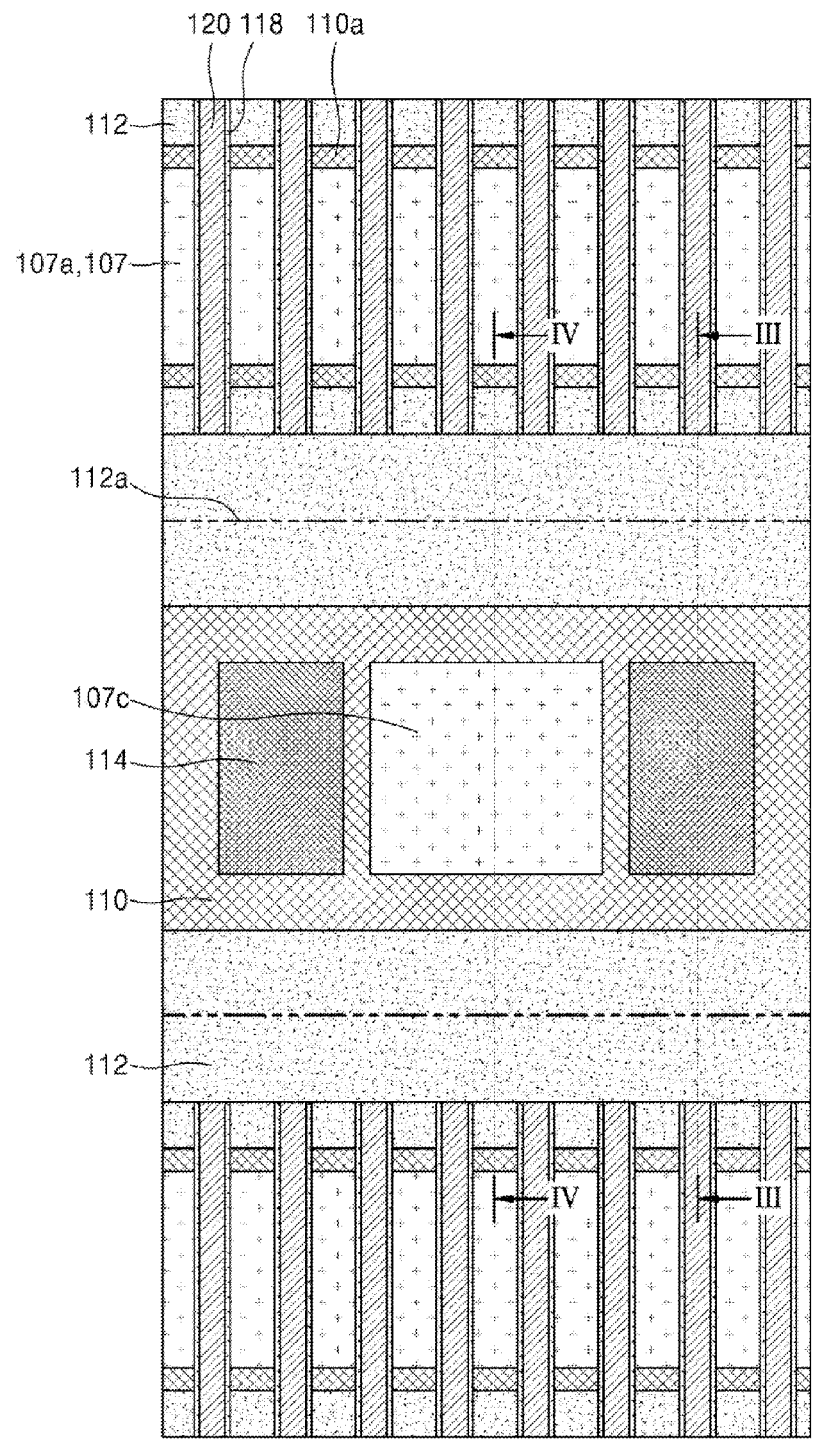
FIG. 39 is a plan view illustrating a power semiconductor device taken along line II-II of FIG. 38.
Figure 40:
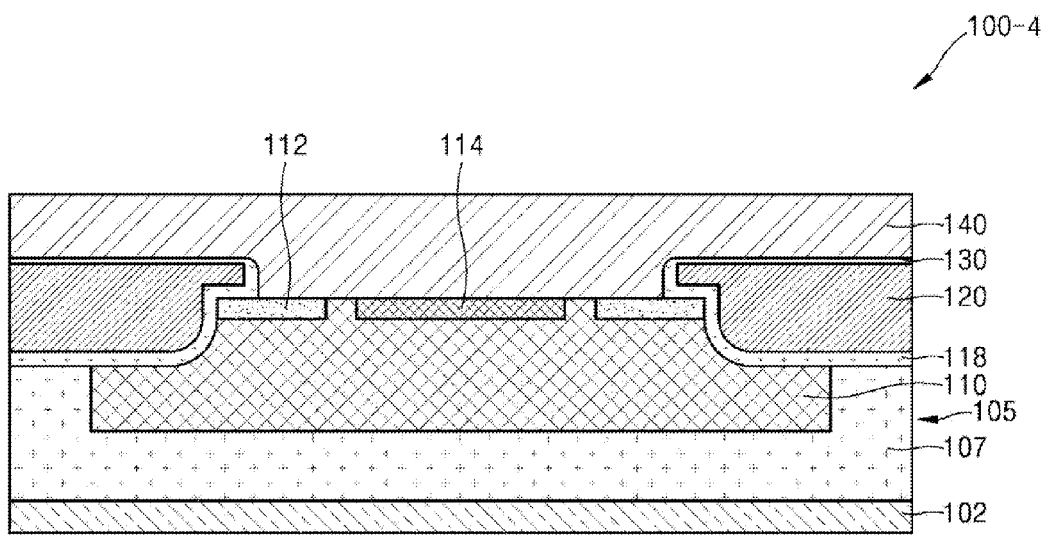
FIG. 40 is a cross-sectional view illustrating a power semiconductor device taken along line III-III of FIG. 39.
Figure 41:
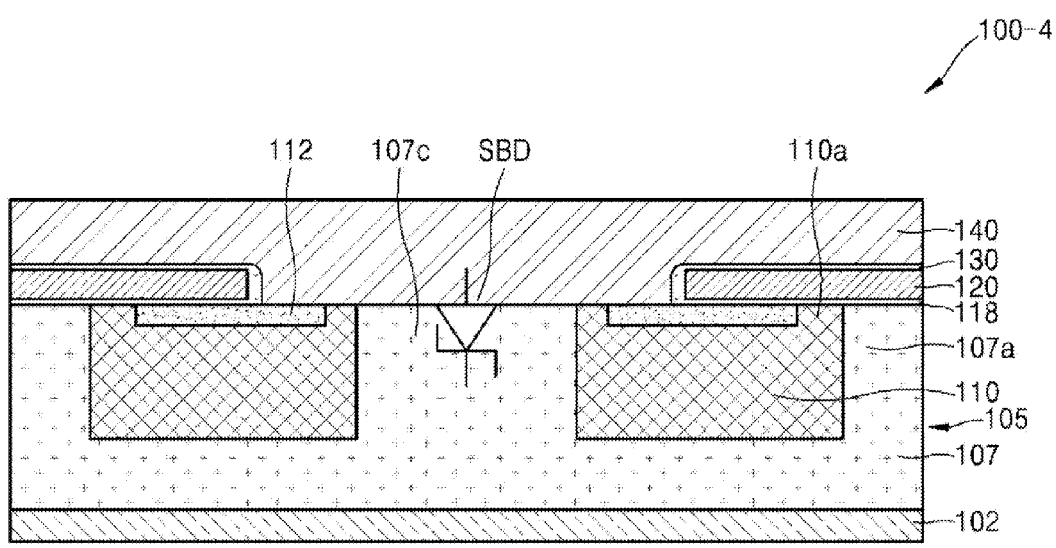
FIG. 41 is a cross-sectional view illustrating a power semiconductor device taken along line IV-IV of FIG. 39.

FIG. 38 is a schematic perspective view illustrating a power semiconductor device 100-4 according to an embodiment of the present disclosure, FIG. 39 is a plan view illustrating the power semiconductor device 100-4 taken along line II-II of FIG. 38, FIG. 40 is a cross-sectional view illustrating the power semiconductor device 100-4 taken along line III-III of FIG. 39, and FIG. 41 is a cross-sectional view illustrating the power semiconductor device 100-4 taken along line IV-IV of FIG. 39.

Referring to FIGS. 38 to 41, the power semiconductor device 100-4 may at least include the semiconductor layer 105, the gate insulating layer 118, and the gate electrode layer 120. For example, the power semiconductor device 100-4 may have a power MOSFET structure.

The semiconductor layer 105 may refer to one semiconductor material layer or a plurality of semiconductor material layers, for example, may refer to one epitaxial layer or a plurality of epitaxial layers. In addition, the semiconductor layer 105 may refer to one or multiple epitaxial layers on a semiconductor substrate.

For example, the semiconductor layer 105 may be formed of silicon carbide (SiC). In more detail, the semiconductor layer 105 may include at least one epitaxial layer of silicon carbide.

Silicon carbide (SiC) may have a bandgap wider than silicon, thus maintaining stability even at a high temperature compared to silicon. In addition, because a breakdown electric field of the silicon carbide is higher than that of the silicon, the silicon carbide may stably operate even at a high temperature. Accordingly, the power semiconductor device 100-4 including the semiconductor layer 105 formed of silicon carbide may have a high breakdown voltage compared to the case of using silicon and may provide an excellent heat release characteristic and a stable operating characteristic at a high temperature.

In more detail, the semiconductor layer 105 may include the drift region 107. The drift region 107 may have the first conductivity type and may be formed by implanting impurities of the first conductivity type into a part of the semiconductor layer 105. For example, the drift region 107 may be formed by doping impurities of the first conductivity type in an epitaxial layer of silicon carbide.

The well region 110 may be formed in the semiconductor layer 105 to be in contact with the drift region 107 and may have the second conductivity type. For example, the well region 110 may be formed by doping impurities of the second conductivity type opposite to the first conductivity type in the drift region 107.

For example, the well region 110 may be formed to surround at least a part of the drift region 107. As such, the drift region 107 may include the vertical portion 107a, at least a part of which is surrounded by the well region 110. In an operation of the power semiconductor device 100-4, the vertical portion 107a may provide a vertical movement path of charges.

The well region 110 is illustrated in FIG. 38 as including two regions spaced from each other and the vertical portion 107a interposed therebetween, but the well region 110 may be variously changed or modified. For example, the vertical portion 107a may have a shape whose side surface is surrounded by the well region 110 once.

The source region 112 may be formed in the well region 110 and may have the first conductivity type. For example, the source region 112 may be formed by doping impurities of the first conductivity type in the well region 110. The concentration of the first conductivity-type impurities doped in the source region 112 may be higher than that doped in the drift region 107.

The channel region 110a may be formed in the semiconductor layer 105 between the drift region 107 and the source region 112. For example, the channel region 110a may have the second conductivity type, and an inversion channel may be formed therein along one direction in an operation of the power semiconductor device 100-4.

Because the channel region 110a has a doping type opposite to that of the source region 112 and the drift region 107, the channel region 110a may form a diode junction with the source region 112 and the drift region 107. Accordingly, the channel region 110a may not permit charges to move in a normal situation; however, when an operating voltage is applied to the gate electrode layer 120, an inversion channel may be formed therein such that the movement of charges is permitted.

In some embodiments, the channel region 110a may be a part of the well region 110. In this case, the channel region 110a may be integrally formed to be continuously connected with the well region 110. A doping concentration of the second conductivity-type impurities of the channel region 110a may be the same as that of the remaining portion of the well region 110 or may be different therefrom for the adjustment of a threshold voltage.

In some embodiments, the well region 110, the channel region 110a, and the source region 112 may be formed to be symmetrical with respect to the vertical portion 107a of the drift region 107. For example, the well region 110, the channel region 110a, and the source region 112 may be formed at opposite ends of the vertical portion 107a of the drift region 107, or each of the well region 110, the channel region 110a, and the source region 112 may include a first part and a second part formed to be symmetrical with respect to the vertical portion 107a of the drift region 107. In each of the well region 110, the channel region 110a, and the source region 112, the first part and the second part may be separated from each other or may be connected to each other.

In addition, the drain region 102 may be formed in the semiconductor layer 105 under the drift region 107 and may have the first conductivity type. For example, the drain region 102 may be doped with impurities of a high concentration compared to the drift region 107.

In some embodiments, the drain region 102 may be implemented with a substrate of silicon carbide having the first conductivity type. In this case, the drain region 102 may be understood as a part of the semiconductor layer 105 or may be understood as a substrate independent of the semiconductor layer 105.

At least one trench 116 may be formed to be recessed into the semiconductor layer 105 from a surface of the semiconductor layer 105 as much as a given depth. For example, the at least one trench 116 may have a predetermined depth from the surface (e.g., an upper surface) of the semiconductor layer 105. The trench 116 may extend in one direction within the semiconductor layer 105. One direction may refer to a length direction, not a depth direction of the trench 116, and may refer to a direction of line III-III or line IV-IV of FIG. 39.

The gate insulating layer 118 may be formed at least on an inner wall of the trench 116. For example, the gate insulating layer 118 may be formed on an inner surface of the trench 116 and on the semiconductor layer 105 outside the trench 116. A thickness of the gate insulating layer 118 may be uniform, or a part of the gate insulating layer 118 formed on the bottom surface of the trench 116 may be thicker than a part of the gate insulating layer 118 formed on a side wall of the trench 116 such that an electric field decreases at a bottom part of the trench 116.

For example, the gate insulating layer 118 may include an insulating material such as silicon oxide, silicon carbide oxide, silicon nitride, hafnium oxide, zirconium oxide, or aluminum oxide, or may include a stacked structure thereof.

At least one gate electrode layer 120 may be formed on the gate insulating layer 118 so as to be disposed in the trench 116. For example, the gate electrode layer 120 may include an appropriate conductive material such as polysilicon, metal, metal nitride, or metal silicide, or may include a stacked structure thereof.

The drift region 107 may be formed in the semiconductor layer 105 on one side of the gate electrode layer 120. For example, the vertical portion 107a of the drift region 107 may vertically extend in the semiconductor layer 105 of one side of the gate electrode layer 120. The channel region 110a may be formed in the semiconductor layer 105 of one side of the gate electrode layer 120 between the vertical portion 107a of the drift region 107 and the source region 112. Accordingly, the semiconductor layer 105 of the one side of the gate electrode layer 120 may include a structure in which the source region 112, the channel region 110a, and the vertical portion 107a of the drift region 107 are connected along one direction.

In some embodiments, the drift region 107 may be formed in the semiconductor layer 105 on opposite sides of the gate electrode layer 120. For example, the drift region 107 may include the vertical portions 107a that vertically extend in the semiconductor layer 105 of opposite sides of the gate electrode layer 120. The channel region 110a may be formed in the semiconductor layer 105 of opposite sides of the gate electrode layer 120 between the vertical portions 107a of the drift region 107 and the source region 112.

The above structure of the channel region 110a may be called a "lateral channel structure" in that the channel region 110a is formed along a side wall of the gate electrode layer 120.

The well region 110 may be formed to be deeper than the gate electrode layer 120, so as to surround the bottom surface of the gate electrode layer 120 at one end of the gate electrode layer 120. In addition, the well region 110 may be formed to be deeper than the gate electrode layer 120, so as to surround the bottom surface of the gate electrode layer 120 at opposite ends of the gate electrode layer 120. As such, opposite end parts of the gate electrode layer 120 around the source region 112 may be surrounded by the well region 110.

This well (110) structure may more alleviate the concentration of an electric field on the bottom surface of the trench 116, that is, at a lower part of the gate electrode layer 120. In addition, a deep well region 111 may be disposed under the well region 110, thus more reducing an electric field across the gate insulating layer 118 as well as an electric field of the bottom surface of the trench 116. As such, a margin of an electric field across the gate insulating layer 118 of the power semiconductor device 100-4 may increase, and thus, the reliability of operation of the power semiconductor device 100-4 may be improved. In addition, it is possible to reduce a junction resistance of the vertical portion 107a of the drift region 107 by decreasing an electric field of the bottom surface of the trench 116 and decreasing an electric field across the gate insulating layer 118.

In some embodiments, the gate insulating layer 118 and the gate electrode layer 120 may be formed in the trench 116, and in addition, may be formed to further extend to the outside of the trench 116.

In some embodiments, one trench 116 or a plurality of trenches 116 may be provided in the semiconductor layer 105. The number of trenches 116 may be appropriately selected without limiting the scope of the embodiment.

For example, the plurality of trenches 116 may be formed in the semiconductor layer 105 in parallel along one direction. As the trenches 116 extend in one direction and are spaced from each other in a direction perpendicular to the one direction, the trenches 116 may be arranged in parallel.

In this case, a plurality of gate electrode layers 120 may be formed on the gate insulating layer 118 so as to fill the inside of the trenches 116. As such, the gate electrode layers 120 may be formed in the semiconductor layer 105 in a trench type and may be arranged to extend in parallel in the one direction like the trenches 116.

In addition, each of the well region 110 and the source region 112 may extend across the gate electrode layers 120. The vertical portions 107a of the drift region 107 may be arranged in the semiconductor layer 105 between the gate electrode layers 120. The channel region 110a may be formed in the semiconductor layer 105 between the source region 112 and the vertical portions 107a of the drift region 107 on one side or opposite sides of each of the gate electrode layers 120.

In some embodiments, the well region 110 may be formed in the semiconductor layer 105 to be deeper than the gate electrode layers 120, so as to be in contact with the vertical portions 107a of the drift region 107 and to surround the bottom surface of the gate electrode layers 120 at opposite ends of the gate electrode layers 120.

The interlayer insulating layer 130 may be formed on the gate electrode layer 120. For example, the interlayer insulating layer 130 may include an appropriate insulating material such as oxide or nitride, or may include a stacked structure thereof.

The source electrode layer 140 may be formed on the interlayer insulating layer 130 and may be connected with the source region 112. For example, the source electrode layer 140 may be formed of an appropriate conductive material, metal, etc.

In addition, the source electrode layer 140 may be in contact with a part of the drift region 107 to form a Schottky barrier diode SBD. The Schottky barrier diode SBD may refer to a diode using a Schottky barrier by the junction of a semiconductor with a metal.

In addition to the Schottky barrier diode SBD, a parasitic body diode may be formed in the power semiconductor device 100-4. For example, a body diode may be formed between the well region 110 and the drift region 107. The body diode may be a PN diode formed when semiconductor materials of different types are joined together.

Figure 48:
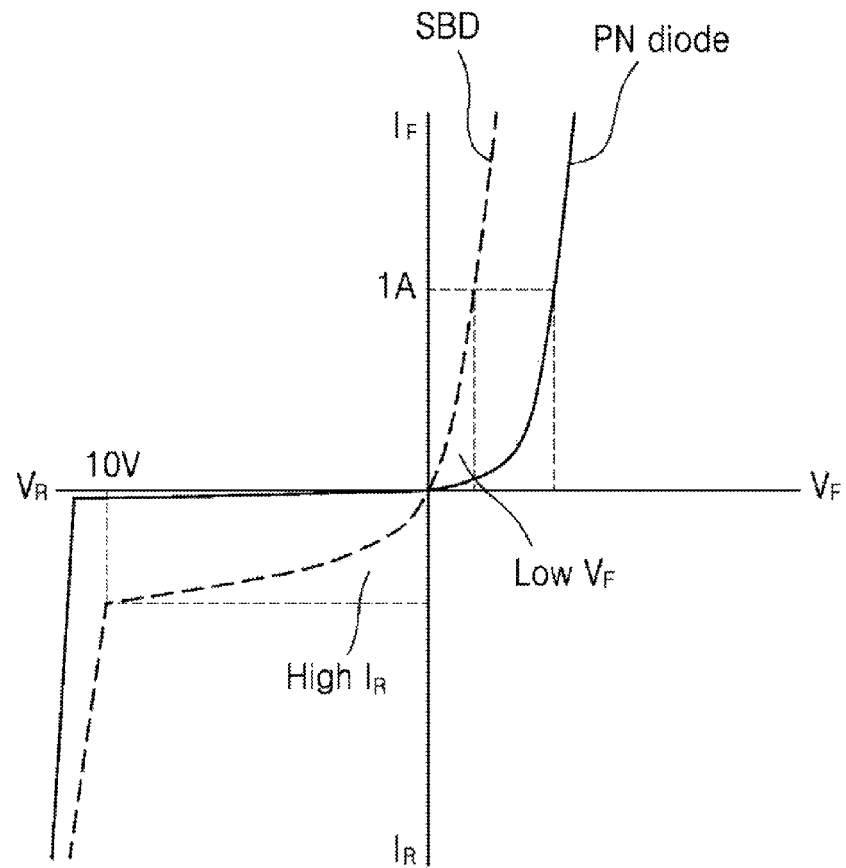
FIG. 48 is a graph illustrating characteristics of diodes of a power semiconductor device according to embodiments of the present disclosure.

It may be understood from FIG. 48 that the Schottky barrier diode SBD provides a low forward voltage VF and a fast switching characteristic compared to the PN diode.

In an operation of the power semiconductor device 100-4, the Schottky barrier diode (SBD) may reduce a switching loss together with the body diode. For example, the Schottky barrier diode SBD and the body diode may function as a free wheeling diode in an operation of the power semiconductor device 100-4.

In some embodiments, the source region 112 may include the source contact region 112a outside at least one ends of the gate electrode layers 120. For example, the source contact region 112a may refer to a region of the semiconductor layer 105, which is connected with the source electrode layer 140.

For example, the source contact region 112a may include a part of the source region 112 outside at least one ends of the gate electrode layers 120, a part of the well region 110, and a protruding portion 107c of the drift region 107 exposed from the well region 110.

The well contact region 114 may be formed on a part of the well region 110 in the source contact region 112a and may have the second conductivity type. For example, one well contact region 114 or a plurality of source contact regions 114 may be formed in the source contact region 112a. In addition, the well contact region 114 may be doped with second conductivity-type impurities of a higher concentration than the well region 110 to reduce a contact resistance when connected with the source electrode layer 140.

The source electrode layer 140 may be connected with the source contact region 112a, and thus, may be connected in common with the source region 112, the well contact region 114, and the protruding portion 107c of the drift region 107.

In some embodiments, the plurality of trenches 116 may be arranged to be spaced from each other in line along one direction. As such, the gate electrode layers 120 may also be arranged to be spaced from each other in line in the one direction, along the trenches 116. In this case, the well region 110, the source region 112, the source contact region 112a, the Schottky barrier diode SBD, and the well contact region 114 may be formed in the semiconductor layer 105 between the trenches 116 arranged to be spaced from each other in line along the one direction.

In the power semiconductor device 100-4 described above, the first conductivity type and the second conductivity type may be opposite to each other, and each of the first conductivity type and the second conductivity type may be one of n-type and p-type. For example, when the first conductivity type is n-type, the second conductivity type is p-type, and vice versa.

In more detail, when the power semiconductor device 100-4 is an N-type MOSFET, the drift region 107 may be an N-region, the source region 112 and the drain region 102 may be N+ regions, the well region 110 and the channel region 110a may be P− regions, and the well contact region 114 may be a P+ region.

In an operation of the power semiconductor device 100-4, a current may generally flow in a vertical direction from the drain region 102 along the vertical portions 107a of the drift region 107, and may then flow through the channel region 110a to the source region 112 along the side surfaces of the gate electrode layers 120.

In the power semiconductor device 100-4 described above, the gate electrode layers 120 in the trenches 116 may be densely arranged in parallel in a stripe type or a line type, and the channel regions 110a may be disposed on the side surfaces of the gate electrode layers 120. As such, a channel density may increase.

According to the power semiconductor device 100-4, the source contact region 112a and the well contact region 114 may be disposed outside the gate electrode layers 120, not between the gate electrode layers 120, and thus, the gate electrode layers 120 may be arranged more densely. As such, a channel density of the power semiconductor device 100-4 may markedly increase.

Figure 42:
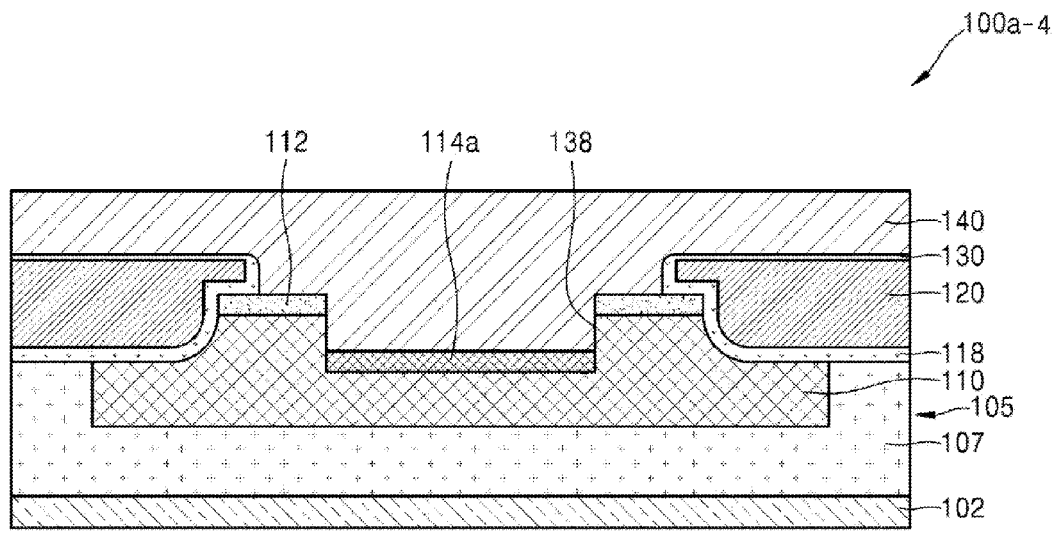
FIGS. 42 and 43 are cross-sectional views illustrating a power semiconductor device according to another embodiment of the present disclosure.
Figure 43:
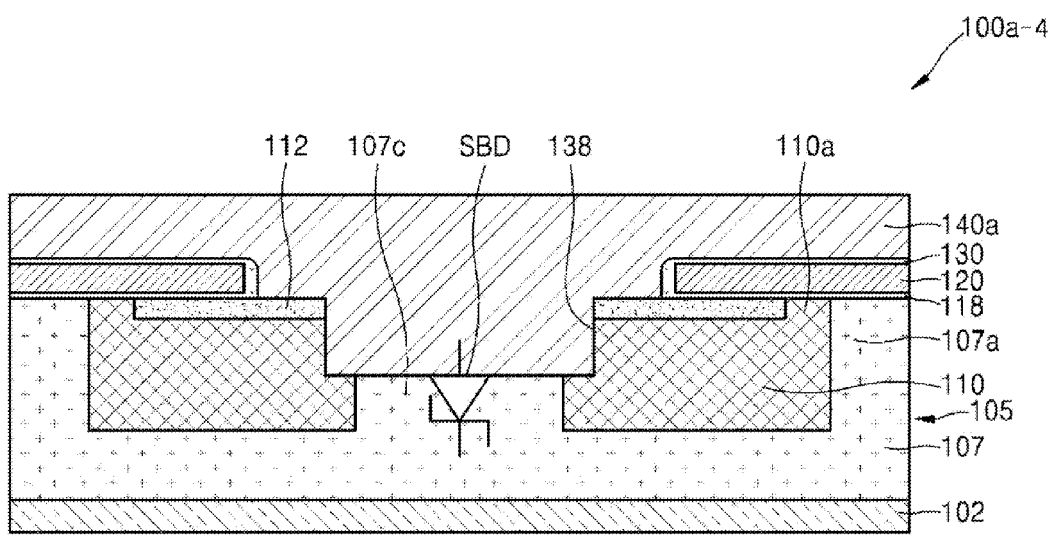

FIGS. 42 and 43 are cross-sectional views illustrating a power semiconductor device 100a-4 according to another embodiment of the present disclosure. The power semiconductor device 100a-4 according to the embodiment may be implemented by modifying a partial configuration of the power semiconductor device 100-4 of FIGS. 38 to 41, and thus, additional description will be omitted to avoid redundancy.

Referring to FIGS. 42 and 43, the power semiconductor device 100a-4 may include at least one groove 138 formed by etching a part of the drift region 107, for example, the protruding portion 107c, a part of the source region 112, and a part of the well region 110. For example, the groove 138 may be formed by etching the source contact region 112a in the power semiconductor device 100-4 of FIGS. 38 to 41.

The well contact region 114a may be formed on a part of the well region 110 exposed from the groove 138. For example, the well contact region 114a may be formed on a part of the well region 110, which corresponds to a bottom surface of the groove 138. The well contact region 114a may have the second conductivity type and may be doped more highly than the well contact region 114.

The source electrode layer 140a may be formed to fill the groove 138 and may in common contact the well contact region 114a, the protruding portion 107c of the drift region 107, and the source region 112 within the groove 138. The contact of the source electrode layer 140 with the protruding portion 107c of the drift region 107 may form the Schottky barrier diode SBD.

The above structure may widen the area where the source electrode layer 140a is in contact with the source region 112 and the well contact region 114a, such that contact resistances therebetween decrease.

In some embodiments, the well contact region 114a may be formed on the whole surface of the well region 110 exposed by the groove 138. Accordingly, the well contact region 114a may be formed on the well region 110 exposed from a bottom surface and a side wall of the groove 138. The above structure of the well contact region 114a may allow the contact resistance between the source electrode layer 140a and the well region 110 to further decrease.

Figure 44:
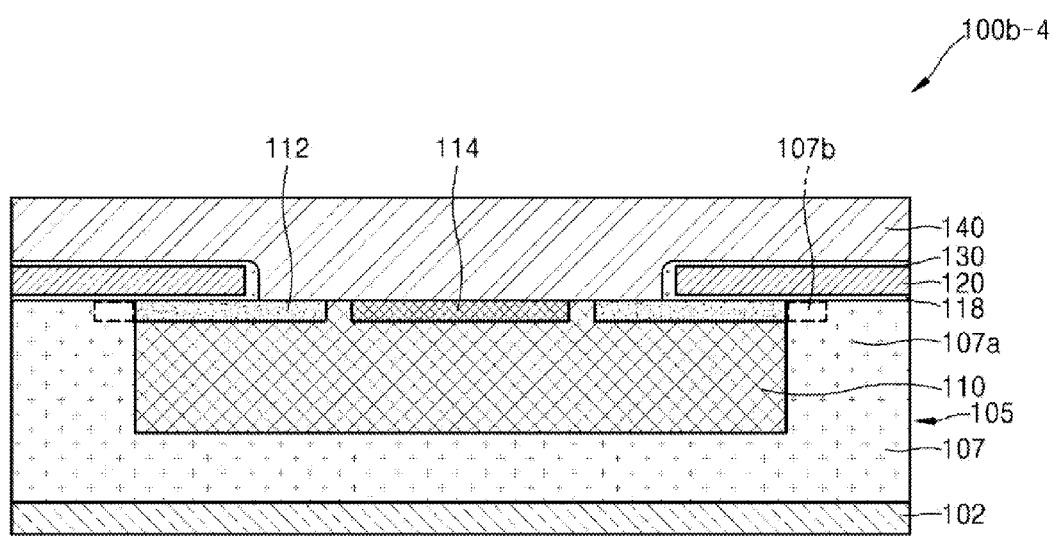
FIG. 44 is a schematic cross-sectional view illustrating a power semiconductor device according to another embodiment of the present disclosure.

FIG. 44 is a schematic cross-sectional view illustrating a power semiconductor device 100b-4 according to another embodiment of the present disclosure. The power semiconductor device 100b-4 according to the embodiment may be implemented by modifying a partial configuration of the power semiconductor device 100-4 of FIGS. 38 to 41, and thus, additional description will be omitted to avoid redundancy.

Referring to FIG. 44, the power semiconductor device 100b-4 may include the channel region 107b forming the accumulation channel, instead of the channel region 110a of the power semiconductor device 100-4 of FIGS. 38 to 41.

In the power semiconductor device 100b-4, the channel region 107b may be formed in the semiconductor layer 105 between the drift region 107 and the source region 112. For example, the channel region 107b may have the first conductivity type, and the accumulation channel may be formed therein in an operation of the power semiconductor device 100b-4.

For example, the channel region 107b may be formed in the semiconductor layer 105 between the source region 112 and the vertical portion 107a of the drift region 107. The channel region 107b may have the same doping type as the source region 112 and the drift region 107.

In this case, the source region 112, the channel region 107b, and the drift region 107 may be normally electrically connected. However, in the structure of the semiconductor layer 105 of silicon carbide, a potential barrier is formed while a band of the channel region 107b is upwardly bent due to the influence of a negative charge generated by the formation of a carbon cluster in the gate insulating layer 118. As such, there may be formed the accumulation channel that permits a charge or current flow in the channel region 107b only when an operating voltage is applied to the gate electrode layer 120.

Accordingly, a threshold voltage to be applied to the gate electrode layer 120 to form the accumulation channel in the channel region 107b may be considerably lower than a threshold voltage to be applied to the gate electrode layer 120 to form the inversion channel of the channel region 110a of FIGS. 38 to 41.

In some embodiments, the channel region 107b may be a part of the drift region 107. In more detail, the channel region 107b may be a part of the vertical portions 107a of the drift region 107. For example, the channel region 107b may be integrally formed with the drift region 107. In this case, the drift region 107 may be connected with the source region 112 through the channel region 107b. That is, at a channel region (107b) part, the drift region 107 and the source region 112 may be in contact with each other.

A doping concentration of the first conductivity-type impurities of the channel region 107b may be the same as that of the remaining portion of the drift region 107 or may be different therefrom for the adjustment of a threshold voltage.

As a modified example of the embodiment, the well region 110 may be formed to protrude toward the vertical portion 107a of the drift region 107 father than a part of the source region 112, and the channel region 107b may be formed in the semiconductor layer 105 on the protruding portion of the well region 110.

In addition, the well region 110 may further include a tap portion extending toward the gate electrode layer 120 at an end part of the protruding portion. The channel region 107b may be formed on the protruding portion and the tap portion of the well region 110 in a bent shape.

Additionally, the vertical portion 107a of the drift region 107 may further extend to between a lower part of the source region 112 and the well region 110. In this case, the channel region 107b may be formed to further extend to between the lower part of the source region 112 and the well region 110.

The above structures may allow the channel region 107b to be more restricted between the gate electrode layer 120 and the well region 110.

The power semiconductor device 100b-4 may include the advantages of the power semiconductor device 100-4 of FIGS. 38 to 41, and additionally, may make a threshold voltage low.

Figure 45:
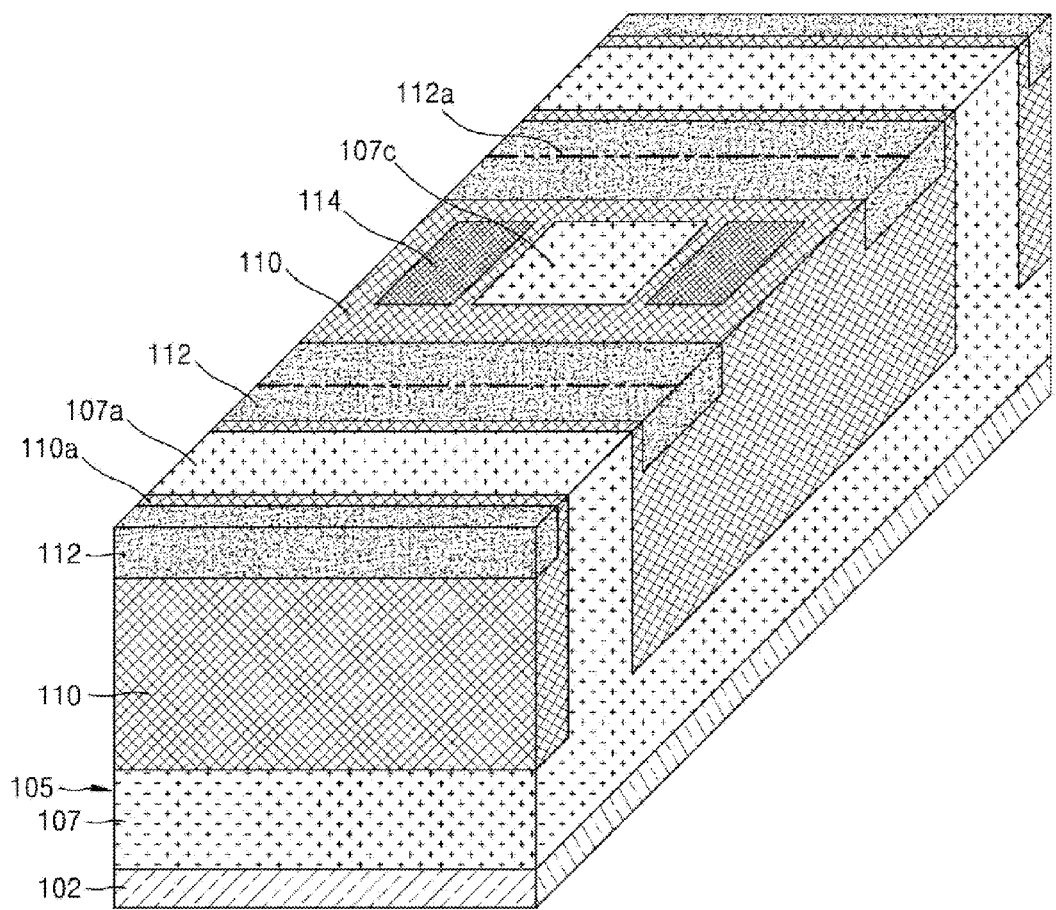
FIGS. 45 to 47 are schematic perspective views illustrating a method of fabricating a power semiconductor device according to an embodiment of the present disclosure.
Figure 46:
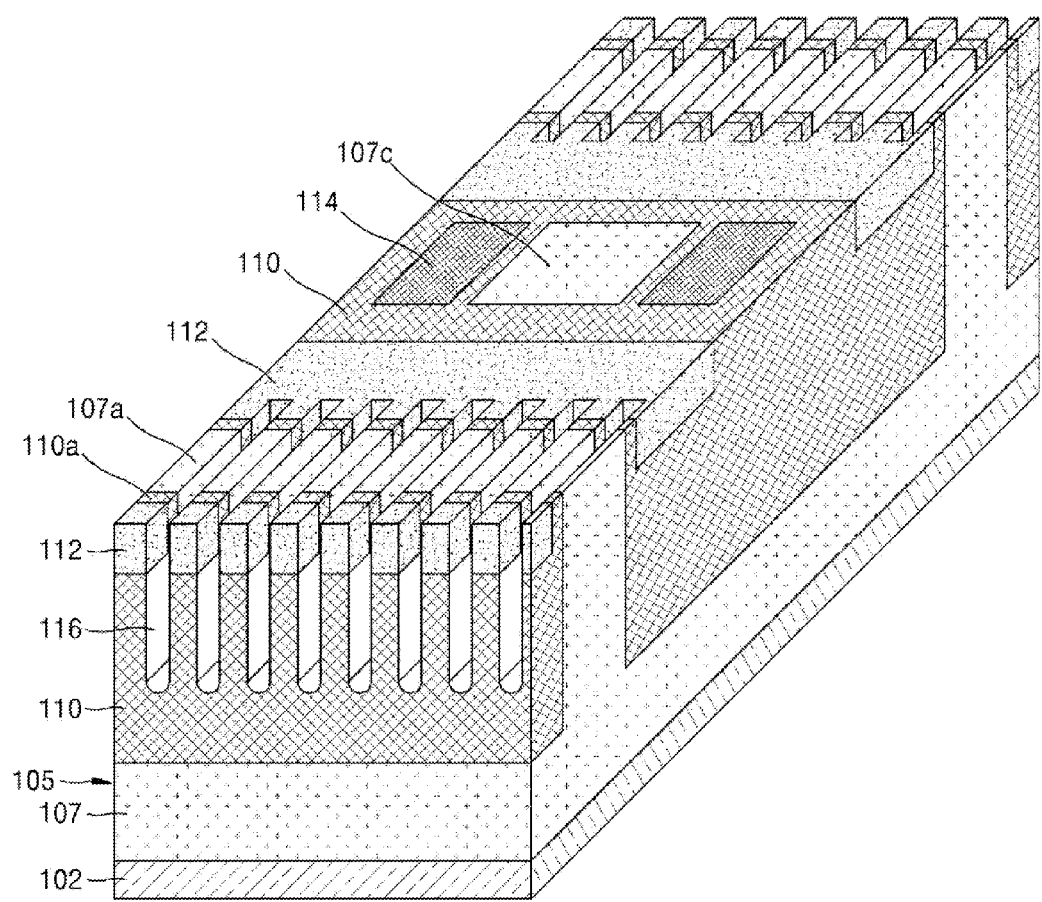
Figure 47:
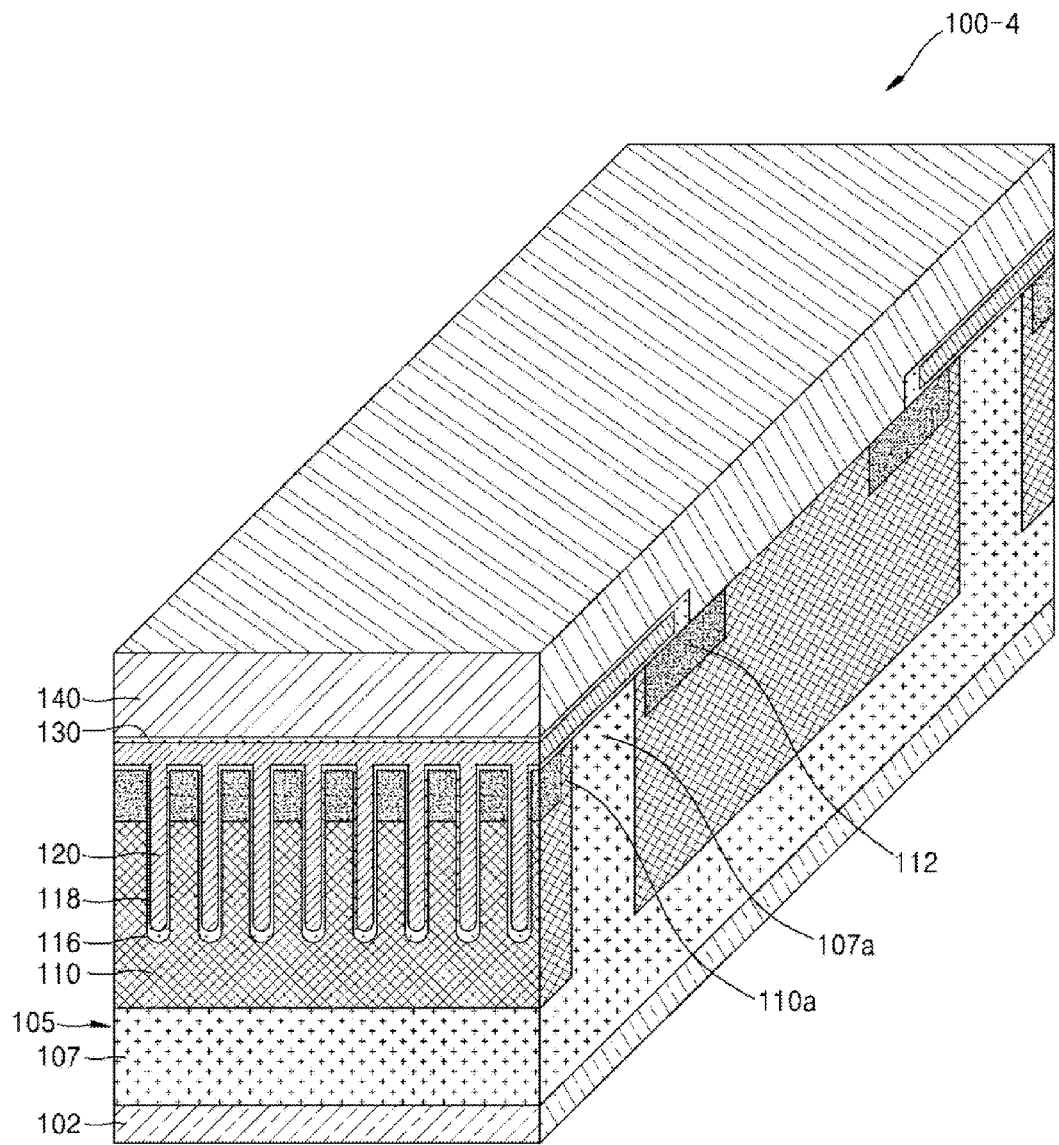

FIGS. 45 to 47 are schematic perspective views illustrating a method of fabricating the power semiconductor device 100-4 according to an embodiment of the present disclosure.

Referring to FIG. 45, the drift region 107 having the first conductivity type may be formed in the semiconductor layer 105 of silicon carbide (SiC). For example, the drift region 107 may be formed on the drain region 102 having the first conductivity type. In some embodiments, the drain region 102 may be implemented with a substrate of the first conductivity type, and the drift region 107 may be formed on the substrate with one or more epitaxial layers.

Next, the well region 110 having the second conductivity type may be formed in the semiconductor layer 105 so as to be in contact with the drift region 107. For example, the forming of the well region 110 may be performed by implanting impurities of the second conductivity type into the semiconductor layer 105.

For example, the well region 110 may be formed in the semiconductor layer 105 such that the drift region 107 includes the vertical portion 107a, at least a part of which is surrounded by the well region 110. In more detail, the well region 110 may be formed by doping impurities of a conductivity type opposite to that of the drift region 107 in the drift region 107.

Then, the source region 112 having the first conductivity type may be formed in the well region 110. For example, source region 112 may be formed by implanting impurities of the first conductivity type into the well region 110.

In addition to the formation of the source region 112, the channel region 110a where an inversion channel is formed along one direction may be formed in the semiconductor layer 105 between the source region 112 and the drift region 107. The channel region 110a may be formed between the source region 112 and the vertical portion 107a of the drift region 107. For example, the channel region 110a may be a part of the well region 110 and may be formed by implanting impurities of the second conductivity type into the semiconductor layer 105.

In addition, when the source region 112 is formed, the source contact region 112a that includes a part of the source region 112, a part of the well region 110, and a protruding portion 107c of the drift region 107 exposed from the well region 110 may be formed at least outside one end of the gate electrode layer 120.

Also, the well contact region 114 that has the second conductivity type and is doped more highly than the well region 110 may be formed on a part of the well region 110. For example, the well contact region 114 may be formed by implanting the second conductivity-type impurities of a higher concentration than the well region 110, into a part of the well region 110.

In steps described above, the impurity implantation or the impurity doping may be performed such that the impurities are mixed when the impurities are implanted into the semiconductor layer 105 or an epitaxial layer is formed. However, an ion implantation method using a mask pattern may be used for implantation of the impurities in a selective region.

Optionally, a heat treatment process for activating or diffusing the impurities may be performed after the ion implantation.

Referring to FIG. 46, at least one trench 116 may be formed to be recessed into the semiconductor layer 105 from the surface of the semiconductor layer 105 as much as a given depth. For example, the at least one trench 116 may have a predetermined depth from the surface (e.g., an upper surface) of the semiconductor layer 105.

For example, the trench 116 may extend across the drift region 107 in one direction and may be formed to be shallower than the well region 110.

In addition, the at least one trench 116 may include a plurality of trenches 116, and the trenches 116 may be simultaneously formed in the semiconductor layer 105 in parallel in one direction, for example. The channel region 110a may be further restricted by the trenches 116.

For example, the trenches 116 may be formed by forming a photo mask by using photo lithography and then etching the semiconductor layer 105 by using the photo mask as an etching protection layer.

In some embodiments, the trenches 116 may be arranged to be spaced from each other in line along one direction. In addition, the well region 110, the channel region 110a, and the source region 112 may be formed in the semiconductor layer 105 between the trenches 116.

Referring to FIG. 47, the gate insulating layer 118 may be formed at least on the inner walls of the trenches 116. For example, the gate insulating layer 118 may be formed by oxidizing the semiconductor layer 105 to form an oxide or by depositing an insulating material such as oxide or nitride on the semiconductor layer 105.

Afterwards, the gate electrode layers 120 may be formed on the gate insulating layer 118 so as to be disposed in the trenches 116. For example, the gate electrode layer 120 may be formed by forming a conductive layer on the gate insulating layer 118 and patterning the conductive layer. The gate electrode layer 120 may be formed by doping impurities in polysilicon or may be formed to include a conductive metal or metal silicide.

A patterning process may be performed by using photo lithography and etching processes. The photo lithography process may include a process of forming a photoresist pattern as a mask layer by using a photo process and a development process, and the etching process may include a process of selectively etching an underlying structure by using the photoresist pattern.

As such, the well region 110 may be disposed to be deeper than the gate electrode layer 120 so as to surround the bottom surface of the gate electrode layer 120 at one end of the gate electrode layer 120, and the channel region 110a may be formed in the semiconductor layer 105 of one side or opposite sides of the gate electrode layer 120 between the drift region 107 and the source region 112.

Afterwards, the interlayer insulating layer 130 may be formed on the gate electrode layer 120.

Afterwards, the source electrode layer 140 may be formed on the interlayer insulating layer 130. For example, the source electrode layer 140 may be formed by forming a conductive layer, for example, a metal layer on the interlayer insulating layer 130 and patterning the conductive layer.

For example, the source electrode layer 140 may be connected with the source region 112 and may be in contact with a part of the drift region 107, and thus, the Schottky barrier diode SBD may be formed. In some embodiments, the source electrode layer 140 may be connected with the source contact region 112a so as to be in contact with the source region 112, the well contact region 114, and the protruding portion 107c of the drift region 107 in common.

The power semiconductor device 100a-4 of FIGS. 42 and 43 may be fabricated by adding some processes to the method of fabricating the power semiconductor device 100-4 described above or changing or modifying the fabricating method. For example, the method of fabricating the power semiconductor device 100a-4 may further include forming at least one groove 138 by etching a part of the drift region 107, for example, the protruding portion 107a of the drift region 107, a part of the source region 112, and a part of the well region 110, forming the well contact region 114 on a part of the well region 110 corresponding to a bottom surface of the groove 138, and forming the source electrode layer 140 by filling the groove 138 so as to be connected with the source region 112, the protruding portion 107c of the drift region 107, and the well contact region 114.

Meanwhile, the power semiconductor device 100b-4 of FIG. 44 may be fabricated by adding some processes to the method of fabricating the power semiconductor device 100-4 described above or changing or modifying the fabricating method. For example, the channel region 107b may be formed with a part of the drift region 107 so as to form the accumulation channel.

According to the above fabricating method, the power semiconductor device 100-4 using the semiconductor layer 105 of silicon carbide may be economically fabricated by using processes that are applied to a conventional silicon substrate.

Figure 49:
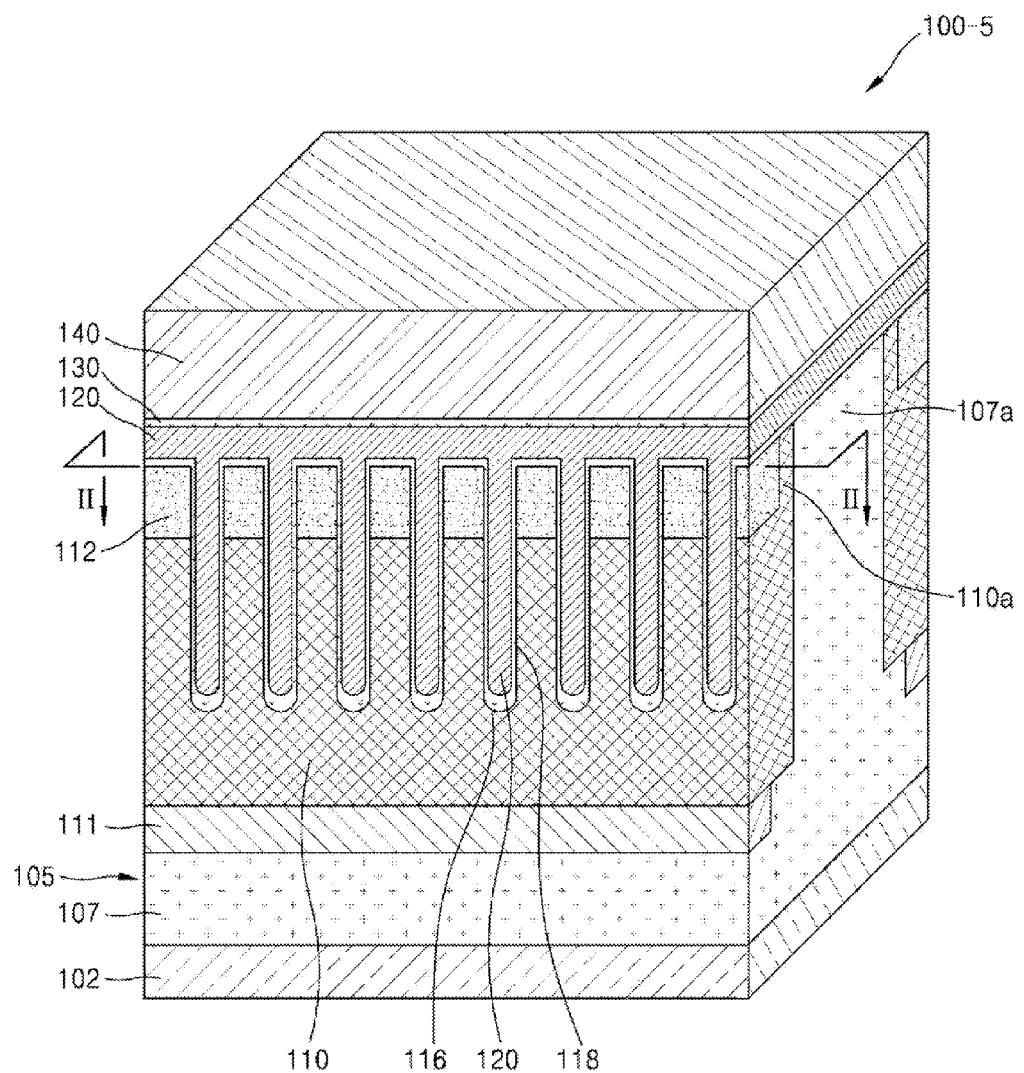
FIG. 49 is a schematic perspective view illustrating a power semiconductor device according to an embodiment of the present disclosure.
Figure 50:
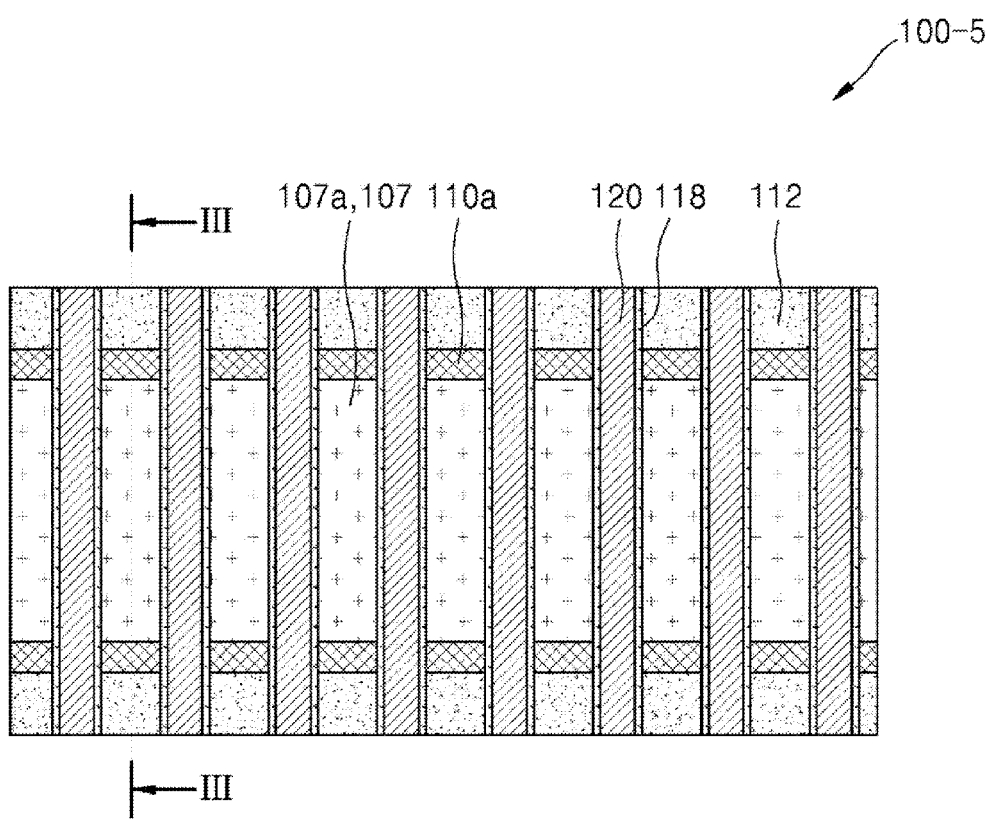
FIG. 50 is a plan view illustrating a power semiconductor device taken along line II-II of FIG. 49.
Figure 51:
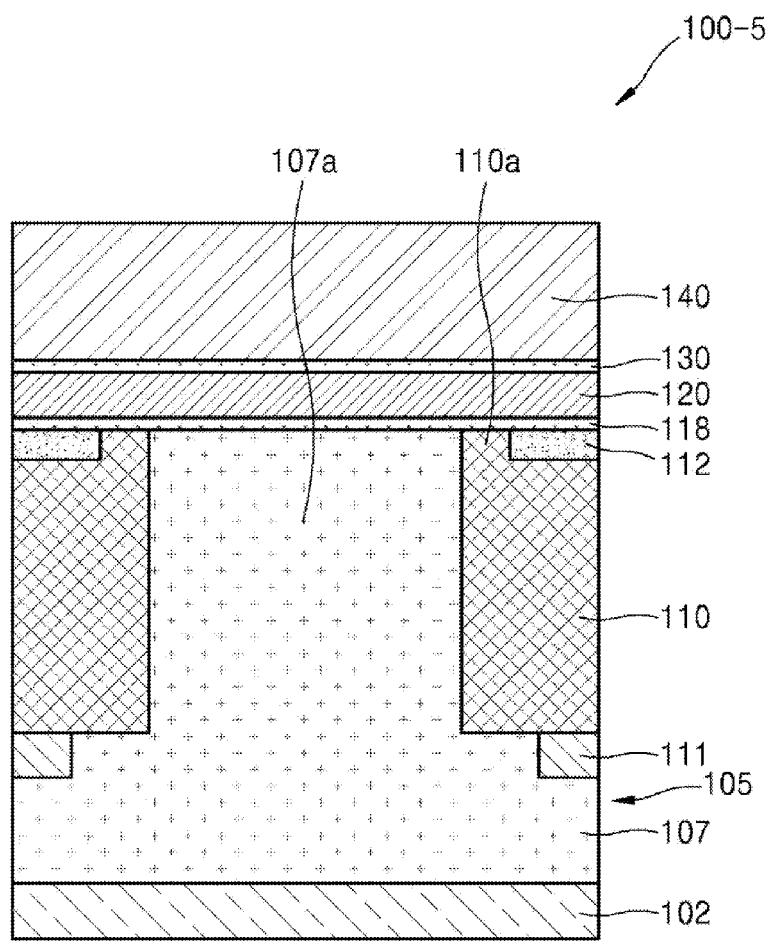
FIG. 51 is a cross-sectional view illustrating a power semiconductor device taken along line III-III of FIG. 50.

FIG. 49 is a schematic perspective view illustrating a power semiconductor device 100-5 according to an embodiment of the present disclosure, FIG. 50 is a plan view illustrating the power semiconductor device 100-5 taken along line II-II of FIG. 49, and FIG. 51 is a cross-sectional view illustrating the power semiconductor device 100-5 taken along line III-III of FIG. 50.

Referring to FIGS. 49 to 51, the power semiconductor device 100-5 may at least include the semiconductor layer 105, the gate insulating layer 118, and the gate electrode layer 120. For example, the power semiconductor device 100-5 may have a power MOSFET structure.

The semiconductor layer 105 may refer to one semiconductor material layer or a plurality of semiconductor material layers, for example, may refer to one epitaxial layer or a plurality of epitaxial layers. In addition, the semiconductor layer 105 may refer to one or multiple epitaxial layers on a semiconductor substrate.

For example, the semiconductor layer 105 may be formed of silicon carbide (SiC). In more detail, the semiconductor layer 105 may include at least one epitaxial layer of silicon carbide.

Silicon carbide (SiC) may have a bandgap wider than silicon, thus maintaining stability even at a high temperature compared to silicon. In addition, because a breakdown electric field of the silicon carbide is higher than that of the silicon, the silicon carbide may stably operate even at a high temperature. Accordingly, the power semiconductor device 100-5 including the semiconductor layer 105 formed of silicon carbide may have a high breakdown voltage compared to the case of using silicon and may provide an excellent heat release characteristic and a stable operating characteristic at a high temperature.

In more detail, the semiconductor layer 105 may include the drift region 107. The drift region 107 may have the first conductivity type and may be formed by implanting impurities of the first conductivity type into a part of the semiconductor layer 105. For example, the drift region 107 may be formed by doping impurities of the first conductivity type in an epitaxial layer of silicon carbide.

The well region 110 may be formed in the semiconductor layer 105 to be in contact with the drift region 107 and may have the second conductivity type. For example, the well region 110 may be formed by doping impurities of the second conductivity type opposite to the first conductivity type in the drift region 107.

For example, the well region 110 may be formed to surround at least a part of the drift region 107. As such, the drift region 107 may include the vertical portion 107a, at least a part of which is surrounded by the well region 110. In an operation of the power semiconductor device 100-5, the vertical portion 107a may provide a vertical movement path of charges.

The well region 110 is illustrated in FIG. 49 as including two regions spaced from each other and the vertical portion 107a interposed therebetween, but the well region 110 may be variously changed or modified. For example, the vertical portion 107a may have a shape whose side surface is surrounded by the well region 110 once.

The deep well region 111 may be formed under the well region 110 to be in contact with the well region 110 and the drift region 107. Like the well region 110, the deep well region 111 may have the second conductivity type. A doping concentration of second conductivity-type impurities of the deep well region 111 may be the same as or lower than a doping concentration of second conductivity-type impurities of the well region 110.

For example, the deep well region 111 may be formed to have a width narrower than a width of the well region 110 on the basis of one direction. One direction may refer to a direction of line III-III of FIG. 50. In addition, opposite ends of the deep well region 111 may be disposed to be inwardly shifted from opposite ends of the well region 110 on the basis of one direction.

As such, under the well region 110, the deep well region 111 may be disposed to inwardly go back from the opposite ends of the well region 110 in a state of being in contact with the well region 110. A side surface and a lower surface of the deep well region 111 may be in contact with the drift region 107.

For example, when the deep well region 111 is formed in two regions spaced from each other like the well region 110, a separation distance between two deep well regions 111 may be greater than a separation distance between two well regions 110.

The source region 112 may be formed in the well region 110 and may have the first conductivity type. For example, the source region 112 may be formed by doping impurities of the first conductivity type in the well region 110. The concentration of the first conductivity-type impurities doped in the source region 112 may be higher than that doped in the drift region 107.

The channel region 110a may be formed in the semiconductor layer 105 between the drift region 107 and the source region 112. For example, the channel region 110a may have the second conductivity type, and an inversion channel may be formed therein along one direction in an operation of the power semiconductor device 100-5.

Because the channel region 110a has a doping type opposite to that of the source region 112 and the drift region 107, the channel region 110a may form a diode junction with the source region 112 and the drift region 107. Accordingly, the channel region 110a may not permit charges to move in a normal situation; however, when an operating voltage is applied to the gate electrode layer 120, an inversion channel may be formed therein such that the movement of charges is permitted.

In some embodiments, the channel region 110a may be a part of the well region 110. In this case, the channel region 110a may be integrally formed to be continuously connected with the well region 110. A doping concentration of the second conductivity-type impurities of the channel region 110a may be the same as that of the remaining portion of the well region 110 or may be different therefrom for the adjustment of a threshold voltage.

In some embodiments, the well region 110, the deep well region 111, the channel region 110a, and the source region 112 may be formed to be symmetrical with respect to the vertical portion 107a of the drift region 107. For example, the well region 110, the deep well region 111, the channel region 110a, and the source region 112 may be formed at opposite ends of the vertical portion 107a of the drift region 107, or each of the well region 110, the deep well region 111, the channel region 110a, and the source region 112 may include a first part and a second part formed to be symmetrical with respect to the vertical portion 107a of the drift region 107. In each of the well region 110, the deep well region 111, the channel region 110a, and the source region 112, the first part and the second part may be separated from each other or may be connected to each other.

In addition, the drain region 102 may be formed in the semiconductor layer 105 under the drift region 107 and may have the first conductivity type. For example, the drain region 102 may be doped with impurities of a high concentration compared to the drift region 107.

In some embodiments, the drain region 102 may be implemented with a substrate of silicon carbide having the first conductivity type. In this case, the drain region 102 may be understood as a part of the semiconductor layer 105 or may be understood as a substrate independent of the semiconductor layer 105.

At least one trench 116 may be formed to be recessed into the semiconductor layer 105 from a surface of the semiconductor layer 105 as much as a given depth. For example, the at least one trench 116 may have a predetermined depth from the surface (e.g., an upper surface) of the semiconductor layer 105. The trench 116 may extend in one direction within the semiconductor layer 105. One direction may refer to a length direction, not a depth direction of the trench 116, and may refer to a direction of line III-III of FIG. 50.

The gate insulating layer 118 may be formed at least on an inner wall of the trench 116. For example, the gate insulating layer 118 may be formed on an inner surface of the trench 116 and on the semiconductor layer 105 outside the trench 116. A thickness of the gate insulating layer 118 may be uniform, or a part of the gate insulating layer 118 formed on the bottom surface of the trench 116 may be thicker than a part of the gate insulating layer 118 formed on a side wall of the trench 116 such that an electric field decreases at a bottom part of the trench 116.

For example, the gate insulating layer 118 may include an insulating material such as silicon oxide, silicon carbide oxide, silicon nitride, hafnium oxide, zirconium oxide, or aluminum oxide, or may include a stacked structure thereof.

At least one gate electrode layer 120 may be formed on the gate insulating layer 118 so as to be disposed in the trench 116. For example, the gate electrode layer 120 may include an appropriate conductive material such as polysilicon, metal, metal nitride, or metal silicide, or may include a stacked structure thereof.

The drift region 107 may be formed in the semiconductor layer 105 on one side of the gate electrode layer 120. For example, the vertical portion 107a of the drift region 107 may vertically extend in the semiconductor layer 105 of one side of the gate electrode layer 120. The channel region 110a may be formed in the semiconductor layer 105 of one side of the gate electrode layer 120 between the vertical portion 107a of the drift region 107 and the source region 112. Accordingly, the semiconductor layer 105 of the one side of the gate electrode layer 120 may include a structure in which the source region 112, the channel region 110a, and the vertical portion 107a of the drift region 107 are connected along one direction.

In some embodiments, the drift region 107 may be formed in the semiconductor layer 105 on opposite sides of the gate electrode layer 120. For example, the drift region 107 may include the vertical portions 107a that vertically extend in the semiconductor layer 105 of opposite sides of the gate electrode layer 120. The channel region 110a may be formed in the semiconductor layer 105 of opposite sides of the gate electrode layer 120 between the vertical portions 107a of the drift region 107 and the source region 112.

The above structure of the channel region 110a may be called a "lateral channel structure" in that the channel region 110a is formed along a side wall of the gate electrode layer 120.

The well region 110 may be formed to be deeper than the gate electrode layer 120, so as to surround the bottom surface of the gate electrode layer 120 at one end of the gate electrode layer 120. In addition, the well region 110 may be formed to be deeper than the gate electrode layer 120, so as to surround the bottom surface of the gate electrode layer 120 at opposite ends of the gate electrode layer 120. As such, opposite end parts of the gate electrode layer 120 around the source region 112 may be surrounded by the well region 110.

This well (110) structure may more alleviate the concentration of an electric field on the bottom surface of the trench 116, that is, at a lower part of the gate electrode layer 120. In addition, the deep well region 111 may be disposed under the well region 110, thus more reducing an electric field across the gate insulating layer 118 as well as an electric field of the bottom surface of the trench 116. As such, a margin of an electric field across the gate insulating layer 118 of the power semiconductor device 100-5 may increase, and thus, the reliability of operation of the power semiconductor device 100-5 may be improved. In addition, it is possible to reduce a junction resistance of the vertical portion 107a of the drift region 107 by decreasing an electric field of the bottom surface of the trench 116 and decreasing an electric field across the gate insulating layer 118.

In some embodiments, the gate insulating layer 118 and the gate electrode layer 120 may be formed in the trench 116, and in addition, may be formed to further extend to the outside of the trench 116.

In some embodiments, one trench 116 or a plurality of trenches 116 may be provided in the semiconductor layer 105. The number of trenches 116 may be appropriately selected without limiting the scope of the embodiment.

For example, the plurality of trenches 116 may be formed in the semiconductor layer 105 in parallel along one direction. As the trenches 116 extend in one direction and are spaced from each other in a direction perpendicular to the one direction, the trenches 116 may be arranged in parallel.

In this case, a plurality of gate electrode layers 120 may be formed on the gate insulating layer 118 so as to fill the inside of the trenches 116. As such, the gate electrode layers 120 may be formed in the semiconductor layer 105 in a trench type and may be arranged to extend in parallel in the one direction like the trenches 116.

In addition, each of the well region 110 and the source region 112 may extend across the gate electrode layers 120. The vertical portions 107a of the drift region 107 may be arranged in the semiconductor layer 105 between the gate electrode layers 120. The channel region 110a may be formed in the semiconductor layer 105 between the source region 112 and the vertical portions 107a of the drift region 107 on one side or opposite sides of each of the gate electrode layers 120.

In some embodiments, the well region 110 may be formed in the semiconductor layer 105 to be deeper than the gate electrode layers 120, so as to be in contact with the vertical portions 107a of the drift region 107 and to surround the bottom surface of the gate electrode layers 120 at opposite ends of the gate electrode layers 120.

The interlayer insulating layer 130 may be formed on the gate electrode layer 120. For example, the interlayer insulating layer 130 may include an appropriate insulating material such as oxide or nitride, or may include a stacked structure thereof.

The source electrode layer 140 may be formed on the interlayer insulating layer 130 and may be connected with the source region 112. For example, the source electrode layer 140 may be formed of an appropriate conductive material, metal, etc.

In the power semiconductor device 100-5 described above, the first conductivity type and the second conductivity type may be opposite to each other, and each of the first conductivity type and the second conductivity type may be one of n-type and p-type. For example, when the first conductivity type is n-type, the second conductivity type is p-type, and vice versa.

In more detail, when the power semiconductor device 100-5 is an N-type MOSFET, the drift region 107 may be an N-region, the source region 112 and the drain region 102 may be N+ regions, and the well region 110, the deep well region 111, and the channel region 110a may be P- regions.

In an operation of the power semiconductor device 100-5, a current may generally flow in a vertical direction from the drain region 102 along the vertical portions 107a of the drift region 107, and may then flow through the channel region 110a to the source region 112 along the side surfaces of the gate electrode layers 120.

In the power semiconductor device 100-5 described above, the gate electrode layers 120 in the trenches 116 may be densely arranged in parallel in a stripe type or a line type, and the channel regions 110a may be disposed on the side surfaces of the gate electrode layers 120. As such, a channel density may increase.

Figure 52:
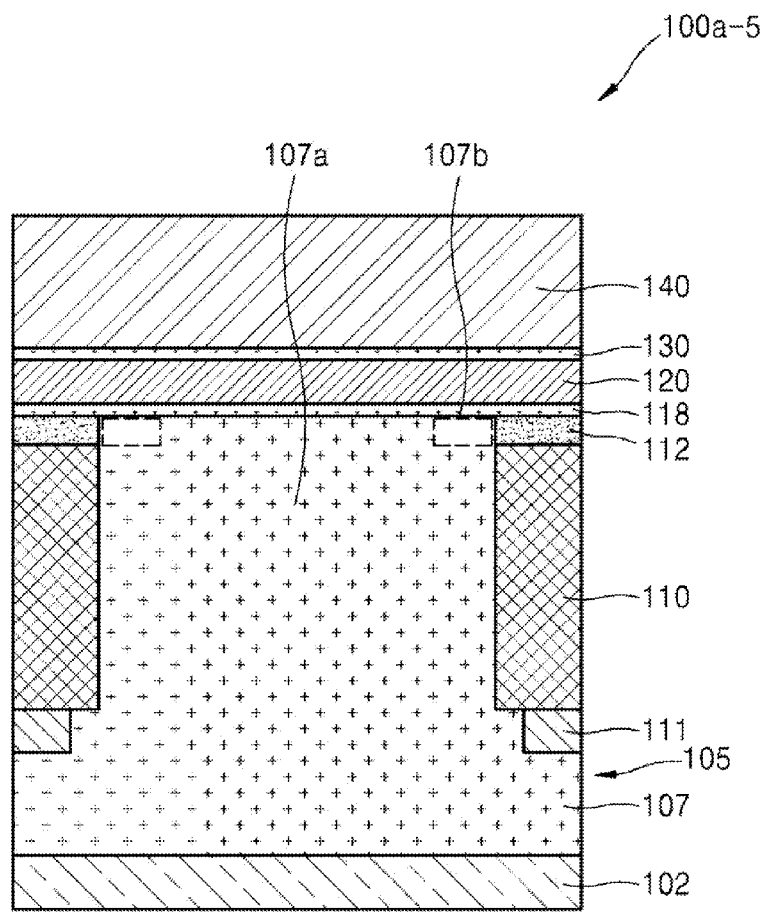
FIG. 52 is a perspective view illustrating a power semiconductor device according to another embodiment of the present disclosure.

FIG. 52 is a perspective view illustrating a power semiconductor device 100a-5 according to another embodiment of the present disclosure.

The power semiconductor device 100a-5 according to the embodiment may be implemented by using or partially modifying the power semiconductor device 100-5 of FIGS. 49 to 51, and thus, additional description will be omitted to avoid redundancy.

Referring to FIG. 52, in the power semiconductor device 100a-5, the channel region 107b may be formed in the semiconductor layer 105 between the drift region 107 and the source region 112. For example, the channel region 107b may have the first conductivity type, and the accumulation channel may be formed therein in an operation of the power semiconductor device 100a-5.

For example, the channel region 107b may be formed in the semiconductor layer 105 between the source region 112 and the vertical portion 107a of the drift region 107. The channel region 107b may have the same doping type as the source region 112 and the drift region 107.

In this case, the source region 112, the channel region 107b, and the drift region 107 may be normally electrically connected. However, in the structure of the semiconductor layer 105 of silicon carbide, a potential barrier is formed while a band of the channel region 107b is upwardly bent due to the influence of a negative charge generated by the formation of a carbon cluster in the gate insulating layer 118. As such, there may be formed the accumulation channel that permits a charge or current flow in the channel region 107b only when an operating voltage is applied to the gate electrode layer 120.

Accordingly, a threshold voltage to be applied to the gate electrode layer 120 to form the accumulation channel in the channel region 107b may be considerably lower than a threshold voltage to be applied to the gate electrode layer 120 to form the inversion channel of the channel region 110a of FIGS. 49 to 51.

In some embodiments, the channel region 107b may be a part of the drift region 107. In more detail, the channel region 107b may be a part of the vertical portions 107a of the drift region 107. For example, the channel region 107b may be integrally formed with the drift region 107. In this case, the drift region 107 may be connected with the source region 112 through the channel region 107b. That is, at a channel region (107b) part, the drift region 107 and the source region 112 may be in contact with each other.

A doping concentration of the first conductivity-type impurities of the channel region 107b may be the same as that of the remaining portion of the drift region 107 or may be different therefrom for the adjustment of a threshold voltage.

As a modified example of the embodiment, the well region 110 may be formed to protrude toward the vertical portion 107a of the drift region 107 father than a part of the source region 112, and the channel region 107b may be formed in the semiconductor layer 105 on the protruding portion of the well region 110.

In addition, the well region 110 may further include a tap portion extending toward the gate electrode layer 120 at an end part of the protruding portion. The channel region 107b may be formed on the protruding portion and the tap portion of the well region 110 in a bent shape.

Additionally, the vertical portion 107a of the drift region 107 may further extend to between a lower part of the source region 112 and the well region 110. In this case, the channel region 107b may be formed to further extend to between the lower part of the source region 112 and the well region 110.

The above structures may allow the channel region 107b to be more restricted between the gate electrode layer 120 and the well region 110.

The power semiconductor device 100a-5 may include the advantages of the power semiconductor device 100-5 of FIGS. 49 to 51, and additionally, may make a threshold voltage low.

Figure 53:
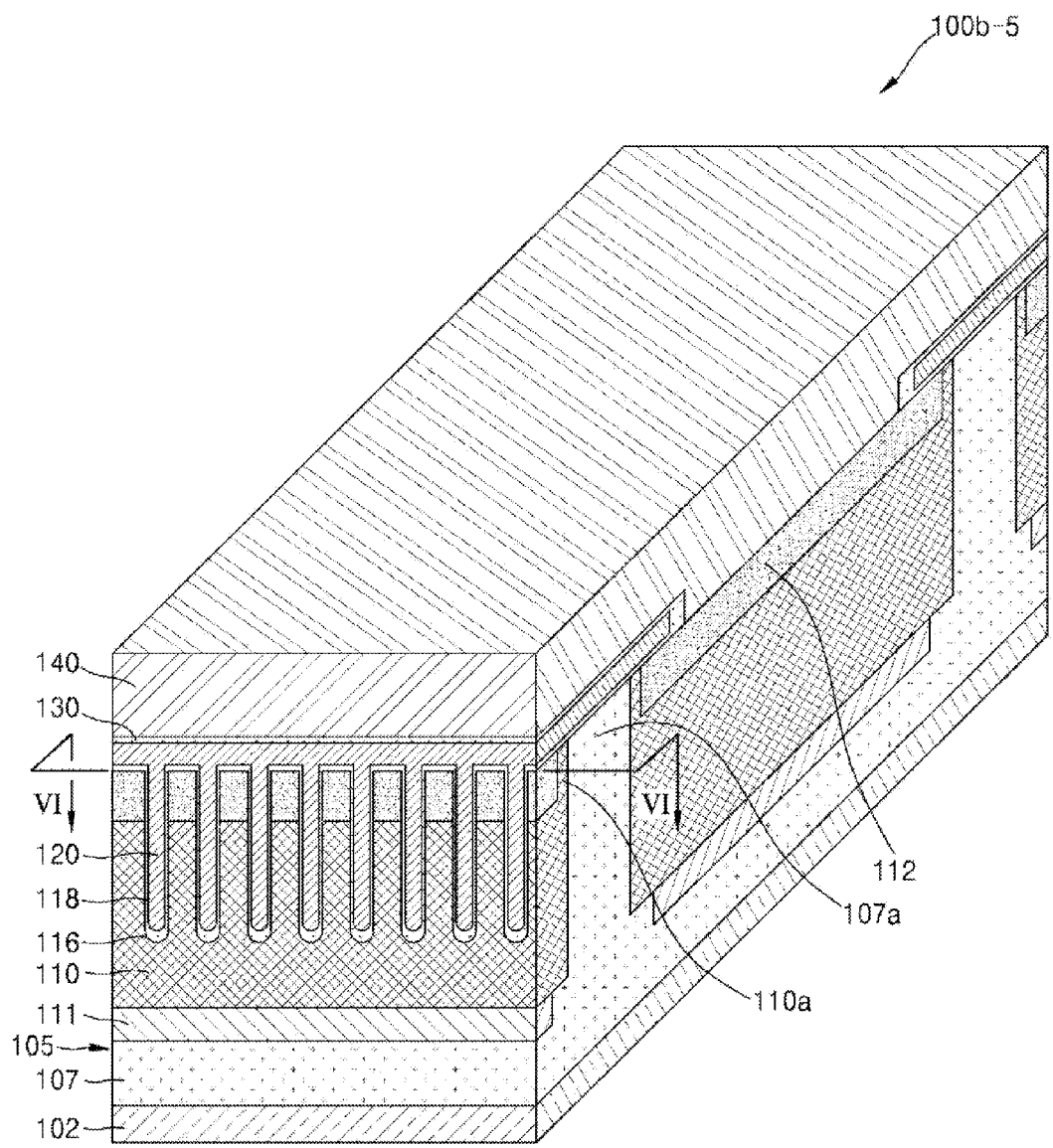
FIG. 53 is a schematic perspective view illustrating a power semiconductor device according to another embodiment of the present disclosure.
Figure 54:
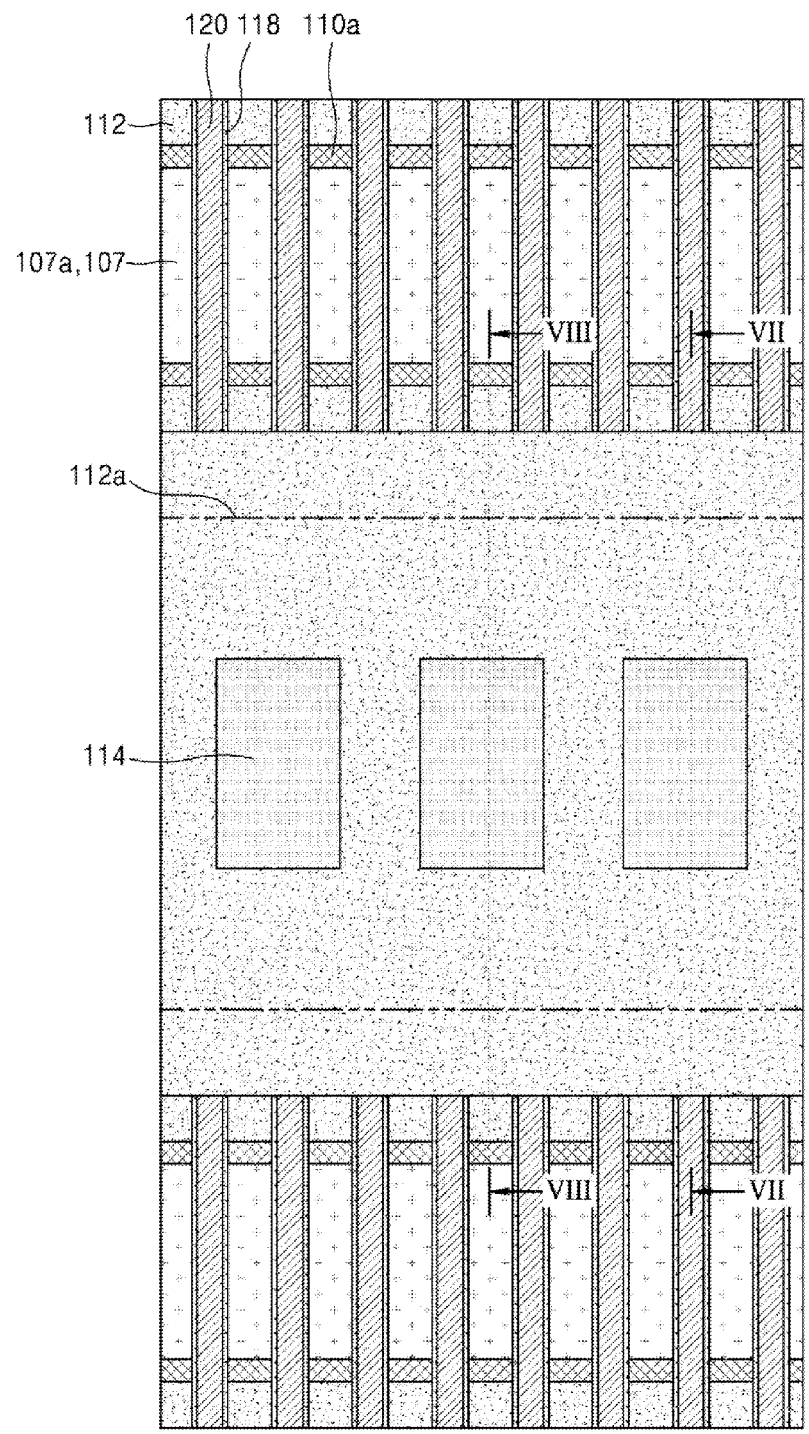
FIG. 54 is a plan view illustrating a power semiconductor device taken along line VI-VI of FIG. 53.
Figure 55:
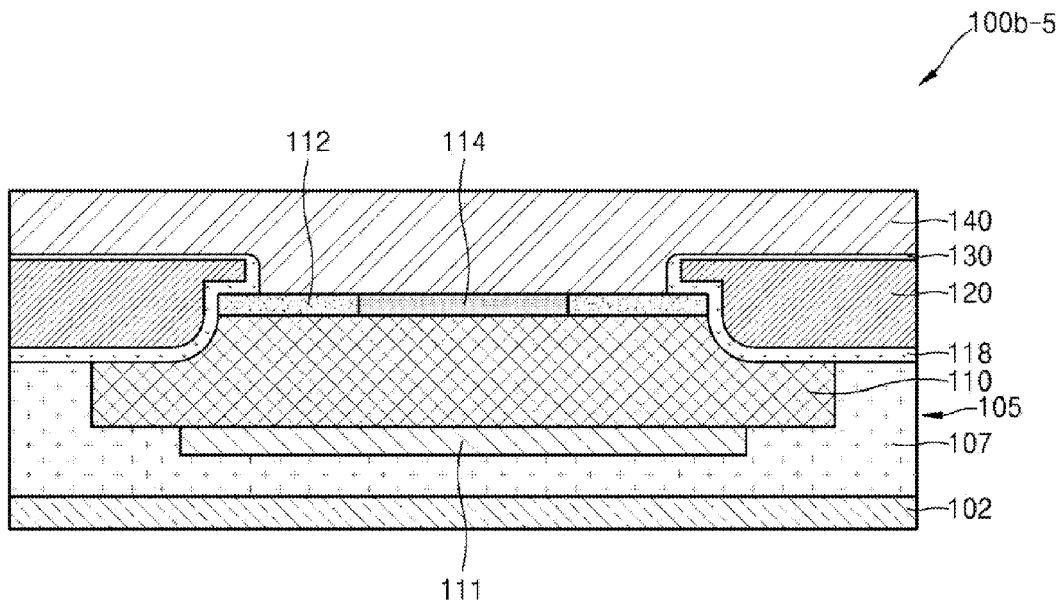
FIG. 55 is a cross-sectional view illustrating a power semiconductor device taken along line VII-VII of FIG. 54.
Figure 56:
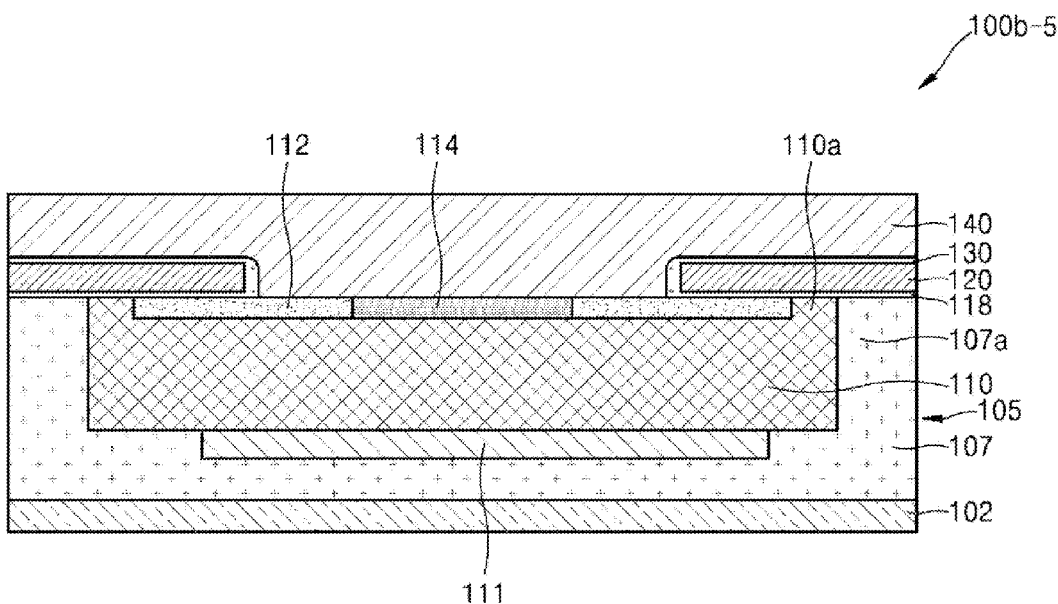
FIG. 56 is a cross-sectional view illustrating a power semiconductor device taken along line VIII-VIII of FIG. 54.

FIG. 53 is a schematic perspective view illustrating a power semiconductor device 100b-5 according to another embodiment of the present disclosure, FIG. 54 is a plan view illustrating the power semiconductor device 100b-5 taken along line VI-VI of FIG. 53, FIG. 55 is a cross-sectional view illustrating the power semiconductor device 100b-5 taken along line VII-VII of FIG. 54, and FIG. 56 is a cross-sectional view illustrating the power semiconductor device 100b-5 taken along line VIII-VIII of FIG. 54.

The power semiconductor device 100b-5 according to the embodiment may be implemented by using or partially modifying the power semiconductor device 100-5 of FIGS. 49 to 51, and thus, additional description will be omitted to avoid redundancy.

Referring to FIGS. 53 to 56, in the power semiconductor device 100b-5, the source region 112 may include the source contact region 112a outside at least one ends of the gate electrode layers 120. For example, the source contact region 112a that is a part of the source region 112 may refer to the part with which the source electrode layer 140 is connected.

The well contact region 114 may be formed in the source contact region 112a. For example, the well contact region 114 may extend from the well region 110 to penetrate the source region 112 and may have the second conductivity type. One well contact region 114 or a plurality of source contact regions 114 may be formed in the source contact region 112a.

For example, the well contact region 114 may be doped with second conductivity-type impurities of a higher concentration than the well region 110 to reduce a contact resistance when connected with the source electrode layer 140.

The source electrode layer 140 may be connected in common with the source contact region 112a and the well contact region 114.

An example is illustrated in FIGS. 53 to 56 as the source contact region 112a and the well contact region 114 are formed in the source region 112 of one side of the vertical portions 107a of the drift region 107. However, when each of the source region 112 and the well region 110 is divided into a plurality of regions, each of the source contact region 112a and the well contact region 114 may be formed in each of the corresponding regions.

In some embodiments, the plurality of trenches 116 may be arranged to be spaced from each other in line along one direction. As such, the gate electrode layers 120 may also be arranged to be spaced from each other in line in the one direction, along the trenches 116. In this case, the well region 110, the source region 112, the source contact region 112a, and the well contact region 114 may be formed in the semiconductor layer 105 between the trenches 116 arranged to be spaced from each other in line along the one direction.

For example, the power semiconductor device 100b-5 may be formed by arranging the structure of the power semiconductor device 100-5 of FIGS. 49 to 51 in plurality along one direction and by disposing the well region 110, the source region 112, the source contact region 112a, and the well contact region 114 therebetween.

For example, when the power semiconductor device 100-5 is an N-type MOSFET, the source contact region 112a may be an N+ region, and the well contact region 114 may be a P+ region.

According to the power semiconductor device 100b-5, the source contact region 112a and the well contact region 114 may be disposed outside the gate electrode layers 120, not between the gate electrode layers 120, and thus, the gate electrode layers 120 may be arranged more densely. As such, a channel density of the power semiconductor device 100b-5 may markedly increase.

Figure 57:
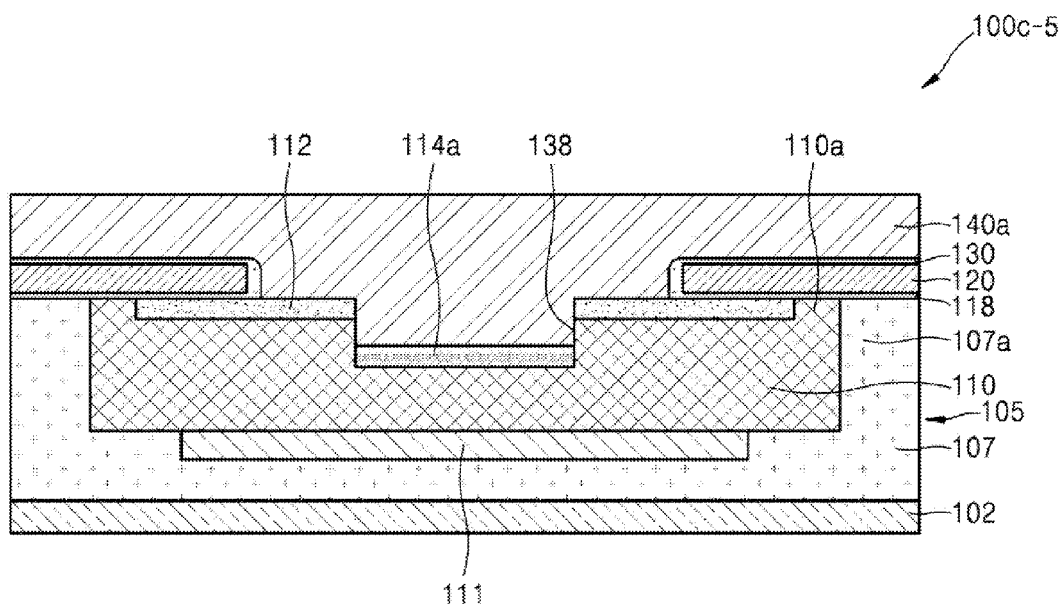
FIGS. 57 and 58 are cross-sectional views illustrating power semiconductor devices according to other embodiments of the present disclosure.
Figure 58:
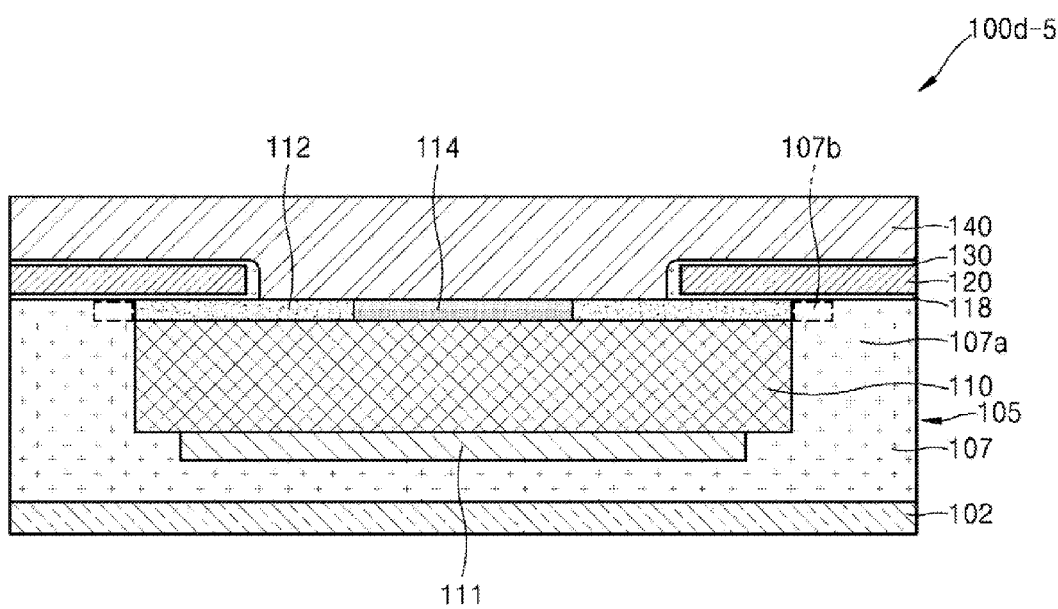

FIGS. 57 and 58 are cross-sectional views illustrating power semiconductor devices 100c-5 and 100d-5 according to other embodiments of the present disclosure.

Referring to FIG. 57, the power semiconductor device 100c-5 may include at least one groove 138, which is formed to penetrate the source region 112 and to be recessed into the well region 110, in the source contact region 112a of the source region 112. The well contact region 114a may be formed on at least a bottom surface of the groove 138 so as to be in contact with the well region 110.

The source electrode layer 140a may be formed to fill the groove 138 and may be connected with the well contact region 114a, the well region 110, and/or the source region 112. The above structure may widen the contact area between the source electrode layer 140a and the well region 110 and the contact area between the source electrode layer 140a and the source region 112 such that contact resistances therebetween decrease.

In some embodiments, the well contact region 114a may be formed on the whole surface of the well region 110 exposed by the groove 138. Accordingly, the well contact region 114a may be formed on the well region 110 exposed from a bottom surface and a side wall of the groove 138. The above structure of the well contact region 114a may allow the contact resistance between the source electrode layer 140a and the well region 110 to further decrease.

Referring to FIG. 58, the power semiconductor device 100d-5 may include the channel region 107b forming the accumulation channel, instead of the channel region 110a of the power semiconductor device 100b-5 of FIGS. 53 to 56. The above structure of the structure of the power semiconductor device 100d-5 including the channel region 107b may refer to the description given with reference to FIG. 52.

Accordingly, the power semiconductor device 100d-5 may correspond to a structure in which the power semiconductor device 100a-5 of FIG. 52 is connected in plurality and the well region 110, the source region 112, the source contact region 112a, and the well contact region 114 are disposed therebetween.

Figure 59:
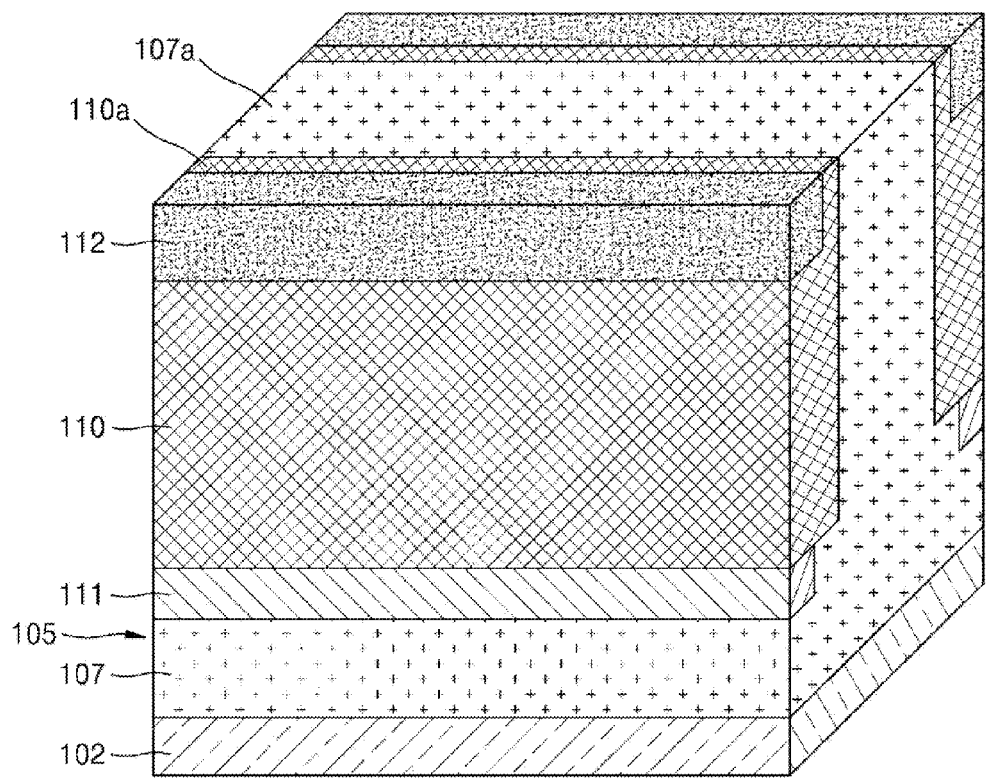
FIGS. 59 to 61 are schematic perspective views illustrating a method of fabricating a power semiconductor device according to an embodiment of the present disclosure.
Figure 60:
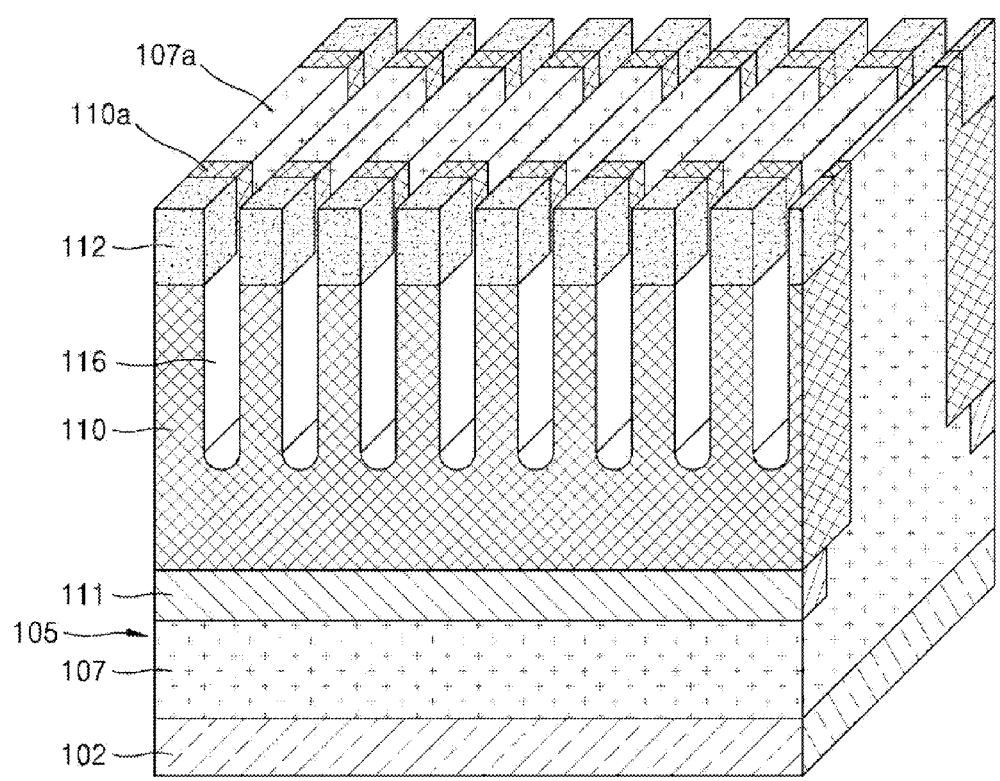
Figure 61:
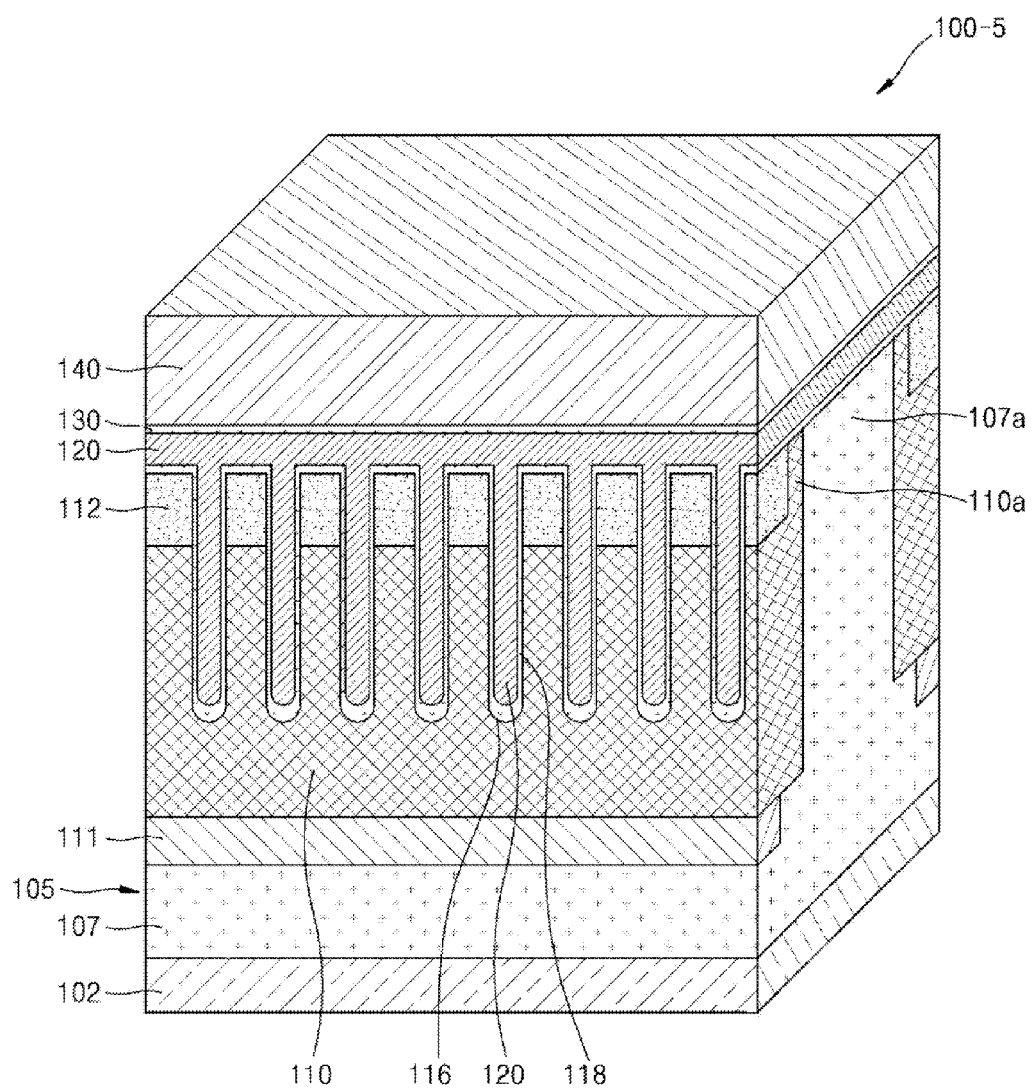

FIGS. 59 to 61 are schematic perspective views illustrating a method of fabricating the power semiconductor device 100-5 according to an embodiment of the present disclosure.

Referring to FIG. 59, the drift region 107 having the first conductivity type may be formed in the semiconductor layer 105 of silicon carbide (SiC). For example, the drift region 107 may be formed on the drain region 102 having the first conductivity type. In some embodiments, the drain region 102 may be implemented with a substrate of the first conductivity type, and the drift region 107 may be formed on the substrate with one or more epitaxial layers.

Next, the well region 110 having the second conductivity type may be formed in the semiconductor layer 105 so as to be in contact with the drift region 107. For example, the forming of the well region 110 may be performed by implanting impurities of the second conductivity type into the semiconductor layer 105.

For example, the well region 110 may be formed in the semiconductor layer 105 such that the drift region 107 includes the vertical portion 107a, at least a part of which is surrounded by the well region 110. In more detail, the well region 110 may be formed by doping impurities of a conductivity type opposite to that of the drift region 107 in the drift region 107.

Next, under the well region 110, the deep well region 111 having the second conductivity type may be formed to be in contact with the well region 110 and the drift region 107. The deep well region 111 may be formed by implanting impurities of the second conductivity type the same as that of the well region 110. The well region 110 and the deep well region 111 may be formed in an arbitrary order.

Then, the source region 112 having the first conductivity type may be formed in the well region 110. For example, source region 112 may be formed by implanting impurities of the first conductivity type into the well region 110.

In addition to the formation of the source region 112, the channel region 110a where an inversion channel is formed along one direction may be formed in the semiconductor layer 105 between the source region 112 and the drift region 107. The channel region 110a may be formed between the source region 112 and the vertical portion 107a of the drift region 107. For example, the channel region 110a may be a part of the well region 110 and may be formed by implanting impurities of the second conductivity type into the semiconductor layer 105.

In the above fabricating method, the impurity implantation or the impurity doping may be performed such that the impurities are mixed when the impurities are implanted into the semiconductor layer 105 or an epitaxial layer is formed. However, an ion implantation method using a mask pattern may be used for implantation of the impurities in a selective region.

Optionally, a heat treatment process for activating or diffusing the impurities may be performed after the ion implantation.

Referring to FIG. 60, at least one trench 116 may be formed to be recessed into the semiconductor layer 105 from the surface of the semiconductor layer 105 as much as a given depth. For example, the at least one trench 116 may have a predetermined depth from the surface (e.g., an upper surface) of the semiconductor layer 105.

For example, the trench 116 may extend across the drift region 107 in one direction and may be formed to be shallower than the well region 110.

In addition, the at least one trench 116 may include a plurality of trenches 116, and the trenches 116 may be simultaneously formed in the semiconductor layer 105 in parallel in one direction, for example. The channel region 110a may be further restricted by the trenches 116.

For example, the trenches 116 may be formed by forming a photo mask by using photo lithography and then etching the semiconductor layer 105 by using the photo mask as an etching protection layer.

Referring to FIG. 61, the gate insulating layer 118 may be formed on the bottoms and inner walls of the trenches 116. For example, the gate insulating layer 118 may be formed by oxidizing the semiconductor layer 105 to form an oxide or by depositing an insulating material such as oxide or nitride on the semiconductor layer 105.

Afterwards, the gate electrode layers 120 may be formed on the gate insulating layer 118 so as to be disposed in the trenches 116. For example, the gate electrode layer 120 may be formed by forming a conductive layer on the gate insulating layer 118 and patterning the conductive layer. The gate electrode layer 120 may be formed by doping impurities in polysilicon or may be formed to include a conductive metal or metal silicide.

A patterning process may be performed by using photo lithography and etching processes. The photo lithography process may include a process of forming a photoresist pattern as a mask layer by using a photo process and a development process, and the etching process may include a process of selectively etching an underlying structure by using the photoresist pattern.

As such, the well region 110 may be disposed to be deeper than the gate electrode layer 120 so as to surround the bottom surface of the gate electrode layer 120 at one end of the gate electrode layer 120, and the channel region 110a may be formed in the semiconductor layer 105 of one side or opposite sides of the gate electrode layer 120 between the drift region 107 and the source region 112.

Afterwards, the interlayer insulating layer 130 may be formed on the gate electrode layer 120.

Afterwards, the source electrode layer 140 may be formed on the interlayer insulating layer 130. For example, the source electrode layer 140 may be formed by forming a conductive layer, for example, a metal layer on the interlayer insulating layer 130 and patterning the conductive layer.

Meanwhile, the power semiconductor device 100*a*-5 of FIG. 52 may be fabricated by adding some processes to the method of fabricating the power semiconductor device 100-5 described above or changing or modifying the fabricating method. For example, the channel region 107*b* may be formed with a part of the drift region 107 so as to form the accumulation channel.

The power semiconductor device 100*b*-5 of FIGS. 53 to 56 may be fabricated by adding some processes to the method of fabricating the power semiconductor device 100-5 described above or changing or modifying the fabricating method.

For example, when the power semiconductor device 100*b*-5 is fabricated, the forming of the source region 112 may include forming the source contact region 112*a* connected with the source electrode layer 140 at least outside one end of the gate electrode layer 120. In some embodiments, the source contact region 112*a* may be a part of the source region 112.

In addition, before the trenches 116 are formed, the well contact region 114 may be formed in the source contact region 112*a*. For example, the well contact region 114 may be formed by implanting the second conductivity-type impurities of a higher concentration than the well region 110, into a part of the well region 110.

When the power semiconductor device 100*b*-5 is fabricated, the trenches 116 may be arranged to be spaced from each other in line in one direction. In addition, the well region 110, the channel region 110*a*, and the source region 112 may be formed in the semiconductor layer 105 between the trenches 116.

The method of fabricating the power semiconductor device 100*c*-5, which is described with reference to FIG. 57, may further include forming at least one groove 138 in the source region 112 so as to penetrate the source region 112 and to be recessed into the well region 110, forming the well contact region 114 on a bottom surface of the groove 138 so as to be in contact with the well region 110, and forming the source electrode layer 140 so as to be connected with the well contact region 114.

According to the above fabricating method, the power semiconductor device 100-5 using the semiconductor layer 105 of silicon carbide may be economically fabricated by using processes that are applied to a conventional silicon substrate.

Figure 62:
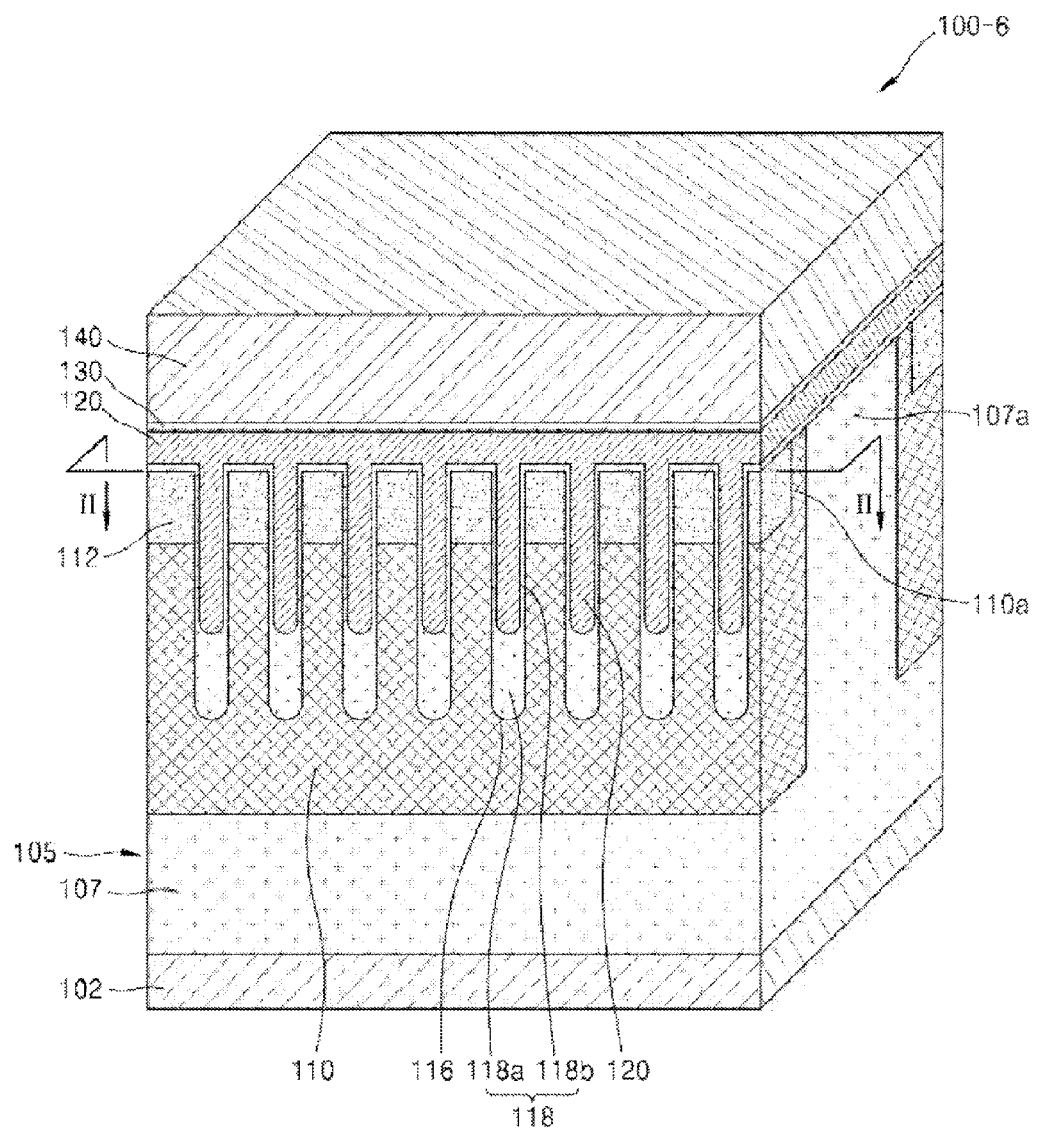
FIG. 62 is a schematic perspective view illustrating a power semiconductor device according to an embodiment of the present disclosure.
Figure 63:
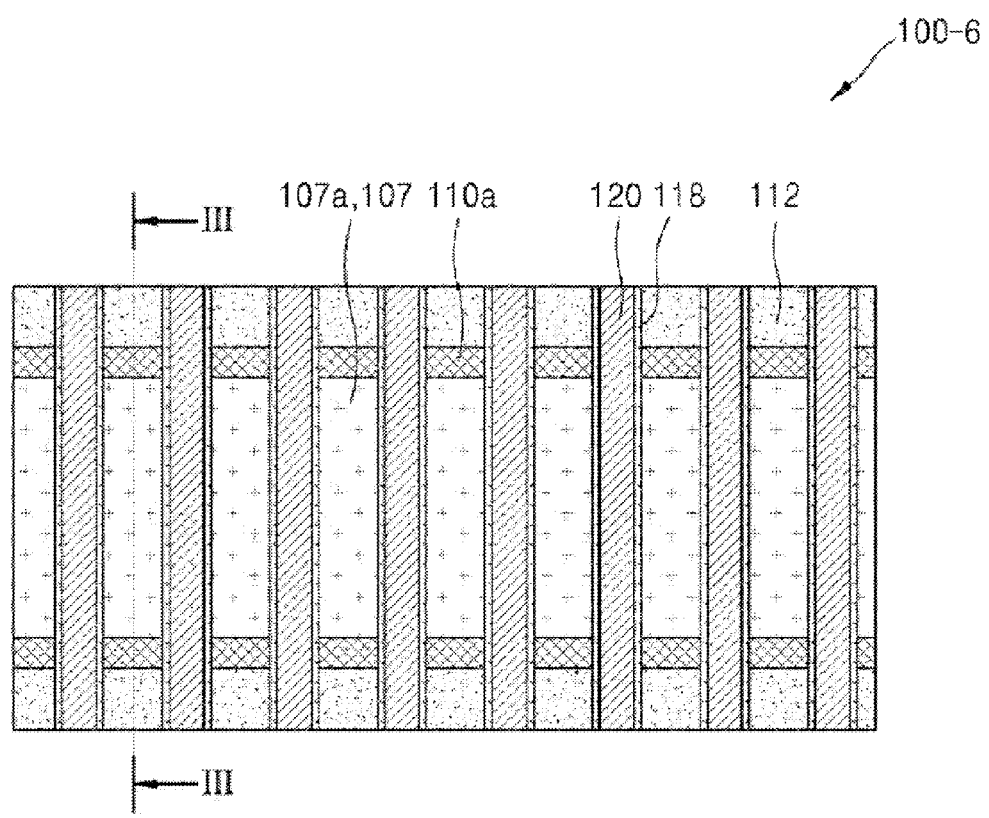
FIG. 63 is a plan view illustrating a power semiconductor device taken along line II-II of FIG. 62.
Figure 64:
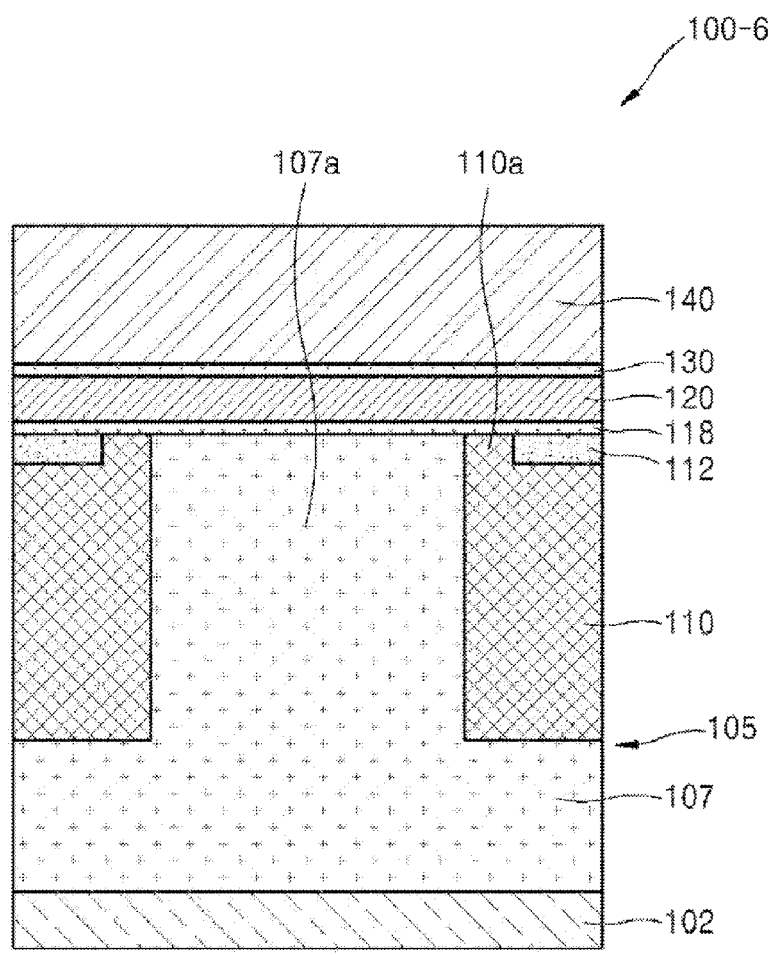
FIG. 64 is a cross-sectional view illustrating a power semiconductor device taken along line III-III of FIG. 63.

FIG. 62 is a schematic perspective view illustrating a power semiconductor device 100-6 according to an embodiment of the present disclosure, FIG. 63 is a plan view illustrating the power semiconductor device 100-6 taken along line II-II of FIG. 62, and FIG. 64 is a cross-sectional view illustrating the power semiconductor device 100-6 taken along line III-III of FIG. 63.

Referring to FIGS. 62 to 64, the power semiconductor device 100-6 may at least include the semiconductor layer 105, the gate insulating layer 118, and the gate electrode layer 120. For example, the power semiconductor device 100-6 may have a power MOSFET structure.

The semiconductor layer 105 may refer to one semiconductor material layer or a plurality of semiconductor material layers, for example, may refer to one epitaxial layer or a plurality of epitaxial layers. In addition, the semiconductor layer 105 may refer to one or multiple epitaxial layers on a semiconductor substrate.

For example, the semiconductor layer 105 may be formed of silicon carbide (SiC). In more detail, the semiconductor layer 105 may include at least one epitaxial layer of silicon carbide.

Silicon carbide (SiC) may have a bandgap wider than silicon, thus maintaining stability even at a high temperature compared to silicon. In addition, because a breakdown electric field of the silicon carbide is higher than that of the silicon, the silicon carbide may stably operate even at a high temperature. Accordingly, the power semiconductor device 100-6 including the semiconductor layer 105 formed of silicon carbide may have a high breakdown voltage compared to the case of using silicon and may provide an excellent heat release characteristic and a stable operating characteristic at a high temperature.

In more detail, the semiconductor layer 105 may include the drift region 107. The drift region 107 may have the first conductivity type and may be formed by implanting impurities of the first conductivity type into a part of the semiconductor layer 105. For example, the drift region 107 may be formed by doping impurities of the first conductivity type in an epitaxial layer of silicon carbide.

The well region 110 may be formed in the semiconductor layer 105 to be in contact with the drift region 107 and may have the second conductivity type. For example, the well region 110 may be formed by doping impurities of the second conductivity type opposite to the first conductivity type in the drift region 107.

For example, the well region 110 may be formed to surround at least a part of the drift region 107. As such, the drift region 107 may include the vertical portion 107*a*, at least a part of which is surrounded by the well region 110. In an operation of the power semiconductor device 100-6, the vertical portion 107*a* may provide a vertical movement path of charges.

The well region 110 is illustrated in FIG. 62 as including two regions spaced from each other and the vertical portion 107*a* interposed therebetween, but the well region 110 may be variously changed or modified. For example, the vertical portion 107*a* may have a shape whose side surface is surrounded by the well region 110 once.

The source region 112 may be formed in the well region 110 and may have the first conductivity type. For example, the source region 112 may be formed by doping impurities of the first conductivity type in the well region 110. The concentration of the first conductivity-type impurities doped in the source region 112 may be higher than that doped in the drift region 107.

The channel region 110*a* may be formed in the semiconductor layer 105 between the drift region 107 and the source region 112. For example, the channel region 110*a* may have the second conductivity type, and an inversion channel may be formed therein along one direction in an operation of the power semiconductor device 100-6. One direction may refer to a direction of line III-III of FIG. 63.

Because the channel region 110*a* has a doping type opposite to that of the source region 112 and the drift region 107, the channel region 110*a* may form a diode junction with the source region 112 and the drift region 107. Accordingly, the channel region 110*a* may not permit charges to move in a normal situation; however, when an operating voltage is applied to the gate electrode layer 120, an inversion channel may be formed therein such that the movement of charges is permitted.

In some embodiments, the channel region 110*a* may be a part of the well region 110. In this case, the channel region 110*a* may be integrally formed to be continuously connected with the well region 110. A doping concentration of the second conductivity-type impurities of the channel region 110*a* may be the same as that of the remaining portion of the well region 110 or may be different therefrom for the adjustment of a threshold voltage.

In some embodiments, the well region 110, the channel region 110a, and the source region 112 may be formed to be symmetrical with respect to the vertical portion 107a of the drift region 107. For example, the well region 110, the channel region 110a, and the source region 112 may be formed at opposite ends of the vertical portion 107a of the drift region 107, or each of the well region 110, the channel region 110a, and the source region 112 may include a first part and a second part formed to be symmetrical with respect to the vertical portion 107a of the drift region 107. In each of the well region 110, the channel region 110a, and the source region 112, the first part and the second part may be separated from each other or may be connected to each other.

In addition, the drain region 102 may be formed in the semiconductor layer 105 under the drift region 107 and may have the first conductivity type. For example, the drain region 102 may be doped with impurities of a high concentration compared to the drift region 107.

In some embodiments, the drain region 102 may be implemented with a substrate of silicon carbide having the first conductivity type. In this case, the drain region 102 may be understood as a part of the semiconductor layer 105 or may be understood as a substrate independent of the semiconductor layer 105.

At least one trench 116 may be formed to be recessed into the semiconductor layer 105 from a surface of the semiconductor layer 105 as much as a given depth. For example, the at least one trench 116 may have a predetermined depth from the surface (e.g., an upper surface) of the semiconductor layer 105. The trench 116 may extend in one direction within the semiconductor layer 105. One direction may refer to a length direction, not a depth direction of the trench 116, and may refer to a direction of line III-III of FIG. 63.

The gate insulating layer 118 may be formed on a bottom surface and an inner wall of the trench 116. For example, the gate insulating layer 118 may include a first portion 118a formed with a first thickness from the bottom surface of the trench 116 and a second portion 118b formed on the inner wall of the trench 116 with a second thickness.

For example, the first portion 118a may be formed with the first thickness from the bottom surface of the trench 116 so as to be partially disposed in the trench 116. As such, the second portion 118b may be formed substantially on the first portion 118a and may be formed on a side wall of the trench 116 without being disposed in the trench 116. As such, the second thickness of the second portion 118b may be smaller than the first thickness of the first portion 118a. For example, the first thickness may be ⅕ or more and ½ or less of the depth of the trench 116, and the second thickness may range from ⅕ to 1/30 of the first thickness.

For example, the gate insulating layer 118 may include an insulating material such as silicon oxide, silicon carbide oxide, silicon nitride, hafnium oxide, zirconium oxide, or aluminum oxide, or may include a stacked structure thereof.

As described above, the concentration of an electric field on a bottom part of the trench 116 in an operation of the power semiconductor device 100-6 may be alleviated by forming the first portion 118a of the gate insulating layer 118 at the bottom part of the trench 116 to be thicker than the second portion 118b.

At least one gate electrode layer 120 may be formed on the gate insulating layer 118 so as to be disposed in the trench 116. For example, the gate electrode layer 120 may include an appropriate conductive material such as polysilicon, metal, metal nitride, or metal silicide, or may include a stacked structure thereof.

The drift region 107 may be formed in the semiconductor layer 105 on one side of the gate electrode layer 120. For example, the vertical portion 107a of the drift region 107 may vertically extend in the semiconductor layer 105 of one side of the gate electrode layer 120. The channel region 110a may be formed in the semiconductor layer 105 of one side of the gate electrode layer 120 between the vertical portion 107a of the drift region 107 and the source region 112. Accordingly, the semiconductor layer 105 of the one side of the gate electrode layer 120 may include a structure in which the source region 112, the channel region 110a, and the vertical portion 107a of the drift region 107 are connected along one direction.

In some embodiments, the drift region 107 may be formed in the semiconductor layer 105 on opposite sides of the gate electrode layer 120. For example, the drift region 107 may include the vertical portions 107a that vertically extend in the semiconductor layer 105 of opposite sides of the gate electrode layer 120. The channel region 110a may be formed in the semiconductor layer 105 of opposite sides of the gate electrode layer 120 between the vertical portions 107a of the drift region 107 and the source region 112.

The above structure of the channel region 110a may be called a "lateral channel structure" in that the channel region 110a is formed along a side wall of the gate electrode layer 120.

The well region 110 may be formed to be deeper than the gate electrode layer 120, so as to surround the bottom surface of the gate electrode layer 120 at one end of the gate electrode layer 120. In addition, the well region 110 may be formed to be deeper than the gate electrode layer 120, so as to surround the bottom surface of the gate electrode layer 120 at opposite ends of the gate electrode layer 120. As such, opposite end parts of the gate electrode layer 120 around the source region 112 may be surrounded by the well region 110.

This well (110) structure may more alleviate the concentration of an electric field on the bottom surface of the trench 116, that is, at a lower part of the gate electrode layer 120. Accordingly, according to the power semiconductor device 100-6, the well region 110 may be formed to be deeper than the gate electrode layer 120 without additionally forming a deep well, and thus, the concentration of an electric field on the bottom surface of the trench 116 may be alleviated. A conventional vertical channel structure is problematic in that a junction resistance and a threshold voltage increase as a distance between a deep well and a trench becomes shorter. However, the issue may not occur in the power semiconductor device 100-6 according to the embodiment.

In some embodiments, the gate insulating layer 118 and the gate electrode layer 120 may be formed in the trench 116, and in addition, may be formed to further extend to the outside of the trench 116.

In some embodiments, one trench 116 or a plurality of trenches 116 may be provided in the semiconductor layer 105. The number of trenches 116 may be appropriately selected without limiting the scope of the embodiment.

For example, the plurality of trenches 116 may be formed in the semiconductor layer 105 in parallel along one direction. As the trenches 116 extend in one direction and are spaced from each other in a direction perpendicular to the one direction, the trenches 116 may be arranged in parallel.

In this case, a plurality of gate electrode layers 120 may be formed on the gate insulating layer 118 so as to fill the inside of the trenches 116. As such, the gate electrode layers 120 may be formed in the semiconductor layer 105 in a trench type and may be arranged to extend in parallel in the one direction like the trenches 116.

In addition, each of the well region 110 and the source region 112 may extend across the gate electrode layers 120. The vertical portions 107a of the drift region 107 may be arranged in the semiconductor layer 105 between the gate electrode layers 120. The channel region 110a may be formed in the semiconductor layer 105 between the source region 112 and the vertical portions 107a of the drift region 107 on one side or opposite sides of each of the gate electrode layers 120.

In some embodiments, the well region 110 may be formed in the semiconductor layer 105 to be deeper than the gate electrode layers 120, so as to be in contact with the vertical portions 107a of the drift region 107 and to surround the bottom surface of the gate electrode layers 120 at opposite ends of the gate electrode layers 120.

The interlayer insulating layer 130 may be formed on the gate electrode layer 120. For example, the interlayer insulating layer 130 may include an appropriate insulating material such as oxide or nitride, or may include a stacked structure thereof.

The source electrode layer 140 may be formed on the interlayer insulating layer 130 and may be connected with the source region 112. For example, the source electrode layer 140 may be formed of an appropriate conductive material, metal, etc.

In the power semiconductor device 100-6 described above, the first conductivity type and the second conductivity type may be opposite to each other, and each of the first conductivity type and the second conductivity type may be one of n-type and p-type. For example, when the first conductivity type is n-type, the second conductivity type is p-type, and vice versa.

In more detail, when the power semiconductor device 100-6 is an N-type MOSFET, the drift region 107 may be an N− region, the source region 112 and the drain region 102 may be N+ regions, and the well region 110 and the channel region 110a may be P− regions.

In an operation of the power semiconductor device 100-6, a current may generally flow in a vertical direction from the drain region 102 along the vertical portions 107a of the drift region 107, and may then flow through the channel region 110a to the source region 112 along the side surfaces of the gate electrode layers 120.

In the power semiconductor device 100-6 described above, the gate electrode layers 120 may be densely arranged in parallel in a stripe type or a line type, and the channel regions 110a may be disposed on the side surfaces of the gate electrode layers 120. As such, a channel density may increase.

Also, in the power semiconductor device 100-6, because the gate insulating layer 118 is formed to be thick at the bottom of the trench 116 and the bottom surfaces of the gate electrode layers 120 are surrounded by the well region 110, a breakdown phenomenon due to the concentration of an electric field on edges of the trenches 116 may be alleviated. Accordingly, the high withstand voltage characteristic of the power semiconductor device 100-6 may be improved. This may mean that the reliability of operation of the power semiconductor device 100-1 is improved.

Figure 65:
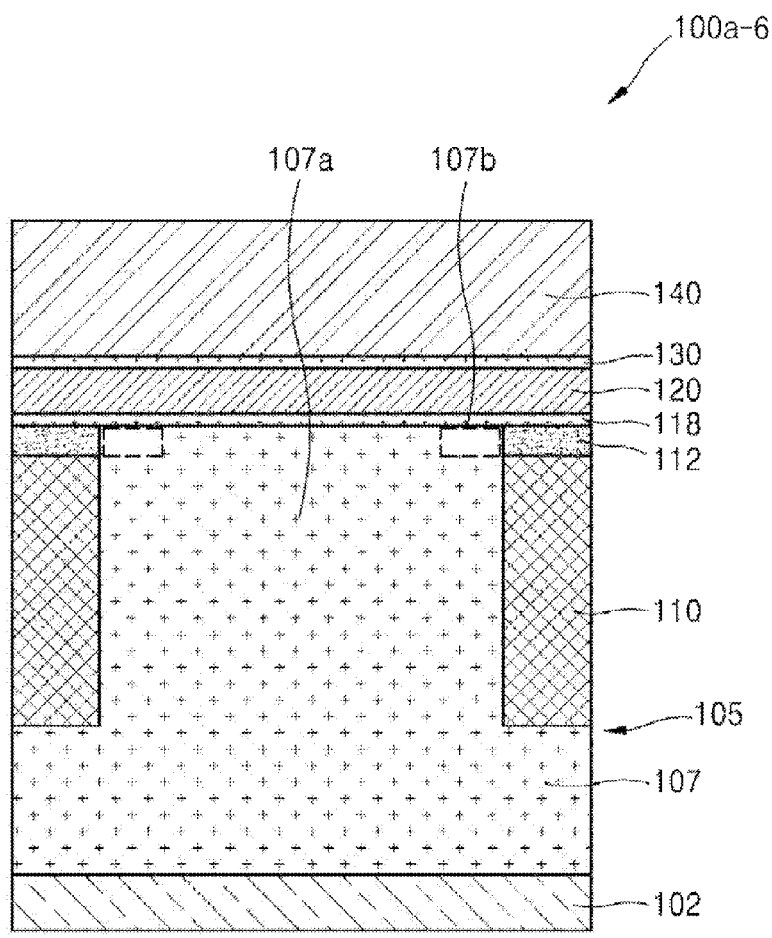
FIG. 65 is a perspective view illustrating a power semiconductor device according to another embodiment of the present disclosure.

FIG. 65 is a perspective view illustrating a power semiconductor device 100a-6 according to another embodiment of the present disclosure.

The power semiconductor device 100a-6 according to the embodiment may be implemented by using or partially modifying the power semiconductor device 100-6 of FIGS. 62 to 64, and thus, additional description will be omitted to avoid redundancy.

Referring to FIG. 65, in the power semiconductor device 100a-6, the channel region 107b may be formed in the semiconductor layer 105 between the drift region 107 and the source region 112. For example, the channel region 107b may have the first conductivity type, and the accumulation channel may be formed therein in an operation of the power semiconductor device 100a-6.

For example, the channel region 107b may be formed in the semiconductor layer 105 between the source region 112 and the vertical portion 107a of the drift region 107. The channel region 107b may have the same doping type as the source region 112 and the drift region 107.

In this case, the source region 112, the channel region 107b, and the drift region 107 may be normally electrically connected. However, in the structure of the semiconductor layer 105 of silicon carbide, a potential barrier is formed while a band of the channel region 107b is upwardly bent due to the influence of a negative charge generated by the formation of a carbon cluster in the gate insulating layer 118. As such, there may be formed the accumulation channel that permits a charge or current flow in the channel region 107b only when an operating voltage is applied to the gate electrode layer 120.

Accordingly, a threshold voltage to be applied to the gate electrode layer 120 to form the accumulation channel in the channel region 107b may be considerably lower than a threshold voltage to be applied to the gate electrode layer 120 to form the inversion channel of the channel region 110a of FIGS. 62 to 64.

In some embodiments, the channel region 107b may be a part of the drift region 107. In more detail, the channel region 107b may be a part of the vertical portions 107a of the drift region 107. For example, the channel region 107b may be integrally formed with the drift region 107. In this case, the drift region 107 may be connected with the source region 112 through the channel region 107b. That is, at a channel region (107b) part, the drift region 107 and the source region 112 may be in contact with each other.

A doping concentration of the first conductivity-type impurities of the channel region 107b may be the same as that of the remaining portion of the drift region 107 or may be different therefrom for the adjustment of a threshold voltage.

As a modified example of the embodiment, the well region 110 may be formed to protrude toward the vertical portion 107a of the drift region 107 father than a part of the source region 112, and the channel region 107b may be formed in the semiconductor layer 105 on the protruding portion of the well region 110.

In addition, the well region 110 may further include a tap portion extending toward the gate electrode layer 120 at an end part of the protruding portion. The channel region 107b may be formed on the protruding portion and the tap portion of the well region 110 in a bent shape.

Additionally, the vertical portion 107a of the drift region 107 may further extend to between a lower part of the source region 112 and the well region 110. In this case, the channel region 107b may be formed to further extend to between the lower part of the source region 112 and the well region 110.

The above structures may allow the channel region 107b to be more restricted between the gate electrode layer 120 and the well region 110.

The power semiconductor device 100a-6 may include the advantages of the power semiconductor device 100-6 of FIGS. 62 to 64, and additionally, may make a threshold voltage low.

Figure 66:
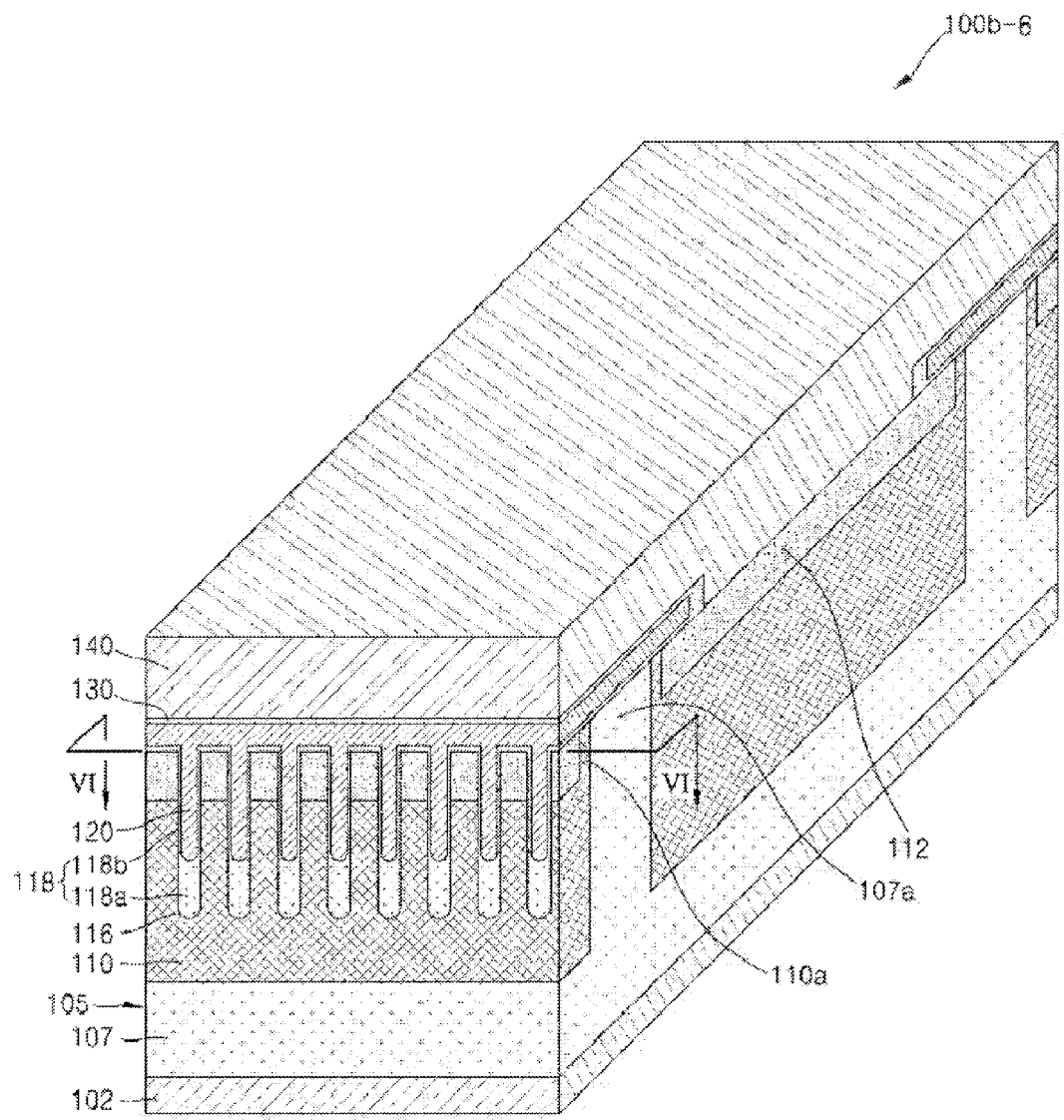
FIG. 66 is a schematic perspective view illustrating a power semiconductor device according to another embodiment of the present disclosure.
Figure 67:
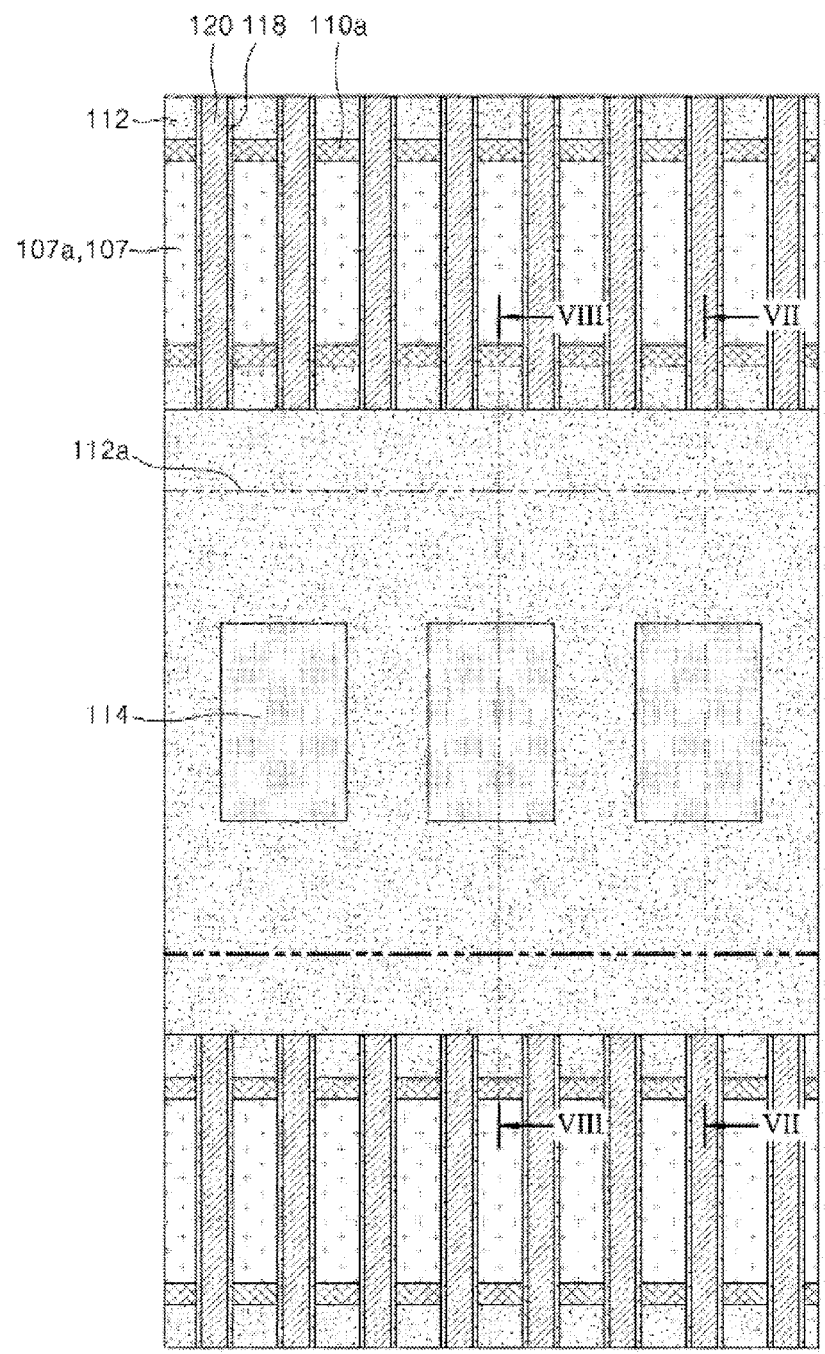
FIG. 67 is a plan view illustrating a power semiconductor device taken along line VI-VI of FIG. 66.
Figure 68:
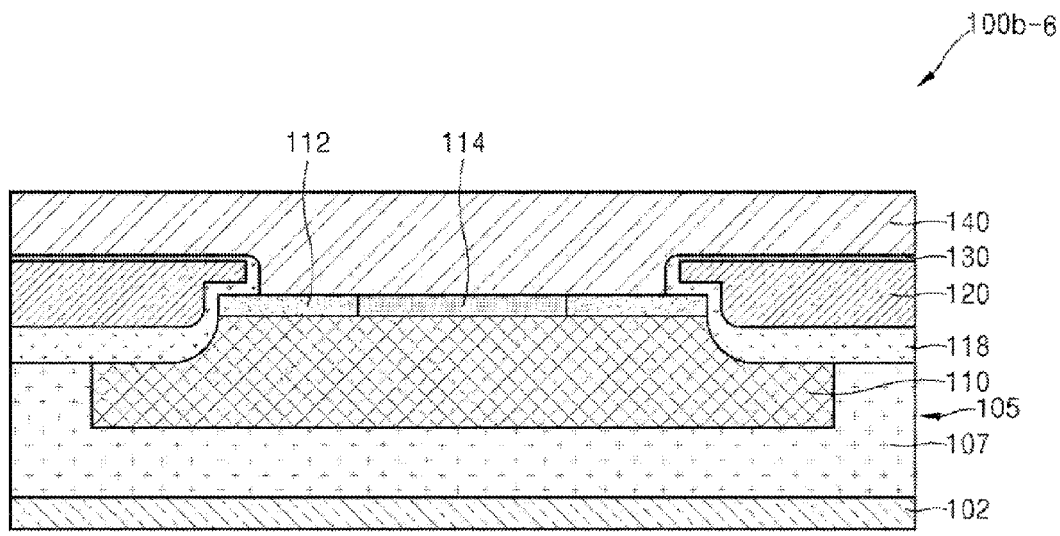
FIG. 68 is a cross-sectional view illustrating a power semiconductor device taken along line VII-VII of FIG. 67.
Figure 69:
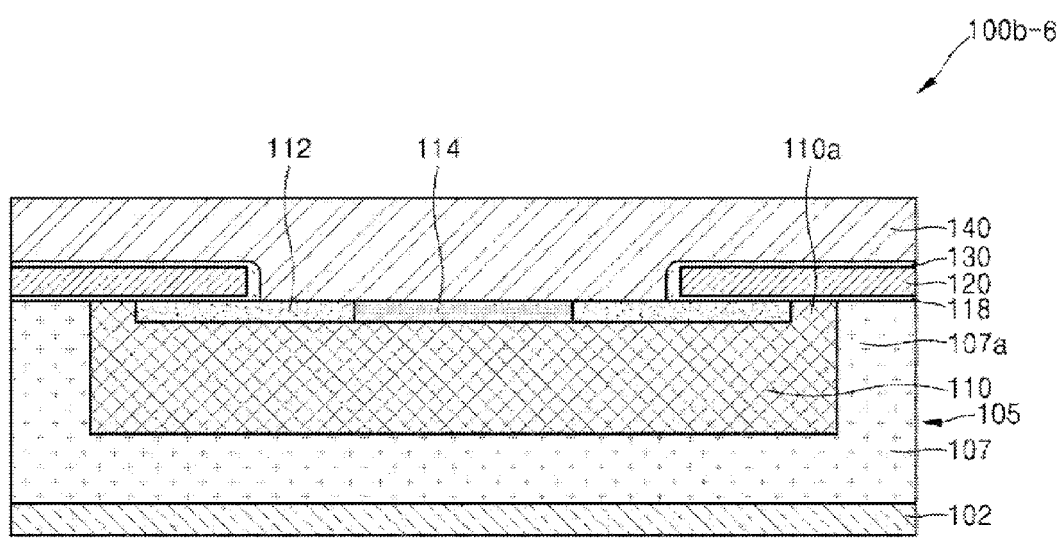
FIG. 69 is a cross-sectional view illustrating a power semiconductor device taken along line VIII-VIII of FIG. 67.

FIG. 66 is a schematic perspective view illustrating a power semiconductor device 100b-6 according to another embodiment of the present disclosure, FIG. 67 is a plan view illustrating the power semiconductor device 100b-6 taken along line VI-VI of FIG. 66, FIG. 68 is a cross-sectional view illustrating the power semiconductor device 100b-6 taken along line VII-VII of FIG. 67, and FIG. 69 is a cross-sectional view illustrating the power semiconductor device 100b-6 taken along line VIII-VIII of FIG. 67.

The power semiconductor device 100b-6 according to the embodiment may be implemented by using or partially modifying the power semiconductor device 100-6 of FIGS. 62 to 64, and thus, additional description will be omitted to avoid redundancy.

Referring to FIGS. 66 to 69, in the power semiconductor device 100b-6, the source region 112 may include the source contact region 112a outside at least one ends of the gate electrode layers 120. For example, the source contact region 112a that is a part of the source region 112 may refer to the part with which the source electrode layer 140 is connected.

The well contact region 114 may be formed in the source contact region 112a. For example, the well contact region 114 may extend from the well region 110 to penetrate the source region 112 and may have the second conductivity type. One well contact region 114 or a plurality of source contact regions 114 may be formed in the source contact region 112a.

For example, the well contact region 114 may be doped with second conductivity-type impurities of a higher concentration than the well region 110 to reduce a contact resistance when connected with the source electrode layer 140.

The source electrode layer 140 may be connected in common with the source contact region 112a and the well contact region 114.

An example is illustrated in FIGS. 66 to 69 as the source contact region 112a and the well contact region 114 are formed in the source region 112 of one side of the vertical portions 107a of the drift region 107. However, when each of the source region 112 and the well region 110 is divided into a plurality of regions, each of the source contact region 112a and the well contact region 114 may be formed in each of the corresponding regions.

In some embodiments, the plurality of trenches 116 may be arranged to be spaced from each other in line along one direction. As such, the gate electrode layers 120 may also be arranged to be spaced from each other in line in the one direction, along the trenches 116. In this case, the well region 110, the source region 112, the source contact region 112a, and the well contact region 114 may be formed in the semiconductor layer 105 between the trenches 116 arranged to be spaced from each other in line along the one direction.

For example, the power semiconductor device 100b-6 may be formed by arranging the structure of the power semiconductor device 100-6 of FIGS. 62 to 64 in plurality along one direction and by disposing the well region 110, the source region 112, the source contact region 112a, and the well contact region 114 therebetween.

For example, when the power semiconductor device 100-6 is an N-type MOSFET, the source contact region 112a may be an N+ region, and the well contact region 114 may be a P+ region.

According to the power semiconductor device 100b-6, the source contact region 112a and the well contact region 114 may be disposed outside the gate electrode layers 120, not between the gate electrode layers 120, and thus, the gate electrode layers 120 may be arranged more densely. As such, a channel density of the power semiconductor device 100b-6 may markedly increase.

Figure 70:
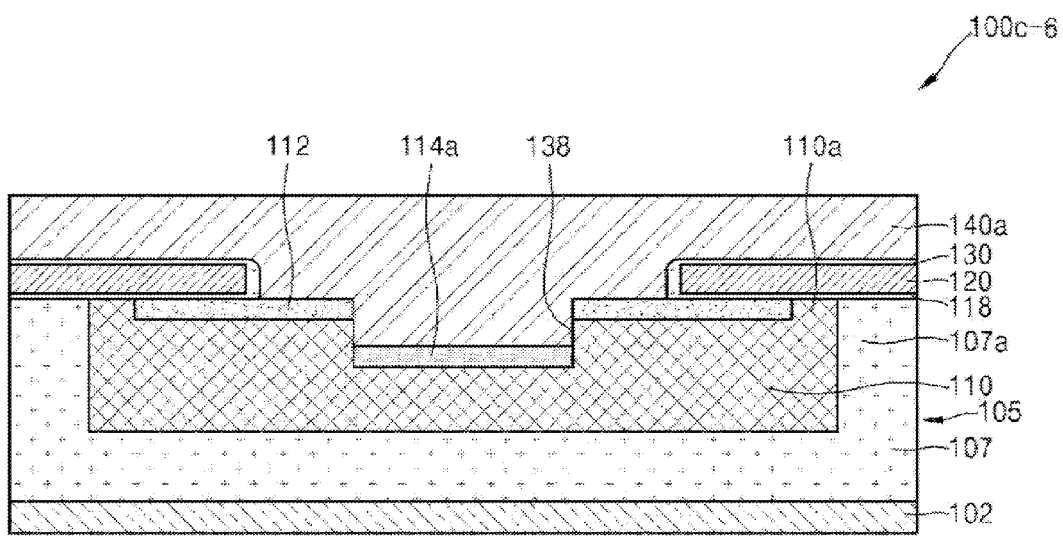
FIGS. 70 and 71 are cross-sectional views illustrating power semiconductor devices according to other embodiments of the present disclosure.
Figure 71:
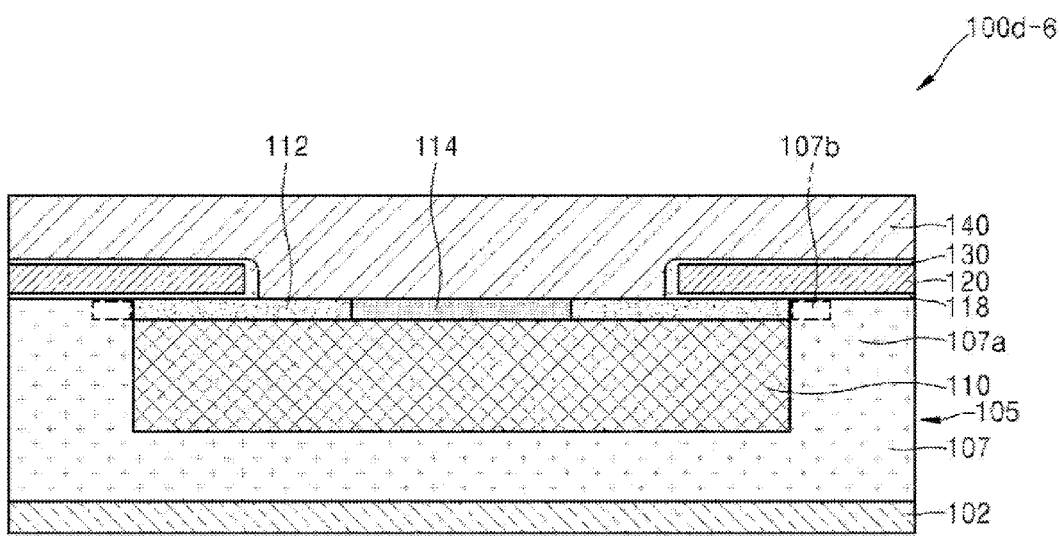

FIGS. 70 and 71 are cross-sectional views illustrating power semiconductor devices 100c-6 and 100d-6 according to other embodiments of the present disclosure.

Referring to FIG. 70, the power semiconductor device 100c-6 may include at least one groove 138, which is formed to penetrate the source region 112 and to be recessed into the well region 110, in the source contact region 112a of the source region 112. The well contact region 114a may be formed on at least a bottom surface of the groove 138 so as to be in contact with the well region 110.

The source electrode layer 140a may be formed to fill the groove 138, and thus, may be connected with the well contact region 114a, the well region 110, and/or the source region 112. The above structure may widen the contact area between the source electrode layer 140a and the well region 110 and the contact area between the source electrode layer 140a and the source region 112 such that contact resistances therebetween decrease.

In some embodiments, the well contact region 114a may be formed on the whole surface of the well region 110 exposed by the groove 138. Accordingly, the well contact region 114a may be formed on the well region 110 exposed from a bottom surface and a side wall of the groove 138. The above structure of the well contact region 114a may allow the contact resistance between the source electrode layer 140a and the well region 110 to further decrease.

Referring to FIG. 71, the power semiconductor device 100d-6 may include the channel region 107b forming the accumulation channel, instead of the channel region 110a of the power semiconductor device 100b-6 of FIGS. 66 to 69. The structure of the power semiconductor device 100d-6 including the channel region 107b may refer to the description given with reference to FIG. 65.

Accordingly, the power semiconductor device 100d-6 may correspond to a structure in which the power semiconductor device 100a-6 of FIG. 65 is connected in plurality and the well region 110, the source region 112, the source contact region 112a, and the well contact region 114 are disposed therebetween.

Figure 72:
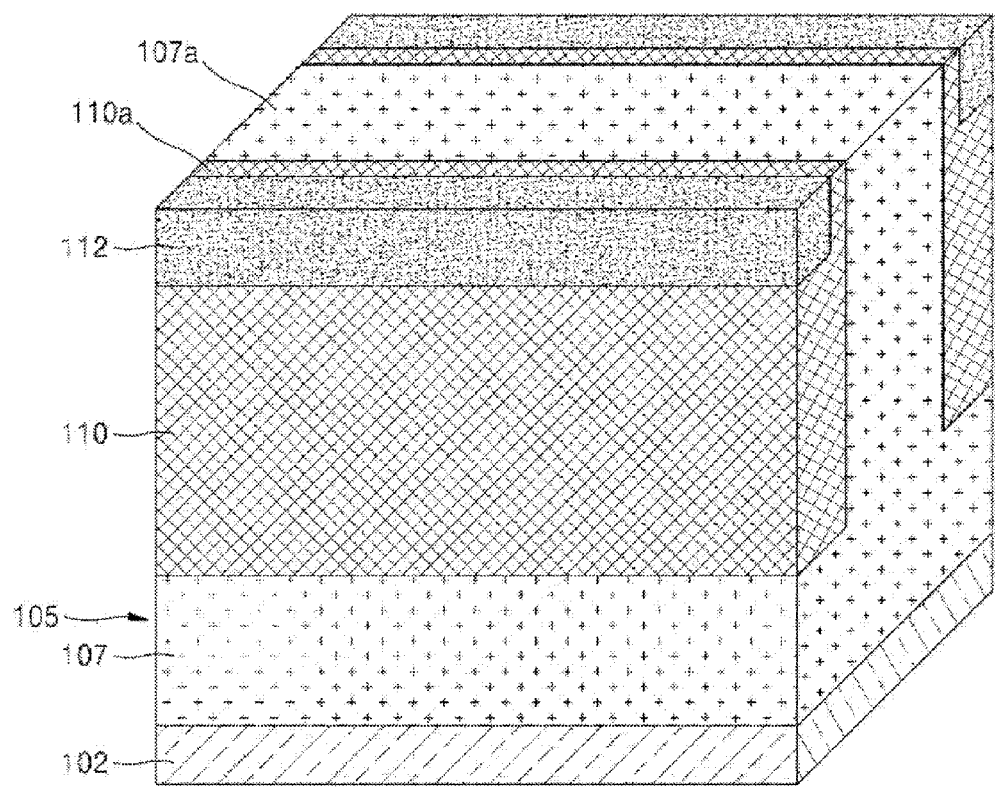
FIGS. 72 to 74 are schematic perspective views illustrating a method of fabricating a power semiconductor device according to an embodiment of the present disclosure.
Figure 73:
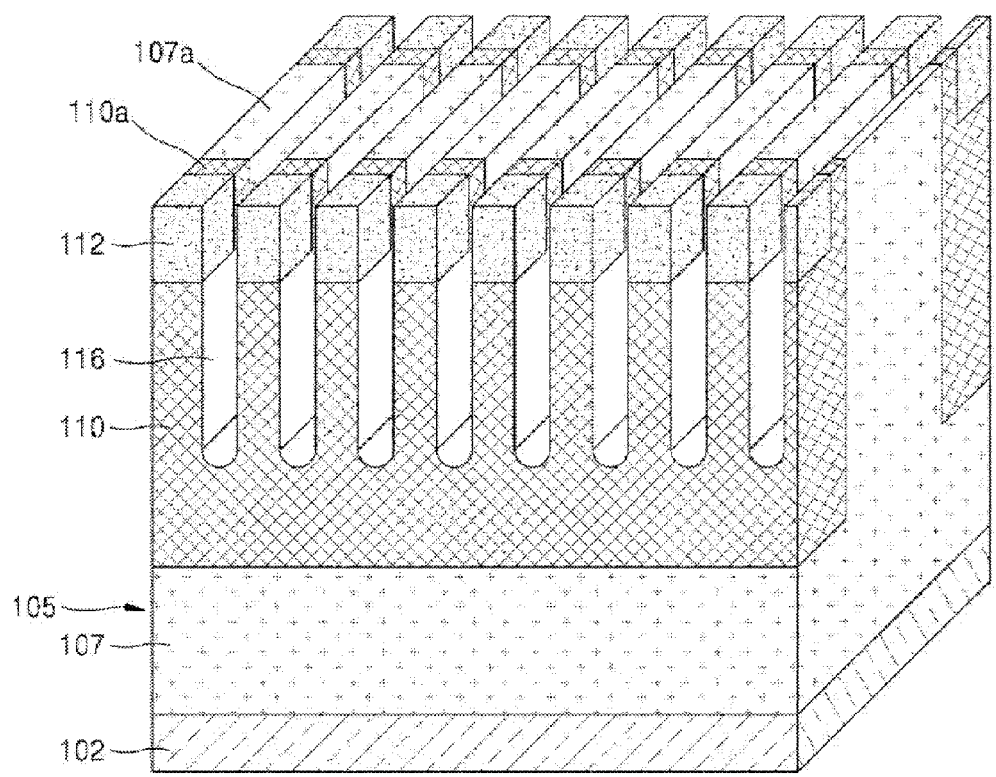
Figure 74:
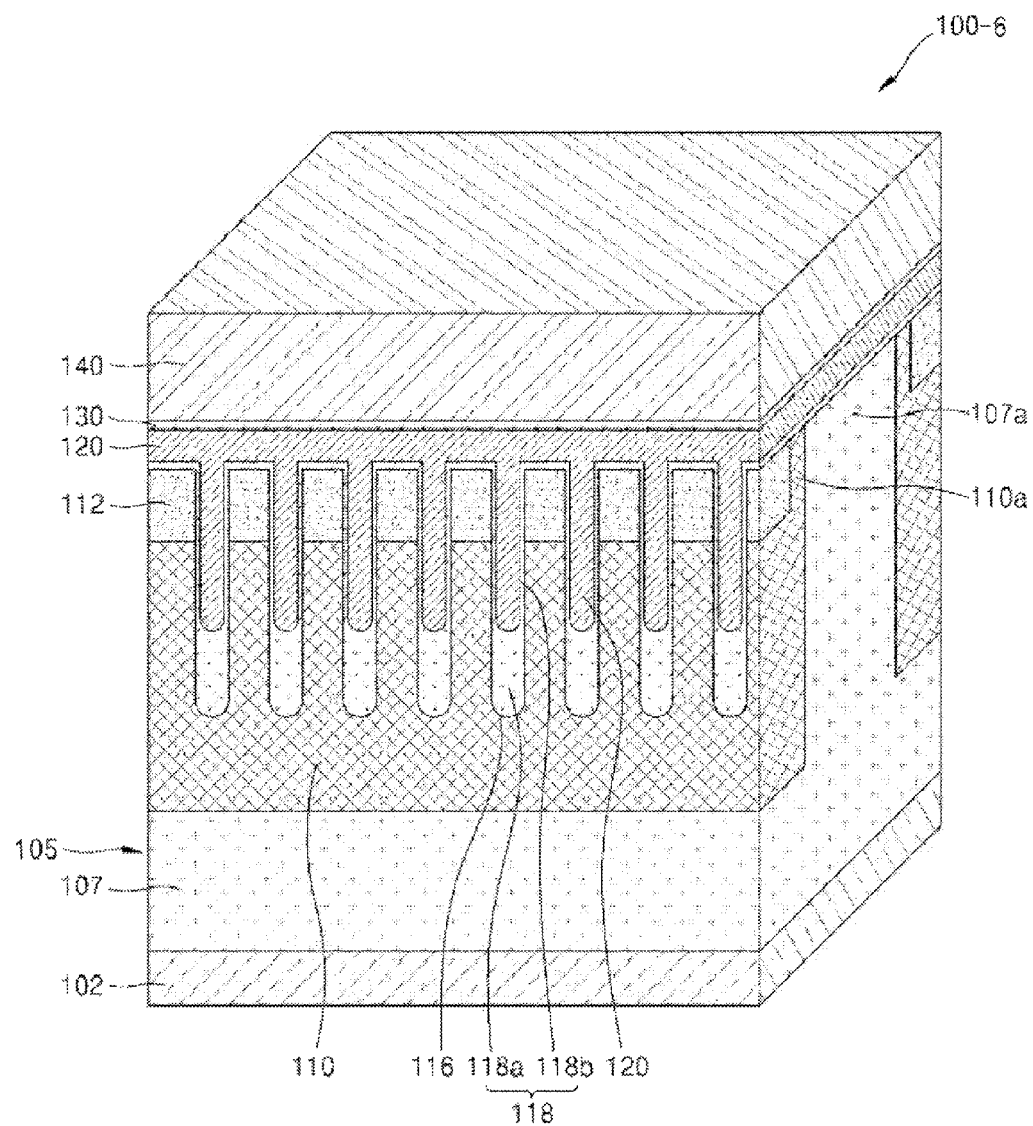

FIGS. 72 to 74 are schematic perspective views illustrating a method of fabricating the power semiconductor device 100-6 according to an embodiment of the present disclosure.

Referring to FIG. 72, the drift region 107 having the first conductivity type may be formed in the semiconductor layer 105 of silicon carbide (SiC). For example, the drift region 107 may be formed on the drain region 102 having the first conductivity type. In some embodiments, the drain region 102 may be implemented with a substrate of the first conductivity type, and the drift region 107 may be formed on the substrate with one or more epitaxial layers.

Next, the well region 110 having the second conductivity type may be formed in the semiconductor layer 105 so as to be in contact with the drift region 107. For example, the forming of the well region 110 may be performed by implanting impurities of the second conductivity type into the semiconductor layer 105.

For example, the well region 110 may be formed in the semiconductor layer 105 such that the drift region 107 includes the vertical portion 107a, at least a part of which is surrounded by the well region 110. In more detail, the well region 110 may be formed by doping impurities of a conductivity type opposite to that of the drift region 107 in the drift region 107.

Then, the source region 112 having the first conductivity type may be formed in the well region 110. For example, source region 112 may be formed by implanting impurities of the first conductivity type into the well region 110.

In addition to the formation of the source region 112, the channel region 110*a* where an inversion channel is formed along one direction may be formed in the semiconductor layer 105 between the source region 112 and the drift region 107. The channel region 110*a* may be formed between the source region 112 and the vertical portion 107*a* of the drift region 107. For example, the channel region 110*a* may be a part of the well region 110 and may be formed by implanting impurities of the second conductivity type into the semiconductor layer 105.

In the above fabricating method, the impurity implantation or the impurity doping may be performed such that the impurities are mixed when the impurities are implanted into the semiconductor layer 105 or an epitaxial layer is formed. However, an ion implantation method using a mask pattern may be used for implantation of the impurities in a selective region.

Optionally, a heat treatment process for activating or diffusing the impurities may be performed after the ion implantation.

Referring to FIG. 73, at least one trench 116 may be formed to be recessed into the semiconductor layer 105 from the surface of the semiconductor layer 105 as much as a given depth. For example, the at least one trench 116 may have a predetermined depth from the surface (e.g., an upper surface) of the semiconductor layer 105.

For example, the trench 116 may extend across the drift region 107 in one direction and may be formed to be shallower than the well region 110.

In addition, the at least one trench 116 may include a plurality of trenches 116, and the trenches 116 may be simultaneously formed in the semiconductor layer 105 in parallel in one direction, for example. The channel region 110*a* may be further restricted by the trenches 116.

For example, the trenches 116 may be formed by forming a photo mask by using photo lithography and then etching the semiconductor layer 105 by using the photo mask as an etching protection layer.

Referring to FIG. 74, the gate insulating layer 118 may be formed on the bottoms and inner walls of the trenches 116. For example, the forming of the gate insulating layer 118 may include forming the first portion 118*a* with the first thickness from the bottom surface of the trench 116 and forming the second portion 118*b* on the inner wall of the trench 116 with the second thickness.

For example, the gate insulating layer 118 may be formed by oxidizing the semiconductor layer 105 to form an oxide or by depositing an insulating material such as oxide or nitride on the semiconductor layer 105. In some embodiments, the first portion 118*a* may be formed by depositing an insulating material, and the second portion 118*b* may be formed by oxidizing the semiconductor layer 105 or depositing an insulating material.

Afterwards, the gate electrode layers 120 may be formed on the gate insulating layer 118 so as to be disposed in the trenches 116. For example, the gate electrode layer 120 may be formed by forming a conductive layer on the gate insulating layer 118 and patterning the conductive layer. The gate electrode layer 120 may be formed by doping impurities in polysilicon or may be formed to include a conductive metal or metal silicide.

A patterning process may be performed by using photo lithography and etching processes. The photo lithography process may include a process of forming a photoresist pattern as a mask layer by using a photo process and a development process, and the etching process may include a process of selectively etching an underlying structure by using the photoresist pattern.

As such, the well region 110 may be disposed to be deeper than the gate electrode layer 120 so as to surround the bottom surface of the gate electrode layer 120 at one end of the gate electrode layer 120, and the channel region 110*a* may be formed in the semiconductor layer 105 of one side or opposite sides of the gate electrode layer 120 between the drift region 107 and the source region 112.

Afterwards, the interlayer insulating layer 130 may be formed on the gate electrode layer 120.

Afterwards, the source electrode layer 140 may be formed on the interlayer insulating layer 130. For example, the source electrode layer 140 may be formed by forming a conductive layer, for example, a metal layer on the interlayer insulating layer 130 and patterning the conductive layer.

Meanwhile, the power semiconductor device 100*a*-6 of FIG. 65 may be fabricated by adding some processes to the method of fabricating the power semiconductor device 100-6 described above or changing or modifying the fabricating method. For example, the channel region 107*b* may be formed with a part of the drift region 107 so as to form the accumulation channel.

The power semiconductor device 100*b*-6 of FIGS. 66 to 69 may be fabricated by adding some processes to the method of fabricating the power semiconductor device 100-6 described above or changing or modifying the fabricating method.

For example, when the power semiconductor device 100*b*-6 is fabricated, the forming of the source region 112 may include forming the source contact region 112*a* connected with the source electrode layer 140 at least outside one end of the gate electrode layer 120. In some embodiments, the source contact region 112*a* may be a part of the source region 112.

In addition, before the trenches 116 are formed, the well contact region 114 may be formed in the source contact region 112*a*. For example, the well contact region 114 may be formed by implanting the second conductivity-type impurities of a higher concentration than the well region 110, into a part of the well region 110.

When the power semiconductor device 100*b*-6 is fabricated, the trenches 116 may be arranged to be spaced from each other in line in one direction. In addition, the well region 110, the channel region 110*a*, and the source region 112 may be formed in the semiconductor layer 105 between the trenches 116.

The method of fabricating the power semiconductor device 100*c*-6, which is described with reference to FIG. 70, may further include forming at least one groove 138 in the source region 112 so as to penetrate the source region 112 and to be recessed into the well region 110, forming the well contact region 114 on a bottom surface of the groove 138 so as to be in contact with the well region 110, and forming the source electrode layer 140 so as to be connected with the well contact region 114.

According to the above fabricating method, the power semiconductor device 100-6 using the semiconductor layer 105 of silicon carbide may be economically fabricated by using processes that are applied to a conventional silicon substrate.

Figure 75:
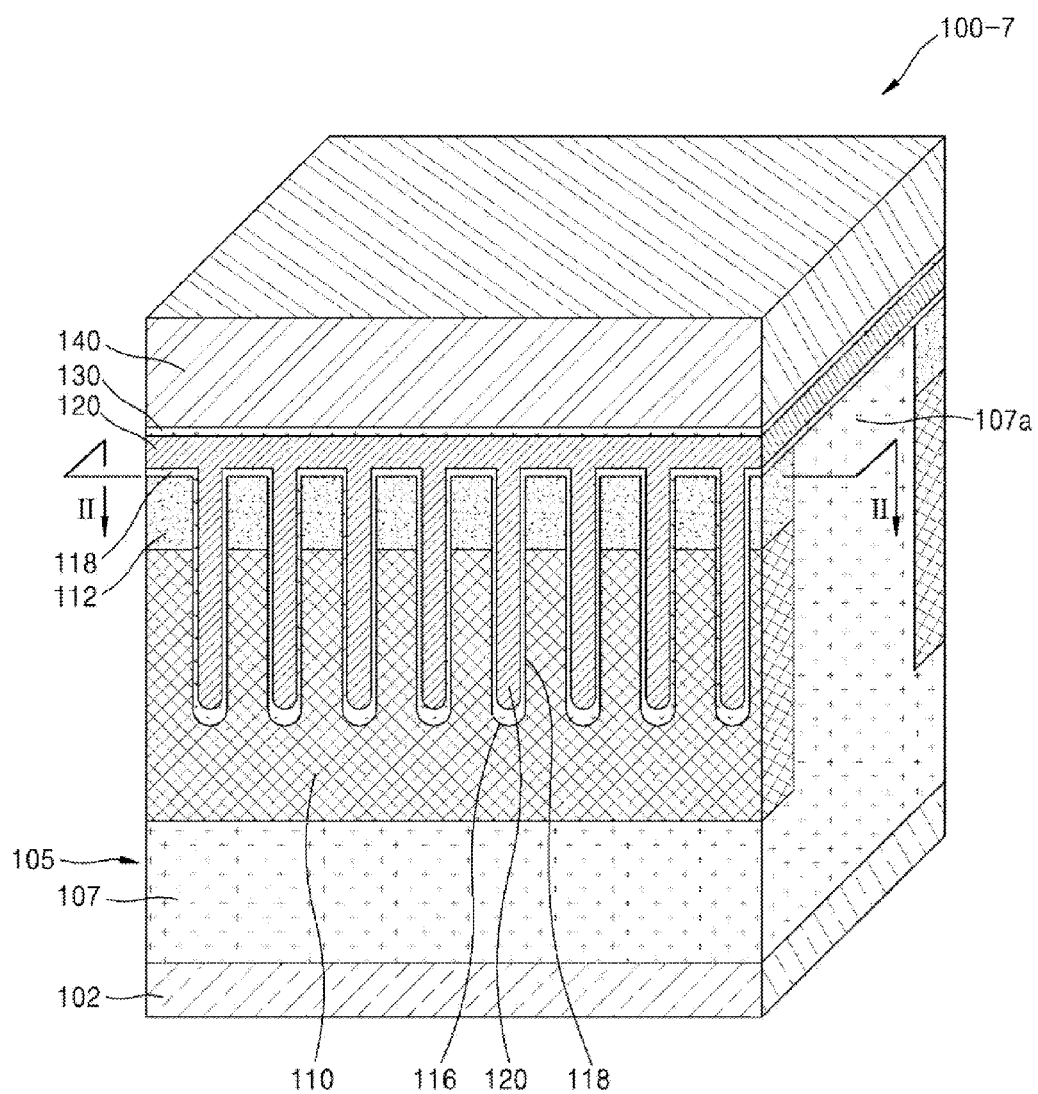
FIG. 75 is a schematic perspective view illustrating a power semiconductor device according to an embodiment of the present disclosure.
Figure 76:
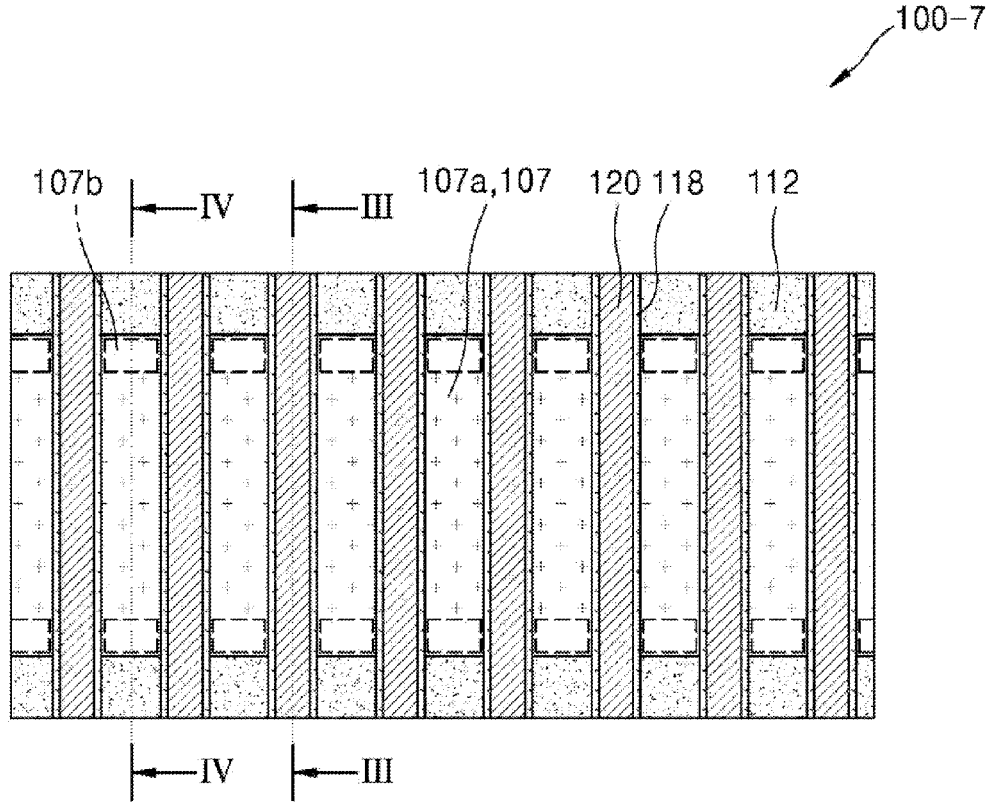
FIG. 76 is a plan view illustrating a power semiconductor device taken along line II-II of FIG. 75.
Figure 77:
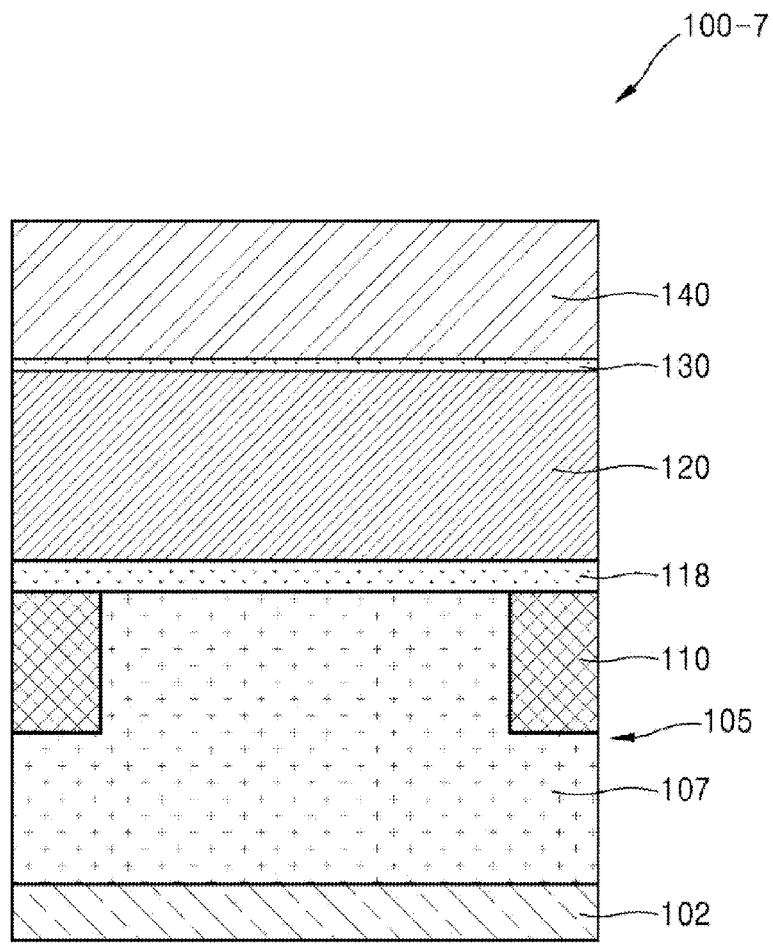
FIG. 77 is a cross-sectional view illustrating a power semiconductor device taken along line III-III of FIG. 76.
Figure 78:
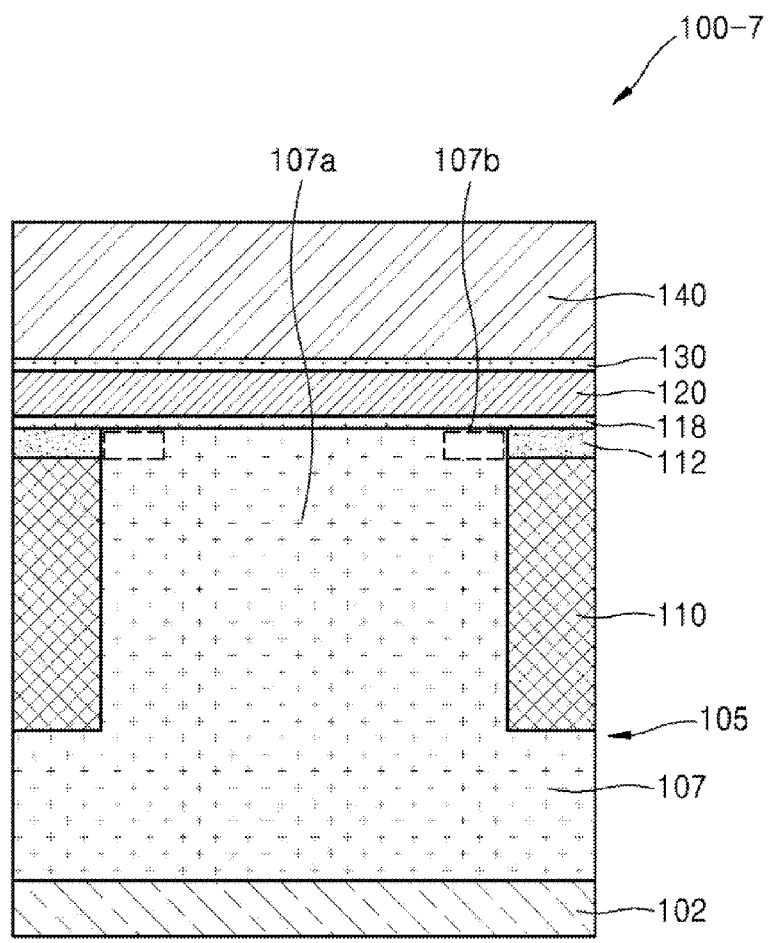
FIG. 78 is a cross-sectional view illustrating a power semiconductor device taken along line IV-IV of FIG. 76.

FIG. 75 is a schematic perspective view illustrating a power semiconductor device 100-7 according to an embodiment of the present disclosure, FIG. 76 is a plan view illustrating the power semiconductor device 100-7 taken along line II-II of FIG. 75, FIG. 77 is a cross-sectional view illustrating the power semiconductor device 100-7 taken along line III-III of FIG. 76, and FIG. 78 is a cross-sectional view illustrating the power semiconductor device 100-7 taken along line IV-IV of FIG. 76.

Referring to FIGS. 75 to 78, the power semiconductor device 100-7 may at least include the semiconductor layer 105, the gate insulating layer 118, and the gate electrode layer 120. For example, the power semiconductor device 100-7 may have a power MOSFET structure.

The semiconductor layer 105 may refer to one semiconductor material layer or a plurality of semiconductor material layers, for example, may refer to one epitaxial layer or a plurality of epitaxial layers. In addition, the semiconductor layer 105 may refer to one or multiple epitaxial layers on a semiconductor substrate.

For example, the semiconductor layer 105 may be formed of silicon carbide (SiC). In more detail, the semiconductor layer 105 may include at least one epitaxial layer of silicon carbide.

Silicon carbide (SiC) may have a bandgap wider than silicon, thus maintaining stability even at a high temperature compared to silicon. In addition, because a breakdown electric field of the silicon carbide is higher than that of the silicon, the silicon carbide may stably operate even at a high temperature. Accordingly, the power semiconductor device 100-7 including the semiconductor layer 105 formed of silicon carbide may have a high breakdown voltage compared to the case of using silicon and may provide an excellent heat release characteristic and a stable operating characteristic at a high temperature.

In more detail, the semiconductor layer 105 may include the drift region 107. The drift region 107 may have the first conductivity type and may be formed by implanting impurities of the first conductivity type into a part of the semiconductor layer 105. For example, the drift region 107 may be formed by doping impurities of the first conductivity type in an epitaxial layer of silicon carbide.

The well region 110 may be formed in the semiconductor layer 105 to be in contact with at least a part of the drift region 107 and may have a second conductivity type. For example, the well region 110 may be formed by doping impurities of the second conductivity type opposite to the first conductivity type in the drift region 107.

For example, the well region 110 may be formed to surround at least a part of the drift region 107. In more detail, the well region 110 may include the vertical portion 107a that vertically extend in the semiconductor layer 105 of one side of the gate electrode layer 120. For example, at least a part of the vertical portion 107a of the drift region 107 may include the vertical portion 107a may be surrounded and restricted by the well region 110. In an operation of the power semiconductor device 100-7, the vertical portion 107a may provide a vertical movement path of charges.

The well region 110 is illustrated in FIG. 75 as including two regions spaced from each other and the vertical portion 107a interposed therebetween, but the well region 110 may be variously changed or modified. For example, the vertical portion 107a may have a shape whose side surface is surrounded by the well region 110 once.

The source region 112 may be formed in the well region 110 and may have the first conductivity type. For example, the source region 112 may be formed by doping impurities of the first conductivity type in the well region 110. The concentration of the first conductivity-type impurities doped in the source region 112 may be higher than that doped in the drift region 107.

The channel region 107b may be formed in the semiconductor layer 105 between the drift region 107 and the source region 112. For example, the channel region 107b may have the first conductivity type, and the accumulation channel may be formed therein in an operation of the power semiconductor device 100-7.

For example, the channel region 107b may be formed in the semiconductor layer 105 between the source region 112 and the vertical portion 107a of the drift region 107. The channel region 107b may have the same doping type as the source region 112 and the drift region 107.

In this case, the source region 112, the channel region 107b, and the drift region 107 may be normally electrically connected. However, in the structure of the semiconductor layer 105 of silicon carbide, a potential barrier is formed while a band of the channel region 107b is upwardly bent due to the influence of a negative charge generated by the formation of a carbon cluster in the gate insulating layer 118. As such, there may be formed the accumulation channel that permits a charge or current flow in the channel region 107b only when an operating voltage is applied to the gate electrode layer 120.

Accordingly, a threshold voltage to be applied to the gate electrode layer 120 to form the accumulation channel in the channel region 107b may be considerably lower than a threshold voltage to be applied to the gate electrode layer 120 to form a normal inversion channel.

In some embodiments, the channel region 107b may be a part of the drift region 107. In more detail, the channel region 107b may be a part of the vertical portions 107a of the drift region 107. For example, the channel region 107b may be integrally formed with the drift region 107.

In this case, the drift region 107 may be connected with the source region 112 through the channel region 107b. That is, at a channel region (107b) part, the drift region 107 and the source region 112 may be in contact with each other.

For example, a doping concentration of the first conductivity-type impurities of the channel region 107b may be the same as that of the remaining portion of the drift region 107 or may be different therefrom for the adjustment of a threshold voltage.

In some embodiments, the well region 110, the channel region 107b, and the source region 112 may be formed to be symmetrical with respect to the vertical portion 107a of the drift region 107. The well region 110, the channel region 107b, and the source region 112 may be formed in the semiconductor layer 105 of opposite sides of the vertical portion 107a, or each of the well region 110, the channel region 107b, and the source region 112 may include a first part and a second part formed to be symmetrical with respect to the vertical portion 107a. In each of the well region 110, the channel region 107b, and the source region 112, the first part and the second part may be separated from each other or may be connected to each other.

In addition, the drain region 102 may be formed in the semiconductor layer 105 under the drift region 107 and may have the first conductivity type. For example, the drain region 102 may be doped with impurities of a high concentration compared to the drift region 107.

In some embodiments, the drain region 102 may be implemented with a substrate of silicon carbide having the first conductivity type. In this case, the drain region 102 may be understood as a part of the semiconductor layer 105 or may be understood as a substrate independent of the semiconductor layer 105.

At least one trench 116 may be formed to be recessed into the semiconductor layer 105 from a surface of the semiconductor layer 105 as much as a given depth. For example, the at least one trench 116 may have a predetermined depth from the surface (e.g., an upper surface) of the semiconductor layer 105. The trench 116 may extend in one direction within the semiconductor layer 105. One direction may refer to a length direction, not a depth direction of the trench 116, and may refer to a direction of line III-III or line IV-IV of FIG. 76.

The gate insulating layer 118 may be formed at least on an inner wall of the trench 116. For example, the gate insulating layer 118 may include an insulating material such as silicon oxide, silicon carbide oxide, silicon nitride, hafnium oxide, zirconium oxide, or aluminum oxide, or may include a stacked structure thereof. A thickness of the gate insulating layer 118 may be uniform, or a part of the gate insulating layer 118 formed on the bottom surface of the trench 116 may be thicker than a part of the gate insulating layer 118 formed on a side wall of the trench 116 such that an electric field decreases at a bottom part of the trench 116.

At least one gate electrode layer 120 may be formed on the gate insulating layer 118 so as to disposed in the trench 116. For example, the gate electrode layer 120 may include an appropriate conductive material such as polysilicon, metal, metal nitride, or metal silicide, or may include a stacked structure thereof.

The drift region 107 may be formed in the semiconductor layer 105 on one side of the gate electrode layer 120. For example, the vertical portion 107a of the drift region 107 may vertically extend in the semiconductor layer 105 of one side of the gate electrode layer 120.

In some embodiments, the drift region 107 may be formed in the semiconductor layer 105 on opposite sides of the gate electrode layer 120. For example, the drift region 107 may include the vertical portions 107a that vertically extend in the semiconductor layer 105 of opposite sides of the gate electrode layer 120.

The well region 110 may be formed to be deeper than the gate electrode layer 120, so as to surround the bottom surface of the gate electrode layer 120 at one end of the gate electrode layer 120. In addition, the well region 110 may be formed to be deeper than the gate electrode layer 120, so as to surround the bottom surface of the gate electrode layer 120 at opposite ends of the gate electrode layer 120. As such, opposite end parts of the gate electrode layer 120 around the source region 112 may be surrounded by the well region 110.

This structure may alleviate the concentration of an electric field on the bottom surface of the trench 116, that is, at a lower part of the gate electrode layer 120. Accordingly, in the power semiconductor device 100-7 according to the embodiment, the well region 110 may be formed to be deeper than the gate electrode layer 120 without additionally forming a deep well, and thus, the concentration of an electric field on the bottom surface of the trench 116 may be alleviated. A conventional vertical channel structure is problematic in that a junction resistance and a threshold voltage increase as a distance between a deep well and a trench becomes shorter. However, the issue may not occur in the power semiconductor device 100-7 according to the embodiment.

The channel region 107b may be formed in the semiconductor layer 105 of one side of the gate electrode layer 120 between the vertical portion 107a of the drift region 107 and the source region 112. Accordingly, the semiconductor layer 105 of the one side of the gate electrode layer 120 may include a structure in which the source region 112, the channel region 107b, and the vertical portion 107a of the drift region 107 are connected along one direction.

The above structure of the channel region 107b may be called a "lateral channel structure" in that the channel region 110a is formed along a side wall of the gate electrode layer 120.

In addition, channel regions 107b may be formed in the semiconductor layer 105 of opposite sides of the gate electrode layer 120 between the vertical portion 107a of the drift region 107 and the source region 112. In the above embodiments, the channel region 107b may be a part of the vertical portions 107a of the drift region 107.

In some embodiments, the gate insulating layer 118 and the gate electrode layer 120 may be formed in the trench 116, and in addition, may be formed to further extend to the outside of the trench 116.

In some embodiments, one trench 116 or a plurality of trenches 116 may be provided in the semiconductor layer 105. The number of trenches 116 may be appropriately selected without limiting the scope of the embodiment.

For example, the plurality of trenches 116 may be formed in the semiconductor layer 105 in parallel along one direction. As the trenches 116 extend in one direction and are spaced from each other in a direction perpendicular to the one direction, the trenches 116 may be arranged in parallel.

In this case, a plurality of gate electrode layers 120 may be formed on the gate insulating layer 118 so as to fill the inside of the trenches 116. As such, the gate electrode layers 120 may be formed in the semiconductor layer 105 in a trench type and may be arranged to extend in parallel in the one direction like the trenches 116.

Also, the gate insulating layer 118 and the gate electrode layers 120 may further extend to the outside of the trenches 116, and thus, may be widely formed on the semiconductor layer 105 across the trenches 116.

In addition, the well region 110 may extend across the gate electrode layers 120. The vertical portions 107a of the drift region 107 may be arranged in the semiconductor layer 105 between the gate electrode layers 120. The channel region 107b may be formed in the semiconductor layer 105 between the source region 112 and the vertical portions 107a of the drift region 107 on one side or opposite sides of each of the gate electrode layers 120.

In some embodiments, the source region 112 may be connected across the gate electrode layers 120 while surrounding end parts of the gate electrode layers 120.

In some embodiments, the well region 110 may be formed in the semiconductor layer 105 to be deeper than the gate electrode layers 120, so as to be in contact with the vertical portions 107a of the drift region 107 and to surround the bottom surface of the gate electrode layers 120 at opposite ends of the gate electrode layers 120.

The interlayer insulating layer 130 may be formed on the gate electrode layer 120. For example, the interlayer insulating layer 130 may include an appropriate insulating material such as oxide or nitride, or may include a stacked structure thereof.

The source electrode layer 140 may be formed on the interlayer insulating layer 130 and may be connected with the source region 112. For example, the source electrode layer 140 may be formed of an appropriate conductive material, metal, etc.

In the power semiconductor device 100-7 described above, the first conductivity type and the second conductivity type may be opposite to each other, and each of the first conductivity type and the second conductivity type may be one of n-type and p-type. For example, when the first conductivity type is n-type, the second conductivity type is p-type, and vice versa.

In more detail, when the power semiconductor device 100-7 is an N-type MOSFET, the drift region 107 and the channel region 107b may be an N− region, the source region 112 and the drain region 102 may be N+ regions, and the well region 110 may be a P− region.

In an operation of the power semiconductor device 100-7, a current may generally flow in a vertical direction from the drain region 102 along the vertical portions 107a of the drift region 107, and may then flow through the channel region 107b to the source region 112 along the side surfaces of the gate electrode layers 120.

In the power semiconductor device 100-7 described above, the gate electrode layers 120 may be densely arranged in parallel in a stripe type, and the channel regions 110a may be disposed on the side surfaces of the gate electrode layers 120. As such, a channel density may increase.

Also, in the power semiconductor device 100-7, because the bottom surfaces of the gate electrode layers 120 are surrounded by the well region 110, a breakdown phenomenon due to the concentration of an electric field on edges of the trenches 116 may be alleviated. Accordingly, the high withstand voltage characteristic of the power semiconductor device 100-7 may be improved. This may mean that the reliability of operation of the power semiconductor device 100-1 is improved.

Figure 79:
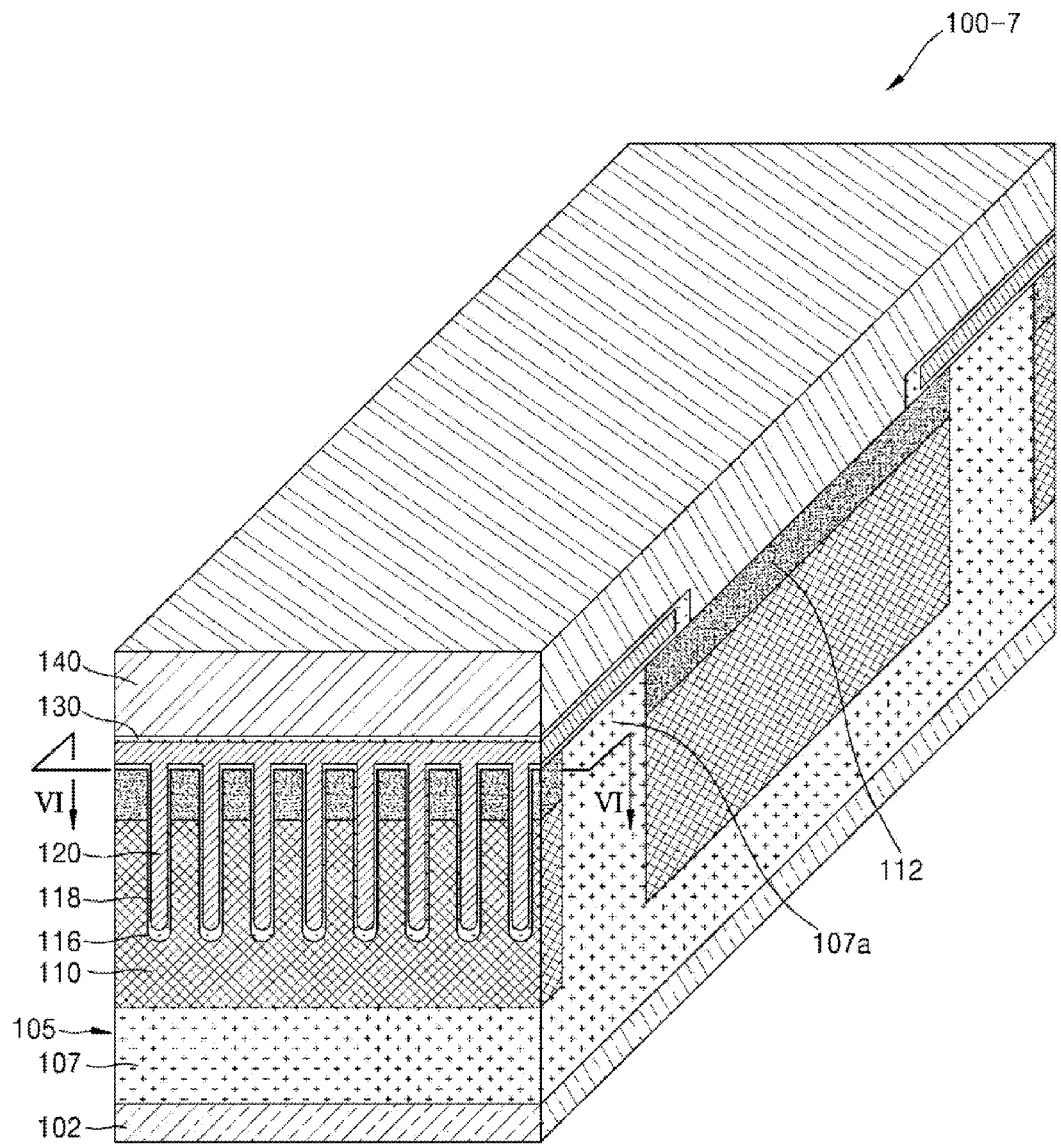
FIG. 79 is a schematic perspective view illustrating a power semiconductor device according to another embodiment of the present disclosure.
Figure 80:
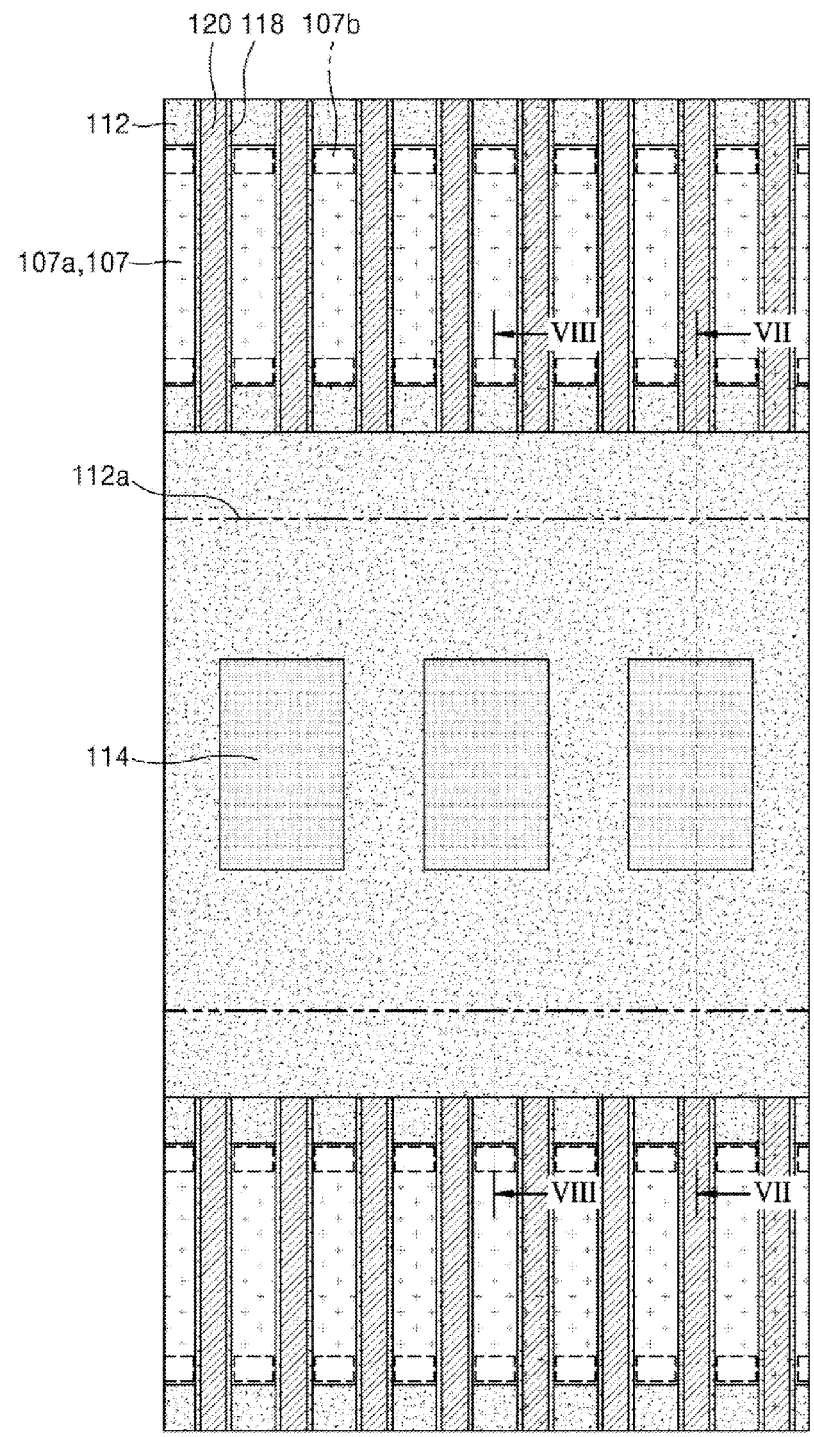
FIG. 80 is a plan view illustrating a power semiconductor device taken along line VI-VI of FIG. 79.
Figure 81:
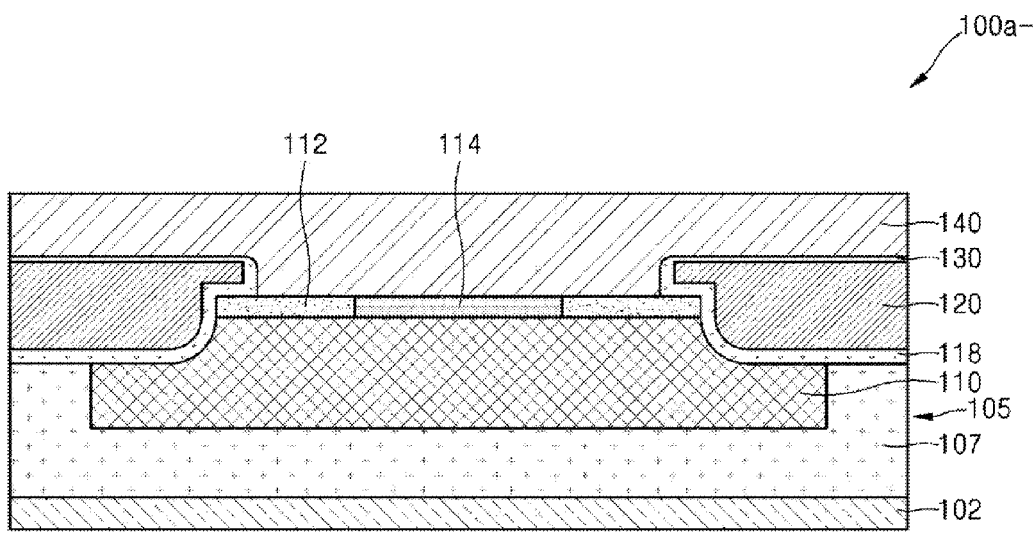
FIG. 81 is a cross-sectional view illustrating a power semiconductor device taken along line VII-VII of FIG. 80.
Figure 82:
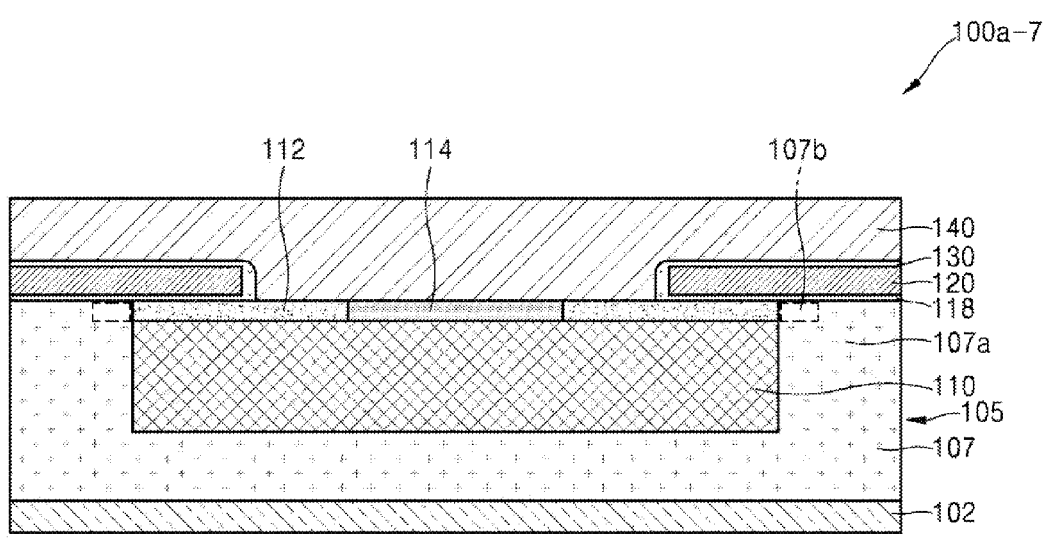
FIG. 82 is a cross-sectional view illustrating a power semiconductor device taken along line VIII-VIII of FIG. 80.

FIG. 79 is a schematic perspective view illustrating a power semiconductor device 100a-7 according to another embodiment of the present disclosure, FIG. 80 is a plan view illustrating the power semiconductor device 100a-7 taken along line VI-VI of FIG. 79, FIG. 81 is a cross-sectional view illustrating the power semiconductor device 100a-7 taken along line VII-VII of FIG. 80, and FIG. 82 is a cross-sectional view illustrating the power semiconductor device 100a-7 taken along line VIII-VIII of FIG. 80.

The power semiconductor device 100a-7 according to the embodiment may be implemented by using or partially modifying the power semiconductor device 100-7 of FIGS. 75 to 78, and thus, additional description will be omitted to avoid redundancy.

Referring to FIGS. 79 to 82, the source region 112 may include the source contact region 112a connected with the source electrode layer 140 outside at least one ends of the gate electrode layers 120. For example, the source contact region 112a that is a part of the source region 112 may refer to the part with which the source electrode layer 140 is connected.

The well contact region 114 may be formed in the source contact region 112a. For example, the well contact region 114 may extend from the well region 110 to penetrate the source region 112 and may have the second conductivity type. One well contact region 114 or a plurality of source contact regions 114 may be formed in the source contact region 112a.

For example, the well contact region 114 may be connected with the source electrode layer 140, and may be doped with second conductivity-type impurities of a higher concentration than the well region 110 to reduce a contact resistance when connected with the source electrode layer 140.

An example is illustrated in FIGS. 79 to 82 as the source contact region 112a and the well contact region 114 are formed in the source region 112 of one side of the vertical portions 107a of the drift region 107. However, the source contact region 112a and the well contact region 114 may be formed at opposite sides of each of the vertical portions 107a of the drift region 107; or, when each of the source region 112 and the well region 110 is divided into a plurality of regions, each of the source contact region 112a and the well contact region 114 may be formed in each of the corresponding regions.

In some embodiments, the plurality of trenches 116 may be arranged to be spaced from each other in line along one direction. As such, the gate electrode layers 120 may also be arranged to be spaced from each other in line in the one direction, along the trenches 116. In this case, the well region 110 and the source region 112 may be formed in the semiconductor layer 105 so as to be located between the trenches 116 arranged to be spaced from each other in line along the one direction.

For example, the structure of the power semiconductor device 100-7 of FIGS. 75 to 77 may be arranged in plurality along one direction, and the well region 110, the source region 112, the source contact region 112a, and the well contact region 114 may be formed therebetween.

For example, when the power semiconductor device 100-7 is an N-type MOSFET, the source contact region 112a may be an N+ region, and the well contact region 114 may be a P+ region.

In the power semiconductor device 100a-7 according to the embodiment, the source contact region 112a and the well contact region 114 may be disposed outside the gate electrode layers 120, not between the gate electrode layers 120, and thus, the gate electrode layers 120 may be arranged more densely. As such, a channel density of the power semiconductor device 100a-7 may markedly increase.

In addition, according to the power semiconductor device 100a-7, as a threshold voltage is decreased by using the channel region 107b where the accumulation channel is formed and a breakdown phenomenon due to the concentration of an electric field on edges of the trenches 116 is alleviated, a high withstand voltage characteristic of the power semiconductor device 100a-7 may be improved. This may mean that the reliability of operation of the power semiconductor device 100a-7 is improved.

Figure 83:
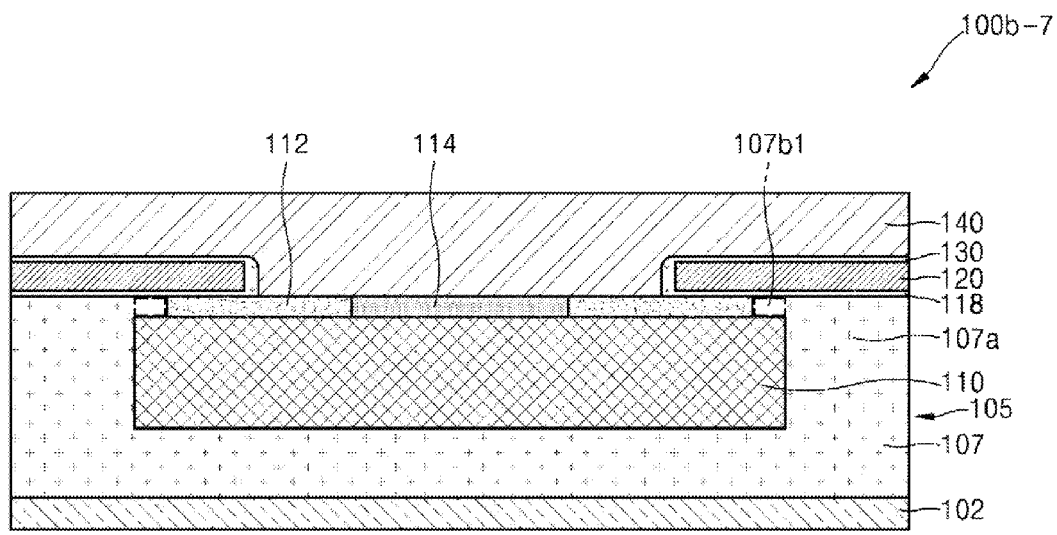
FIGS. 83 and 86 are cross-sectional views illustrating power semiconductor devices according to other embodiments of the present disclosure.
Figure 86:
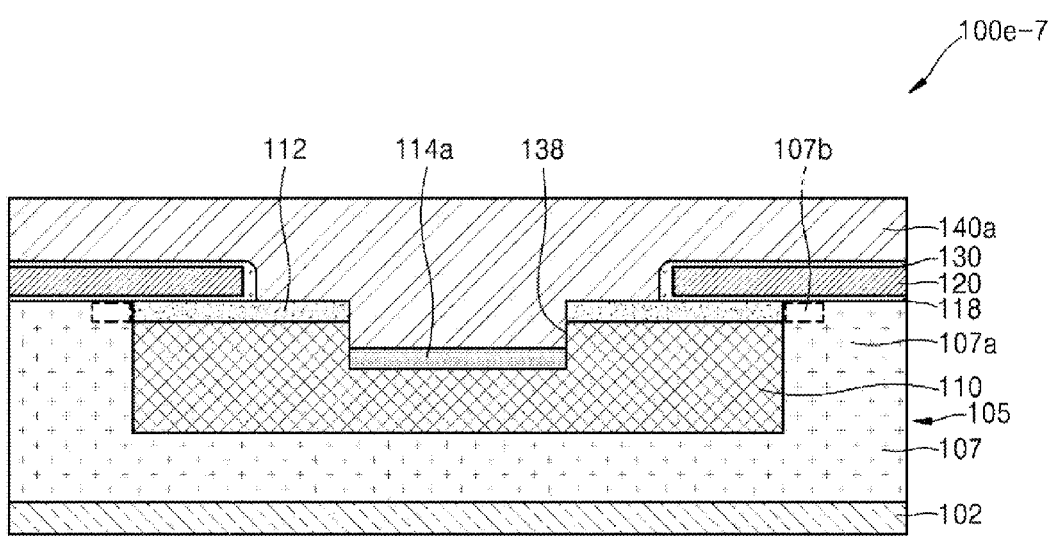

FIGS. 83 and 86 are cross-sectional views illustrating power semiconductor devices 100b-7, 100c-7, 100d-7, and 100e-7 according to other embodiments of the present disclosure. Each of the power semiconductor devices 100b-7, 100c-7, 100d-7, and 100e-7 may be implemented by modifying a partial configuration of the power semiconductor device 100-7 or 100a-7 of FIGS. 75 to 82, and thus, additional description will be omitted to avoid redundancy.

Referring to FIG. 83, in the power semiconductor device 100b-7, the well region 110 may protrude toward the vertical portion 107a of the drift region 107 father than a part of the source region 112.

A channel region 107b1 may be formed in the semiconductor layer 105 on the protruding portion of the well region 110. For example, the vertical portion 107a of the drift region 107 may further extend to a groove portion between the well region 110 and the gate electrode layer 120, which is formed as the well region 110 protrudes, and the channel region 107b1 may be formed at the vertical portion 107a.

The above structure may allow the channel region 107b1 to be more restricted between the gate electrode layer 120 and the well region 110.

Figure 84:
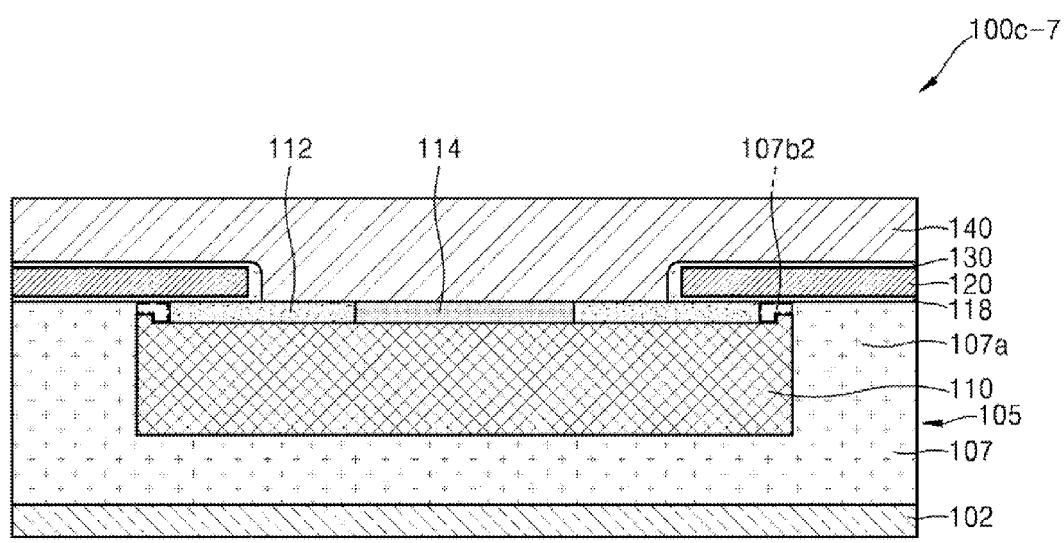

Referring to FIG. 84, in the power semiconductor device 100c-7, the well region 110 may protrude toward the vertical portion 107a of the drift region 107 father than a part of the source region 112, and in addition, may include a tap portion extending toward the gate electrode layer 120 at an end part thereof. For example, the well region 110 may protrude toward the vertical portion 107a of the drift region 107 father than the source region 112, and may include the tap portion at an end part thereof.

A channel region 107b2 may be formed in the semiconductor layer 105 on the protruding portion of the well region 110. For example, the channel region 107b2 may be formed on the protruding portion and the tap portion of the well region 110 in a bent shape. The above structure may allow the channel region 107b2 to be more restricted between the gate electrode layer 120 and the well region 110.

Figure 85:
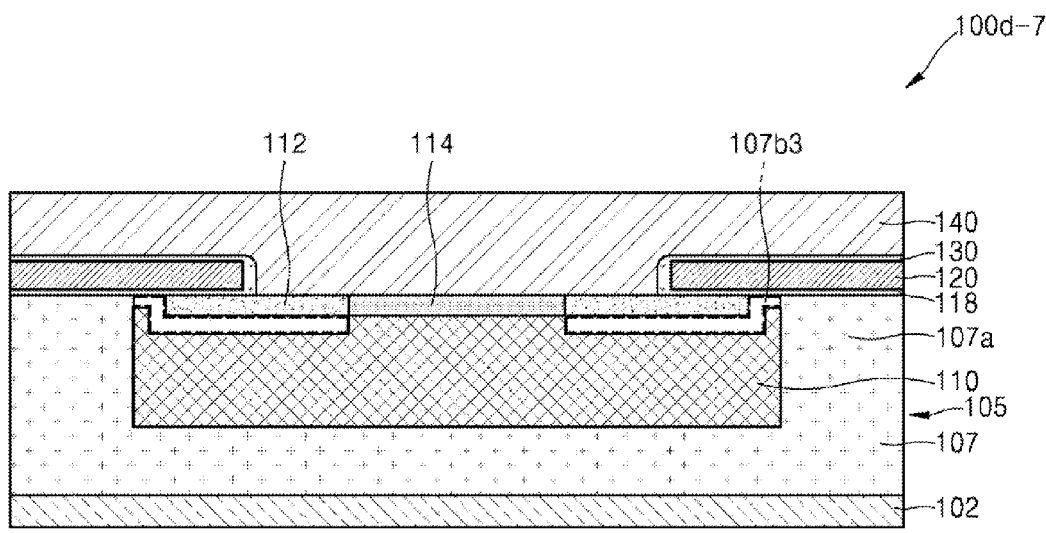

Referring to FIG. 85, in the power semiconductor device 100d-7, the well region 110 may protrude toward the vertical portion 107a of the drift region 107 father than a part of the source region 112, and in addition, may include a tap portion extending toward the gate electrode layer 120 at an end part thereof. For example, the well region 110 may protrude toward the vertical portion 107a of the drift region 107 father than the source region 112, and may include the tap portion at an end part thereof. Additionally, the vertical portion 107a of the drift region 107 may further extend to between a lower part of the source region 112 and the well region 110.

A channel region 107b3 may be formed to further extend to between the lower part of the source region 112 and the well region 110. For example, the channel region 107b3 may be formed from on the tap portion of the well region 110 to the lower part in a bent shape. This structure may make the contact area between the channel region 107b3 and the source region 112 wide.

Referring to FIG. 86, the power semiconductor device 100e-7 may include at least one groove 138, which is formed to penetrate the source region 112 and to be recessed into the well region 110, in the source contact region 112a of the source region 112. The well contact region 114a may be formed on at least a bottom surface of the groove 138 so as to be in contact with the well region 110.

The source electrode layer 140a may be formed to fill the groove 138, and thus, may be connected with the well contact region 114a, the well region 110, and/or the source region 112. The above structure may widen the area where the source electrode layer 140a is in contact with the well region 110 and the source region 112, such that contact resistances therebetween decrease.

In some embodiments, the well contact region 114a may be formed on the whole surface of the well region 110 exposed by the groove 138. Accordingly, the well contact region 114a may be formed on the well region 110 exposed from a bottom surface and a side wall of the groove 138. The above structure of the well contact region 114a may allow the contact resistance between the source electrode layer 140a and the well region 110 to further decrease.

Figure 87:
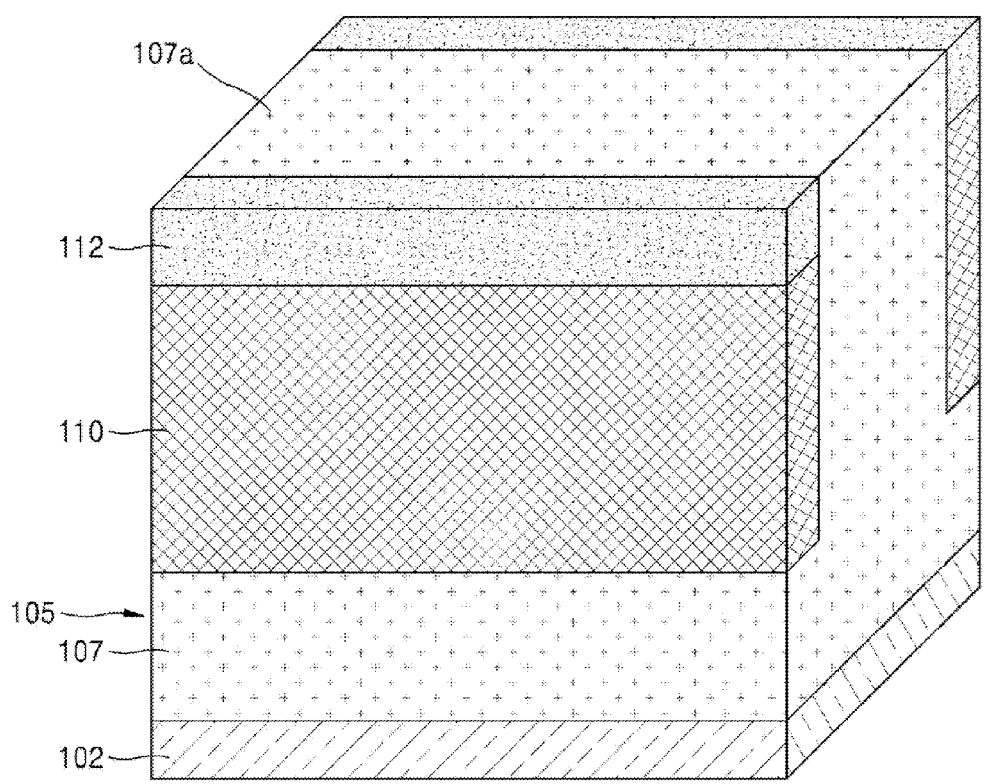
FIGS. 87 to 89 are schematic perspective views illustrating a method of fabricating a power semiconductor device according to an embodiment of the present disclosure.
Figure 88:
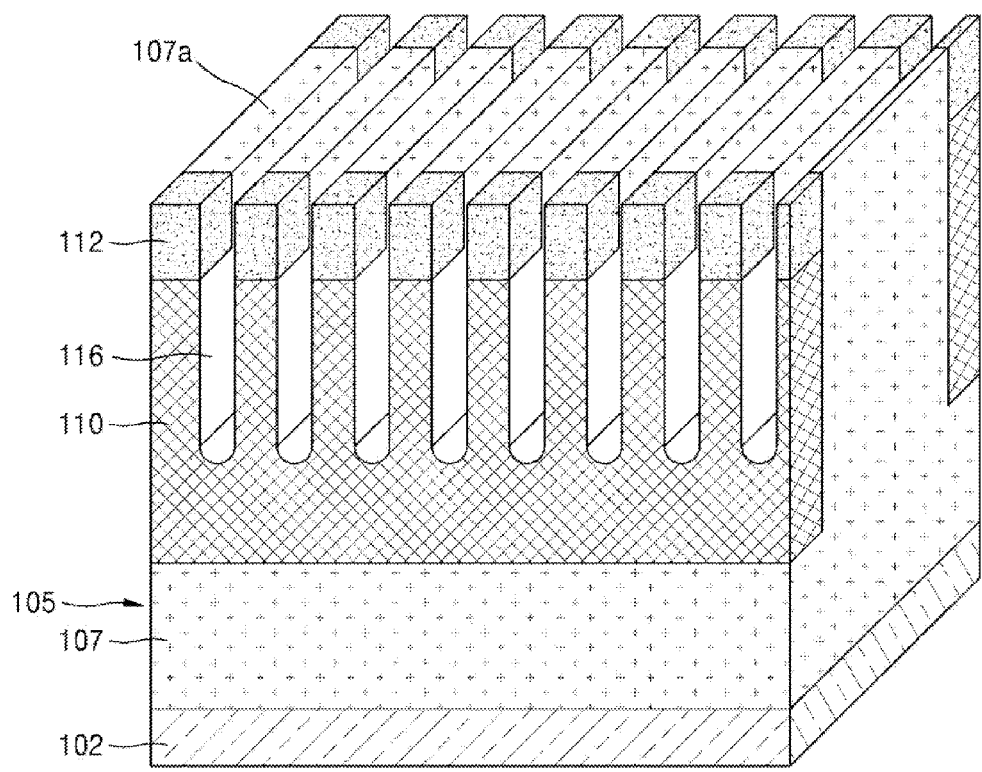
Figure 89:
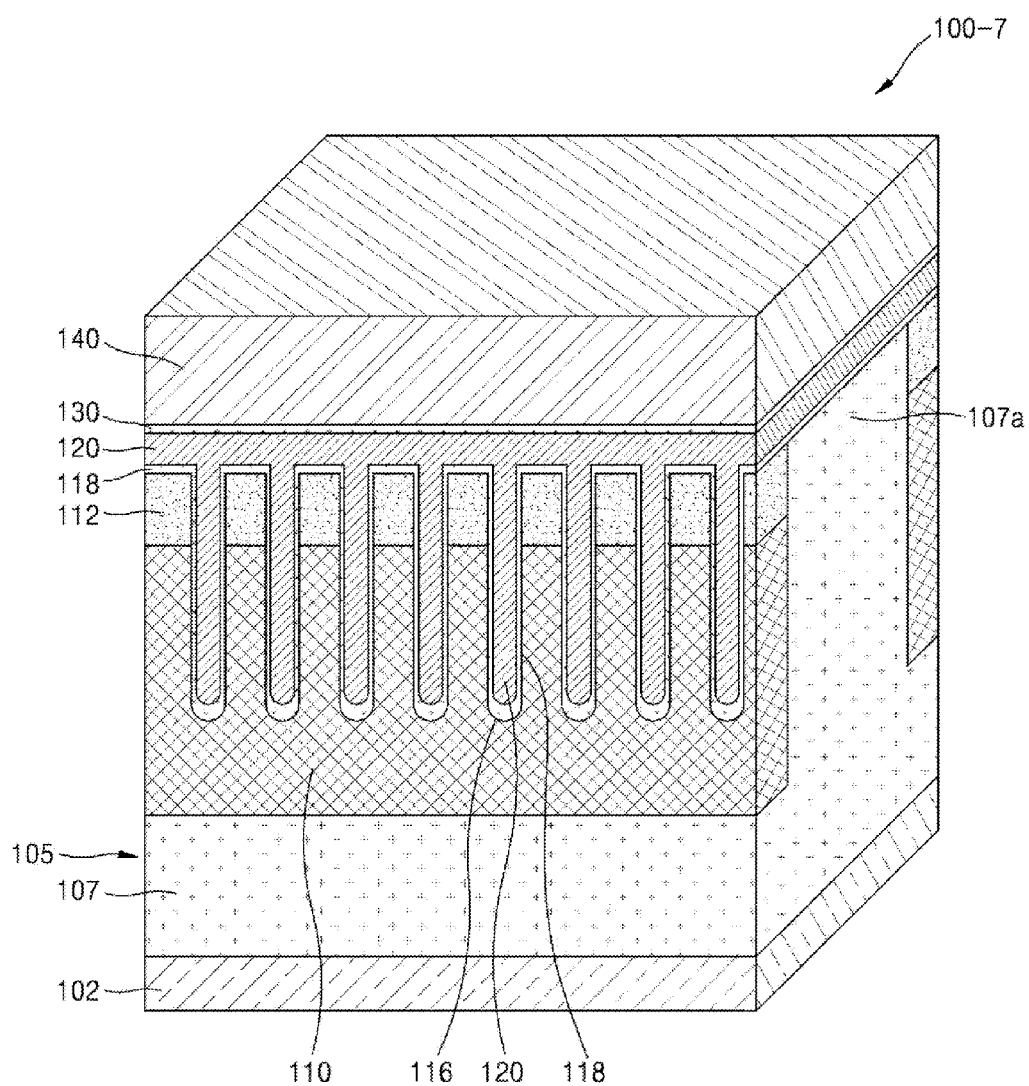

FIGS. 87 to 89 are schematic perspective views illustrating a method of fabricating the power semiconductor device 100a-7 according to an embodiment of the present disclosure.

Referring to FIG. 87, the drift region 107 having the first conductivity type may be formed in the semiconductor layer 105 of silicon carbide (SiC). For example, the drift region 107 may be formed on the drain region 102 having the first conductivity type. In some embodiments, the drain region 102 may be implemented with a substrate of the first conductivity type, and the drift region 107 may be formed on the substrate with one or more epitaxial layers.

Next, the well region 110 having the second conductivity type may be formed in the semiconductor layer 105 so as to be in contact with at least a part of the drift region 107. For example, the forming of the well region 110 may be performed by implanting impurities of the second conductivity type into the semiconductor layer 105.

For example, the well region 110 may be formed in the semiconductor layer 105 such that the drift region 107 includes the vertical portion 107a, at least a part of which is surrounded by the well region 110. In more detail, the well region 110 may be formed by doping impurities of a conductivity type opposite to that of the drift region 107 in the drift region 107.

Then, the source region 112 having the first conductivity type may be formed in the well region 110. For example, source region 112 may be formed by implanting impurities of the first conductivity type into the well region 110.

In addition to the formation of the source region 112, at least one channel region 107b in which the accumulation channel is formed along one direction and which has the second conductivity type may be formed in the semiconductor layer 105 between the source region 112 and the drift region 107. For example, the channel region 107b may be formed between the source region 112 and the vertical portion 107a of the drift region 107.

For example, when the channel region 107b is a part of the drift region 107, the source region 112 may be formed to be in contact with the drift region 107 through the channel region 107b.

In the above fabricating method, the impurity implantation or the impurity doping may be performed such that the impurities are mixed when the impurities are implanted into the semiconductor layer 105 or an epitaxial layer is formed. However, an ion implantation method using a mask pattern may be used for implantation of the impurities in a selective region.

Optionally, a heat treatment process for activating or diffusing the impurities may be performed after the ion implantation.

Referring to FIG. 88, at least one trench 116 may be formed to be recessed into the semiconductor layer 105 from the surface of the semiconductor layer 105 as much as a given depth. For example, the at least one trench 116 may have a predetermined depth from the surface (e.g., an upper surface) of the semiconductor layer 105.

For example, the trench 116 may extend across the drift region 107 in one direction and may be formed to be shallower than the well region 110.

In addition, the plurality of trenches 116 may be formed in the semiconductor layer 105 in parallel in one direction.

For example, the trenches 116 may be formed by forming a photo mask by using photo lithography and then etching the semiconductor layer 105 by using the photo mask as an etching protection layer.

Referring to FIG. 89, the gate insulating layer 118 may be formed at least on the inner walls of the trenches 116. For example, the gate insulating layer 118 may be formed by oxidizing the semiconductor layer 105 to form an oxide or by depositing an insulating material such as oxide or nitride on the semiconductor layer 105.

Afterwards, the gate electrode layers 120 may be formed on the gate insulating layer 118 so as to be disposed in the trenches 116. For example, the gate electrode layer 120 may be formed by forming a conductive layer on the gate insulating layer 118 and patterning the conductive layer. The gate electrode layer 120 may be formed by doping impurities in polysilicon or may be formed to include a conductive metal or metal silicide.

For example, the gate insulating layer 118 and the gate electrode layers 120 may be formed to further protrude outside the trenches 116. In addition, the gate insulating layer 118 and the gate electrode layers 120 may be widely formed on the semiconductor layer 105 across the trenches 116.

A patterning process may be performed by using photo lithography and etching processes. The photo lithography process may include a process of forming a photoresist pattern as a mask layer by using a photo process and a development process, and the etching process may include a process of selectively etching an underlying structure by using the photoresist pattern.

As such, the well region 110 may be disposed to be deeper than the gate electrode layer 120 so as to surround the bottom surface of the gate electrode layer 120 at least at one end of the gate electrode layer 120, and the channel region 107b may be formed in the semiconductor layer 105 of one side or opposite sides of the gate electrode layer 120 between the drift region 107 and the source region 112.

In addition, the interlayer insulating layer 130 may be formed on the gate electrode layer 120.

Afterwards, the source electrode layer 140 may be formed on the interlayer insulating layer 130. For example, the source electrode layer 140 may be formed by forming a conductive layer, for example, a metal layer on the interlayer insulating layer 130 and patterning the conductive layer.

Meanwhile, the power semiconductor device 100a-7 of FIGS. 79 to 82 may be fabricated by adding some processes to the method of fabricating the power semiconductor device 100-7 described above or changing or modifying the fabricating method.

For example, when the power semiconductor device 100a-7 is fabricated, the forming of the source region 112 may include forming the source contact region 112a connected with the source electrode layer 140 at least outside one end of the gate electrode layer 120. In some embodiments, the source contact region 112a may not be distinguished from the source region 112.

In addition, before the trenches 116 are formed, the well contact region 114 may be formed in the source contact region 112a. For example, the well contact region 114 may be formed by implanting the second conductivity-type impurities of a higher concentration than the well region 110, into a part of the well region 110.

When the power semiconductor device 100a-7 is fabricated, the trenches 116 may be arranged to be spaced from each other in line in one direction. In addition, the well region 110, the channel region 107b, and the source region 112 may be formed in the semiconductor layer 105 between the trenches 116.

According to the above fabricating method, the power semiconductor device 100-7 using the semiconductor layer 105 of silicon carbide may be economically fabricated by using processes that are applied to a conventional silicon substrate.

Figure 90:
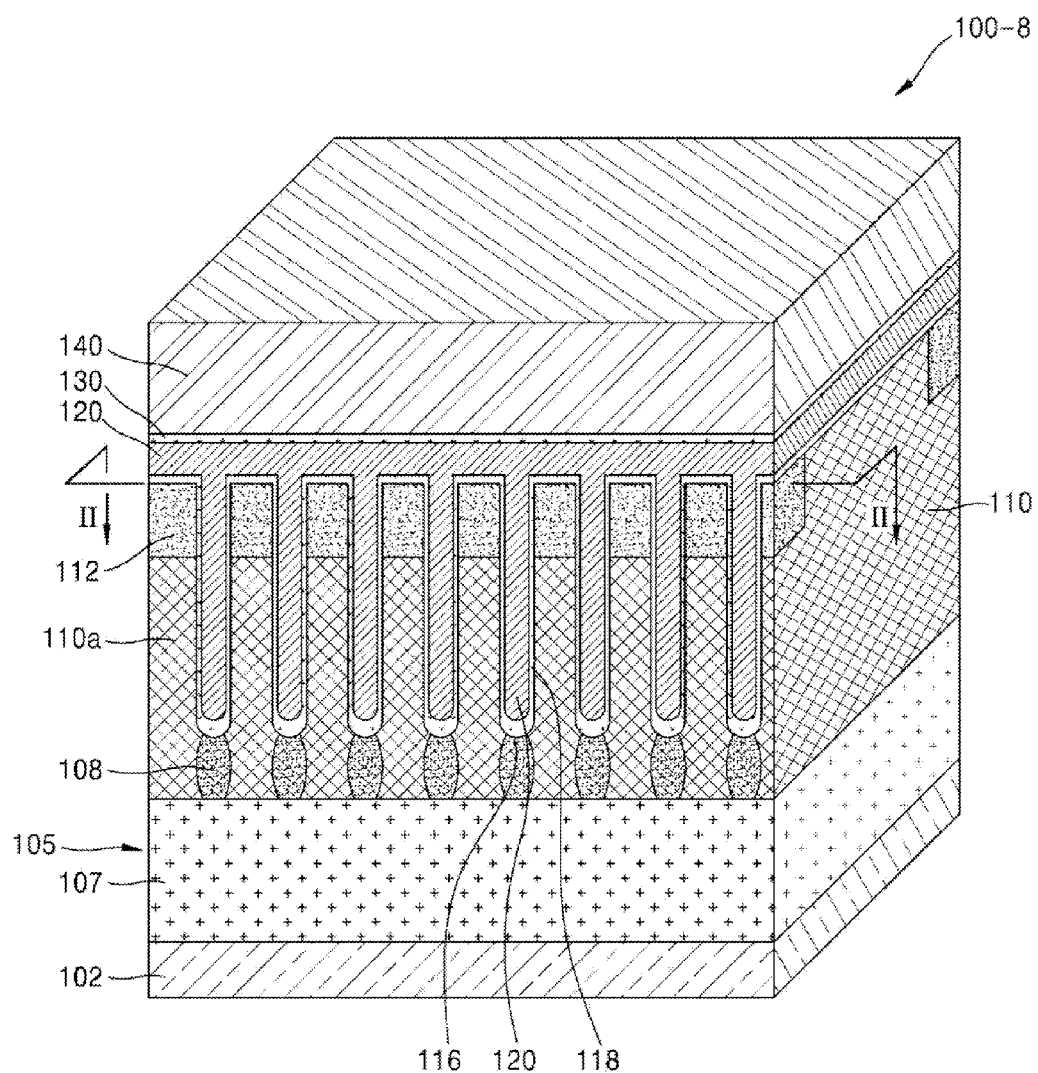
FIG. 90 is a schematic perspective view illustrating a power semiconductor device according to an embodiment of the present disclosure.
Figure 91:
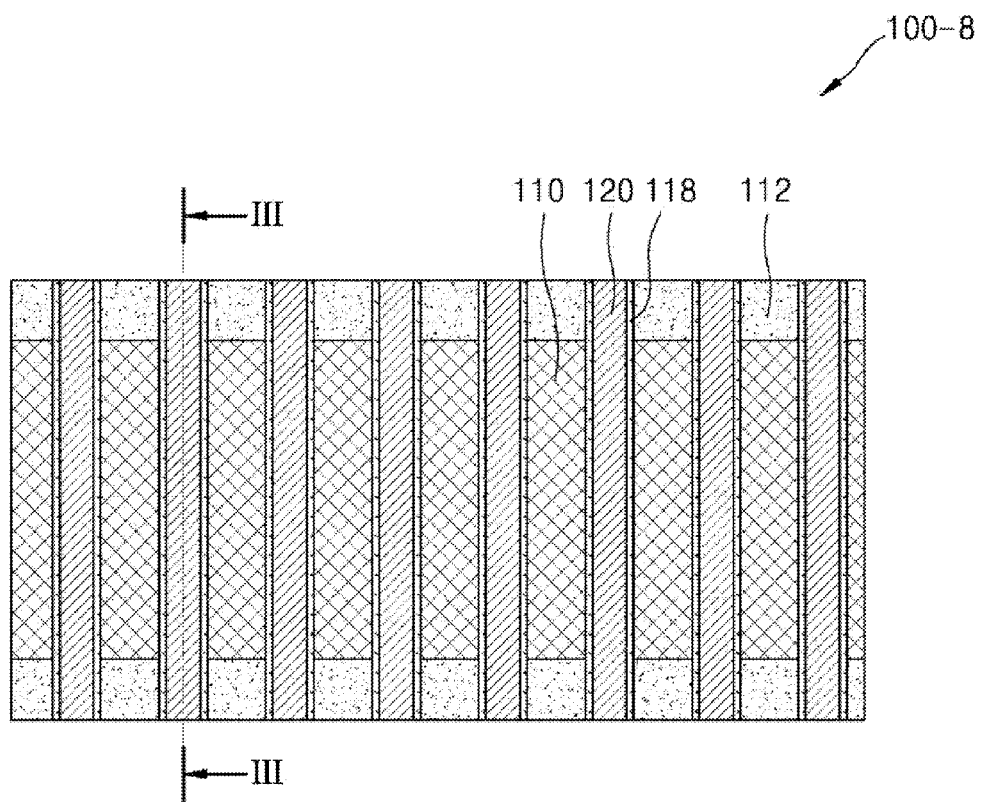
FIG. 91 is a plan view illustrating a power semiconductor device taken along line II-II of FIG. 90.
Figure 92:
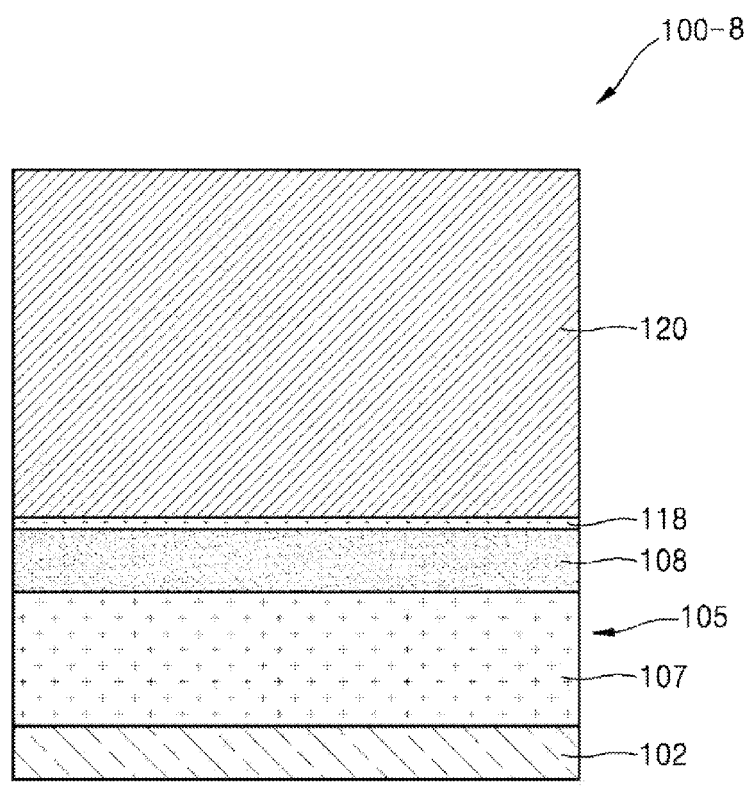
FIG. 92 is a cross-sectional view illustrating a power semiconductor device taken along line III-III of FIG. 91.

FIG. 90 is a schematic perspective view illustrating a power semiconductor device 100-8 according to an embodiment of the present disclosure, FIG. 91 is a plan view illustrating the power semiconductor device 100-8 taken along line II-II of FIG. 90, and FIG. 92 is a cross-sectional view illustrating the power semiconductor device 100-8 taken along line III-III of FIG. 91.

Referring to FIGS. 90 to 92, the power semiconductor device 100-8 may at least include the semiconductor layer 105, the gate insulating layer 118, and the gate electrode layer 120. For example, the power semiconductor device 100-8 may have a power MOSFET structure.

The semiconductor layer 105 may refer to one semiconductor material layer or a plurality of semiconductor material layers, for example, may refer to one epitaxial layer or a plurality of epitaxial layers. In addition, the semiconductor layer 105 may refer to one or multiple epitaxial layers on a semiconductor substrate.

For example, the semiconductor layer 105 may be formed of silicon carbide (SiC). In more detail, the semiconductor layer 105 may include at least one epitaxial layer of silicon carbide.

Silicon carbide (SiC) may have a bandgap wider than silicon, thus maintaining stability even at a high temperature compared to silicon. In addition, because a breakdown electric field of the silicon carbide is higher than that of the silicon, the silicon carbide may stably operate even at a high temperature. Accordingly, the power semiconductor device 100-8 including the semiconductor layer 105 formed of silicon carbide may have a high breakdown voltage compared to the case of using silicon and may provide an excellent heat release characteristic and a stable operating characteristic at a high temperature.

In more detail, the semiconductor layer 105 may include the drift region 107. The drift region 107 may have the first conductivity type and may be formed by implanting impurities of the first conductivity type into a part of the semiconductor layer 105. For example, the drift region 107 may be formed by doping impurities of the first conductivity type in an epitaxial layer of silicon carbide.

The well region 110 may be formed in the semiconductor layer 105 to be in contact with the drift region 107 and may have the second conductivity type. For example, the well region 110 may be formed by doping impurities of the second conductivity type opposite to the first conductivity type in the drift region 107. In more detail, the well region 110 may be disposed on the drift region 107.

The source region 112 may be formed on the well region 110 or in the well region 110 and may have the first conductivity type. For example, the source region 112 may be formed by doping impurities of the first conductivity type in the well region 110. The concentration of the first conductivity-type impurities doped in the source region 112 may be higher than that doped in the drift region 107.

In addition, the drain region 102 may be formed in the semiconductor layer 105 under the drift region 107 and may have the first conductivity type. For example, the drain region 102 may be doped with impurities of a high concentration compared to the drift region 107.

In some embodiments, the drain region 102 may be implemented with a substrate of silicon carbide having the first conductivity type. In this case, the drain region 102 may be understood as a part of the semiconductor layer 105 or may be understood as a substrate independent of the semiconductor layer 105.

At least one trench 116 may be formed to be recessed into the semiconductor layer 105 from a surface of the semiconductor layer 105 as much as a given depth. For example, the at least one trench 116 may have a predetermined depth from the surface (e.g., an upper surface) of the semiconductor layer 105. The trench 116 may extend in one direction within the semiconductor layer 105. One direction may refer to a length direction, not a depth direction of the trench 116, and may refer to a direction of line III-III of FIG. 91.

The gate insulating layer 118 may be formed at least on an inner wall of the trench 116. For example, the gate insulating layer 118 may be formed on an inner surface of the trench 116 and on the semiconductor layer 105 outside the trench 116. A thickness of the gate insulating layer 118 may be uniform, or a part of the gate insulating layer 118 formed on the bottom surface of the trench 116 may be thicker than a part of the gate insulating layer 118 formed on a side wall of the trench 116 such that an electric field decreases at a bottom part of the trench 116.

For example, the gate insulating layer 118 may include an insulating material such as silicon oxide, silicon carbide oxide, silicon nitride, hafnium oxide, zirconium oxide, or aluminum oxide, or may include a stacked structure thereof.

At least one gate electrode layer 120 may be formed on the gate insulating layer 118 so as to be disposed in the trench 116. For example, the gate electrode layer 120 may include an appropriate conductive material such as polysilicon, metal, metal nitride, or metal silicide, or may include a stacked structure thereof.

In some embodiments, the drift region 107 may be formed in the semiconductor layer 105 under the gate electrode layer 120. In the semiconductor layer 105 on the drift region 107, the well region 110 may be formed to be deeper than the gate electrode layer 120, so as to at least surround opposite side walls and bottom edges of the gate electrode layer 120.

A junction resistance reduction region 108 may be formed in the semiconductor layer 105 so as to be connected with the drift region 107 under the bottom surface of the gate electrode layer 120. The junction resistance reduction region 108 may have the first conductivity type and may be formed by implanting impurities of the first conductivity type into the semiconductor layer 105.

In some embodiments, the well region 110 may be formed to surround the side walls and the bottom surface of the gate electrode layer 120, and the junction resistance reduction region 108 may be formed between the bottom surface of the gate electrode layer 120 and the drift region 107 so as to penetrate the well region 110. In this case, the junction resistance reduction region 108 may be formed by doping impurities of the first conductivity type in the well region 110.

This well (110) structure may more alleviate the concentration of an electric field on the bottom surface of the trench 116, that is, at lower end edges of the gate electrode layer 120. The above structure may increase a margin of an electric field across the gate insulating layer 118 of the power semiconductor device 100-8, and thus, the reliability of operation of the power semiconductor device 100-8 may be improved.

The channel region 110a may be formed in the semiconductor layer 105 between the junction resistance reduction region 108 and the source region 112. For example, the channel region 110a may be formed in the semiconductor layer 105 along a side wall of the gate electrode layer 120 between the junction resistance reduction region 108 and the source region 112. For example, the channel region 110a may have the second conductivity type, and an inversion channel may be formed therein along one direction in an operation of the power semiconductor device 100-8.

Because the channel region 110a has a doping type opposite to that of the source region 112 and the drift region 107, the channel region 110a may form a diode junction with the source region 112 and the drift region 107. Accordingly, the channel region 110a may not permit charges to move in a normal situation; however, when an operating voltage is applied to the gate electrode layer 120, an inversion channel may be formed therein such that the movement of charges is permitted.

In some embodiments, the channel region 110a may be a part of the well region 110. In this case, the channel region 110a may be integrally formed to be continuously connected with the well region 110. A doping concentration of the second conductivity-type impurities of the channel region 110a may be the same as that of the remaining portion of the well region 110 or may be different therefrom for the adjustment of a threshold voltage.

A doping concentration of the first conductivity-type impurities of the junction resistance reduction region 108 may be the same as or higher than that of the drift region 107. In some embodiments, the doping concentration of the first conductivity-type impurities of the junction resistance reduction region 108 may be higher than that of the drift region 107 such that a junction resistance decreases. In this case, because the junction resistance reduction region 108 whose resistance is smaller than that of the drift region 107 is joined together with the channel region 110a, the junction resistance may decrease.

In addition, the doping concentration of the first conductivity-type impurities of the junction resistance reduction region 108 may be the same as or lower than a doping concentration of the first conductivity-type impurities of the source region 112 and the drain region 102.

In some embodiments, the gate insulating layer 118 and the gate electrode layer 120 may be formed in the trench 116, and in addition, may be formed to further extend to the outside of the trench 116.

In some embodiments, one trench 116 or a plurality of trenches 116 may be provided in the semiconductor layer 105. The number of trenches 116 may be appropriately selected without limiting the scope of the embodiment.

For example, the plurality of trenches 116 may be formed in the semiconductor layer 105 in parallel along one direction. As the trenches 116 extend in one direction and are spaced from each other in a direction perpendicular to the one direction, the trenches 116 may be arranged in parallel.

In this case, a plurality of gate electrode layers 120 may be formed on the gate insulating layer 118 so as to fill the inside of the trenches 116. As such, the gate electrode layers 120 may be formed in the semiconductor layer 105 in a trench type and may be arranged to extend in parallel in the one direction like the trenches 116.

The interlayer insulating layer 130 may be formed on the gate electrode layer 120. For example, the interlayer insulating layer 130 may include an appropriate insulating material such as oxide or nitride, or may include a stacked structure thereof.

The source electrode layer 140 may be formed on the interlayer insulating layer 130 and may be connected with the source region 112. For example, the source electrode layer 140 may be formed of an appropriate conductive material, metal, etc.

In the power semiconductor device 100-8 described above, the first conductivity type and the second conductivity type may be opposite to each other, and each of the first conductivity type and the second conductivity type may be one of n-type and p-type. For example, when the first conductivity type is n-type, the second conductivity type is p-type, and vice versa.

In more detail, when the power semiconductor device 100-8 is an N-type MOSFET, the drift region 107 may be an N− region, the junction resistance reduction region 108 may be an N− region, the source region 112 and the drain region 102 may be N+ regions, and the well region 110 and the channel region 110*a* may be P− regions.

In an operation of the power semiconductor device 100-8, a current may generally flow in a vertical direction from the drain region 102 to the drift region 107 and the junction resistance reduction region 108, and may then flow to the source region 112 along the side walls of the gate electrode layers 120, on which channel regions are formed.

In the power semiconductor device 100-8 described above, the gate electrode layers 120 in the trenches 116 may be densely arranged in parallel in a stripe type or a line type, and the channel regions may be disposed on the side surfaces of the gate electrode layers 120. As such, a channel density may increase.

Figure 93:
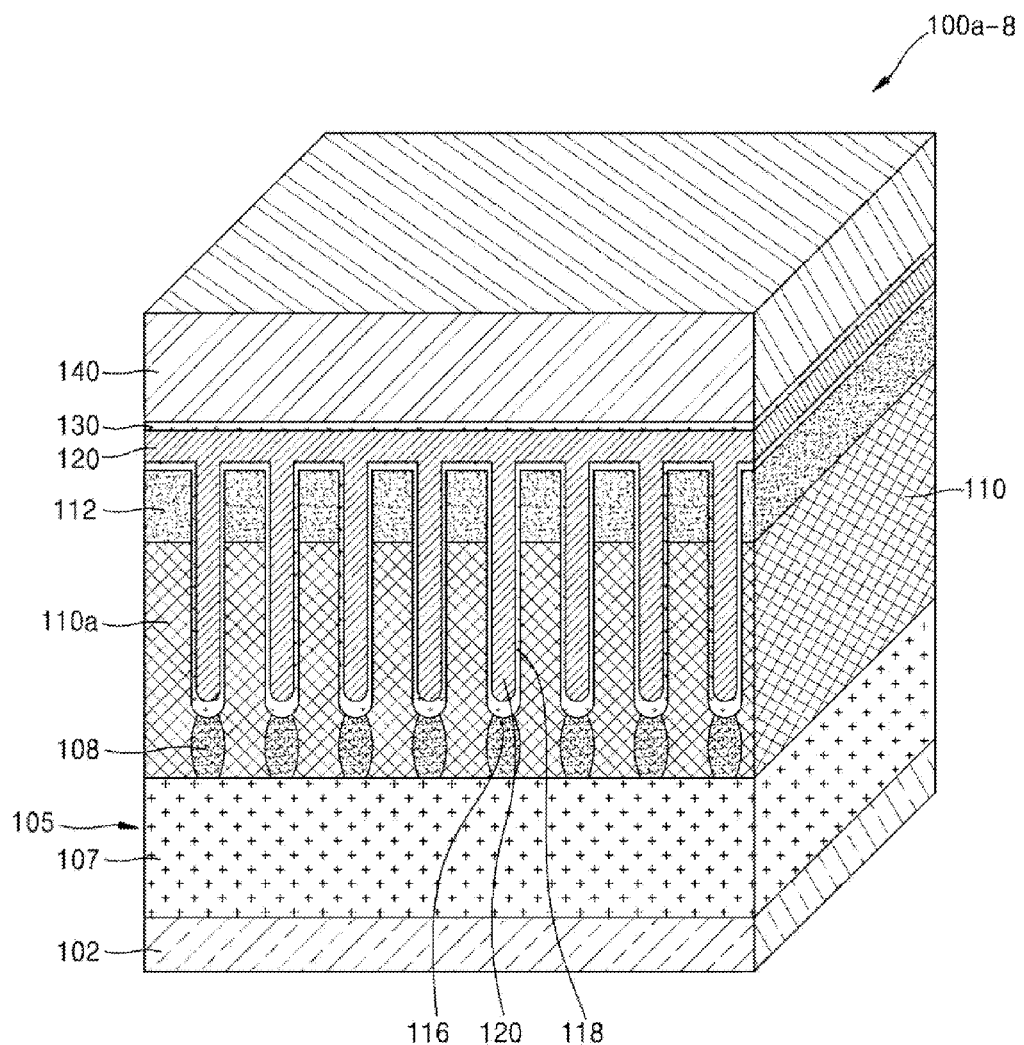
FIG. 93 is a perspective view illustrating a power semiconductor device according to another embodiment of the present disclosure.

FIG. 93 is a perspective view illustrating a power semiconductor device 100*a*-8 according to another embodiment of the present disclosure. The power semiconductor device 100*a*-8 according to the embodiment may be implemented by using or partially modifying the power semiconductor device 100-8 of FIGS. 90 to 92, and thus, additional description will be omitted to avoid redundancy.

Referring to FIG. 93, in the power semiconductor device 100*a*-8, the source region 112 may be formed to be continuous along an extending direction of the gate electrode layer 120. For example, the source region 112 may be formed widely to surround an upper-part region of the gate electrode layer 120. As described above, when the source region 112 is widely formed, a charge movement path from the drain region 102 to the source region 112 may widen.

Figure 94:
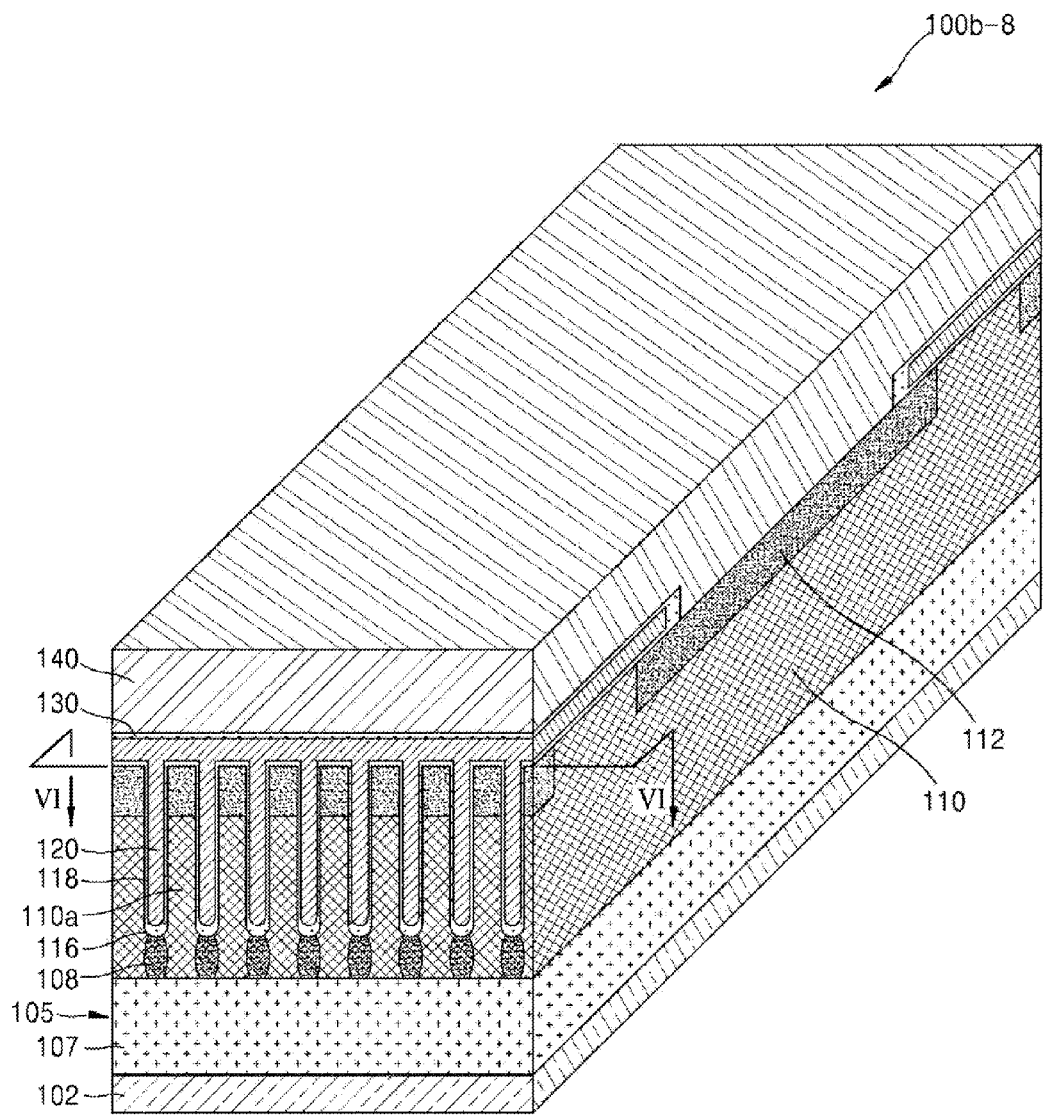
FIG. 94 is a schematic perspective view illustrating a power semiconductor device according to another embodiment of the present disclosure.
Figure 95:
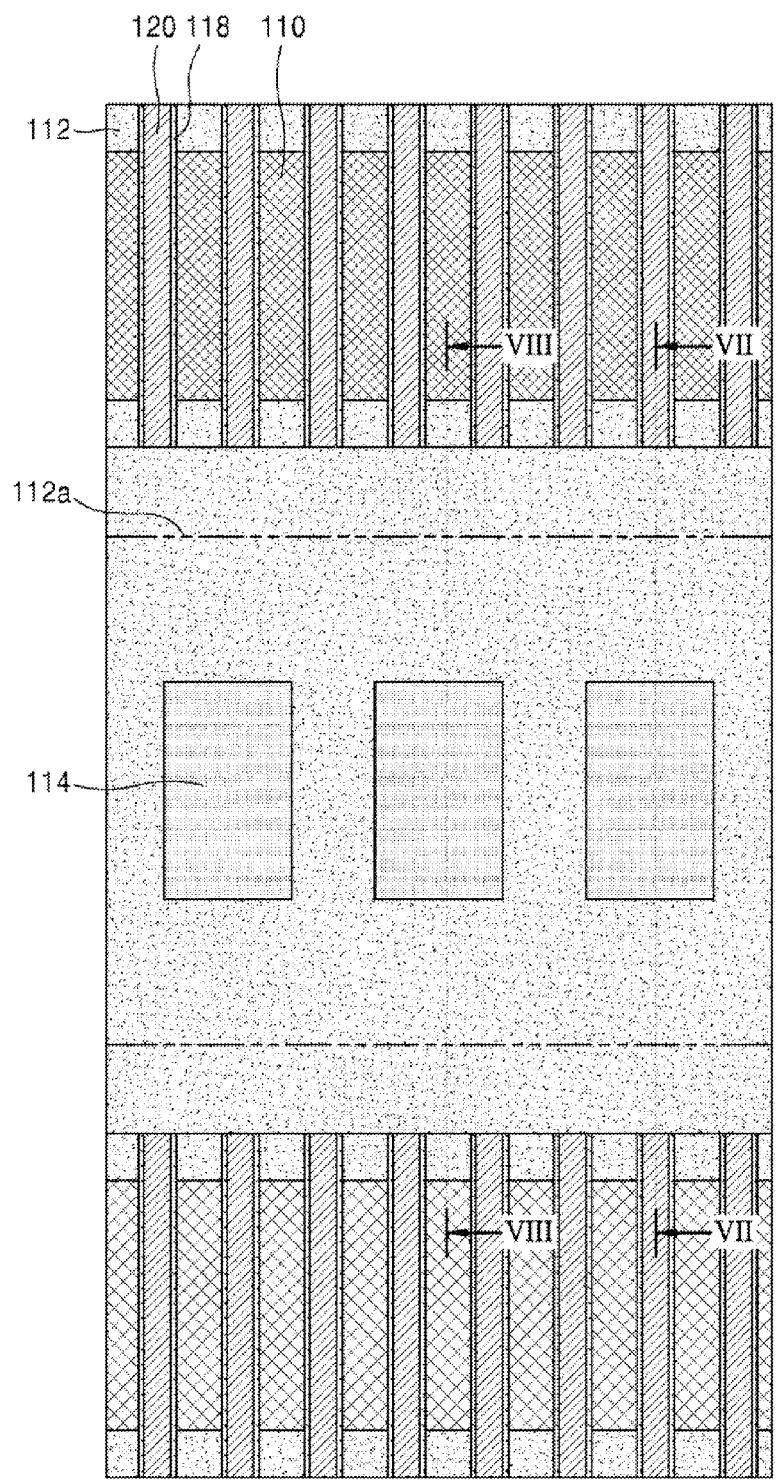
FIG. 95 is a plan view illustrating a power semiconductor device taken along line VI-VI of FIG. 94.
Figure 96:
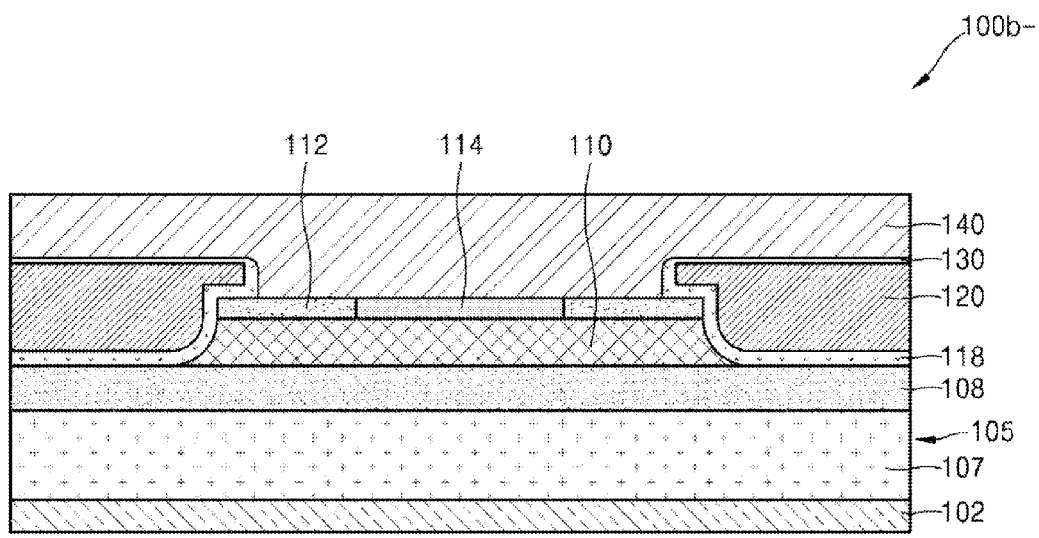
FIG. 96 is a cross-sectional view illustrating a power semiconductor device taken along line VII-VII of FIG. 95.
Figure 97:
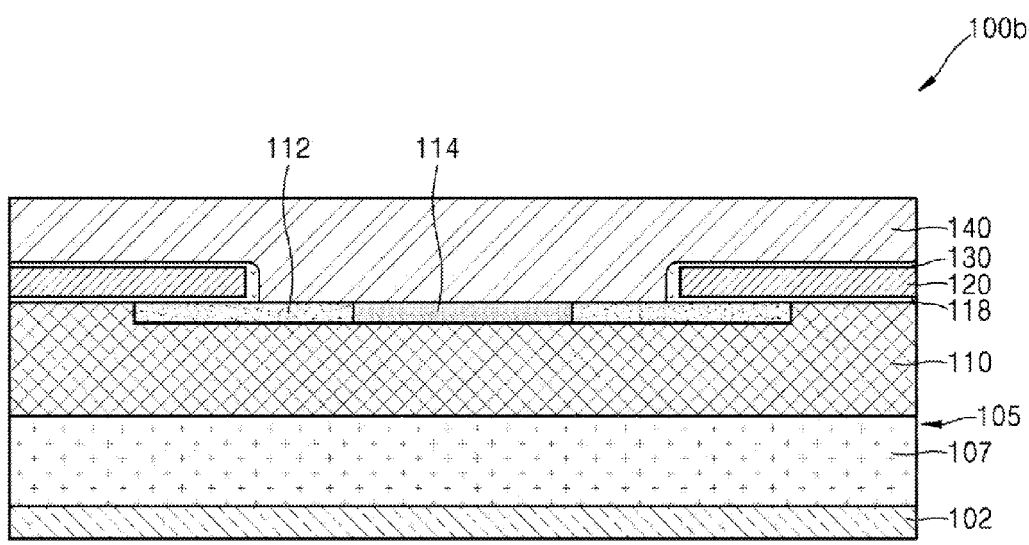
FIG. 97 is a cross-sectional view illustrating a power semiconductor device taken along line VIII-VIII of FIG. 95.

FIG. 94 is a schematic perspective view illustrating a power semiconductor device 100*b*-8 according to another embodiment of the present disclosure, FIG. 95 is a plan view illustrating the power semiconductor device 100*b*-8 taken along line VI-VI of FIG. 94, FIG. 96 is a cross-sectional view illustrating the power semiconductor device 100*b*-8 taken along line VII-VII of FIG. 95, and FIG. 97 is a cross-sectional view illustrating the power semiconductor device 100*b*-8 taken along line VIII-VIII of FIG. 95.

The power semiconductor device 100*b*-8 according to the embodiment may be implemented by using or partially modifying the power semiconductor device 100-8 of FIGS. 90 to 92, and thus, additional description will be omitted to avoid redundancy.

Referring to FIGS. 94 to 97, in the power semiconductor device 100*b*-8, the source region 112 may include the source contact region 112*a* outside at least one ends of the gate electrode layers 120. For example, the source contact region 112*a* that is a part of the source region 112 may refer to the part with which the source electrode layer 140 is connected.

The well contact region 114 may be formed in the source contact region 112*a*. For example, the well contact region 114 may extend from the well region 110 to penetrate the source region 112 and may have the second conductivity type. One well contact region 114 or a plurality of source contact regions 114 may be formed in the source contact region 112*a*.

For example, the well contact region 114 may be doped with second conductivity-type impurities of a higher concentration than the well region 110 to reduce a contact resistance when connected with the source electrode layer 140.

The source electrode layer 140 may be connected in common with the source contact region 112*a* and the well contact region 114.

In some embodiments, the plurality of trenches 116 may be arranged to be spaced from each other in line along one direction. As such, the gate electrode layers 120 may also be arranged to be spaced from each other in line in the one direction, along the trenches 116. In this case, the well region 110, the source region 112, the source contact region 112*a*, and the well contact region 114 may be formed in the semiconductor layer 105 between the trenches 116 arranged to be spaced from each other in line along the one direction.

For example, the power semiconductor device 100*b*-8 may be formed by arranging the structure of the power semiconductor device 100-8 of FIGS. 90 to 92 in plurality along one direction and by disposing the well region 110, the source region 112, the source contact region 112*a*, and the well contact region 114 therebetween.

For example, when the power semiconductor device 100-8 is an N-type MOSFET, the source contact region 112*a* may be an N+ region, and the well contact region 114 may be a P+ region.

According to the power semiconductor device 100*b*-8, the source contact region 112*a* and the well contact region 114 may be disposed outside the gate electrode layers 120, not between the gate electrode layers 120, and thus, the gate electrode layers 120 may be arranged more densely. As such, a channel density of the power semiconductor device 100*b*-8 may markedly increase.

Figure 98:
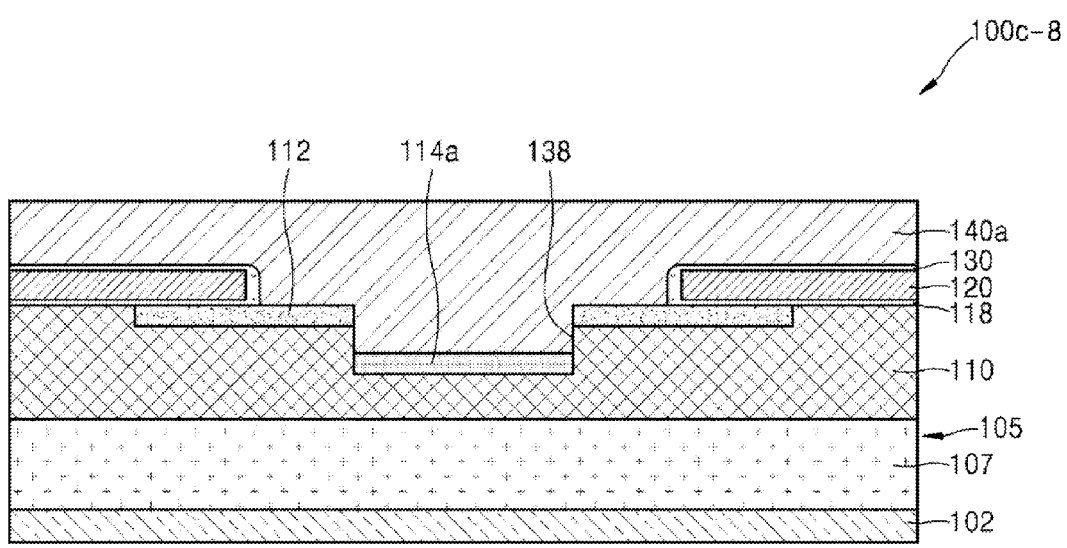
FIG. 98 is a cross-sectional view illustrating a power semiconductor device according to another embodiment of the present disclosure.

FIG. 98 is a cross-sectional view illustrating a power semiconductor device 100*c*-8 according to another embodiment of the present disclosure. The power semiconductor device 100*c*-8 may be implemented by modifying a partial configuration of the power semiconductor device 100*b*-8 of FIGS. 94 to 97, and thus, additional description will be omitted to avoid redundancy because they may be referred to each other.

Referring to FIG. 98, the power semiconductor device 100*c*-8 may include at least one groove 138, which is formed to penetrate the source region 112 and to be recessed into the well region 110, in the source contact region 112*a* of the source region 112. The well contact region 114*a* may be formed on at least a bottom surface of the groove 138 so as to be in contact with the well region 110.

The source electrode layer 140*a* may be formed to fill the groove 138 and may be connected with the well contact region 114*a*, the well region 110, and/or the source region 112. The above structure may widen the contact area between the source electrode layer 140*a* and the well region 110 and the contact area between the source electrode layer 140*a* and the source region 112 such that contact resistances therebetween decrease.

In some embodiments, the well contact region 114*a* may be formed on the whole surface of the well region 110 exposed by the groove 138. Accordingly, the well contact region 114*a* may be formed on the well region 110 exposed from a bottom surface and a side wall of the groove 138. The above structure of the well contact region 114*a* may allow the contact resistance between the source electrode layer 140*a* and the well region 110 to further decrease.

Figure 99:
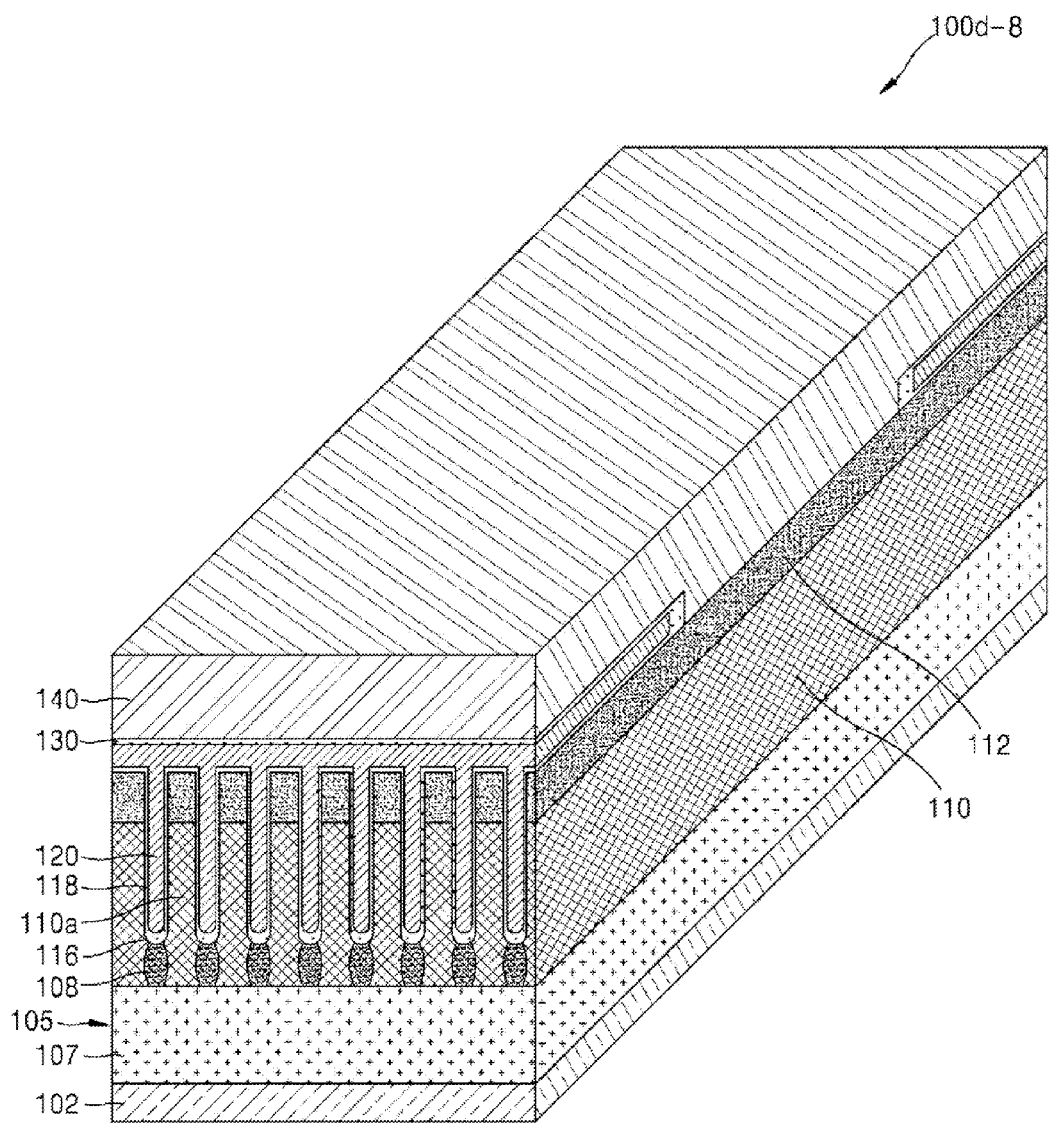
FIG. 99 is a perspective view illustrating a power semiconductor device according to another embodiment of the present disclosure.

FIG. 99 is a cross-sectional view illustrating a power semiconductor device 100*d*-8 according to another embodiment of the present disclosure. The power semiconductor device 100*d*-8 may be implemented by modifying a partial configuration of the power semiconductor device 100*b*-8 of FIGS. 94 to 97, and thus, additional description will be omitted to avoid redundancy because they may be referred to each other.

Referring to FIG. 99, in the power semiconductor device 100*d*-8, the source region 112 may be formed to be continuous along an extending direction of the gate electrode layer 120. For example, the source region 112 may extend along upper parts of the gate electrode layers 120, and in addition, may extend beyond between the gate electrode layers 120 arranged in line.

The source region 112 may be formed widely to surround an upper-part region of the gate electrode layer 120. As described above, when the source region 112 is widely formed, a charge movement path from the drain region 102 to the source region 112 may widen.

As described above, according to an embodiment of the present disclosure, a power semiconductor device and a method of fabricating the same may allow the concentration of an electric field to be alleviated and a channel density to increase, thus improving the degree of integration.

Of course, these effects are exemplary, and the scope of the invention is not limited by these effects.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A power semiconductor device comprising:
a semiconductor layer of silicon carbide (SiC);
at least one trench extending in one direction and recessed into the semiconductor layer from a surface of the semiconductor layer;
a gate insulating layer disposed on at least an inner wall of the at least one trench;
at least one gate electrode layer disposed on the gate insulating layer and disposed in the at least one trench;
a drift region disposed in the semiconductor layer at least on one side of the at least one gate electrode layer and having a first conductivity type;
a well region disposed in the semiconductor layer to be deeper than the at least one gate electrode layer, so as to be in contact with at least a part of the drift region and to surround a bottom surface of the at least one gate electrode layer at least at one end of the at least one gate electrode layer, and having a second conductivity type;
a source region disposed in the well region and having the first conductivity type; and
at least one channel region disposed in the semiconductor layer of one side of the at least one gate electrode layer between the drift region and the source region, and having the second conductivity type,
wherein the drift region includes a vertical portion vertically extending in the semiconductor layer of the one side of the at least one gate electrode layer,
wherein the at least one channel region is disposed in the semiconductor layer between the vertical portion of the drift region and the source region, and
wherein the well region, the source region, and the channel region are disposed in the semiconductor layer so as to be located on opposite sides of the vertical portion of the drift region.

2. The power semiconductor device of claim 1, wherein the source region includes a source contact region connected with a source electrode layer outside the one end of the at least one gate electrode layer.

3. The power semiconductor device of claim 2, further comprising:
a well contact region extending through the source region from the well region in the source contact region, connected with the source electrode layer, and having the second conductivity type,
wherein a doping concentration of the well contact region is higher than a doping concentration of the well region.

4. The power semiconductor device of claim 1, wherein the vertical portion of the drift region includes vertical portions vertically extending in the semiconductor layer of opposite sides of the at least one gate electrode layer, and
wherein the at least one channel region includes channel regions disposed in the semiconductor layer between the vertical portions of the drift region and the source region.

5. The power semiconductor device of claim 1, wherein the at least one channel region is a part of the well region.

6. The power semiconductor device of claim 1, wherein the at least one trench includes a plurality of trenches disposed in the semiconductor layer in parallel along the one direction,
wherein the at least one gate electrode layer includes a plurality of gate electrode layers disposed in the plurality of trenches,
wherein the well region and the source region extend across the plurality of gate electrode layers, and
wherein the at least one channel region includes a plurality of channel regions disposed in the semiconductor layer of one sides of the plurality of gate electrode layers.

7. The power semiconductor device of claim 6, wherein the source region includes a source contact region connected with a source electrode layer outside one ends of the plurality of gate electrode layers.

8. The power semiconductor device of claim 6, wherein the vertical portion of the drift region includes vertical portions vertically extending in the semiconductor layer between the plurality of gate electrode layers, and
wherein the channel regions are disposed in the semiconductor layer between the vertical portions of the drift region and the source region.

9. The power semiconductor device of claim 1, wherein the at least one trench includes a plurality of trenches arranged to be spaced from each other in line along the one direction,
wherein the at least one gate electrode layer includes a plurality of gate electrode layers disposed in the plurality of trenches, and
wherein the well region and the source region are disposed in the semiconductor layer between the plurality of trenches at least.

10. The power semiconductor device of claim 1, further comprising:
a drain region having the first conductivity type in the semiconductor layer under the drift region,
wherein a doping concentration of the drain region is higher than a doping concentration of the drift region.

11. A power semiconductor device comprising:
a semiconductor layer of silicon carbide (SiC);
a plurality of trenches extending in parallel in one direction and recessed into the semiconductor layer from a surface of the semiconductor layer;
a gate insulating layer disposed on at least inner walls of the trenches;
a gate electrode layer disposed on the gate insulating layer and including a plurality of portions respectively disposed in the plurality of trenches;

a drift region including a plurality of vertical portions disposed in the semiconductor layer between the plurality of portions of the gate electrode layer, and having a first conductivity type;

a well region disposed in the semiconductor layer to be deeper than the plurality of portions of the gate electrode layer, so as to be in contact with the plurality of vertical portions of the drift region and to surround bottom surfaces of the plurality of portions of the gate electrode layer at opposite ends of the plurality of portions of the gate electrode layer, and having a second conductivity type;

a source region disposed in the well region and having the first conductivity type; and a plurality of channel regions disposed in the semiconductor layer of opposite sides of the plurality of portions of the gate electrode layer between the plurality of vertical portions of the drift region and the source region, and having the second conductivity type, wherein the gate electrode layer continuously extends from one of the plurality of trenches to another of the plurality of trenches so as to continuously cover an upper surface of the source region between the one of the plurality of trenches and the another of the plurality of trenches.

12. A method of fabricating a power semiconductor device, comprising:

forming a drift region having a first conductivity type in a semiconductor layer of silicon carbide (SiC);

forming a well region being in contact with at least a part of the drift region and having a second conductivity type, in the semiconductor layer;

forming a source region having the first conductivity type, in the well region;

forming at least one channel region having the second conductivity type, in the semiconductor layer between the drift region and the source region;

forming at least one trench to be shallower than the well region, so as to be recessed into the semiconductor layer from a surface of the semiconductor layer to extend across the drift region in one direction;

forming a gate insulating layer on at least an inner wall of the at least one trench; and forming at least one gate electrode layer on the gate insulating layer and in the at least one trench, wherein the well region is formed in the semiconductor layer to be deeper than the at least one gate electrode layer, so as to surround a bottom surface of the at least one gate electrode layer at one end of the at least one gate electrode layer, and wherein the channel region is formed in the semiconductor layer of one side of the at least one gate electrode layer between the drift region and the source region, wherein the forming of the source region includes:
  forming a source contact region connected with a source electrode layer outside the one end of the at least one gate electrode layer, wherein the method further comprises:
  forming, in the source contact region, a well contact region extending through the source region from the well region, connected with the source electrode layer, and having the second conductivity type,
  wherein a doping concentration of the well contact region is higher than a doping concentration of the well region.

13. The method of claim 12, wherein the forming of the well region is performed by implanting impurities of the second conductivity type into the semiconductor layer, and
  wherein the forming of the source region is performed by implanting impurities of the first conductivity type into the well region.

14. The method of claim 12, wherein the drift region is formed on a drift region having the first conductivity type, and
  wherein a doping concentration of the drain region is higher than a doping concentration of the drift region.

15. The method of claim 14, wherein the drain region is formed with a substrate of the first conductivity type, and
  wherein the drift region is formed with an epitaxial layer on the substrate.

* * * * *